(12) United States Patent
Yamamoto et al.

(10) Patent No.: US 12,189,085 B2
(45) Date of Patent: Jan. 7, 2025

(54) IMAGING DEVICE

(71) Applicant: SONY SEMICONDUCTOR SOLUTIONS CORPORATION, Kanagawa (JP)

(72) Inventors: Atsushi Yamamoto, Kanagawa (JP); Kensaku Maeda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 501 days.

(21) Appl. No.: 17/595,917

(22) PCT Filed: May 25, 2020

(86) PCT No.: PCT/JP2020/020581
§ 371 (c)(1),
(2) Date: Nov. 29, 2021

(87) PCT Pub. No.: WO2020/246293
PCT Pub. Date: Dec. 10, 2020

(65) Prior Publication Data
US 2022/0236454 A1    Jul. 28, 2022

(30) Foreign Application Priority Data
Jun. 6, 2019  (JP) .................. 2019-105899

(51) Int. Cl.
*G02B 1/11*  (2015.01)
*G02B 3/04*  (2006.01)
(Continued)

(52) U.S. Cl.
CPC .................. *G02B 1/11* (2013.01); *G02B 3/04* (2013.01); *G02B 7/021* (2013.01); *G02B 27/0018* (2013.01)

(58) Field of Classification Search
CPC ........ G02B 1/11; G02B 3/04; G02B 27/0018; G02B 7/021
(Continued)

(56) References Cited

U.S. PATENT DOCUMENTS

2005/0275741 A1* 12/2005 Watanabe ......... H01L 27/14618
257/E31.118
2013/0032914 A1*  2/2013 Iwasaki ............. H01L 27/14621
257/E31.127

FOREIGN PATENT DOCUMENTS

CN         1713214 A    12/2005
CN       110431453 A    11/2019
(Continued)

OTHER PUBLICATIONS

Translation of 201800423 (Year: 2024).*
(Continued)

*Primary Examiner* — Jerry L Brooks
(74) *Attorney, Agent, or Firm* — CHIP LAW GROUP

(57) ABSTRACT

The present disclosure relates to an imaging device capable of preventing occurrence of flare and ghosts. The imaging device includes a solid-state imaging element including a laminate substrate in which a first substrate and a second substrate are laminated, a glass substrate positioned above the first substrate, and a lens formed on the glass substrate, in which a cavity is provided between the lens and the solid-state imaging element. The present technology can be applied to, for example, an imaging device.

14 Claims, 72 Drawing Sheets

(51) Int. Cl.
*G02B 7/02* (2021.01)
*G02B 27/00* (2006.01)

(58) Field of Classification Search
USPC .......................................................... 359/601
See application file for complete search history.

(56) References Cited

FOREIGN PATENT DOCUMENTS

| | | | | | |
|---|---|---|---|---|---|
| JP | 2006-005029 | A | | 1/2006 | |
| JP | 2013-038164 | A | | 2/2013 | |
| JP | 2015-061193 | A | | 3/2015 | |
| JP | 2018200423 | A | * | 12/2018 | ............. G02B 1/118 |
| JP | 2019047237 | A | * | 3/2019 | ......... G02B 13/0085 |
| KR | 10-2005-0119073 | A | | 12/2005 | |
| TW | 200541063 | A | | 12/2005 | |
| TW | 201902206 | A | | 1/2019 | |
| WO | WO-2004027880 | A2 | | 4/2004 | |
| WO | WO-2008108268 | A1 | | 9/2008 | |
| WO | 2018/221191 | A1 | | 12/2018 | |
| WO | 2019/044540 | A1 | | 3/2019 | |

OTHER PUBLICATIONS

Translation of 2019047237 (Year: 2024).*
International Search Report and Written Opinion of PCT Application No. PCT/JP2020/020581, issued on Aug. 11, 2020, 11 pages of ISRWO.

* cited by examiner

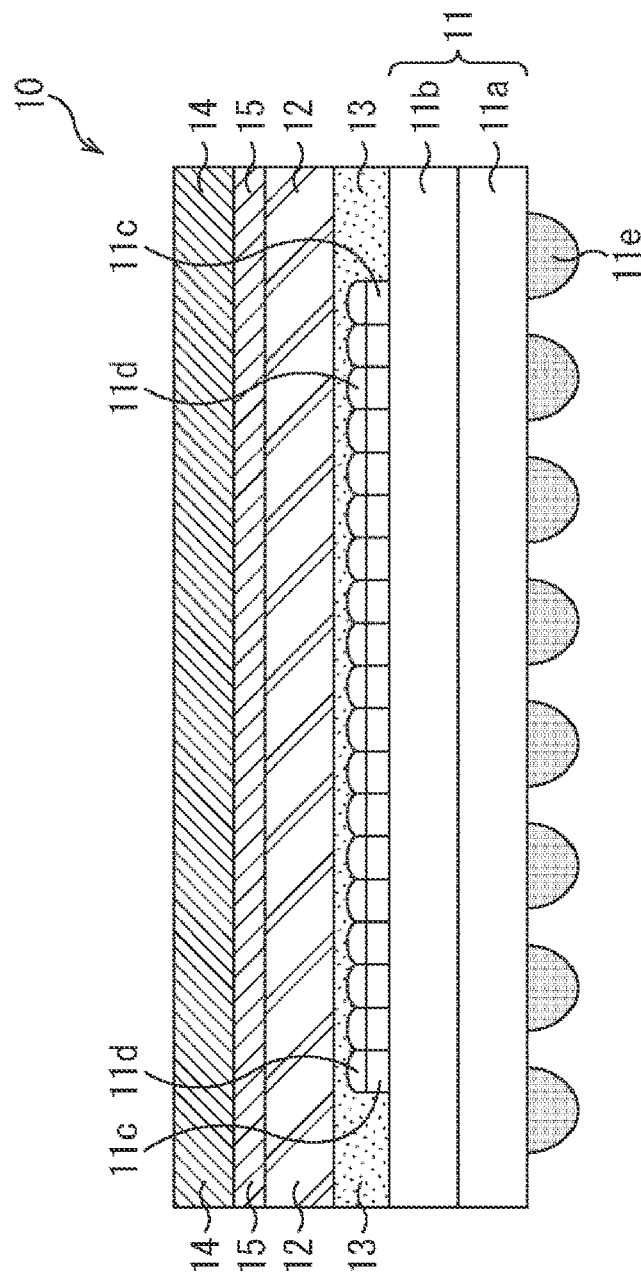

FIG. 25

IMAGING DEVICE

CROSS REFERENCE TO RELATED APPLICATIONS

This application is a U.S. National Phase of International Patent Application No. PCT/JP2020/020581 filed on May 25, 2020, which claims priority benefit of Japanese Patent Application No. JP 2019-105899 filed in the Japan Patent Office on Jun. 6, 2019. Each of the above-referenced applications is hereby incorporated herein by reference in its entirety.

TECHNICAL FIELD

The present disclosure relates to an imaging device, and more particularly, to an imaging device capable of capturing an image while preventing occurrence of flare and ghosts.

BACKGROUND ART

In recent years, solid-state imaging elements used in mobile terminal devices with cameras, digital still cameras, and the like have achieved progress in increase in the number of pixels, downsizing, and reduction in height.

The increase in the number of pixels and downsizing of a camera generally results in a lens and a solid-state imaging element being closer to each other on an optical axis, and an infrared cut filter being arranged in the vicinity of the lens.

For example, there has been proposed a technology for achieving downsizing of a solid-state imaging element by disposing a lens constituting a lowermost layer among a lens group including a plurality of lenses on the solid-state imaging element.

CITATION LIST

Patent Document

Patent Document 1: Japanese Patent Application Laid-Open No. 2015-061193

SUMMARY OF THE INVENTION

Problems to be Solved by the Invention

However, in a case where a lowermost lens is disposed on the solid-state imaging element, although this contributes to downsizing and reduction in height of a device configuration, a distance between the infrared cut filter and the lens becomes short, which causes flare and ghosts attributable to internal diffuse reflection due to reflection of light.

The present disclosure has been made in view of such a situation, and in particular, in a solid-state imaging element, it is possible to achieve downsizing and reduction in height and to prevent occurrence of flare and ghosts.

Solutions to Problems

One aspect of the present disclosure provides an imaging device including a solid-state imaging element including a laminate substrate in which a first substrate and a second substrate are laminated, a glass substrate positioned above the first substrate, and a lens formed on the glass substrate, in which a cavity is provided between the lens and the solid-state imaging element.

In the one aspect of the present disclosure, a solid-state imaging element including a laminate substrate in which a first substrate and a second substrate are laminated, a glass substrate positioned above the first substrate, and a lens formed on the glass substrate are provided, and a cavity is provided between the lens and the solid-state imaging element.

The imaging device may be an independent device or a module incorporated in another device.

BRIEF DESCRIPTION OF DRAWINGS

FIG. 2 is a schematic external view of an integrated component including a solid-state imaging element in the imaging device in FIG. 1.

FIG. 25 is a diagram illustrating a modified example of a structure of an edge of the lens in FIG. 23.

MODE FOR CARRYING OUT THE INVENTION

Figure 1:
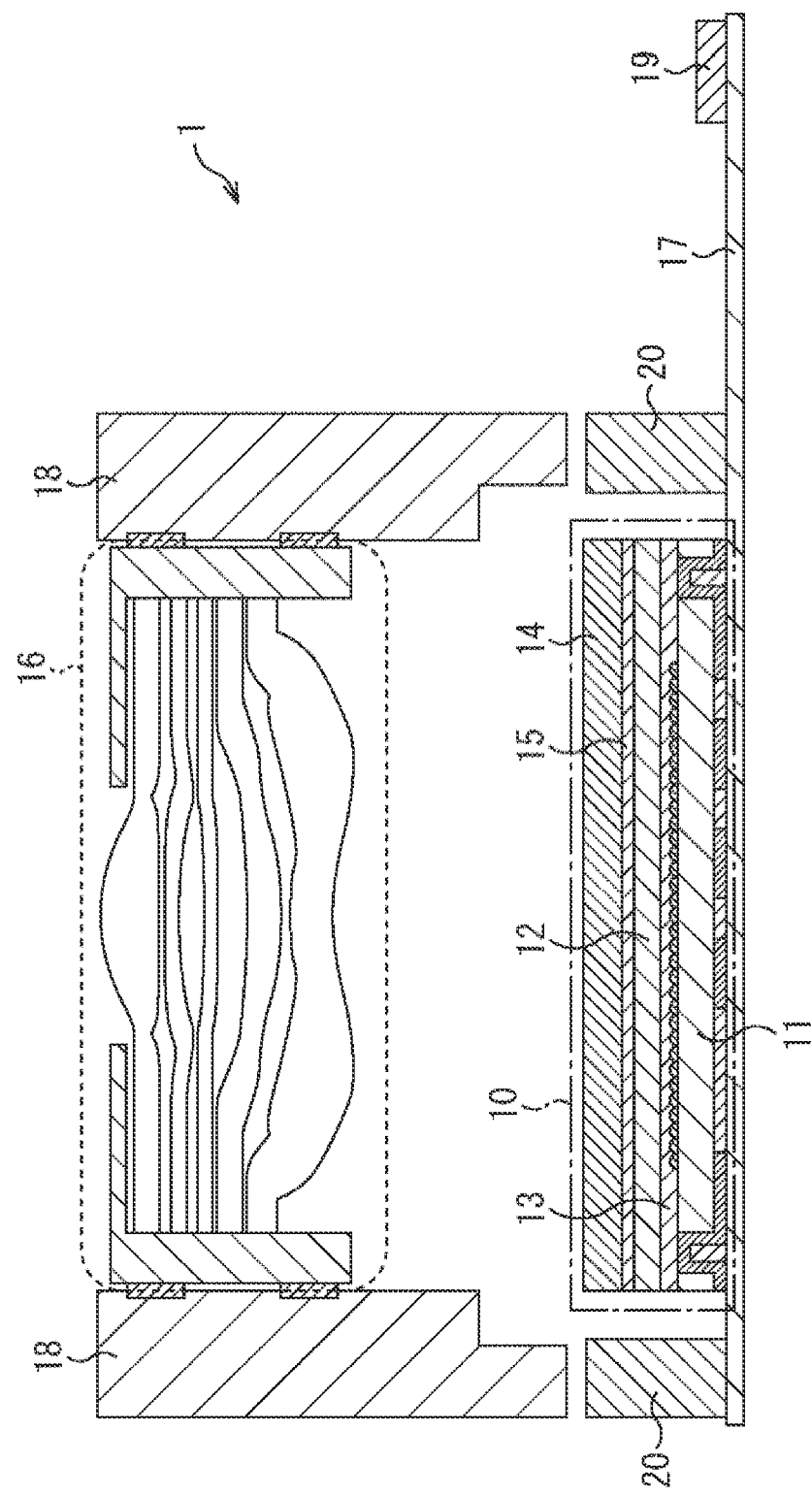
FIG. 1 is a diagram illustrating a configuration example of a first embodiment of an imaging device of the present disclosure.

Preferred embodiments of the present disclosure will be described below in detail with reference to the accompanying drawings. Note that, in the present specification and drawings, components having substantially the same functional configurations are denoted by the same reference numerals, and the description thereof will thus not be repeated.

Modes for carrying out the present disclosure (hereinafter referred to as "embodiments") will be described below. Note that the description will be made in the order below.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment
10. Tenth Embodiment
11. Eleventh Embodiment
12. Twelfth Embodiment
13. Thirteenth Embodiment
14. Fourteenth Embodiment
15. Fifteenth Embodiment
16. Sixteenth Embodiment
17. Seventeenth Embodiment
18. Eighteenth Embodiment
19. Nineteenth Embodiment
20. Twentieth Embodiment
21. Twenty-First Embodiment
22. Twenty-Second Embodiment
23. Example of application to electronic equipment
24. Usage example of solid-state imaging device
25. Example of application to endoscopic surgery system
26. Example of application to mobile object 1. First Embodiment <Configuration Example of Imaging Device>

A configuration example of an imaging device according to a first embodiment of the present disclosure that prevents occurrence of ghosts and flare while achieving downsizing and reduction in height of the device configuration will be described with reference to FIG. 1. Note that FIG. 1 is a side sectional view of the imaging device.

An imaging device 1 in FIG. 1 includes a solid-state imaging element 11, a glass substrate 12, an infrared cut filter (IRCF) 14, a lens group 16, a circuit board 17, an actuator 18, a connector 19, and a spacer 20.

The solid-state imaging element 11 is an image sensor constituted by a so-called complementary metal oxide semiconductor (CMOS), a charge coupled device (CCD), or the like, and is fixed on the circuit board 17 in an electrically connected state. As will be described later with reference to FIG. 4, the solid-state imaging element 11 is constituted by a plurality of pixels arranged in an array, generates a pixel signal in accordance with an amount of incident light condensed and incident from the upper side in the drawing via the lens group 16 in a pixel unit, and outputs the pixel signal as an image signal to outside from the connector 19 via the circuit board 17.

The glass substrate 12 is provided on an upper surface portion of the solid-state imaging element 11 in FIG. 1, and is bonded by a transparent adhesive (glue) 13, that is, an adhesive having substantially the same refractive index as the glass substrate 12.

The IRCF 14 that cuts infrared light in incident light is provided on an upper surface portion of the glass substrate 12 in FIG. 1, and is bonded by a transparent adhesive (glue) 15, that is, an adhesive having substantially the same refractive index as the glass substrate 12. The IRCF 14 is constituted by, for example, blue plate glass, and cuts (removes) infrared light.

That is, the solid-state imaging element 11, the glass substrate 12, and the IRCF 14 are laminated and bonded together by the transparent adhesives 13 and 15 to form an integrated configuration, and are connected to the circuit board 17. Note that the solid-state imaging element 11, the glass substrate 12, and the IRCF 14 surrounded by a long dashed short dashed line in the drawing are bonded together by the adhesives 13 and 15 having substantially the same refractive index into an integrated configuration, and thus are also simply referred to as an integrated component 10 hereinafter.

Furthermore, the IRCF 14 may be singulated in a step of manufacturing the solid-state imaging element 11 and then attached onto the glass substrate 12, or a large IRCF 14 may be attached onto the entire wafer-like glass substrate 12 constituted by a plurality of the solid-state imaging elements 11 and then singulated in units of the solid-state imaging elements 11, and either of the techniques may be adopted.

The spacer 20 is disposed on the circuit board 17 so as to surround the entire structure in which the solid-state imaging element 11, the glass substrate 12, and the IRCF 14 are integrally formed. Furthermore, the actuator 18 is provided on the spacer 20. The actuator 18 has a cylindrical configuration, incorporates the lens group 16 formed by laminating a plurality of lenses inside the cylinder, and drives the lens group 16 in a vertical direction in FIG. 1.

With such a configuration, the actuator 18 moves the lens group 16 in the vertical direction in FIG. 1 (a front-rear direction with respect to an optical axis) to adjust a focus in accordance with a distance to a subject (not illustrated) on the upper side in the drawing so that the subject is formed as an image on an imaging surface of the solid-state imaging element 11, thereby implementing autofocus.

<Schematic external view>

Next, a configuration of the integrated component 10 will be described with reference to FIGS. 2, 3A, 3B, 4, 5 and 6. FIG. 2 is a schematic external view of the integrated component 10.

The integrated component 10 illustrated in FIG. 2 is a semiconductor package in which the solid-state imaging element 11 constituted by a laminate substrate formed by laminating a lower substrate 11a and an upper substrate 11b is packaged.

A plurality of solder balls 11e, which are back electrodes for electrical connection with the circuit board 17 in FIG. 1, is formed on the lower substrate 11a of the laminate substrate constituting the solid-state imaging element 11.

On an upper surface of the upper substrate 11b, a color filter 11c of red (R), green (G), or blue (B) and an on-chip lens 11d are formed. Furthermore, the upper substrate 11b is connected, in a cavity-less structure, to the glass substrate 12 for protecting the on-chip lens 11d via the adhesive 13 constituted by a glass seal resin.

Figure 3A:
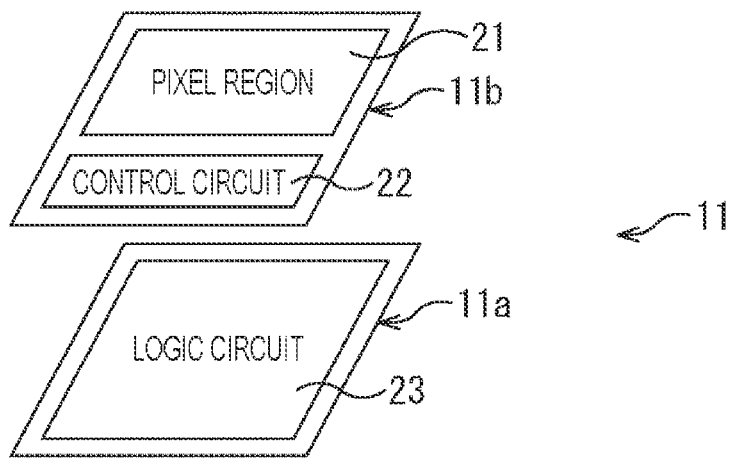
FIGS. 3A and 3B are diagrams illustrating a substrate configuration of the integrated component.

For example, as illustrated in FIG. 3A, a pixel region 21 in which pixel portions that perform photoelectric conversion are two-dimensionally arranged in an array and a control circuit 22 that controls the pixel portions are formed on the upper substrate 11b, and a logic circuit 23 such as a signal processing circuit that processes a pixel signal output from the pixel portions is formed on the lower substrate 11a.

Figure 3B:
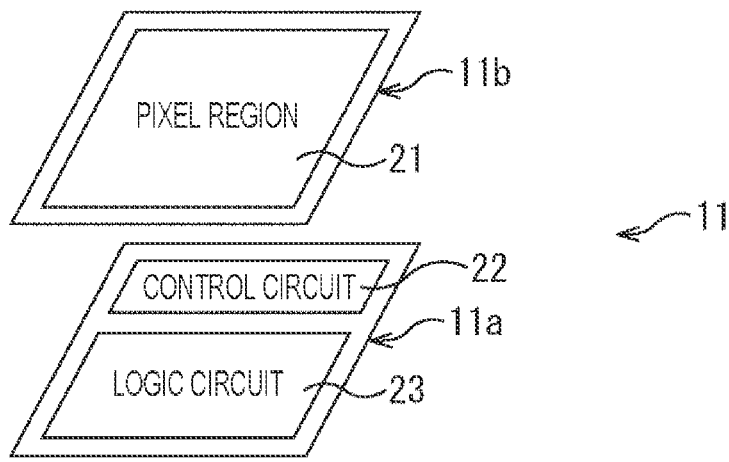

Alternatively, as illustrated in FIG. 3B, only the pixel region 21 may be formed on the upper substrate 11b, and the control circuit 22 and the logic circuit 23 may be formed on the lower substrate 11a.

As described above, by forming and laminating the logic circuit 23 or both the control circuit 22 and the logic circuit 23 on the lower substrate 11a separately from the upper substrate 11b of the pixel region 21, the imaging device 1 can be downsized as compared with a case where the pixel region 21, the control circuit 22, and the logic circuit 23 are arranged in a planar direction on one semiconductor substrate.

In the following description, the upper substrate 11b on which at least the pixel region 21 is formed will be referred to as a pixel sensor substrate 11b, and the lower substrate 11a on which at least the logic circuit 23 is formed will be referred to as a logic substrate 11a.

<Configuration Example of Laminate Substrate>

Figure 4:
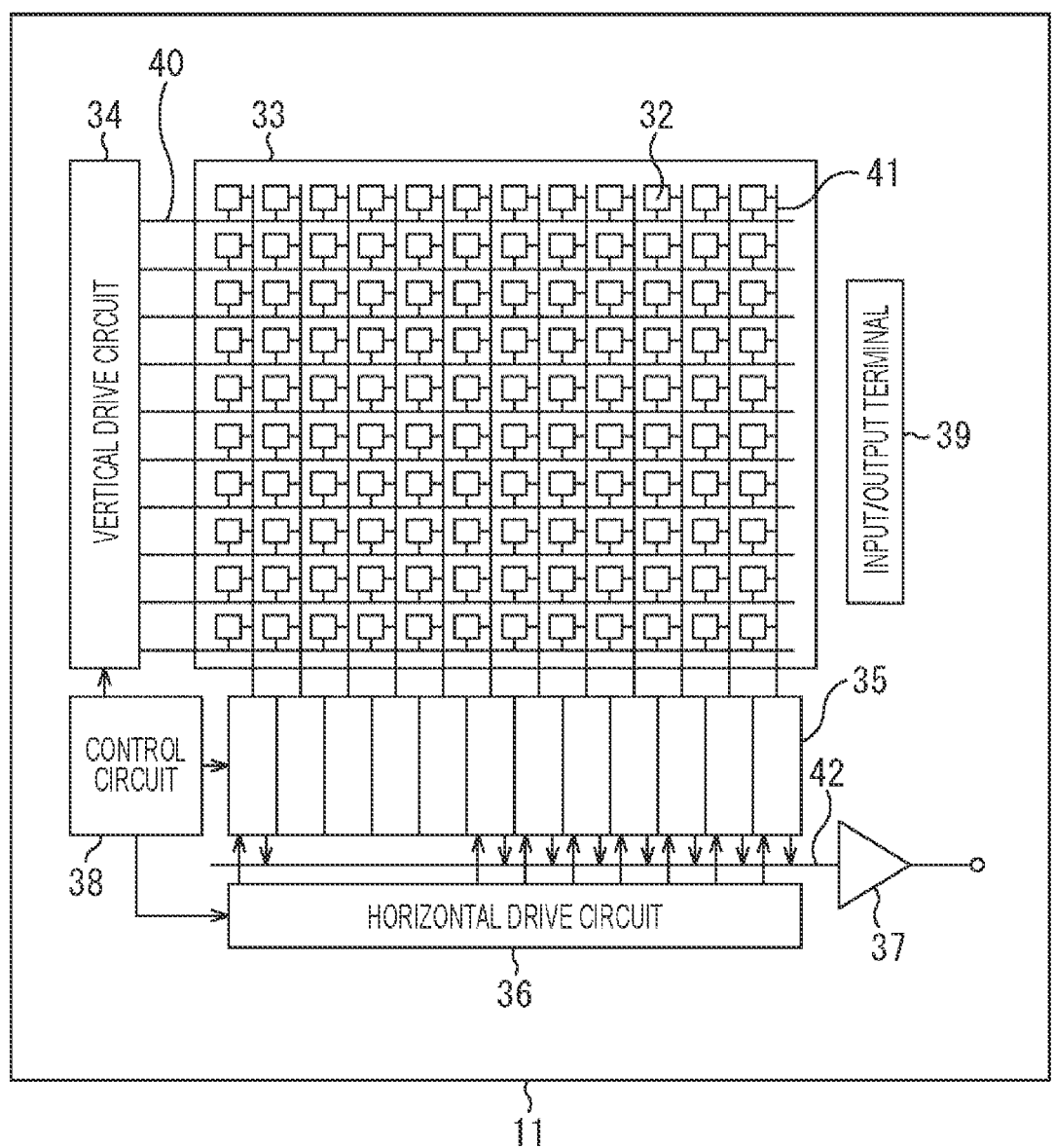
FIG. 4 is a diagram illustrating a circuit configuration example of a laminate substrate.

FIG. 4 illustrates a circuit configuration example of the solid-state imaging element 11.

The solid-state imaging element 11 includes a pixel array unit 33 in which pixels 32 are arranged in a two-dimensional array, a vertical drive circuit 34, column signal processing circuits 35, a horizontal drive circuit 36, an output circuit 37, a control circuit 38, and an input/output terminal 39.

The pixels 32 include a photodiode as a photoelectric conversion element and a plurality of pixel transistors. A circuit configuration example of the pixels 32 will be described later with reference to FIG. 5.

Furthermore, the pixels 32 may have a shared pixel structure. The pixel sharing structure is constituted by a plurality of photodiodes, a plurality of transfer transistors, one shared floating diffusion (floating diffusion region), and one shared pixel transistor of each of other types. That is, the shared pixels have a configuration in which the photodiodes and the transfer transistors that constitute a plurality of unit pixels share one pixel transistor of each of other types.

The control circuit 38 receives an input clock and data for giving an instruction on an operation mode or the like, and outputs data such as internal information of the solid-state imaging element 11. That is, on the basis of a vertical synchronization signal, a horizontal synchronization signal, and a master clock, the control circuit 38 generates a clock signal and a control signal that serve as the basis of operations of the vertical drive circuit 34, the column signal processing circuits 35, the horizontal drive circuit 36, and the like. Then, the control circuit 38 outputs the generated clock signal and control signal to the vertical drive circuit 34, the column signal processing circuits 35, the horizontal drive circuit 36, and the like.

The vertical drive circuit 34 is constituted by, for example, a shift register, selects a predetermined pixel drive wiring 40, supplies a pulse for driving the pixels 32 to the selected pixel drive wiring 40, and drives the pixels 32 on a row-by-row basis. That is, the vertical drive circuit 34 selectively scans each of the pixels 32 in the pixel array unit 33 on a row-by-row basis sequentially in a perpendicular direction, and supplies, through a vertical signal line 41 to the column signal processing circuits 35, a pixel signal based on a signal charge generated in accordance with the amount of light received by a photoelectric conversion unit of each of the pixels 32.

The column signal processing circuits 35 are arranged, one for each of columns of the pixels 32, and perform signal processing such as noise removal for each pixel column on signals output from the pixels 32 in one row. For example, the column signal processing circuits 5 perform signal processing such as correlated double sampling (CDS) for removing pixel-specific fixed pattern noise and analog-to-digital conversion.

The horizontal drive circuit 36 is constituted by, for example, a shift register, sequentially outputs horizontal scanning pulses to sequentially select each of the column signal processing circuits 35, and causes each of the column signal processing circuits 35 to output a pixel signal to a horizontal signal line 42.

The output circuit 37 performs signal processing on signals sequentially supplied from each of the column signal processing circuits 35 through the horizontal signal line 42, and outputs the processed signals. In the output circuit 37, for example, only buffering may be performed, or black level adjustment, column variation correction, various types of digital signal processing, and the like may be performed. The input/output terminal 39 is used to exchange signals with the outside.

The solid-state imaging element 11 configured as described above is a CMOS image sensor called a column AD system in which the column signal processing circuits 35 that perform CDS processing and analog-to-digital conversion processing are arranged, one for each pixel column.

<Circuit Configuration Example of Pixel>

Figure 5:
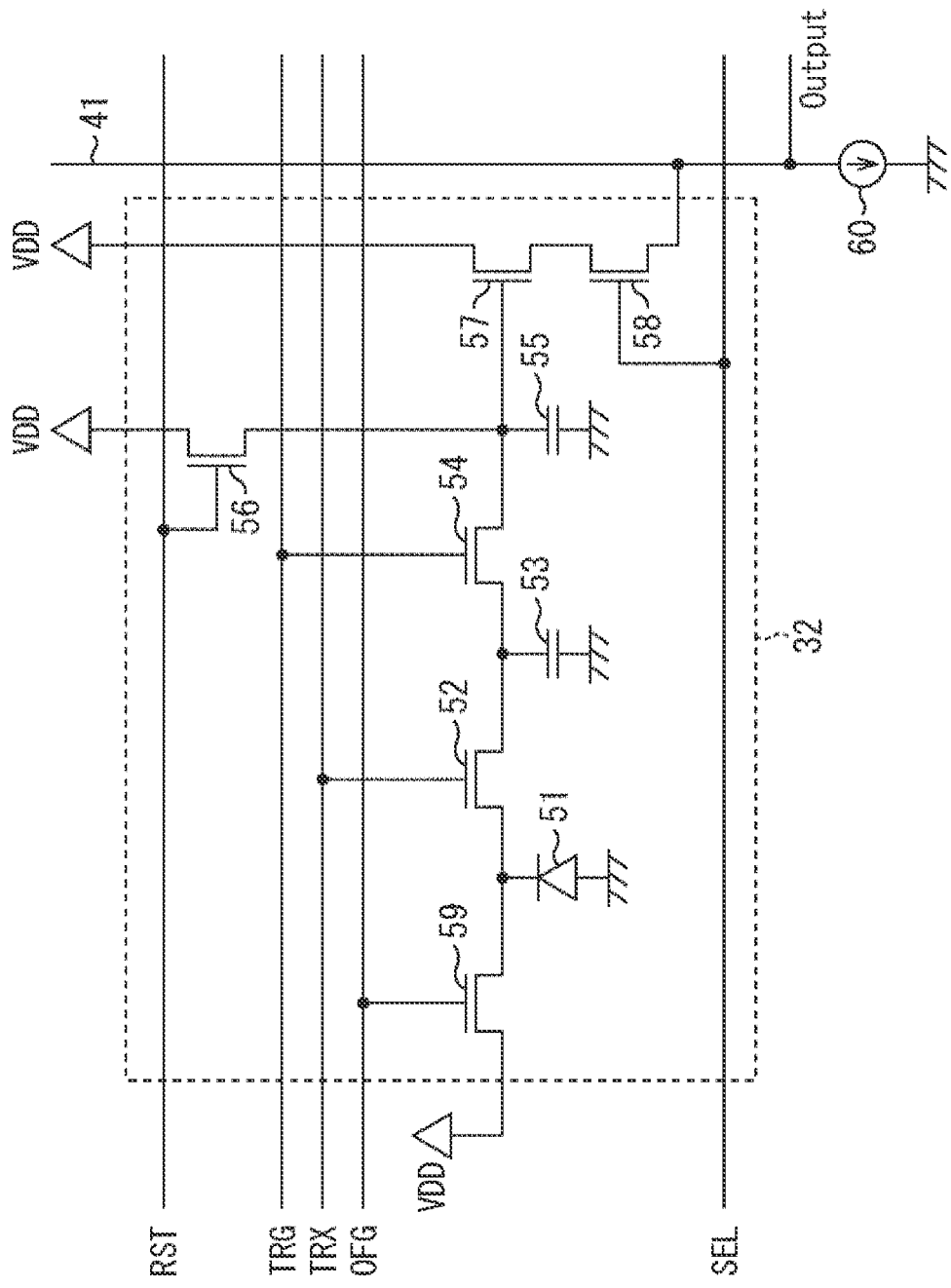
FIG. 5 is a diagram illustrating an equivalent circuit of a pixel.

FIG. 5 illustrates an equivalent circuit of the pixel 32.

The pixel 32 illustrated in FIG. 5 shows a configuration for implementing an electronic global shutter function.

The pixel 32 includes a photodiode 51 as a photoelectric conversion element, a first transfer transistor 52, a memory unit (MEM) 53, a second transfer transistor 54, a floating diffusion region (FD) 55, a reset transistor 56, an amplification transistor 57, a selection transistor 58, and a discharge transistor 59.

The photodiode 51 is a photoelectric conversion unit that generates and accumulates a charge (signal charge) in accordance with the amount of received light. An anode terminal of the photodiode 51 is grounded, and a cathode terminal is connected to the memory unit 53 via the first transfer transistor 52. Furthermore, the cathode terminal of the photodiode 51 is also connected to the discharge transistor 59 for discharging unnecessary charges.

When turned on by a transfer signal TRX, the first transfer transistor 52 reads the charge generated by the photodiode 51, and transfers the charge to the memory unit 53. The memory unit 53 is a charge holding unit that temporarily holds a charge until the charge is transferred to the FD 55.

When turned on by a transfer signal TRG, the second transfer transistor 54 reads the charge held in the memory unit 53, and transfers the charge to the FD 55.

The FD 55 is a charge holding unit that holds the charge read from the memory unit 53 to allow the charge to be read as a signal. When the reset transistor 56 is turned on by a reset signal RST, the charge accumulated in the FD 55 is discharged to a constant voltage source VDD, and the reset transistor 56 resets a potential of the FD 55.

The amplification transistor 57 outputs a pixel signal in accordance with the potential of the FD 55. That is, the amplification transistor 57 constitutes, together with a load MOS 60 as a constant current source, a source follower circuit, and a pixel signal indicating a level corresponding to the charge accumulated in the FD 55 is output from the amplification transistor 57 to the column signal processing circuit 35 (FIG. 4) via the selection transistor 58. The load MOS 60 is arranged, for example, in the column signal processing circuit 35.

The selection transistor 58 is turned on when the pixel 32 is selected by a selection signal SEL, and outputs the pixel signal of the pixel 32 to the column signal processing circuit 35 via the vertical signal line 41.

When turned on by a discharge signal OFG, the discharge transistor 59 discharges an unnecessary charge accumulated in the photodiode 51 to the constant voltage source VDD.

The transfer signals TRX and TRG, the reset signal RST, the discharge signal OFG, and the selection signal SEL are supplied from the vertical drive circuit 34 via the pixel drive wiring 40.

An operation of the pixel 32 will be briefly described.

First, before exposure is started, a high-level discharge signal OFG is supplied to the discharge transistor 59 and causes the discharge transistor 59 to be turned on. Then, the charge accumulated in the photodiode 51 is discharged to the constant voltage source VDD, and the photodiodes 51 of all the pixels are reset.

After the photodiodes 51 have been reset, the discharge transistor 59 is turned off by a low-level discharge signal OFG, and exposure is started in all the pixels of the pixel array unit 33.

When a predetermined exposure time that has been set in advance has elapsed, the first transfer transistor 52 is turned on by a transfer signal TRX in all the pixels of the pixel array unit 33, and the charge accumulated in the photodiode 51 is transferred to the memory unit 53.

After the first transfer transistor 52 has been turned off, the charges held in the memory unit 53 of each pixel 32 are sequentially read out to the column signal processing circuits 35 on a row-by-row basis. In the read operation, the second transfer transistor 54 of each pixel 32 in the row to be read is turned on by the transfer signal TRG, and the charge held in the memory unit 53 is transferred to the FD 55. Then, when the selection transistor 58 is turned on by the selection signal SEL, a signal indicating the level corresponding to the charge accumulated in the FD 55 is output from the amplification transistor 57 to the column signal processing circuit 35 via the selection transistor 58.

As described above, in the pixel 32 having the pixel circuit in FIG. 5, the exposure time is set to be the same in all the pixels of the pixel array unit 33, and after the exposure has ended, the charge is temporarily held in the memory unit 53, so that a global shutter operation (imaging) can be performed in which the charges are sequentially read from the memory unit 53 on a row-by-row basis.

Note that the circuit configuration of the pixel 32 is not limited to the configuration illustrated in FIG. 5. For example, a circuit configuration can be adopted in which the memory unit 53 is not included and an operation is performed by a so-called rolling shutter method.

<Basic Structure Example of Solid-State Imaging Device>

Figure 6:
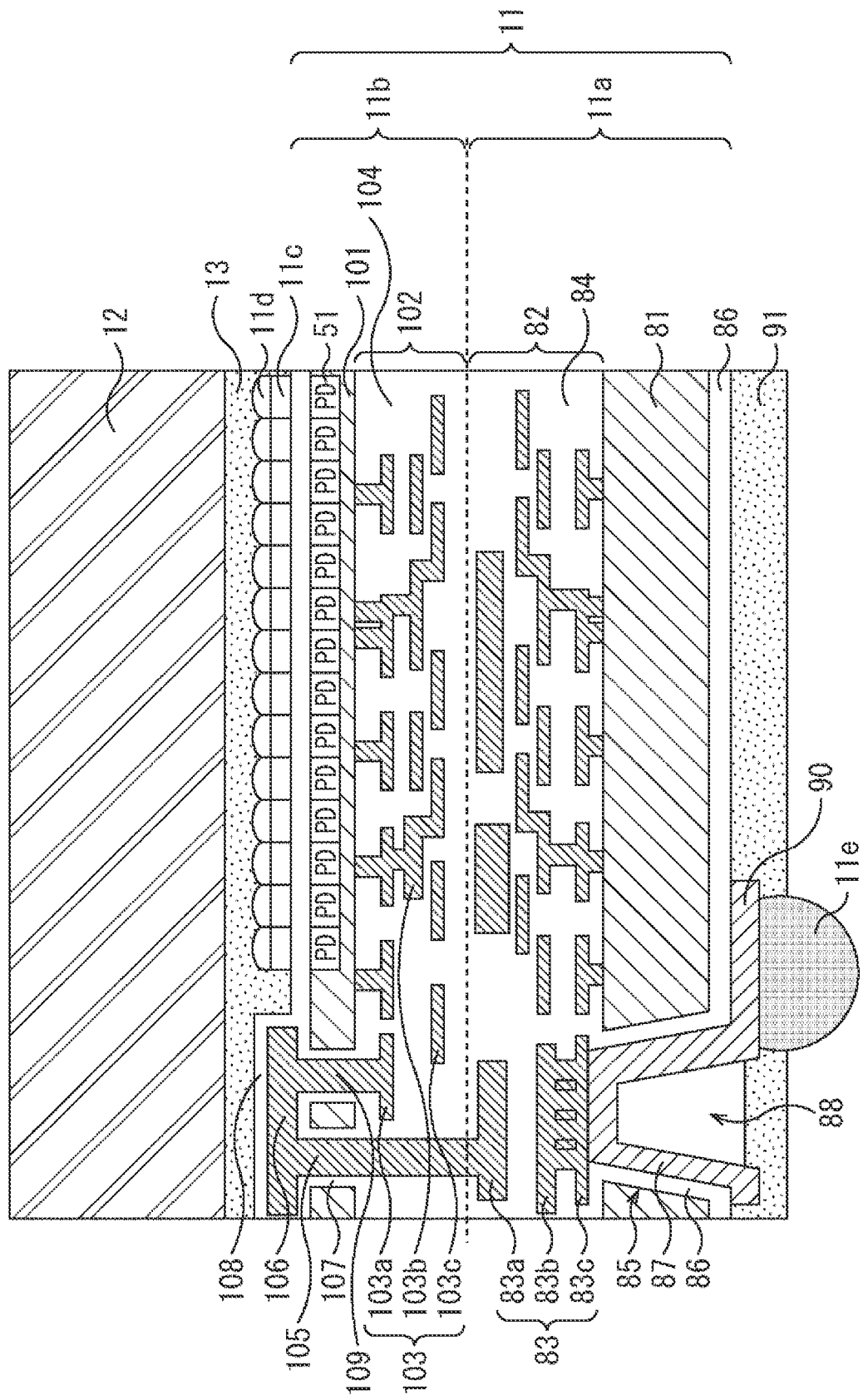
FIG. 6 is a diagram illustrating a detailed structure of the laminate substrate.

Next, a detailed structure of the solid-state imaging element 11 will be described with reference to FIG. 6. FIG. 6 is an enlarged sectional view of a part of the solid-state imaging element 11.

In the logic substrate 11a, a multilayer wiring layer 82 is formed on the upper side (pixel sensor substrate 11b side) of a semiconductor substrate 81 (hereinafter referred to as the silicon substrate 81) constituted by, for example, silicon (Si). The multilayer wiring layer 82 constitutes the control circuit 22 and the logic circuit 23 in FIG. 3.

The multilayer wiring layer 82 is constituted by a plurality of wiring layers 83 including an uppermost wiring layer 83a closest to the pixel sensor substrate 11b, an intermediate wiring layer 83b, a lowermost wiring layer 83c closest to the silicon substrate 81, and the like, and an interlayer dielectric 84 formed between the wiring layers 83.

The plurality of wiring layers 83 is formed with the use of, for example, copper (Cu), aluminum (Al), or tungsten (W), and the interlayer dielectric 84 is formed with the use of, for example, a silicon dioxide film or a silicon nitride film. In each one of the plurality of wiring layers 83 and the interlayer dielectric 84, all the layers may be formed with the use of the same material, or two or more different materials may be used depending on the layer.

A silicon through hole 85 penetrating the silicon substrate 81 is formed at a predetermined position in the silicon substrate 81, and a connection conductor 87 is embedded in an inner wall of the silicon through hole 85 via an insulating film 86, and thus a through silicon via (TSV) 88 is formed. The insulating film 86 can be formed with the use of, for example, a SiO2 film, a SiN film, or the like.

Note that, in the through silicon via 88 illustrated in FIG. 6, the insulating film 86 and the connection conductor 87 are formed along an inner wall surface, and the inside of the silicon through hole 85 is a cavity, but the entire inside of the silicon through hole 85 may be embedded with the connection conductor 87 depending on an inner diameter. In other words, the inside of the through hole may be embedded with a conductor, or a part of the through hole may be a cavity. The same applies to a through chip via (TCV) 105 and the like described later.

The connection conductor 87 of the through silicon via 88 is connected to a rewiring 90 formed on the lower surface side of the silicon substrate 81, and the rewiring 90 is connected to the solder ball 11e. The connection conductor 87 and the rewiring 90 can be formed with the use of, for example, copper (Cu), tungsten (W), tungsten (W), or polysilicon.

Furthermore, on the lower surface side of the silicon substrate 81, a solder mask (solder resist) 91 is formed so as to cover the rewiring 90 and the insulating film 86, except for the region where the solder ball 11e is formed.

On the other hand, in the pixel sensor substrate 11b, a multilayer wiring layer 102 is formed on the lower side (logic substrate 11a side) of a semiconductor substrate 101 (hereinafter referred to as the silicon substrate 101) constituted by silicon (Si). The multilayer wiring layer 102 constitutes a pixel circuit of the pixel region 21 in FIG. 3.

The multilayer wiring layer 102 is constituted by a plurality of wiring layers 103 including an uppermost wiring layer 103a closest to the silicon substrate 101, an intermediate wiring layer 103b, a lowermost wiring layer 103c closest to the logic substrate 11a, and the like, and an interlayer dielectric 104 formed between the wiring layers 103.

As a material used as the plurality of wiring layers 103 and the interlayer dielectric 104, the same type of material as the material of the wiring layers 83 and the interlayer dielectric 84 described above can be adopted. Furthermore, the plurality of wiring layers 103 and the interlayer dielectric 104 may be formed with the use of one material or two or more different materials in a similar manner to the wiring layers 83 and the interlayer dielectric 84 described above.

Note that, in the example in FIG. 6, the multilayer wiring layer 102 of the pixel sensor substrate 11b is constituted by the three wiring layers 103, and the multilayer wiring layer 82 of the logic substrate 11a is constituted by the four wiring layers 83. However, the total number of wiring layers is not limited to this, and the number of layers formed is optional.

In the silicon substrate 101, the photodiode 51 formed by a PN junction is formed, one for each of the pixels 32.

Furthermore, although not illustrated, a plurality of pixel transistors such as the first transfer transistor 52 and the second transfer transistor 54, the memory unit (MEM) 53, and the like are also formed on the multilayer wiring layer 102 and the silicon substrate 101.

At a predetermined position in the silicon substrate 101 where the color filter 11c and the on-chip lens 11d are not formed, a through silicon via 109 connected to the wiring layer 103a of the pixel sensor substrate lib and the through chip via 105 connected to the wiring layer 83a of the logic substrate 11a are formed.

The through chip via 105 and the through silicon via 109 are connected by a connection wiring 106 formed on an upper surface of the silicon substrate 101. Furthermore, an insulating film 107 is formed between each of the through silicon via 109 and the through chip via 105 and the silicon substrate 101. Moreover, on the upper surface of the silicon substrate 101, the color filter 11c and the on-chip lens 11d are formed via a planarization film (insulating film) 108.

As described above, the solid-state imaging element 11 illustrated in FIG. 2 has a laminated structure in which the multilayer wiring layer 102 side of the logic substrate 11a and the multilayer wiring layer 82 side of the pixel sensor substrate 11b are bonded together. In FIG. 6, a bonding surface between the multilayer wiring layer 102 side of the logic substrate 11a and the multilayer wiring layer 82 side of the pixel sensor substrate 11b is indicated by a broken line.

Furthermore, in the solid-state imaging element 11 of the imaging device 1, the wiring layers 103 of the pixel sensor substrate 11b and the wiring layers 83 of the logic substrate 11a are connected by two vias, the through silicon via 109 and the through chip via 105, and the wiring layers 83 of the logic substrate 11a and the solder ball (back electrode) 11e are connected by the through silicon via 88 and the rewiring 90. With this arrangement, the plane area of the imaging device 1 can be minimized.

Moreover, by bonding with the adhesive 13 in a cavity-less structure between the solid-state imaging element 11 and the glass substrate 12, it is also possible to achieve a reduction in the height direction.

Thus, according to the imaging device 1 illustrated in FIG. 1, it is possible to achieve a further downsized semiconductor device (semiconductor package).

With the configuration of the imaging device 1 as described above, the IRCF 14 is provided on the solid-state imaging element 11 and the glass substrate 12, so that it is possible to prevent occurrence of flare and ghosts due to internal diffuse reflection of light.

Figure 7:
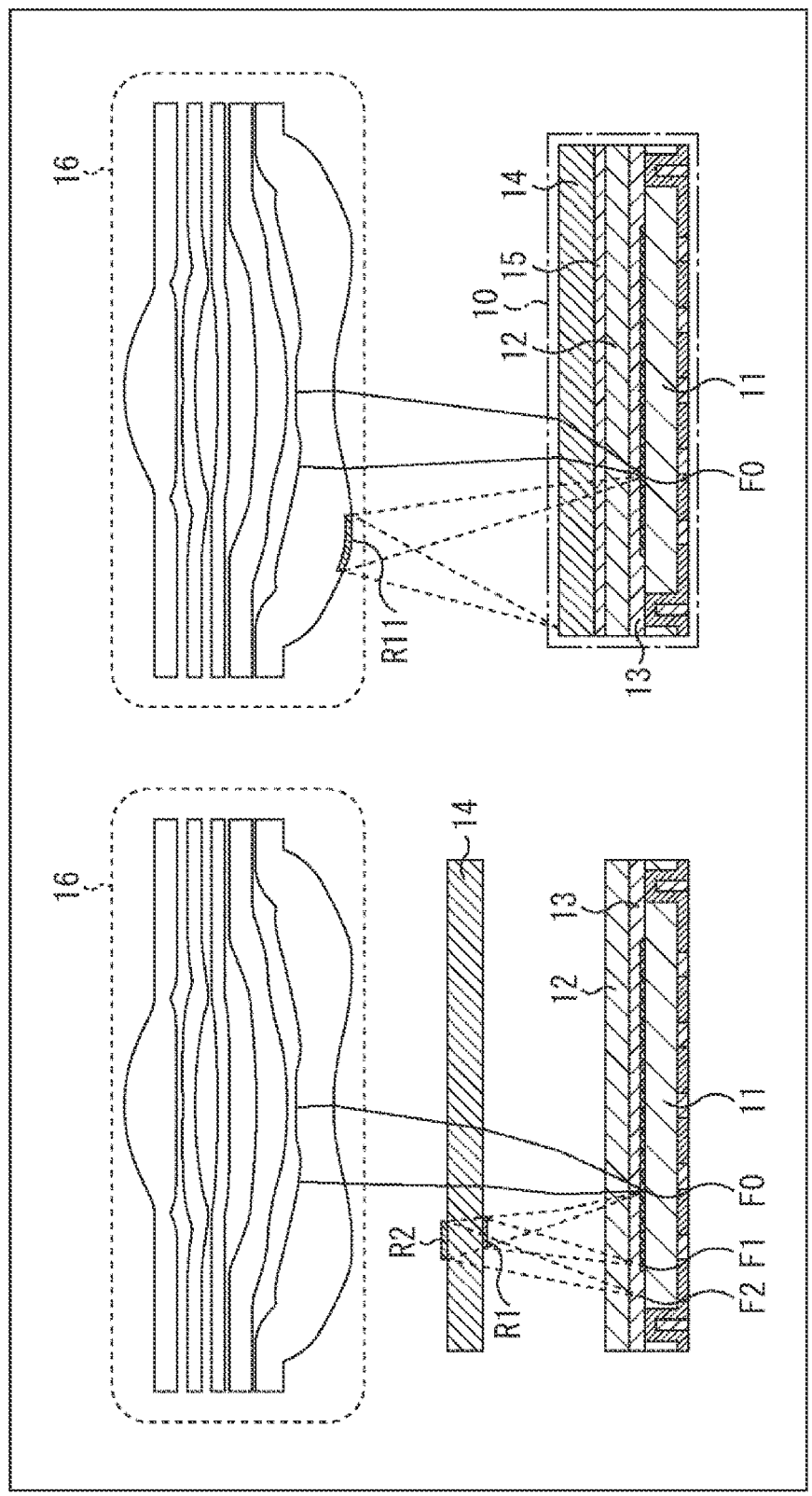
FIG. 7 is a diagram illustrating that ghosts and flare attributable to internal diffuse reflection do not occur in the imaging device in FIG. 1.

That is, as illustrated in a left part of FIG. 7, in a case where the IRCF 14 is separated from the glass substrate (glass) 12 and is disposed in the vicinity of the midpoint between the lens 16 and the glass substrate 12, incident light is condensed as indicated by a solid line, is incident on the solid-state imaging element (CIS) 11 at a position F0 via the IRCF 14, the glass substrate 12, and the adhesive 13, and then is reflected at the position F0 as indicated by a dotted line, and thus reflected light is generated.

As indicated by the dotted line, a part of the reflected light reflected at the position F0 is reflected by a back surface (surface on the lower side in FIG. 7) R1 of the IRCF 14 arranged at a position separated from the glass substrate 12 via the adhesive 13 and the glass substrate 12, for example, and is incident again on the solid-state imaging element 11 at a position F1 via the glass substrate 12 and the adhesive 13.

Furthermore, as indicated by the dotted line, another part of the reflected light reflected at the focal point F0 passes through, for example, the adhesive 13, the glass substrate 12, and the IRCF 14 arranged at a position separated from the glass substrate 12, is reflected by an upper surface (surface on the upper side in FIG. 7) R2 of the IRCF 14, and is incident again on the solid-state imaging element 11 at a position F2 via the IRCF 14, the glass substrate 12, and the adhesive 13.

At the positions F1 and F2, the light incident again generates flare and ghosts attributable to internal diffuse reflection. More specifically, as illustrated in an image P1 in FIG. 8, when the solid-state imaging element 11 images a lighting L, the lighting L appears as flare or a ghost as indicated by reflected lights R21 and R22.

On the other hand, in a case where the IRCF 14 is disposed on the glass substrate 12 as in the imaging device 1 as illustrated in a right part of FIG. 7 corresponding to the configuration of the imaging device 1 in FIG. 1, incident light indicated by a solid line is condensed, incident on the solid-state imaging element 11 at the position F0 via the IRCF 14, the adhesive 15, the glass substrate 12, and the adhesive 13, and then reflected as indicated by a dotted line. Then, the reflected light is reflected by a surface R11 of a lowermost lens of the lens group 16 via the adhesive 13, the glass substrate 12, the adhesive 15, and the IRCF 14. Since the lens group 16 is at a position sufficiently separated from the IRCF 14, the reflected light is reflected to a range where the solid-state imaging element 11 cannot sufficiently receive the light.

Here, the solid-state imaging element 11, the glass substrate 12, and the IRCF 14 surrounded by a long dashed short dashed line in the drawing are bonded together and integrated by the adhesives 13 and 15 having substantially the same refractive index to be configured as the integrated component 10. In the integrated component 10, since the refractive index is standardized, occurrence of internal diffuse reflection that occurs at a boundary between layers having different refractive indexes is prevented, and, for example, re-incidence at the positions F1 and F2 in the vicinity of the position F0 in the left part of FIG. 7 is prevented.

Figure 8:
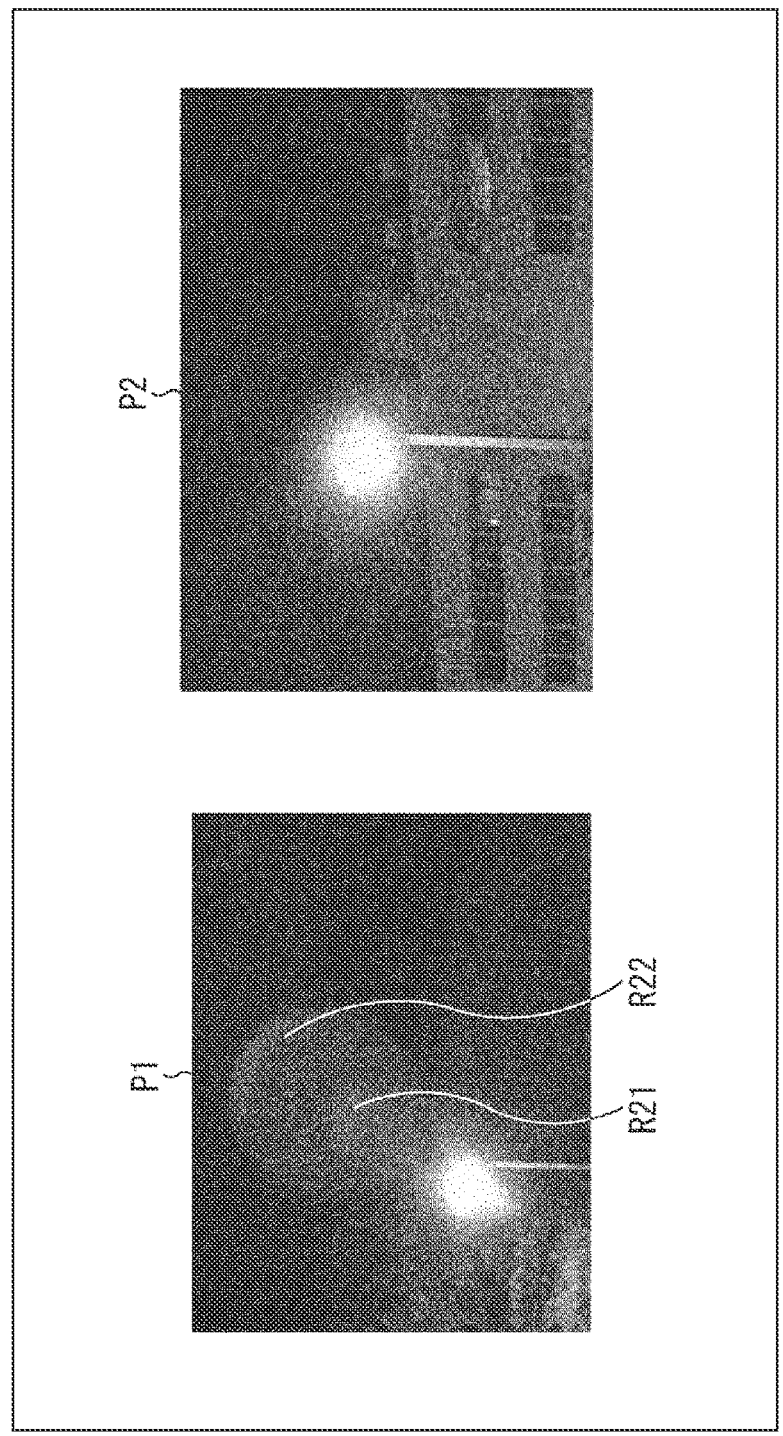
FIG. 8 is a diagram illustrating that ghosts and flare attributable to internal diffuse reflection do not occur in an image captured by the imaging device in FIG. 1.

With this arrangement, in a case where the imaging device 1 in FIG. 1 captures an image of the lighting L, as illustrated in an image P2 in FIG. 8, the imaging device 1 can capture an image in which occurrence of flare and ghosts attributable to internal diffuse reflection such as the reflected lights R21 and R22 in the image P1 is prevented.

As a result, with a configuration like that of the imaging device 1 of the first embodiment illustrated in FIG. 1, it is possible to achieve downsizing and reduction in height of the device configuration, and to prevent occurrence of flare and ghosts attributable to internal diffuse reflection.

Note that the image P1 in FIG. 8 is an image in which the lighting L is imaged at night by the imaging device 1 having the configuration in the left part of FIG. 7, and the image P2 is an image in which the lighting L is imaged at night by the imaging device 1 (in FIG. 1) having the configuration in the right part of FIG. 7.

Furthermore, in the above description, the configuration has been described as an example in which the lens group 16 is moved in the vertical direction in FIG. 1 by the actuator 18 so that a focal length is adjusted in accordance with a distance to a subject and autofocus is implemented. However, the actuator 18 may not be provided, and the lens group 16 may not be used for adjustment of the focal length, but function as a so-called single focus lens.

2. Second Embodiment

In the first embodiment, the example in which the IRCF 14 is attached onto the glass substrate 12 attached to the imaging surface side of the solid-state imaging element 11 has been described, but the lowermost lens constituting the lens group 16 may be further provided on the IRCF 14.

Figure 9:
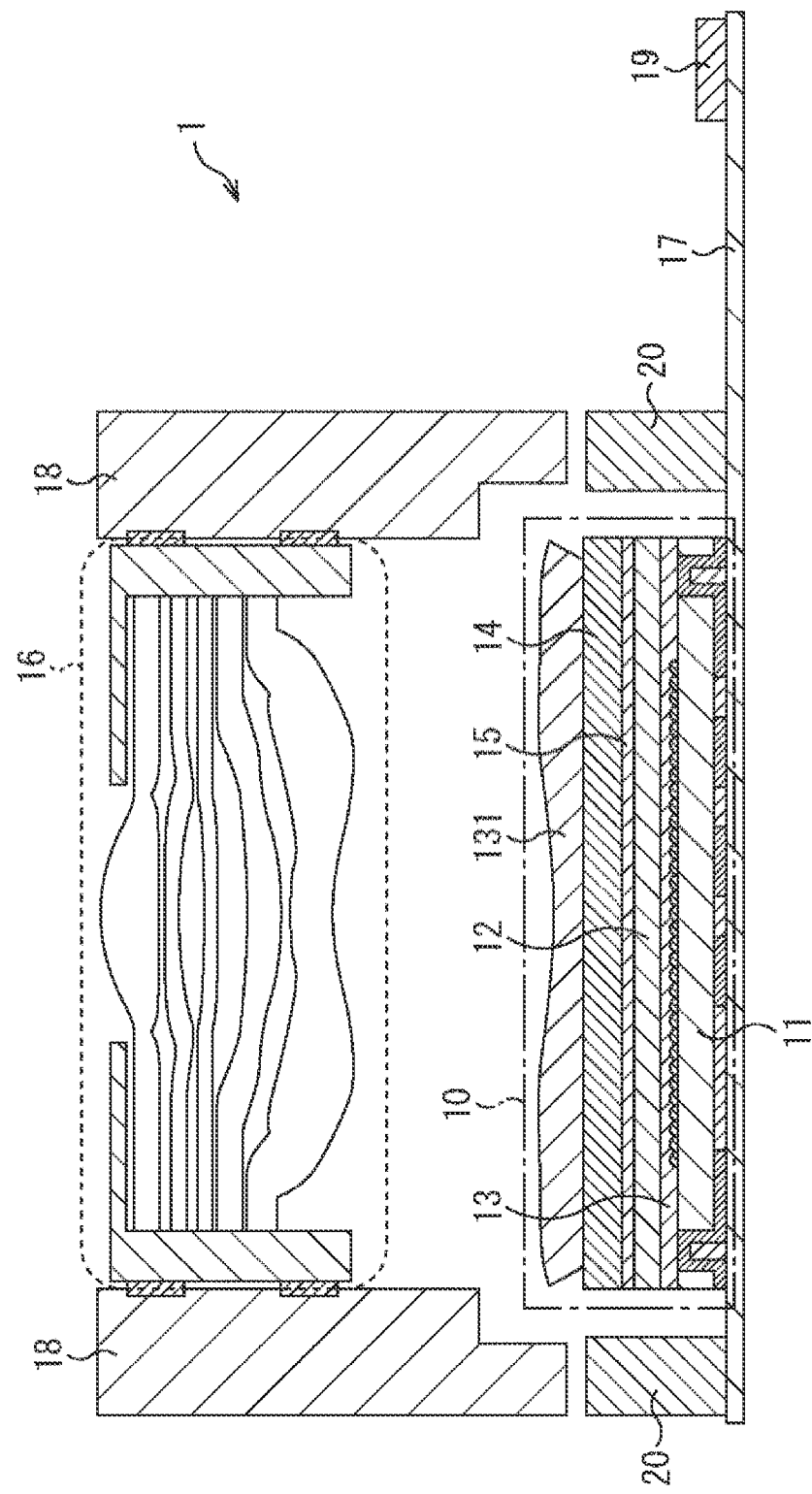
FIG. 9 is a diagram illustrating a configuration example of a second embodiment of an imaging device of the present disclosure.

FIG. 9 illustrates a configuration example of an imaging device 1 in which a lens constituting a lowermost layer with respect to an incident direction of light among a lens group 16 including a plurality of lenses constituting the imaging device 1 in FIG. 1 is separated from the lens group 16 and disposed on an IRCF 14. Note that, in FIG. 5, configurations having basically the same functions as those in FIG. 1 are denoted by the same reference numerals, and description thereof will be omitted as appropriate.

That is, the imaging device 1 in FIG. 9 is different from the imaging device 1 in FIG. 1 in that a lens 131 serving as the lowermost layer with respect to the incident direction of light among a plurality of lenses constituting the lens group 16 is further provided separately from the lens group 16 on an upper surface of the IRCF 14 in the drawing. Note that the lens group 16 in FIG. 9 is denoted by the same reference numeral as the lens group 16 in FIG. 1, but is different from the lens group 16 in FIG. 1 in a strict sense that the lens 131 serving as the lowermost layer with respect to the incident direction of light is not included.

With a configuration of the imaging device 1 as illustrated in FIG. 9, the IRCF 14 is provided on a glass substrate 12 provided on a solid-state imaging element 11. Moreover, the lowermost lens 131 constituting the lens group 16 is provided on the IRCF 14. It is therefore possible to prevent occurrence of flare and ghosts due to internal diffuse reflection of light.

Figure 10:
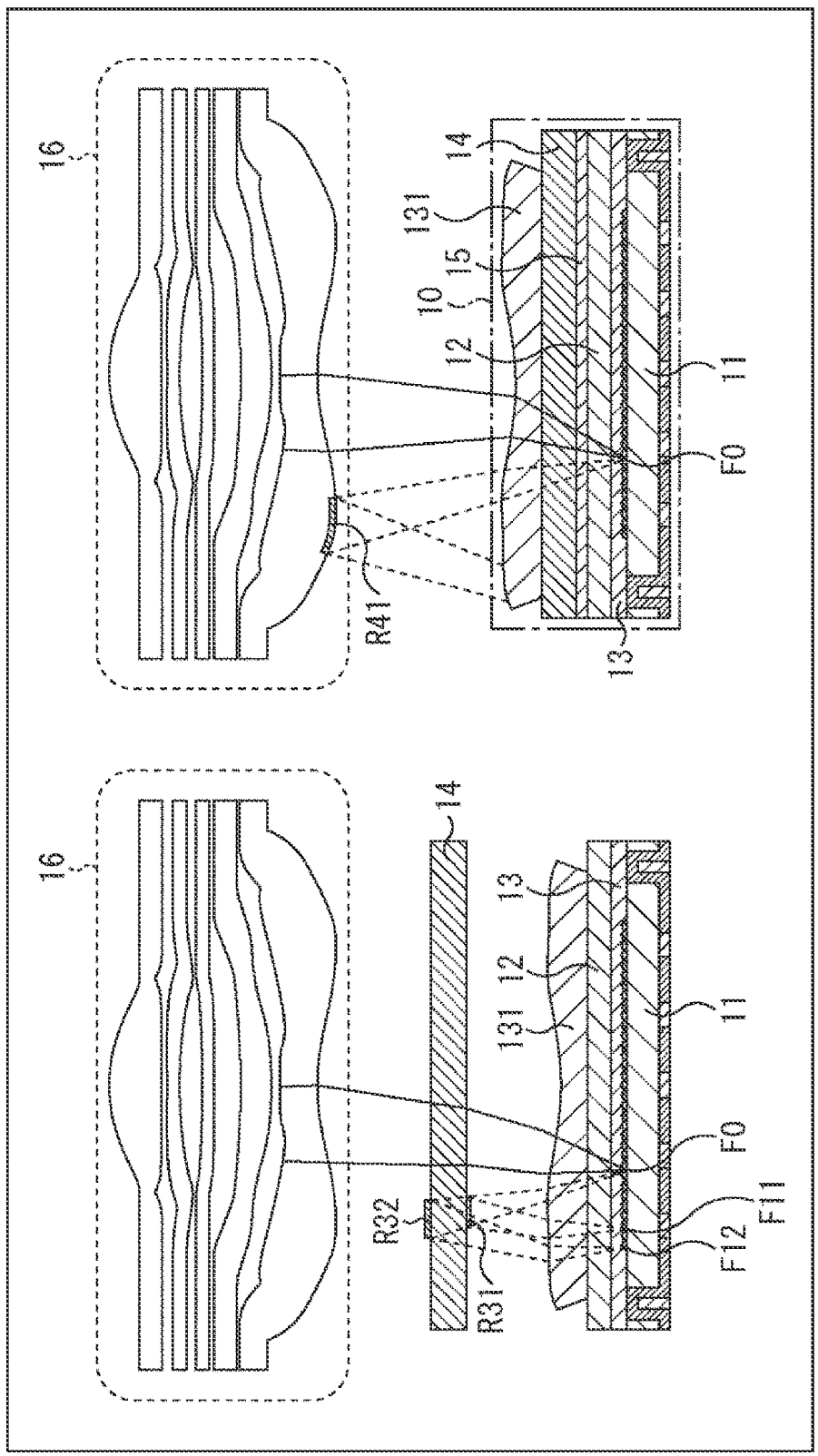
FIG. 10 is a diagram illustrating that ghosts and flare attributable to internal diffuse reflection do not occur in the imaging device in FIG. 9.

That is, as illustrated in a left part of FIG. 10, in a case where the lens 131 serving as the lowermost layer with respect to the incident direction of light among the lens group 16 is provided on the glass substrate 12, and the IRCF 14 is separated from the lens 131 and is disposed in the vicinity of the midpoint between the lens group 16 and the lens 131, incident light indicated by a solid line is condensed, incident on the solid-state imaging element 11 at a position F0 via the IRCF 14, the lens 131, the glass substrate 12, and an adhesive 13, and then reflected from the position F0 as indicated by a dotted line, and thus reflected light is generated.

As indicated by the dotted line, a part of the reflected light reflected at the position F0 is reflected by a back surface (surface on the lower side in FIG. 2) R31 of the IRCF 14 arranged at a position separated from the lens 131 via, for example, the adhesive 13, the glass substrate 12, and the lens 131, and is incident again on the solid-state imaging element 11 at a position F11 via the lens 131, the glass substrate 12, and the adhesive 13.

Furthermore, as indicated by the dotted line, another part of the reflected light reflected at the focal point F0 passes through, for example, the adhesive 13, the glass substrate 12, the lens 131, and the IRCF 14 arranged at a position separated from the lens 131, is reflected by an upper surface (surface on the upper side in FIG. 7) R32 of the IRCF 14, and is incident again on the solid-state imaging element 11 at a position F12 via the IRCF 14, the lens 131, the glass substrate 12, and the adhesive 13.

At the positions F11 and F12, the light that is incident again appears as flare or a ghost in the solid-state imaging element 11. This point is basically similar to the principle that occurs in a case where the reflected lights R21 and R21 of the lighting L in the image P1 described with reference to FIG. 8 are incident again at the positions F1 and F2 in FIG. 7.

On the other hand, in a similar manner to the configuration of the imaging device 1 in FIG. 9, in a case where the lowermost lens 131 of the lens group 16 is disposed on the IRCF 14 as illustrated in a right part of FIG. 10, incident light is condensed as indicated by a solid line, is incident on the solid-state imaging element 11 at the position F0 via the lens 131, the IRCF 14, an adhesive 15, the glass substrate 12, and the adhesive 13, and then is reflected, and reflected light is generated by a surface R41 on the lens group 16 at a sufficiently distant position via the adhesive 13, the glass substrate 12, the adhesive 15, the IRCF 14, and the lens 131 as indicated by a dotted line. However, the reflected light is reflected in a range where the light cannot be substantially received by the solid-state imaging element 11, so that occurrence of flare and ghosts can be prevented.

That is, the solid-state imaging element 11, the adhesive 13, the glass substrate 12, and the IRCF 14 are bonded together by the adhesives 13 and 15 having substantially the same refractive index into an integrated configuration. Thus, in an integrated component 10 surrounded by a long dashed short dashed line in the drawing, which is the integrated configuration, the refractive index is standardized. This prevents occurrence of internal diffuse reflection that occurs at a boundary between layers having different refractive indexes, and prevents, for example, incidence of reflected light or the like at the positions F11 and F12 in the vicinity of the position F0 as illustrated in the left part of FIG. 10.

As a result, with a configuration like that of the imaging device 1 of a second embodiment illustrated in FIG. 10, it is possible to achieve downsizing and reduction in height of the device configuration, and to prevent occurrence of flare and ghosts attributable to internal diffuse reflection.

3. Third Embodiment

In the second embodiment, the example in which the lowermost lens 131 is provided on the IRCF 14 has been described. However, the lowermost lens 131 and the IRCF 14 may be bonded together with an adhesive.

Figure 11:
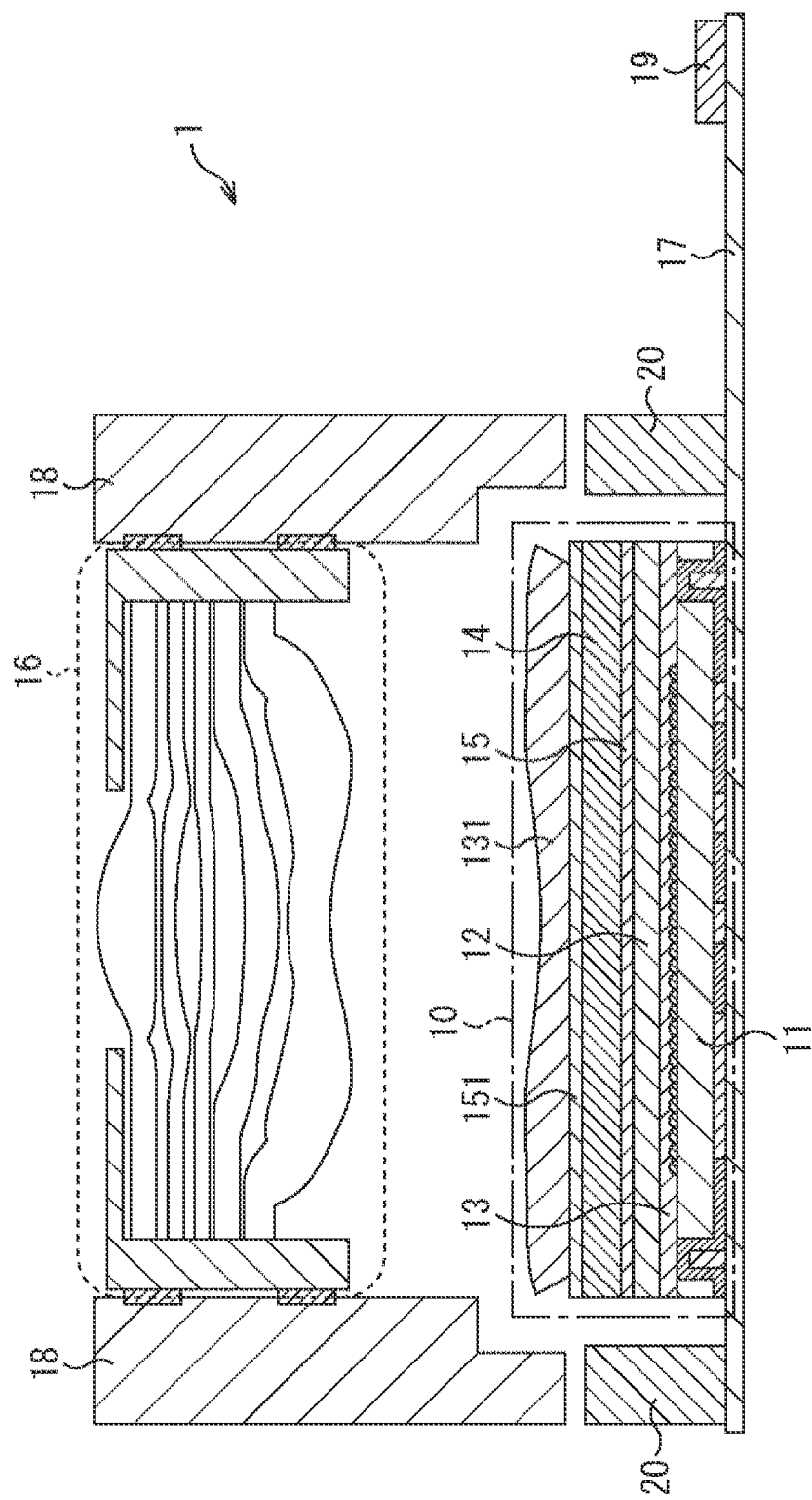
FIG. 11 is a diagram illustrating a configuration example of a third embodiment of an imaging device of the present disclosure.

FIG. 11 illustrates a configuration example of an imaging device 1 in which a lowermost lens 131 and an IRCF 14 are bonded together with an adhesive. Note that, in the imaging device 1 in FIG. 11, configurations having the same functions as those of the imaging device 1 in FIG. 9 are denoted by the same reference numerals, and description thereof will be omitted as appropriate.

That is, the imaging device 1 in FIG. 11 is different from the imaging device 1 in FIG. 9 in that the lowermost lens 131 and the IRCF 14 are bonded together by a transparent adhesive 151, that is, an adhesive having substantially the same refractive index.

A configuration like that of the imaging device 1 in FIG. 11 allows for prevention of occurrence of flare and ghosts in a similar manner to the imaging device 1 in FIG. 9.

Furthermore, in a case where flatness of the lens 131 is not high, there is a possibility that the IRCF 14 is shifted with respect to the optical axis of the lens 131 in a case where the lens 131 is fixed to the IRCF 14 without the use of the adhesive 151. However, by bonding the lens 131 and the IRCF 14 together with the adhesive 151, it is possible to fix the IRCF 14 so that the IRCF 14 does not shift with respect to the optical axis of the lens 131 even in a case where the flatness of the lens 131 is not high, and it is possible to prevent occurrence of distortion of an image caused by a shift with respect to the optical axis.

4. Fourth Embodiment

In the second embodiment, the example in which the lowermost lens 131 with respect to the incident direction of light is provided on the IRCF 14 has been described. However, not only the lowermost lens 131 but also a plurality of lens groups constituting the lowermost layer of the lens group 16 may be provided on the IRCF 14.

Figure 12:
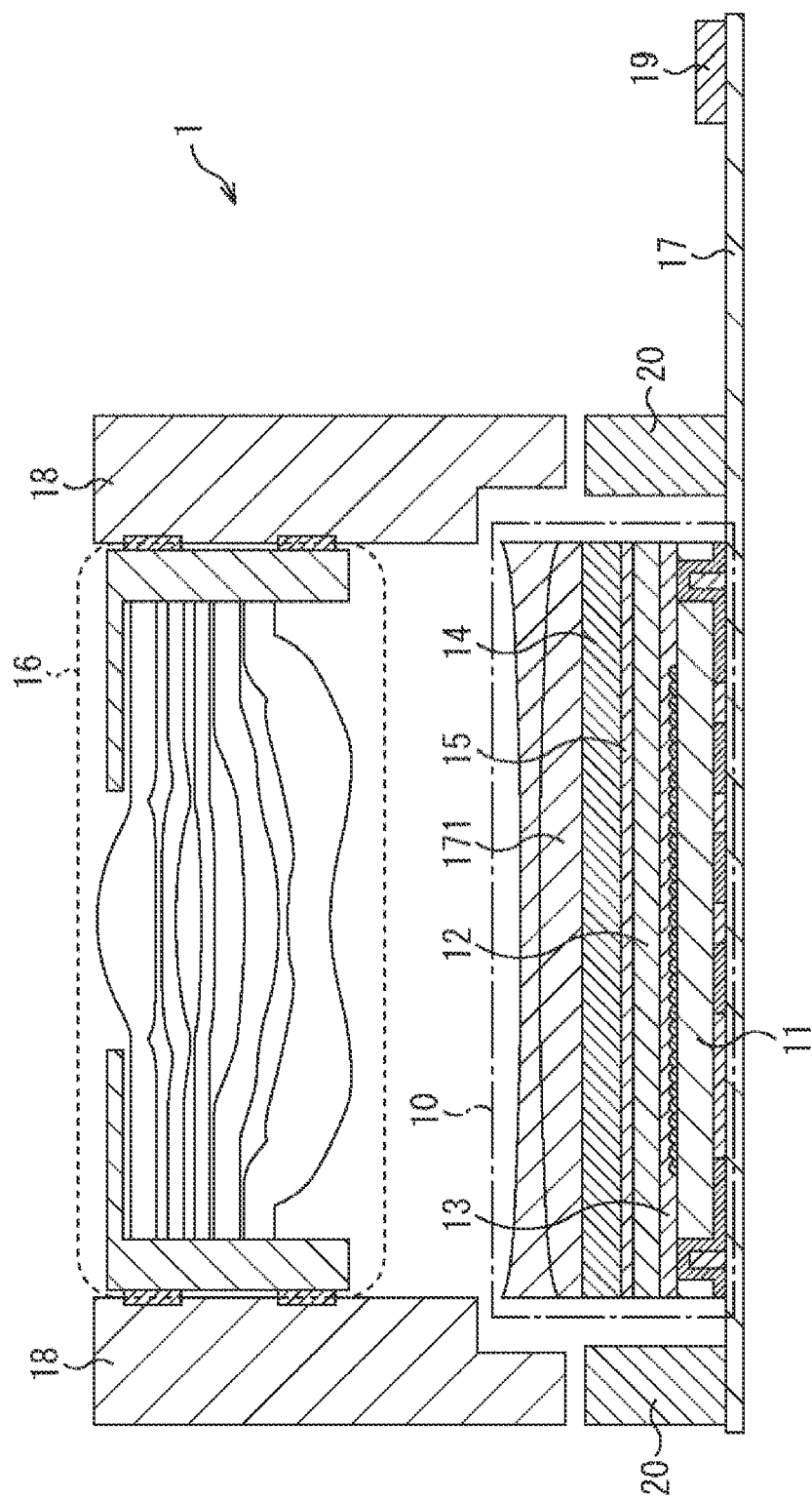
FIG. 12 is a diagram illustrating a configuration example of a fourth embodiment of an imaging device of the present disclosure.

FIG. 12 illustrates a configuration example of an imaging device 1 in which a lens group including a plurality of lenses constituting the lowermost layer with respect to the incident direction among a lens group 16 is disposed on an IRCF 14. Note that, in the imaging device 1 in FIG. 12, configurations having the same functions as those of the imaging device 1 in FIG. 9 are denoted by the same reference numerals, and description thereof will be omitted as appropriate.

That is, the imaging device 1 in FIG. 12 is different from the imaging device 1 in FIG. 9 in that a lens group 171 including a plurality of lenses constituting the lowermost layer with respect to the incident direction of light in the lens group 16 is provided on the IRCF 14 instead of the lens 131. Note that, although FIG. 12 illustrates an example of the lens group 171 including two lenses, the lens group 171 may include more lenses.

Such a configuration allows for prevention of occurrence of flare and ghosts in a similar manner to the imaging device 1 in FIG. 9.

Furthermore, since the lens group 171 including the plurality of lenses constituting the lowermost layer among the plurality of lenses constituting the lens group 16 is disposed on the IRCF 14, the number of lenses constituting the lens group 16 can be reduced, and the weight of the lens group 16 can be reduced. This allows for a reduction in amount of driving force of an actuator 18 used for autofocus, and downsizing and reduction in power consumption of the actuator 18.

Note that the lens 131 in the imaging device 1 in FIG. 11 of the third embodiment may be attached to the IRCF 14 with the transparent adhesive 151 instead of the lens group 171.

5. Fifth Embodiment

In the second embodiment, the example in which the glass substrate 12 is attached onto the solid-state imaging element 11 with the adhesive 13 and the IRCF 14 is attached onto the glass substrate 12 with the adhesive 15 has been described. However, the glass substrate 12, the adhesive 15, and the IRCF 14 may be replaced with a configuration having both the function of the glass substrate 12 and the function of the IRCF 14, and the configuration may be attached onto the solid-state imaging element 11 with the adhesive 13.

Figure 13:
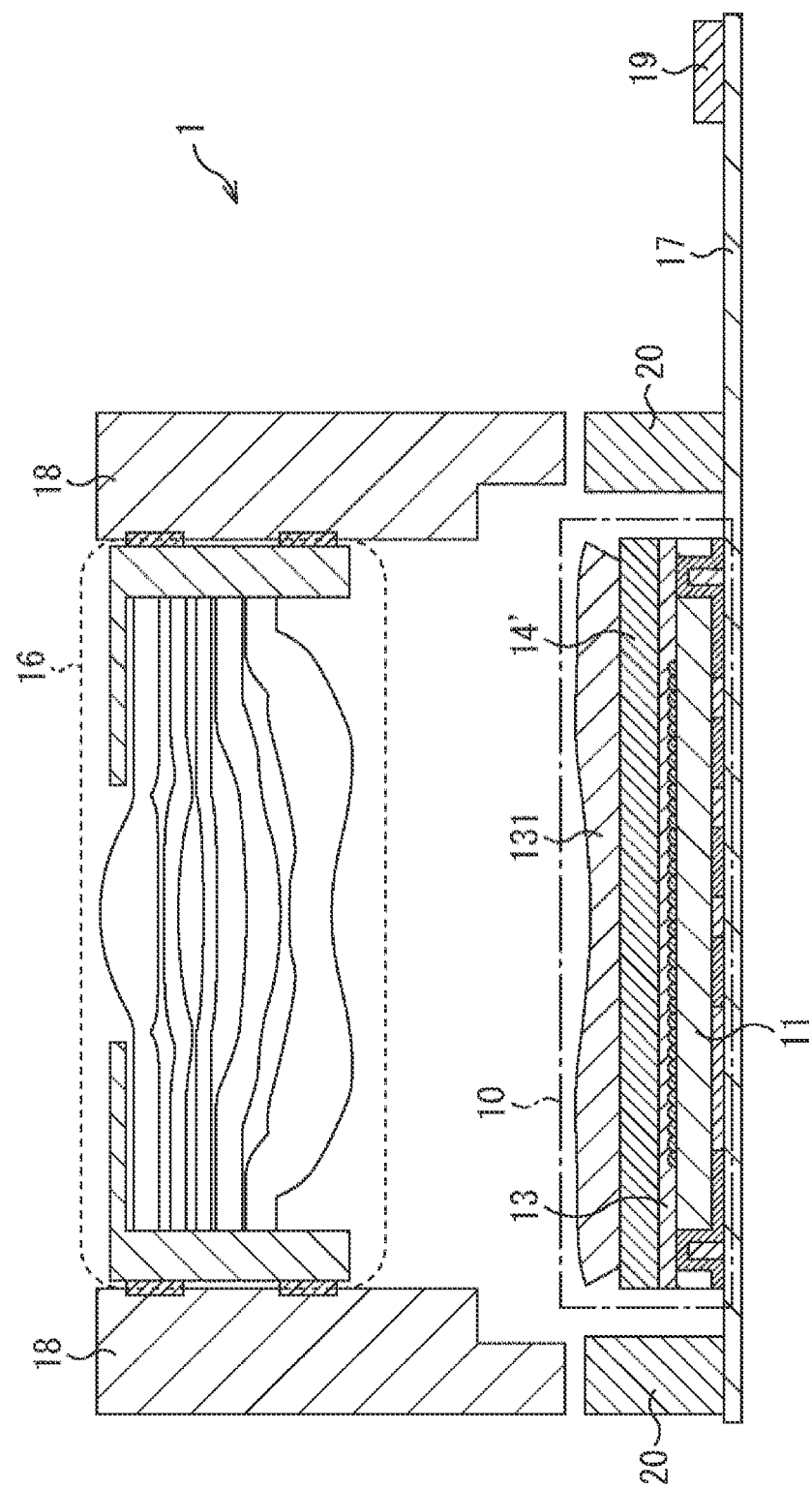
FIG. 13 is a diagram illustrating a configuration example of a fifth embodiment of an imaging device of the present disclosure.

FIG. 13 illustrates a configuration example of an imaging device 1 in which a glass substrate 12, an adhesive 15, and an IRCF 14 are replaced with a configuration having both the function of the glass substrate 12 and the function of the IRCF 14, and the configuration is attached onto a solid-state imaging element 11 with an adhesive 13, and a lowermost lens 131 is provided thereon. Note that, in the imaging device 1 in FIG. 13, configurations having the same functions as those of the imaging device 1 in FIG. 9 are denoted by the same reference numerals, and description thereof will be omitted as appropriate.

That is, the imaging device 1 in FIG. 13 is different from the imaging device 1 in FIG. 9 in that the glass substrate 12 and the IRCF 14 are replaced with an IRCF glass substrate 14' having the function of the glass substrate 12 and the function of the IRCF 14, and the IRCF glass substrate 14' is attached onto the solid-state imaging element 11 with the adhesive 13, and moreover, the lowermost lens 131 is provided on the IRCF 14'.

Such a configuration allows for prevention of occurrence of flare and ghosts in a similar manner to the imaging device 1 in FIG. 9.

That is, currently, for the purpose of downsizing of the solid-state imaging element 11, the glass substrate 12 and the solid-state imaging element 11 referred to as a chip size package (CSP) structure are bonded, and the solid-state imaging element 11 is thinned with the glass substrate as a base substrate, so that the solid-state imaging element can be downsized. In FIG. 13, the IRCF glass substrate 14' implements not only the function of the IRCF 14 but also the function as the glass substrate 12 having a degree of flatness, and this allows for reduction in height.

Note that the glass substrate 12, the adhesive 15, and the IRCF 14 of the imaging device 1 in FIGS. 1, 11, and 12 according to the first embodiment, the third embodiment, and the fourth embodiment may be replaced with the IRCF glass substrate 14' having the function of the glass substrate 12 and the function of the IRCF 14.

6. Sixth Embodiment

In the fourth embodiment, the example has been described in which the glass substrate 12 is attached onto the solid-state imaging element 11 having the CSP structure with the adhesive 13, moreover, the IRCF 14 is attached onto the glass substrate 12 with the adhesive 15, and moreover, the lens group 171 including the plurality of lenses in the lowermost layer among the plurality of lenses constituting the lens group 16 is provided on the IRCF 14. However, instead of the solid-state imaging element 11 having the CSP structure, a solid-state imaging element 11 having a chip on board (COB) structure may be used.

Figure 14:
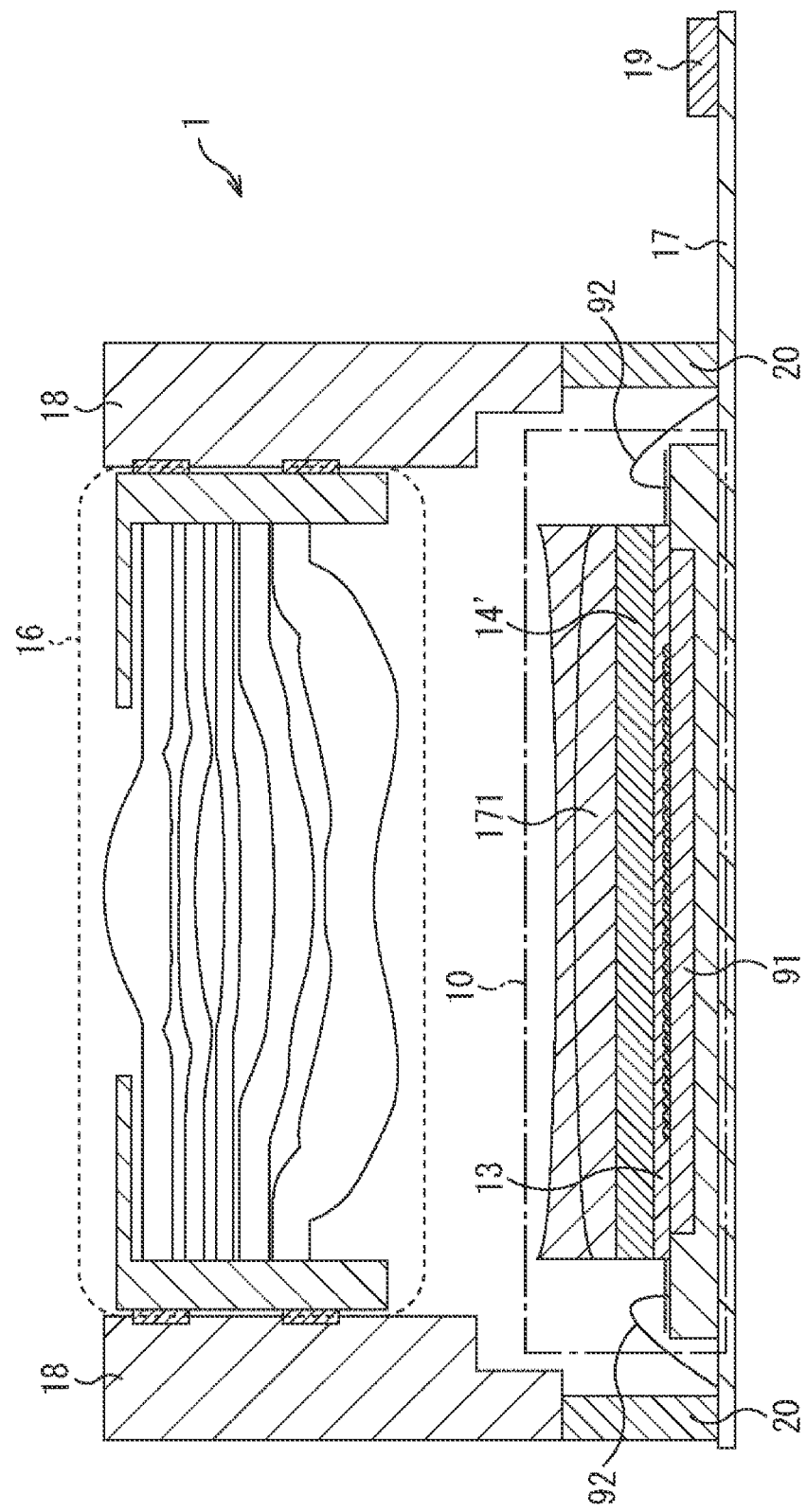
FIG. 14 is a diagram illustrating a configuration example of a sixth embodiment of an imaging device of the present disclosure.

FIG. 14 illustrates a configuration example in which the glass substrate 12 and the IRCF 14 in the imaging device 1 in FIG. 12 are replaced with an IRCF glass substrate 14' having the function of the glass substrate 12 and the function of the IRCF 14, and the solid-state imaging element 11 having the chip on board (COB) structure is used instead of the solid-state imaging element 11 having the CSP structure. Note that, in the imaging device 1 in FIG. 14, configurations having the same functions as those of the imaging device 1 in FIG. 12 are denoted by the same reference numerals, and description thereof will be omitted as appropriate.

That is, the imaging device 1 in FIG. 14 is different from the imaging device 1 in FIG. 12 in that the glass substrate 12 and the IRCF 14 are replaced with the IRCF glass substrate 14' having the function of the glass substrate 12 and the function of the IRCF 14, and a solid-state imaging element 91 having a chip on board (COB) structure is used instead of the solid-state imaging element 11 having the CSP structure.

Such a configuration allows for prevention of occurrence of flare and ghosts in a similar manner to the imaging device 1 in FIG. 12.

Furthermore, in recent years, in accordance with downsizing of the imaging device 1, a CSP structure has been generally adopted for downsizing of the solid-state imaging element 11. However, the CSP structure is more expensive than the solid-state imaging element 11 having the COB structure because complicated processing is required, for example, bonding to the glass substrate 12 or the IRCF glass substrate 14' or wiring of a terminal of the solid-state imaging element 11 on a rear side of a light receiving surface. Thus, not only the CSP structure but also the solid-state imaging element 91 having the COB structure connected to a circuit board 17 by a wire bond 92 or the like may be used.

Using the solid-state imaging element 91 having the COB structure facilitates connection to the circuit board 17, so that processing can be simplified, and cost can be reduced.

Note that the solid-state imaging element 11 having the CSP structure of the imaging device 1 in FIGS. 1, 9, 11, and 13 according to the first to third embodiments and the fifth embodiment may be replaced with the solid-state imaging element 11 having the chip on board (COB) structure.

7. Seventh Embodiment

In the second embodiment, the example has been described in which the glass substrate 12 is provided on the solid-state imaging element 11, and moreover, the IRCF 14 is provided on the glass substrate. However, the IRCF 14 may be provided on the solid-state imaging element 11, and moreover, the glass substrate 12 may be provided on the IRCF 14.

Figure 15:
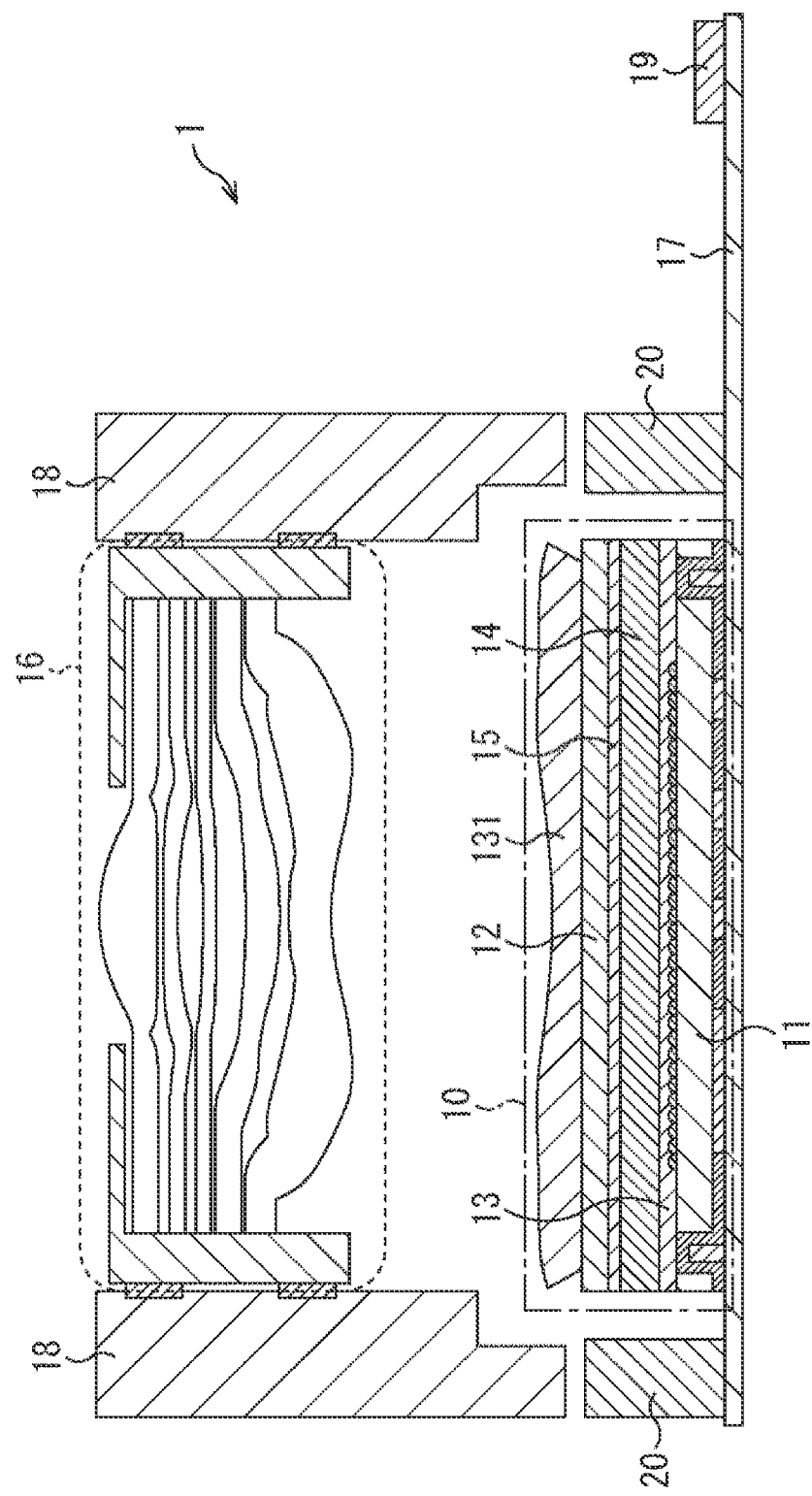
FIG. 15 is a diagram illustrating a configuration example of a seventh embodiment of an imaging device of the present disclosure.

FIG. 15 illustrates a configuration example of an imaging device 1 in a case where a glass substrate 12 is used, an IRCF 14 is provided on a solid-state imaging element 11, and moreover, the glass substrate 12 is provided on the IRCF 14.

The imaging device 1 in FIG. 15 is different from the imaging device 1 in FIG. 9 in that the glass substrate 12 and the IRCF 14 are switched in position, the IRCF 14 is attached onto the solid-state imaging element 11 with a transparent adhesive 13, and moreover, the glass substrate 12 is attached onto the IRCF 14 with a transparent adhesive 15, and a lens 131 is provided on the glass substrate 12.

Such a configuration allows for prevention of occurrence of flare and ghosts in a similar manner to the imaging device 1 in FIG. 9.

Furthermore, the IRCF 14 generally has a characteristic that flatness is low under influence of temperature and disturbance, and may cause distortion of an image on the solid-state imaging element 11.

Thus, a special material is generally adopted in which flatness is kept by a coating material or the like being applied to both surfaces of the IRCF 14, for example. However, this increases cost.

On the other hand, in the imaging device 1 in FIG. 15, the IRCF 14 having low flatness is sandwiched between the solid-state imaging element 11 and the glass substrate 12 having high flatness, so that flatness can be secured at low cost, and distortion of an image can be reduced.

Thus, the imaging device 1 in FIG. 15 allows for prevention of occurrence of flare and ghosts, and also allows for prevention of image distortion caused by the characteristic of the IRCF 14. Furthermore, a coating constituted by a special material for keeping the flatness is unnecessary, and the cost can be reduced.

Note that, similarly in the imaging device 1 in FIGS. 1, 11, and 12 according to the first embodiment, the third embodiment, and the fourth embodiment, the glass substrate 12 and the IRCF 14 may be switched in position and attached with the adhesives 13 and 15.

8. Eighth Embodiment

In the first embodiment, the example has been described in which the IRCF 14 is used as a configuration for cutting infrared light. However, a configuration other than the IRCF 14 may be used as long as the configuration can cut infrared light. For example, instead of the IRCF 14, an infrared cut resin may be applied and used.

Figure 16:
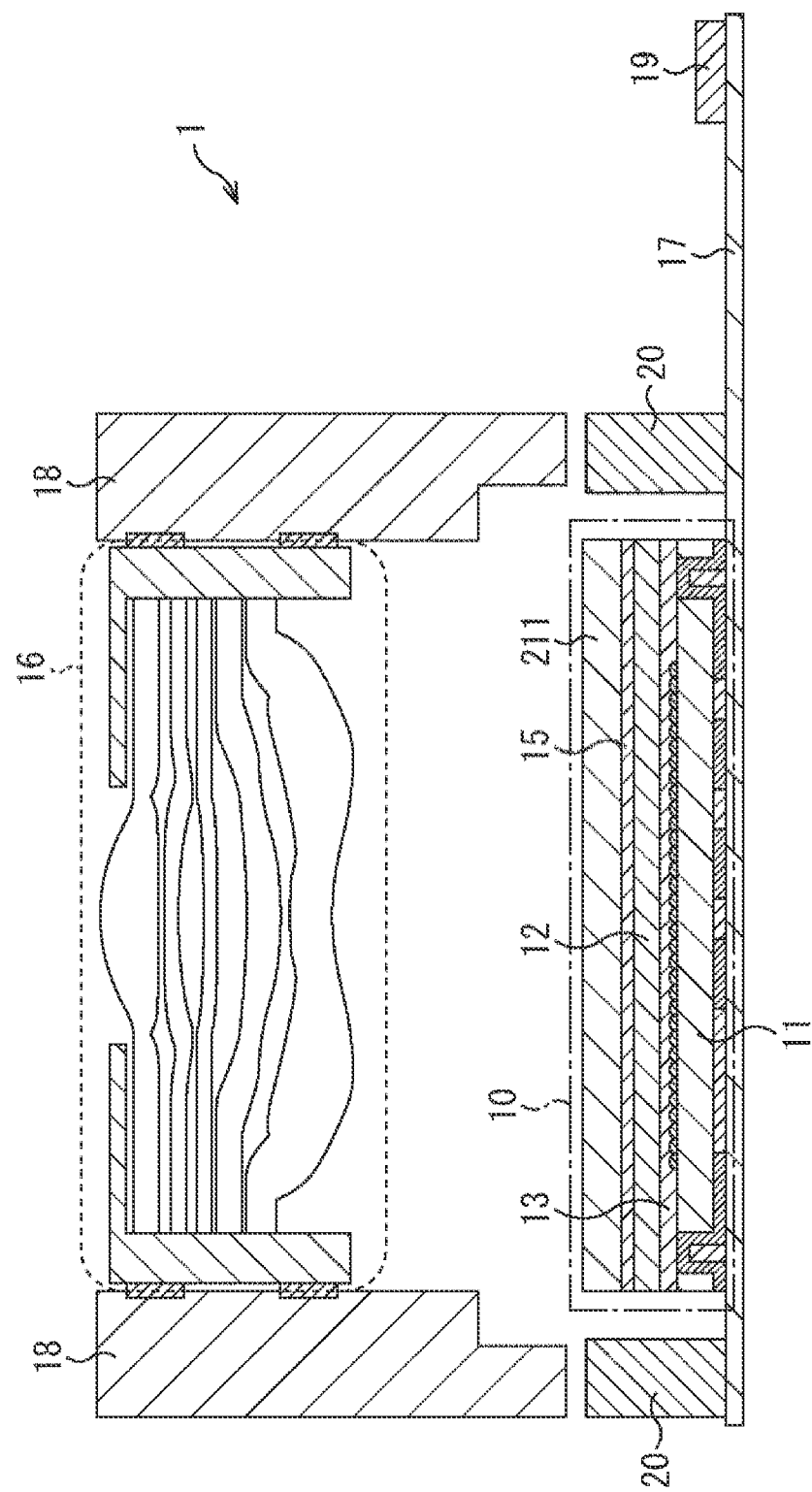
FIG. 16 is a diagram illustrating a configuration example of an eighth embodiment of an imaging device of the present disclosure.

FIG. 16 illustrates a configuration example of an imaging device 1 in which an infrared cut resin is used instead of the IRCF 14. Note that, in the imaging device 1 in FIG. 16, configurations having the same functions as those of the imaging device 1 in FIG. 1 are denoted by the same reference numerals, and description thereof will be omitted as appropriate.

That is, the imaging device 1 in FIG. 16 is different from the imaging device 1 in FIG. 1 in that an infrared cut resin 211 is provided instead of the IRCF 14. The infrared cut resin 211 is provided by being applied, for example.

Such a configuration allows for prevention of occurrence of flare and ghosts in a similar manner to the imaging device 1 in FIG. 1.

Furthermore, in recent years, resin has been increasingly improved, and resin having an infrared cut effect has become general. It is known that the infrared cut resin 211 can be applied to a glass substrate 12 at the time of production of a CSP solid-state imaging element 11.

Note that the infrared cut resin 211 may be used instead of the IRCF 14 of the imaging device 1 in FIGS. 9, 11, 12, and 15 according to the second to fourth embodiments and the seventh embodiment.

9. Ninth Embodiment

In the second embodiment, the example has been described in which, in a case where the glass substrate 12 is used, a flat plate is provided in a state of being in close contact with the solid-state imaging element 11 without a cavity or the like. However, a cavity may be provided between the glass substrate 12 and the solid-state imaging element 11.

Figure 17:
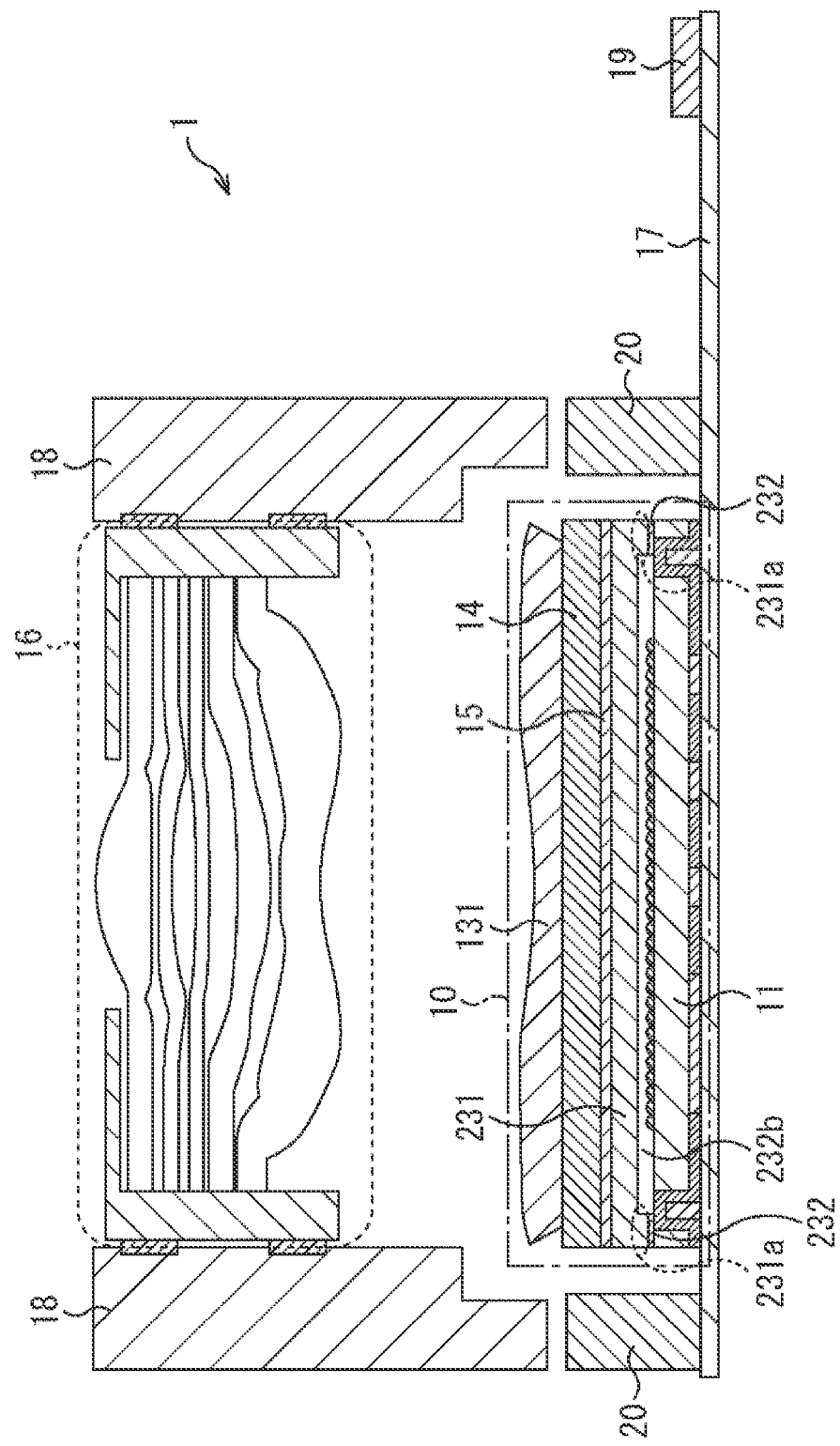
FIG. 17 is a diagram illustrating a configuration example of a ninth embodiment of an imaging device of the present disclosure.

FIG. 17 illustrates a configuration example of an imaging device 1 in which a cavity is provided between a glass substrate 12 and a solid-state imaging element 11. Note that, in the imaging device 1 in FIG. 17, configurations having the same functions as those of the imaging device 1 in FIG. 9 are denoted by the same reference numerals, and description thereof will be omitted as appropriate.

That is, the imaging device 1 in FIG. 17 is different from the imaging device in FIG. 9 in that a glass substrate 231 having a protrusion 231a at the periphery is provided instead of the glass substrate 12. The protrusion 231a at the periphery abuts on the solid-state imaging element 11, and the protrusion 231a is bonded by a transparent adhesive 232, so that a cavity 231b constituted by an air layer is formed between an imaging surface of the solid-state imaging element 11 and the glass substrate 231.

Such a configuration allows for prevention of occurrence of flare and ghosts in a similar manner to the imaging device 1 in FIG. 9.

Note that, instead of the glass substrate 12 of the imaging device 1 in FIGS. 1, 11, 12, and 16 according to the first embodiment, the third embodiment, the fourth embodiment, and the eighth embodiment, the glass substrate 231 may be used, and only the protrusion 231a may be bonded by the adhesive 232 so that the cavity 231b is formed.

10. Tenth Embodiment

In the second embodiment, the lowermost lens 131 of the lens group 16 is disposed on the IRCF 14 provided on the glass substrate 12 by way of example. However, instead of the IRCF 14 on the glass substrate 12, it is possible to use a coating agent constituted by an organic multilayer film having an infrared cut function.

Figure 18:
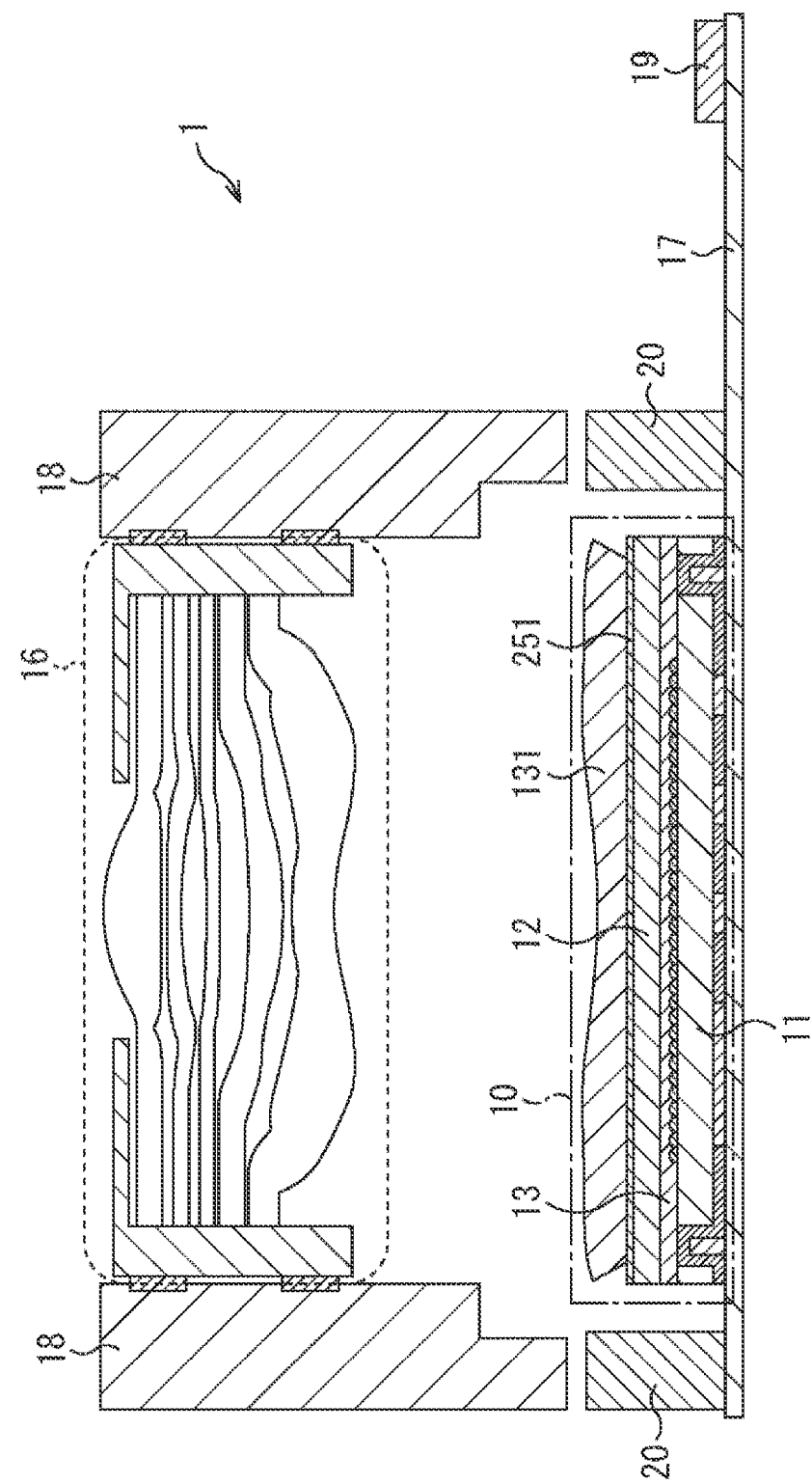
FIG. 18 is a diagram illustrating a configuration example of a tenth embodiment of an imaging device of the present disclosure.

FIG. 18 illustrates a configuration example of an imaging device 1 in which, instead of the IRCF 14 on the glass substrate 12, a coating agent constituted by an organic multilayer film having an infrared cut function is used.

The imaging device 1 in FIG. 18 is different from the imaging device 1 in FIG. 9 in that a coating agent 251 constituted by an organic multilayer film having an infrared cut function is used instead of the IRCF 14 on the glass substrate 12.

Such a configuration allows for prevention of occurrence of flare and ghosts in a similar manner to the imaging device 1 in FIG. 9.

Note that the coating agent 251 constituted by the organic multilayer film having the infrared cut function may be used instead of the IRCF 14 of the imaging device 1 in FIGS. 1, 6, 7, 10, and 12 according to the first embodiment, the third embodiment, the fourth embodiment, the seventh embodiment, and the ninth embodiment.

11. Eleventh Embodiment

In the tenth embodiment, the example has been described in which, instead of the IRCF 14 on the glass substrate 12, the lowermost lens 131 of the lens group 16 is provided on the coating agent 251 constituted by the organic multilayer film having the infrared cut function. However, the lens 131 may be further provided with antireflection (AR) coating.

Figure 19:
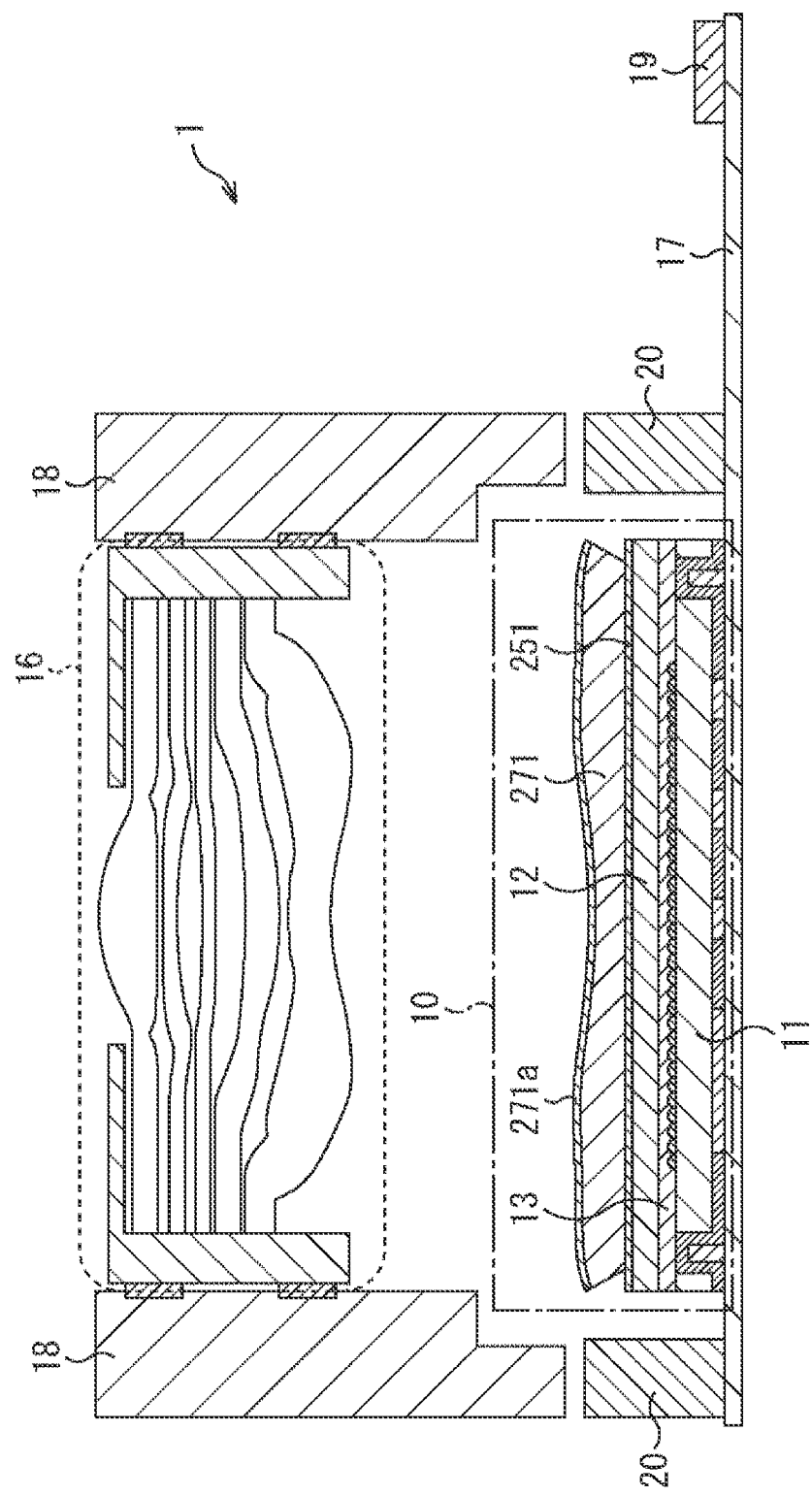
FIG. 19 is a diagram illustrating a configuration example of an eleventh embodiment of an imaging device of the present disclosure.

FIG. 19 illustrates a configuration example of an imaging device 1 in which AR coat is applied to a lens 131 in the imaging device 1 in FIG. 13.

That is, the imaging device 1 in FIG. 19 is different from the imaging device 1 in FIG. 18 in that, instead of the lens 131, a lens 271 in the lowermost layer of a lens group 16 to which an AR coat 271a is applied is provided. For the AR coat 271a, for example, vacuum deposition, sputtering, wet coating, or the like can be adopted.

Such a configuration allows for prevention of occurrence of flare and ghosts in a similar manner to the imaging device 1 in FIG. 9.

Furthermore, the AR coat 271a of the lens 271 prevents internal diffuse reflection of reflected light from a solid-state imaging element 11, and this makes it possible to prevent occurrence of flare and ghosts with higher accuracy.

Note that the lens 271 provided with the AR coat 271a may be used instead of the lens 131 of the imaging device 1 in FIGS. 9, 11, 13, 15, 17, and 18 according to the second embodiment, the third embodiment, the fifth embodiment, the seventh embodiment, the ninth embodiment, and the tenth embodiment. Furthermore, an AR coat similar to the AR coat 271a may be applied to the surface (uppermost surface in the drawing) of the lens group 171 of the imaging device 1 in FIGS. 12 and 14 according to the fourth embodiment and the sixth embodiment.

The AR coat 271a desirably has a film having a single-layer or multi-layer structure of the following films. That is, the AR coat 271a is, for example, an insulating film (e.g., SiCH, SiCOH, or SiCNH) containing, as main components, resin such as a transparent silicon-based resin, an acryl-based resin, an epoxy-based resin, or a styrene-based resin, silicon (Si), carbon (C), and hydrogen (H), an insulating film (e.g., SiON or SiN) containing silicon (Si) and nitrogen (N) as main components, or a SiO2 film, a P—SiO film, an HDP-SiO film, or the like formed with the use of an oxidizing agent and a material gas including at least one of silicon hydroxide, alkylsilane, alkoxysilane, polysiloxane, or the like.

12. Twelfth Embodiment

In the eleventh embodiment, the example has been described in which the lens 271 provided with the antireflection (AR) coat 271a is used instead of the lens 131. However, as long as an antireflection function can be implemented, a configuration other than the AR coat may be used. For example, a moth-eye structure, which is a structure with minute recesses and protrusions for preventing reflection, may be used.

Figure 20:
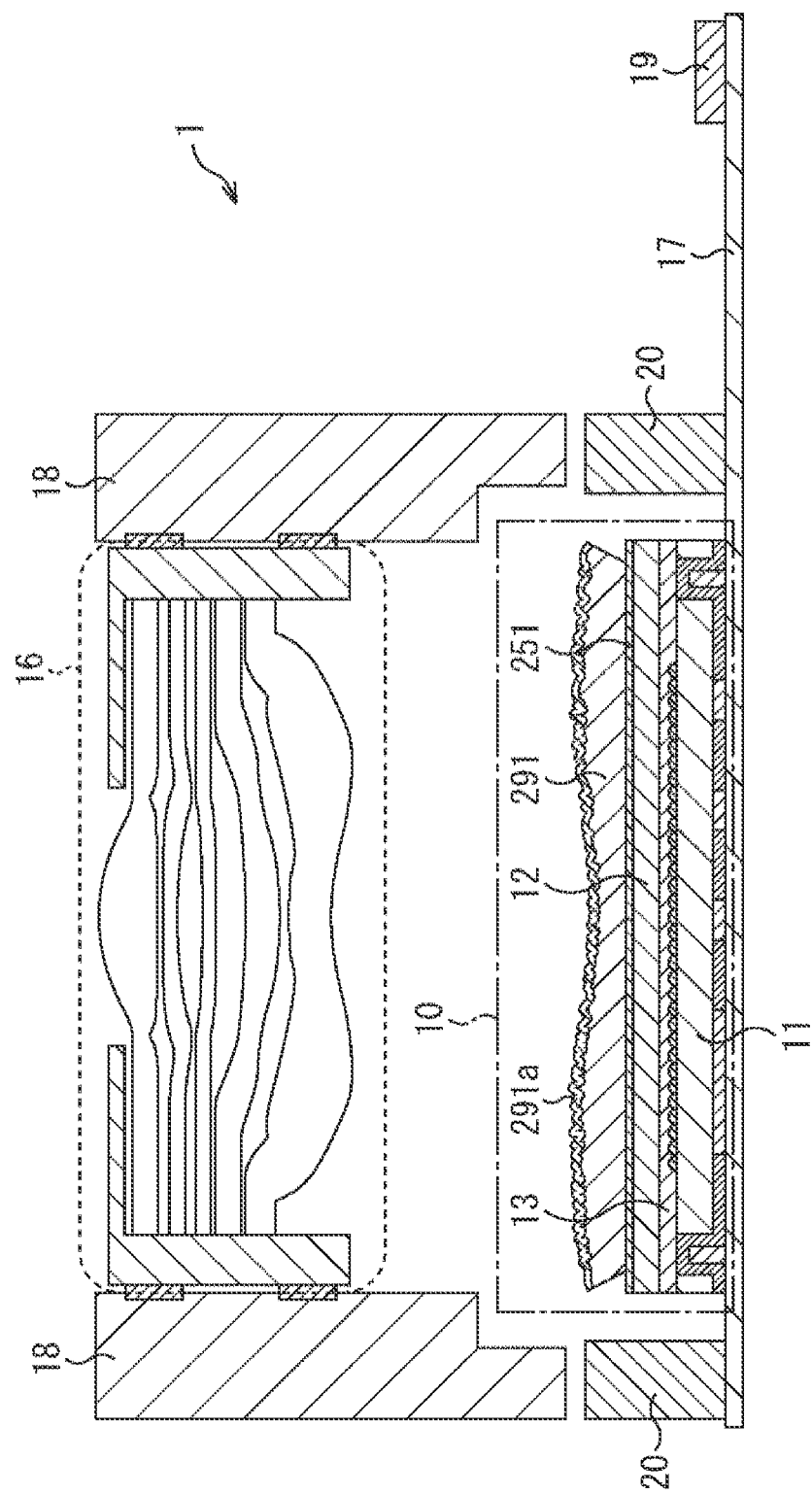
FIG. 20 is a diagram illustrating a configuration example of a twelfth embodiment of an imaging device of the present disclosure.

FIG. 20 illustrates a configuration example of an imaging device 1 in which a lens 291 having a moth-eye structure with an antireflection function is provided instead of the lens 131 of the imaging device 1 in FIG. 19.

That is, the imaging device 1 in FIG. 20 is different from the imaging device 1 in FIG. 18 in that, instead of the lens 131, the lens 291 provided with an antireflection treated portion 291a subjected to treatment for forming a moth-eye structure is provided in the lowermost layer of a lens group 16.

Such a configuration allows for prevention of occurrence of flare and ghosts in a similar manner to the imaging device 1 in FIG. 18.

Furthermore, the lens 291 has the antireflection treated portion 291a subjected to treatment for forming a moth-eye structure. This prevents internal diffuse reflection of reflected light from a solid-state imaging element 11, and allows for prevention of occurrence of flare and ghosts with higher accuracy. Note that the antireflection treated portion 291a may be subjected to antireflection treatment other than the moth-eye structure as long as the antireflection function can be implemented.

The antireflection treated portion 291a desirably has a film having a single-layer or multi-layer structure of the following films. That is, the antireflection treated portion 291a is, for example, an insulating film (e.g., SiCH, SiCOH, or SiCNH) containing, as main components, resin such as a transparent silicon-based resin, an acryl-based resin, an epoxy-based resin, or a styrene-based resin, silicon (Si), carbon (C), and hydrogen (H), an insulating film (e.g., SiON or SiN) containing silicon (Si) and nitrogen (N) as main components, or a SiO2 film, a P—SiO film, an HDP-SiO film, or the like formed with the use of an oxidizing agent and a material gas including at least one of silicon hydroxide, alkylsilane, alkoxysilane, polysiloxane, or the like.

Note that the lens 291 provided with the antireflection treated portion 291a may be used instead of the lens 131 of the imaging device 1 in FIGS. 9, 11, 13, 15, 17, and 18 according to the second embodiment, the third embodiment, the fifth embodiment, the seventh embodiment, the ninth embodiment, and the tenth embodiment. Furthermore, the surface of the lens group 171 of the imaging device 1 in FIGS. 12 and 14 according to the fourth embodiment and the sixth embodiment may be subjected to antireflection treatment similar to that of the antireflection treated portion 291*a*.

13. Thirteenth Embodiment

In the fourth embodiment, the example has been described in which the lowermost lens 131 of the lens group 16 is provided on the IRCF 14. However, this configuration may be replaced with a configuration having a function of cutting infrared light and a function similar to that of the lowermost lens 131.

Figure 21:
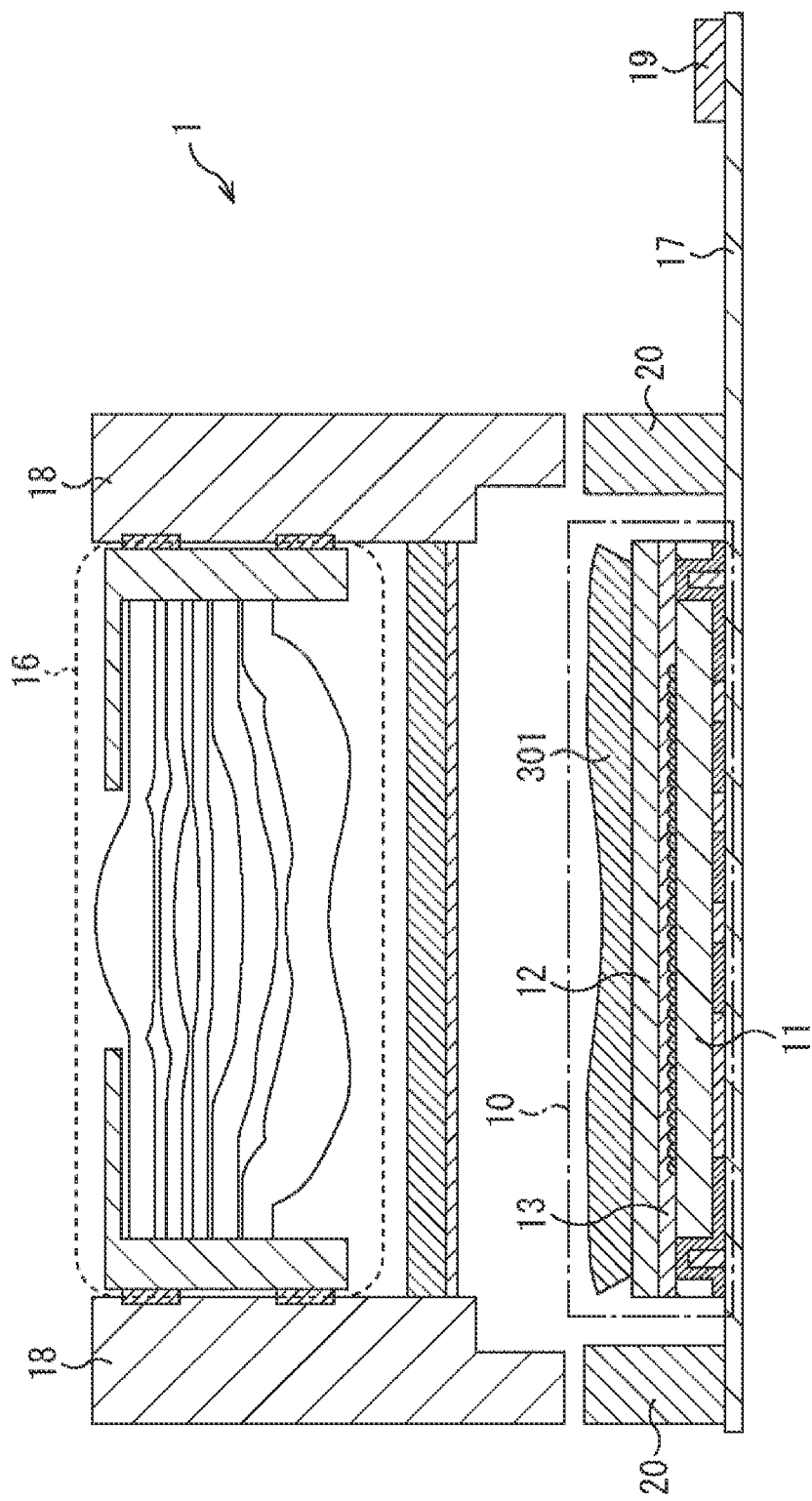
FIG. 21 is a diagram illustrating a configuration example of a thirteenth embodiment of an imaging device of the present disclosure.

FIG. 21 illustrates a configuration example of an imaging device 1 provided with an infrared light cut lens having an infrared cut function and a function similar to that of the lowermost lens of the lens group 16, instead of the IRCF 14 and the lowermost lens 131 of the lens group 16 in the imaging device 1 in FIG. 9.

That is, the imaging device 1 in FIG. 21 is different from the imaging device 1 in FIG. 9 in that an infrared light cut lens 301 with an infrared cut function is provided instead of the IRCF 14 and the lowermost lens 131 of the lens group 16.

Such a configuration allows for prevention of occurrence of flare and ghosts in a similar manner to the imaging device 1 in FIG. 9.

Furthermore, the infrared light cut lens 301 has a configuration having both an infrared cut function and a function as the lowermost lens 131 of the lens group 16. This makes it unnecessary to individually provide the IRCF 14 and the lens 131, and allows for further downsizing and reduction in height of the device configuration of the imaging device 1. Furthermore, the lens group 171 and the IRCF 14 of the imaging device 1 in FIG. 12 according to the fourth embodiment may be replaced with an infrared light cut lens having both an infrared cut function and a function as the lens group 171 including a plurality of lenses in the lowermost layer of the lens group 16.

14. Fourteenth Embodiment

It is known that stray light easily enters from a marginal portion of a light receiving surface of a solid-state imaging element 11. Thus, a black mask may be applied to the marginal portion of the light receiving surface of the solid-state imaging element 11 to prevent entry of stray light so that occurrence of flare and ghosts may be prevented.

Figure 22:
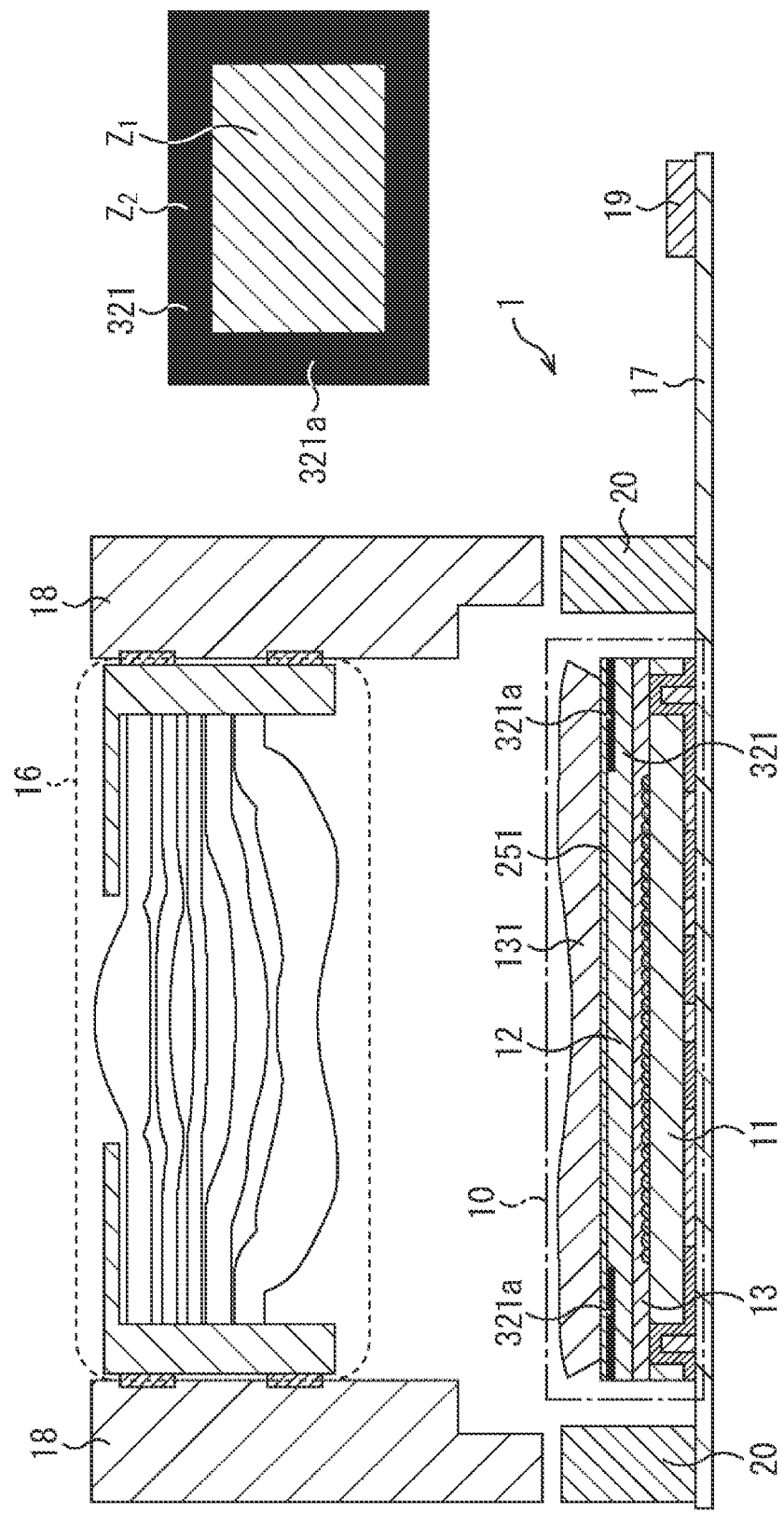
FIG. 22 is a diagram illustrating a configuration example of a fourteenth embodiment of an imaging device of the present disclosure.

A left part of FIG. 22 illustrates a configuration example of an imaging device 1 in which a glass substrate 321 provided with a black mask 321*a* that shields the marginal portion of the light receiving surface of the solid-state imaging element 11 from light is provided instead of the glass substrate 12 of the imaging device 1 in FIG. 18.

That is, the imaging device 1 in the left part of FIG. 22 is different from the imaging device 1 in FIG. 18 in that, as illustrated in a right part of FIG. 22, the glass substrate 321 provided with the black mask 321*a* constituted by a light shielding film at a marginal portion Z2 is provided instead of the glass substrate 12. The black mask 321*a* is applied to the glass substrate 321 by photolithography or the like. Note that the black mask is not applied to a central portion Z1 of the glass substrate 321 in the right part of FIG. 22.

Such a configuration allows for prevention of occurrence of flare and ghosts in a similar manner to the imaging device 1 in FIG. 9.

Furthermore, in the glass substrate 321, the black mask 321*a* is applied to the marginal portion Z2, and this allows for prevention of entry of stray light from the marginal portion, and prevention of occurrence of flare and ghosts attributable to stray light.

Note that the black mask 321*a* may be provided not only in the glass substrate 321 but also in another configuration as long as stray light can be prevented from entering the solid-state imaging element 11. For example, the black mask 321*a* may be provided in a lens 131 or a coating agent 251 constituted by an organic multilayer film having an infrared cut function, or may be provided in an IRCF 14, an IRCF glass substrate 14', a glass substrate 231, a lens group 171, a lens 271 or 291, an infrared cut resin 211, an infrared light cut lens 301, or the like. Note that, at this time, in a case of a surface with a low flatness where a black mask cannot be applied by photolithography, a black mask may be applied to the surface with low flatness by inkjet, for example.

As described above, according to the present disclosure, it is possible to reduce flare and ghosts attributable to internal diffuse reflection of light from the solid-state imaging element due to downsizing, and it is possible to achieve an increase in the number of pixels, an improvement in image quality, and downsizing without degradation of performance of the imaging device.

15. Fifteenth Embodiment

In the above description, the example has been described in which the lens 131, 271, or 291, the lens group 171, or the infrared light cut lens 301 is joined onto the rectangular solid-state imaging element 11 by bonding, attaching, or the like.

However, in a case where any one of the rectangular lens 131, 271, or 291, the lens group 171, or the infrared light cut lens 301 is bonded or attached to the solid-state imaging element 11 of substantially the same size, the vicinities of corner portions are likely to come unstuck, and there is a possibility that incident light is not appropriately incident on the solid-state imaging element 11 due to a corner portion of the lens 131 having come unstuck, and flare or a ghost occurs.

Thus, in a case where any one of the rectangular lens 131, 271, or 291, the lens group 171, or the infrared light cut lens 301 is bonded or attached to the solid-state imaging element 11, external dimensions may be set to be smaller than those of the solid-state imaging element 11, and moreover, an effective region may be set in the vicinity of the center of the lens and an ineffective region may be set in an outer circumferential part, so that the lens is less likely to come unstuck, or even in a case where the lens has come partly unstuck at an edge, incident light is effectively condensed.

Figure 23:
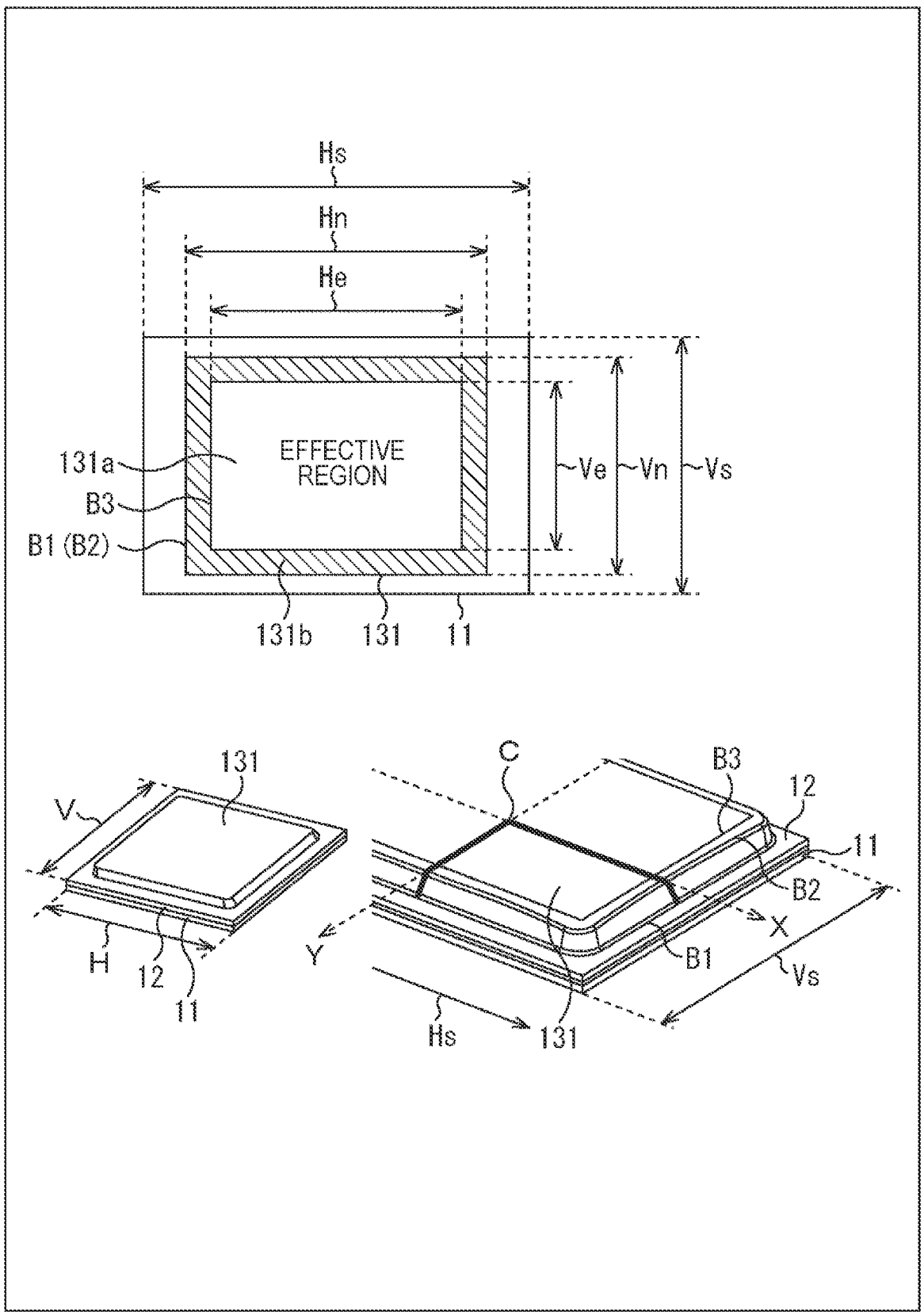
FIG. 23 is a diagram illustrating a configuration example of a fifteenth embodiment of an imaging device of the present disclosure.

That is, in a case where the lens 131 is bonded or attached to a glass substrate 12 provided on the solid-state imaging element 11, for example, as illustrated in FIG. 23, external dimensions of the lens 131 are set to be smaller than those of the glass substrate 12 on the solid-state imaging element 11, with an ineffective region 131*b* set in the outer circumferential part of the lens 131 and an effective region 131*a* set inside thereof. Note that, instead of the glass substrate 12, a glass substrate 231 may be provided on the solid-state imaging element 11.

Furthermore, the configuration in FIG. 23 is a configuration in which the IRCF 14 and the adhesive 15 have been omitted from the integrated component 10 of the imaging device 1 in FIG. 9. However, the IRCF 14 and the adhesive 15 have been omitted only for convenience of description, and, as a matter of course, may be provided between the lens 131 and the glass substrate 12.

Moreover, here, the effective region 131a is a region that is in a region where incident light enters through the lens 131, has an aspheric shape, and effectively functions to condense the incident light into a region in the solid-state imaging element 11 where photoelectric conversion can be performed. In other words, the effective region 131a has a concentric structure in which a structure of a lens having an aspheric shape is formed, is a region circumscribing the outer circumferential part of the lens, and is a region where the incident light is condensed on an imaging surface of the solid-state imaging element 11 where photoelectric conversion can be performed.

On the other hand, the ineffective region 131b is a region that does not necessarily function as a lens that condenses incident light incident on the lens 131 on a region in the solid-state imaging element 11 where photoelectric conversion can be performed.

However, in the ineffective region 131b, at a boundary with the effective region 131a, it is desirable to have a structure in which a structure functioning as a lens having a partially aspheric shape is extended. As described above, the structure functioning as a lens is provided so as to extend to the vicinity of the boundary with the effective region 131a in the ineffective region 131b. This allows incident light to be appropriately condensed on the imaging surface of the solid-state imaging element 11 even in a case where the lens 131 has not been positioned correctly when bonded or attached to the glass substrate 12 on the solid-state imaging element 11.

Note that, in FIG. 23, the size of the glass substrate 12 on the solid-state imaging element 11 is Vs in height in a perpendicular direction (Y direction)×Hs in width in a horizontal direction (X direction), and the lens 131 having a size of Vn in height in the perpendicular direction×Hn in width in the horizontal direction, which is smaller than that of the solid-state imaging element 11 (glass substrate 12), is bonded or attached to a central portion inside the glass substrate 12 on the solid-state imaging element 11. Moreover, the ineffective region 131b that does not function as a lens is set in the outer circumferential part of the lens 131, and the effective region 131a having a size of Ve in height in the perpendicular direction×He in width in the horizontal direction is set inside the ineffective region 131b.

In other words, a relationship in width in the horizontal direction and a relationship in height in the perpendicular direction are both expressed as follows: the width and length of the effective region 131a of the lens 131 <the width and length of the ineffective region 131b <the width and length of the external size of the solid-state imaging element 11 (glass substrate 12 thereon). Each of the lens 131, the effective region 131a, and the ineffective region 131b has substantially the same center position.

Furthermore, in FIG. 23, a top view in a case where the lens 131 is bonded or attached to the glass substrate 12 on the solid-state imaging element 11 as viewed from the light incident direction side is illustrated in an upper part of the drawing, and an external perspective view in a case where the lens 131 is bonded or attached to the glass substrate 12 on the solid-state imaging element 11 is illustrated in a lower left part of the drawing.

Moreover, in FIG. 23, a lower right part of the drawing illustrates a boundary B1 between a side surface portion of the lens 131 and the glass substrate 12, a boundary B2 outside the ineffective region 131b, and a boundary B3 between the outside of the effective region 131a and the inside of the ineffective region 131b, at an edge of the external perspective view in a case where the lens 131 is bonded or attached to the glass substrate 12 on the solid-state imaging element 11.

Here, FIG. 23 illustrates an example in which side surface edges of the lens 131 are perpendicular to the glass substrate 12 on the solid-state imaging element 11. Thus, in the top view in FIG. 23, the boundary B2 outside the ineffective region 131b, which is formed on an upper surface portion of the lens 131, and the boundary B1 between the effective region 131a and the ineffective region 131b, which is formed on a lower surface portion of the lens 131, are the same in size. With this arrangement, in the upper part of FIG. 23, the outer circumferential part (boundary B1) of the lens 131 and an outer circumferential part (boundary B2) of the ineffective region 131b are expressed as being the same in external shape.

With such a configuration, a space is formed between side surfaces serving as the outer circumferential part of the lens 131 and an outer circumferential part of the glass substrate 12 on the solid-state imaging element 11. It is therefore possible to prevent interference between the side surface portion of the lens 131 and another object, and to achieve a configuration in which the lens 131 is less likely to come unstuck from the glass substrate 12 on the solid-state imaging element 11.

Furthermore, since the effective region 131a of the lens 131 is set inside the ineffective region 131b, even in a case where a peripheral portion has come partly unstuck, incident light can be appropriately condensed on the imaging surface of the solid-state imaging element 11. Furthermore, when the lens 131 has come unstuck, interface reflection increases, and flare and ghosts worsen. Therefore, by preventing the lens 131 from coming unstuck, occurrence of flare and ghosts can be prevented as a result.

Note that, in FIG. 23, the example has been described in which the lens 131 is bonded or attached to the glass substrate 12 on the solid-state imaging element 11. However, as a matter of course, this applies to any of the lens 271 or 291, the lens group 171, or the infrared light cut lens 301 may be used.

<Modified Example of External Shape of Lens>

In the above description, the example has been described in which the effective region 131a is set in a central part of the lens 131, the ineffective region 131b is set in the outer circumferential part thereof, and moreover, the effective region 131a is smaller in size than the outer circumference of the solid-state imaging element 11 (glass substrate 12 thereon), in which all four corners of the external shape of the lens 131 are formed in an acute angle shape.

However, as long as the size of the lens 131 is set to be smaller than the size of the solid-state imaging element 11 (glass substrate 12 thereon), the effective region 131a is set in the central part of the lens 131, and the ineffective region 131b is set in the outer circumferential part thereof, the external shape may be any other shape.

Figure 24:
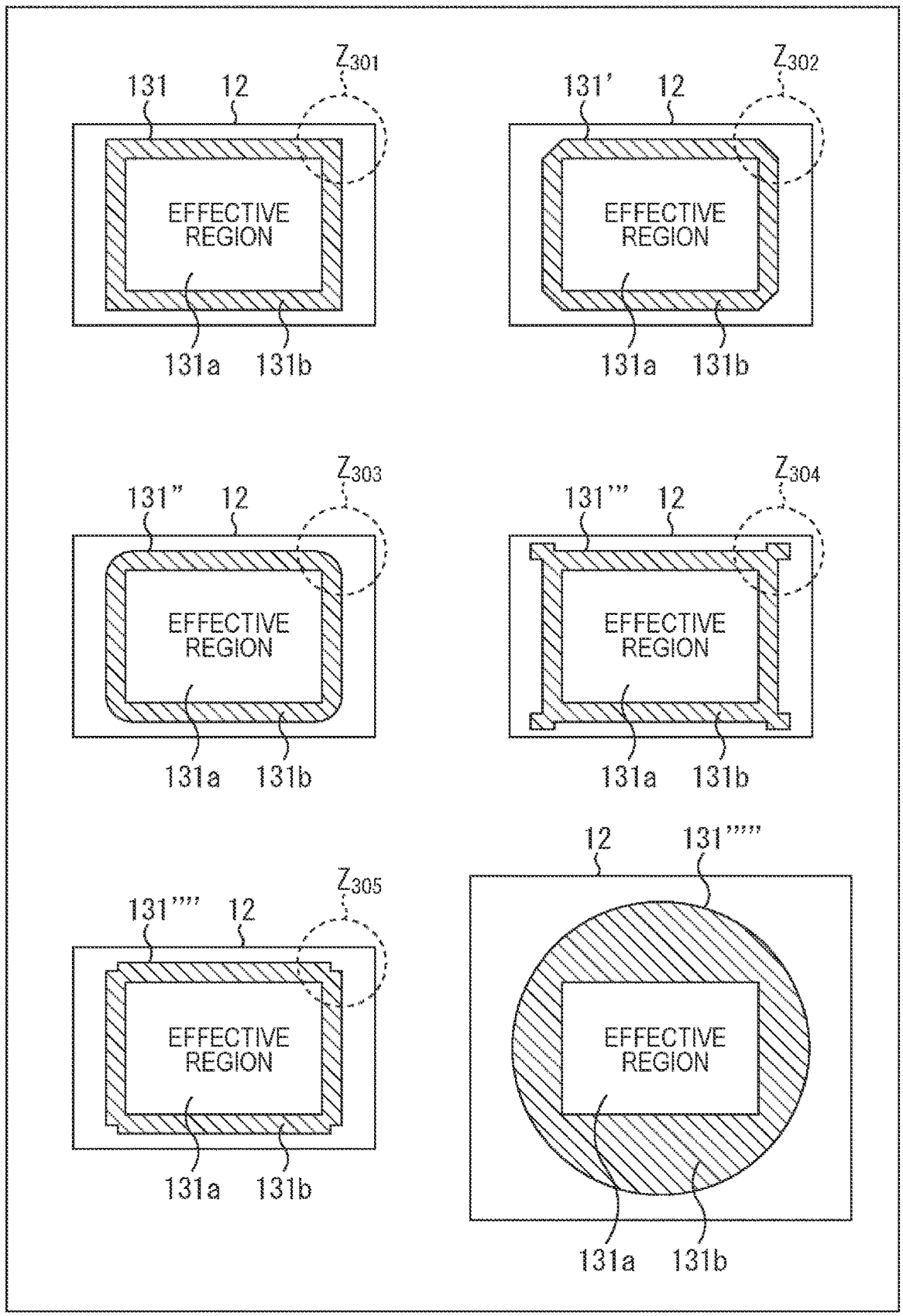
FIG. 24 is a diagram illustrating a modified example of an external shape of a lens in FIG. 23.

That is, as illustrated in an upper left part of FIG. 24 (corresponding to FIG. 23), four corner regions 2301 of the external shape of the lens 131 may be formed in an acute angle shape. Furthermore, as indicated by a lens 131' in an upper right part of FIG. 24, four corner regions 2302 may have a polygonal shape including obtuse angles.

Furthermore, as indicated by a lens 131″ in a middle left part of FIG. 24, four corner regions 2303 of the external shape may have a circle-like shape.

Moreover, as indicated by a lens 131‴ in a middle right part of FIG. 24, four corner regions 2304 of the external shape may have a shape in which small rectangular parts protrude from the four corners. Furthermore, the protruding shape may be a shape other than a rectangle, and may be, for example, a circular shape, an elliptical shape, a polygonal shape, or the like.

Furthermore, as indicated by a lens 131‴ in a lower left part of FIG. 24, four corner regions 2305 of the external shape may have a shape recessed in a rectangular shape.

Moreover, as indicated by a lens 131 in a lower right part of FIG. 24, the effective region 131*a* may have a rectangular shape, and an outer circumferential part of the ineffective region 131*b* may have a circular shape.

That is, as the angles of the corner portions of the lens 131 are more acute, the corner portions are more likely to come unstuck from the glass substrate 12, and this may create an optical adverse effect. Thus, as illustrated by the lenses 131′ to 131 in FIG. 24, by forming the corner portions into a polygonal shape having obtuse angles larger than 90 degrees, a round shape, a shape provided with a recess or a protrusion, or the like, it is possible to achieve a configuration in which the lens 131 is less likely to come unstuck from the glass substrate 12, and reduce the risk of creating an optical adverse effect.

<Modified Example of Structure of Lens Edge>

In the above description, the example has been described in which the edges of the lens 131 are formed perpendicular to the imaging surface of the solid-state imaging element 11. However, as long as the size of the lens 131 is set to be smaller than the size of the solid-state imaging element 11, the effective region 131*a* is set in the central part of the lens 131, and the ineffective region 131*b* is set in the outer circumferential part thereof, another shape may be formed.

Figure 25:
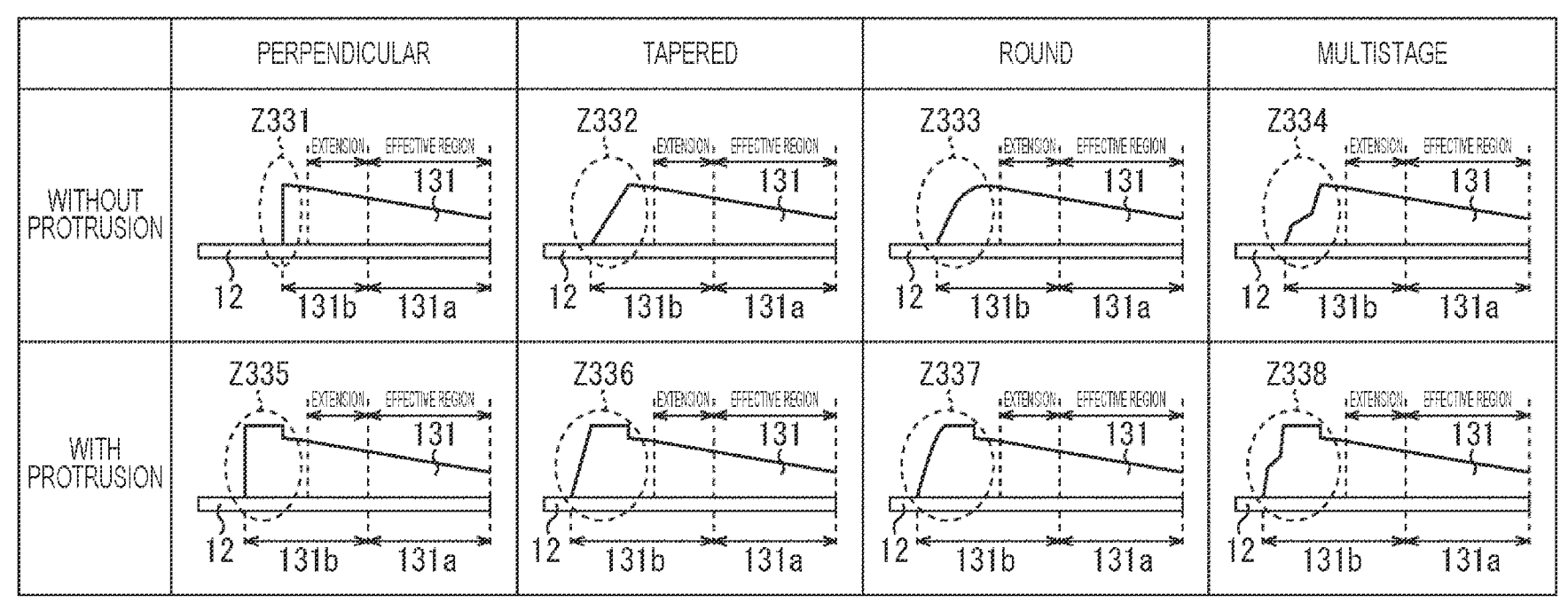

That is, as illustrated in an upper left part of FIG. 25, at the boundary with the effective region 131*a* in the ineffective region 131*b*, a configuration similar to that of the effective region 131*a* as an aspheric lens may be extended, and an edge may be formed perpendicularly as indicated by an edge Z331 of the ineffective region 131*b* (corresponding to the configuration in FIG. 23).

Furthermore, as illustrated in a second drawing from the left in an upper part of FIG. 25, at the boundary with the effective region 131*a* in the ineffective region 131*b*, a configuration similar to that of the effective region 131*a* as an aspheric lens may be extended, and an edge may be formed in a tapered shape as indicated by an edge 2332 of the ineffective region 131*b*.

Moreover, as illustrated in a third drawing from the left in the upper part of FIG. 25, at the boundary with the effective region 131*a* in the ineffective region 131*b*, a configuration similar to that of the effective region 131*a* as an aspheric lens may be extended, and an edge may be formed in a round shape as indicated by an edge 2333 of the ineffective region 131*b*.

Furthermore, as illustrated in an upper right part of FIG. 25, at the boundary with the effective region 131*a* in the ineffective region 131*b*, a configuration similar to that of the effective region 131*a* as an aspheric lens may be extended, and an edge may be formed as a side surface of a multistage structure as indicated by an edge 2334 of the ineffective region 131*b*.

Moreover, as illustrated in a lower left part of FIG. 25, at the boundary with the effective region 131*a* in the ineffective region 131*b*, a configuration similar to that of the effective region 131*a* as an aspheric lens may be extended, and as indicated by an edge 2335 of the ineffective region 131*b*, the edge may have a horizontal planar portion, a mound-like protruding portion protruding over the effective region 131*a* in a direction facing the incident direction of incident light may be formed, and a side surface of the protruding portion may be formed perpendicularly.

Furthermore, as illustrated in a second drawing from the left in a lower part of FIG. 25, at the boundary with the effective region 131*a* in the ineffective region 131*b*, a configuration similar to that of the effective region 131*a* as an aspheric lens may be extended, and as indicated by an edge 2336 of the ineffective region 131*b*, the edge may have a horizontal planar portion, a mound-like protruding portion protruding over the effective region 131*a* in a direction facing the incident direction of incident light may be formed, and a side surface of the protruding portion may be formed in a tapered shape.

Moreover, as illustrated in a third drawing from the left in the lower part of FIG. 25, at the boundary with the effective region 131*a* in the ineffective region 131*b*, a configuration similar to that of the effective region 131*a* as an aspheric lens may be extended, and as indicated by an edge 2337 of the ineffective region 131*b*, the edge may have a horizontal planar portion, a mound-like protruding portion protruding over the effective region 131*a* in a direction facing the incident direction of incident light may be formed, and a side surface of the protruding portion may be formed in a round shape.

Furthermore, as illustrated in a lower right part of FIG. 25, at the boundary with the effective region 131*a* in the ineffective region 131*b*, a configuration similar to that of the effective region 131*a* as an aspheric lens may be extended, and as indicated by an edge 2338 of the ineffective region 131*b*, the edge may have a horizontal planar portion, a mound-like protruding portion protruding over the effective region 131*a* in a direction facing the incident direction of incident light may be formed, and a side surface of the protruding portion may be formed in a multistage structure.

Note that the upper part of FIG. 25 illustrates structure examples in which the edge of the lens 131 has a horizontal planar portion, and a mound-like protruding portion protruding over the effective region 131*a* in a direction facing the incident direction of incident light is not provided. The lower part illustrates structural examples in which the edge of the lens 131 is not provided with a protruding portion having a horizontal planar portion. Furthermore, the upper part and the lower part of FIG. 25 illustrate, both in order from the left, an example in which the edge of the lens 131 is perpendicular to the glass substrate 12, an example in which the edge is formed in a tapered shape, an example in which the edge is formed in a round shape, and an example in which the edge has a plurality of side surfaces in multiple stages.

Figure 26:
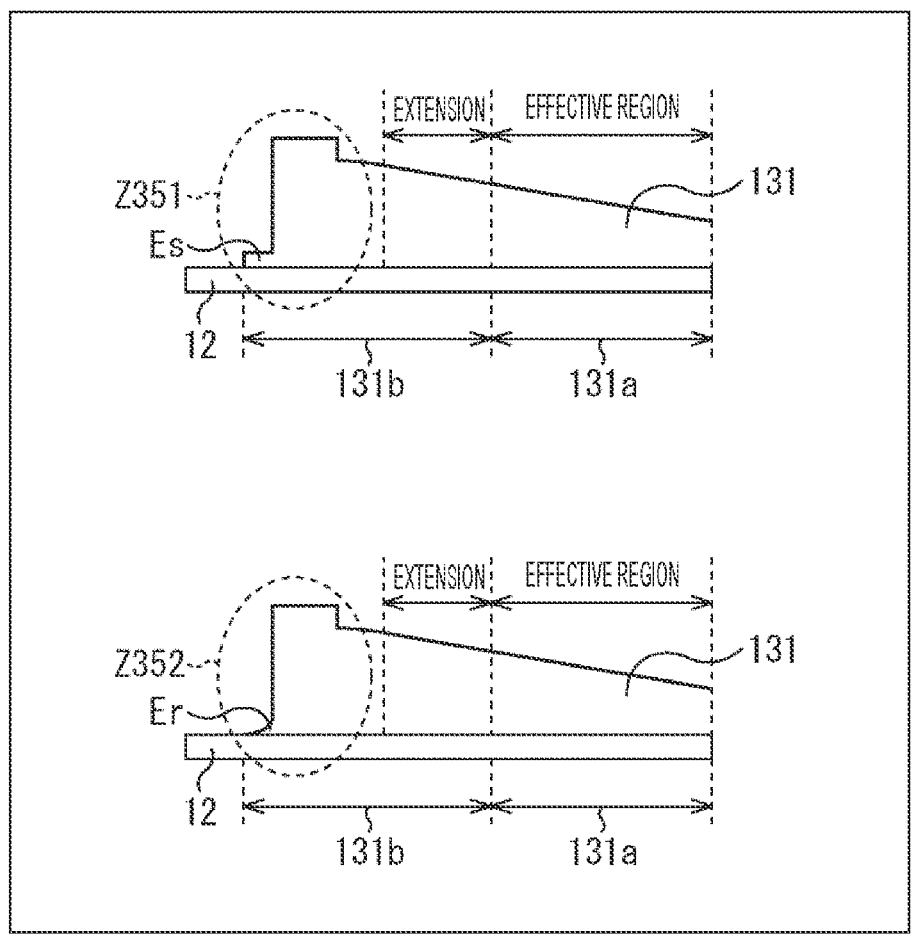
FIG. 26 is a diagram illustrating a modified example of the structure of the edge of the lens in FIG. 23.

Furthermore, as illustrated in an upper part of FIG. 26, at the boundary with the effective region 131*a* in the ineffective region 131*b*, a configuration similar to that of the effective region 131*a* as an aspheric lens may be extended, and as indicated by an edge 2351 of the ineffective region 131*b*, a protruding portion may be formed perpendicular to the glass substrate 12, and moreover, a rectangular boundary structure Es may be left at the boundary with the glass substrate 12 on the solid-state imaging element 11.

Moreover, as illustrated in a lower part of FIG. 26, at the boundary with the effective region 131*a* in the ineffective region 131*b*, a configuration similar to that of the effective region 131a as an aspheric lens may be extended, and as indicated by an edge 2352 of the ineffective region 131b, a protruding portion may be formed perpendicular to the glass substrate 12, and moreover, a round boundary structure Er may be left at the boundary with the glass substrate 12 on the solid-state imaging element 11.

Both of the rectangular boundary structure Es and the round boundary structure Er increase a contact area between the lens 131 and the glass substrate 12. This allows the lens 131 and the glass substrate 12 to be more closely joined, and, as a result, the lens 131 to be prevented from coming unstuck from the glass substrate 12.

Note that the rectangular boundary structure Es and the round boundary structure Er may be used in any of a case where the edge is formed in a tapered shape, a case where the edge is formed in a round shape, or a case where the edge is formed in a multistage structure.

Figure 27:
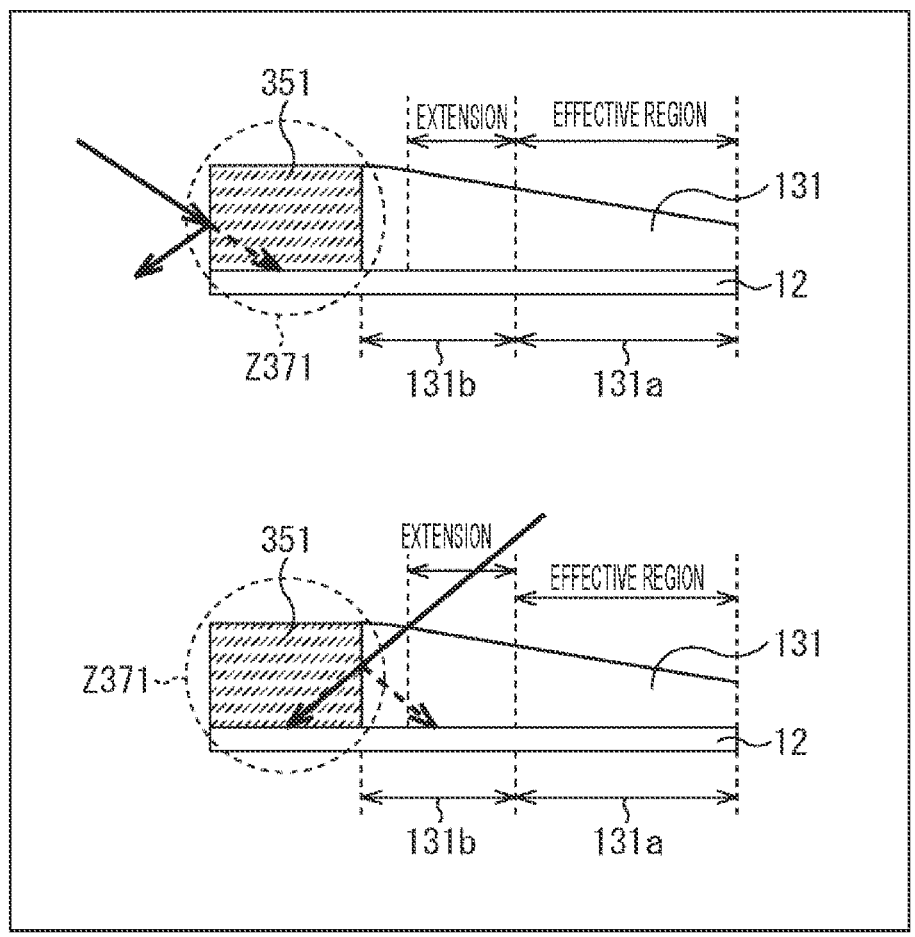
FIG. 27 is a diagram illustrating a modified example of the structure of the edge of the lens in FIG. 23.

Furthermore, as illustrated in FIG. 27, at the boundary with the effective region 131a in the ineffective region 131b, a configuration similar to that of the effective region 131a as an aspheric lens may be extended, and as indicated by an edge 2371 of the ineffective region 131b, a side surface of the lens 131 may be formed perpendicular to the glass substrate 12, and moreover, a refractive film 351 having a predetermined refractive index may be disposed on the glass substrate 12 in the outer circumferential part thereof at substantially the same height as the lens 131.

With this arrangement, for example, in a case where the refractive film 351 has a refractive index higher than the predetermined refractive index, as indicated by a solid arrow in an upper part of FIG. 27, in a case where incident light enters from the outer circumferential part of the lens 131, the incident light is reflected to the outside of the lens 131, and the incident light to the side surface portion of the lens 131 is reduced as indicated by a dotted arrow. As a result, since entry of stray light into the lens 131 is prevented, occurrence of flare and ghosts is prevented.

Furthermore, in a case where the refractive film 351 has a refractive index lower than the predetermined refractive index, light that is not incident on an incidence plane of the solid-state imaging element 11 but is going to pass through from the side surface of the lens 131 to the outside of the lens 131 is allowed to pass through as indicated by a solid arrow in a lower part of FIG. 27, and reflected light from the side surface of the lens 131 is reduced as indicated by a dotted arrow. As a result, since entry of stray light into the lens 131 is prevented, occurrence of flare and ghosts can be prevented.

Moreover, in FIG. 27, the example has been described in which the refractive film 351 is formed at the same height as the lens 131 on the glass substrate 12 and has an edge formed perpendicularly, but other shapes may be adopted.

Figure 28:
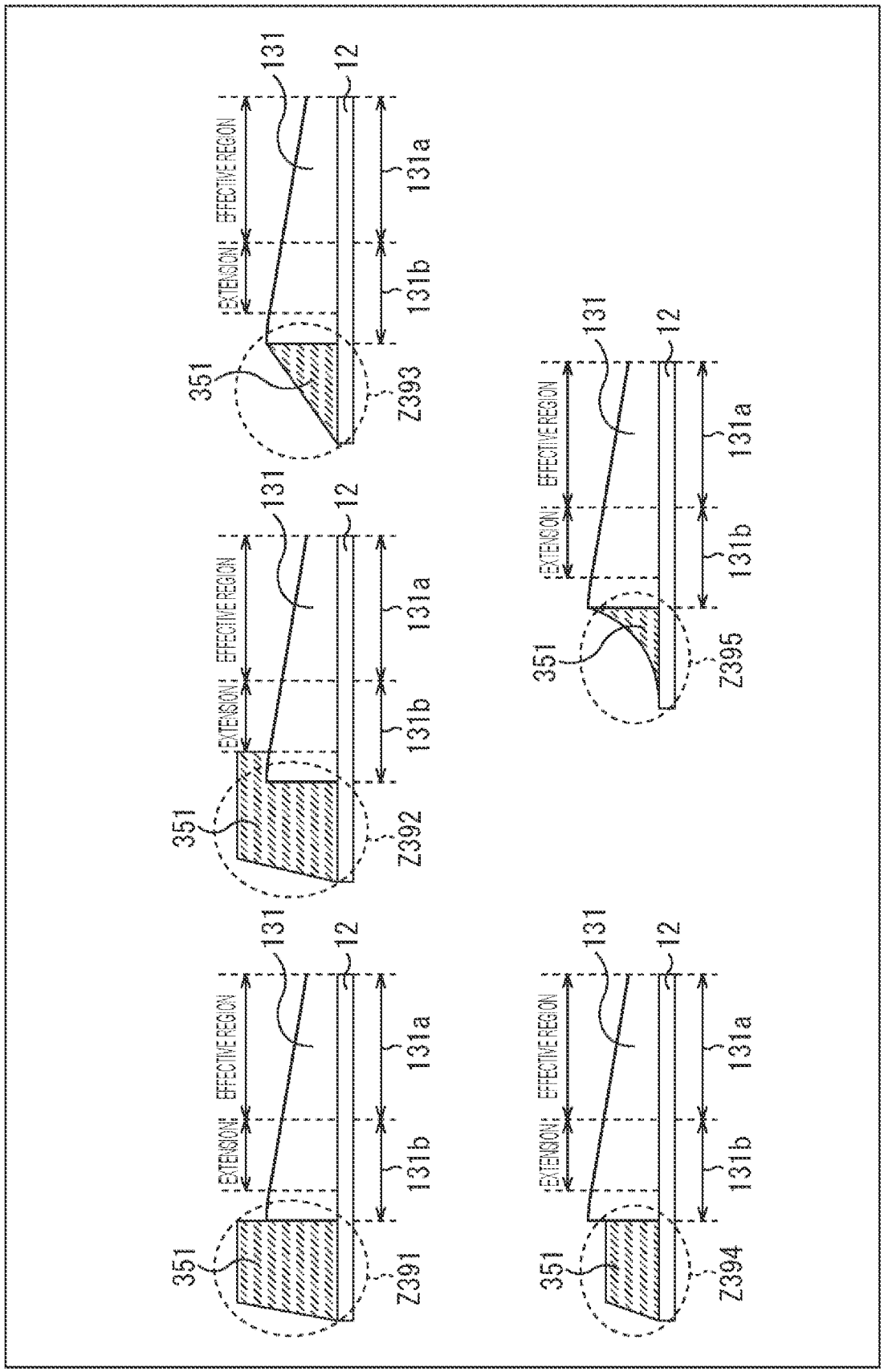
FIG. 28 is a diagram illustrating a modified example of the structure of the edge of the lens in FIG. 23.

For example, as indicated by a region 2391 in an upper left part of FIG. 28, the refractive film 351 may be formed in a tapered shape at an edge on the glass substrate 12 and have a thickness larger than the height of the edge of the lens 131.

Furthermore, for example, as indicated by a region 2392 in an upper central part of FIG. 28, the refractive film 351 may be formed in a tapered shape at an edge and have a thickness larger than the height of the edge of the lens 131, and moreover, may partially cover the ineffective region 131b of the lens 131.

Moreover, for example, as indicated by a region 2393 in an upper right part of FIG. 28, the refractive film 351 may be formed in a tapered shape from the height of the edge of the lens 131 to the edge of the glass substrate 12.

Furthermore, for example, as indicated by a region 2394 in a lower left part of FIG. 28, the refractive film 351 may be formed in a tapered shape at the edge of the glass substrate 12 and have a thickness smaller than the height of the edge of the lens 131.

Moreover, for example, as indicated by a region 2395 in a lower right part of FIG. 28, the refractive film 351 may be recessed toward the glass substrate 12 with respect to the height of the edge of the lens 131 and formed in a round shape.

In any of the configurations in FIGS. 27 and 28, since entry of stray light into the lens 131 is prevented, occurrence of flare and ghosts can be prevented.

16. Sixteenth Embodiment

In the above description, the example has been described in which flare and ghosts are reduced by a configuration that makes the lens 131 less likely to come unstuck from the glass substrate 12 or a configuration that prevents entry of stray light. However, flare and ghosts may be reduced by a configuration that prevents burrs of an adhesive generated at the time of processing.

That is, a consideration will be given to a case of a configuration in which, as illustrated in an upper part of FIG. 29, an IRCF 14 is formed on a solid-state imaging element 11, and a glass substrate 12 is bonded onto the IRCF 14 by an adhesive 15 (e.g., the case of the configuration according to the seventh embodiment in FIG. 15). Note that the configuration in FIG. 29 corresponds to the configuration except for the lens in the integrated component 10 in the imaging device 1 in FIG. 15.

In this case, the IRCF 14 needs to have a film thickness of a predetermined thickness, but it is generally difficult to increase viscosity of a material of the IRCF 14, and a desired film thickness cannot be formed at a time. However, in a case where overcoating is performed, there has been a possibility that microvoids and bubbles are generated, and optical characteristics are deteriorated.

Furthermore, the glass substrate 12 is bonded by the adhesive 15 after the IRCF 14 has been formed on the solid-state imaging element 11. However, warpage occurs due to curing shrinkage of the IRCF 14, and thus poor joining between the glass substrate 12 and the IRCF 14 may occur. Moreover, there has been a possibility that the glass substrate 12 alone cannot force the warpage of the IRCF 14, and the entire device warps, which results in deterioration of the optical characteristics.

Figure 29:
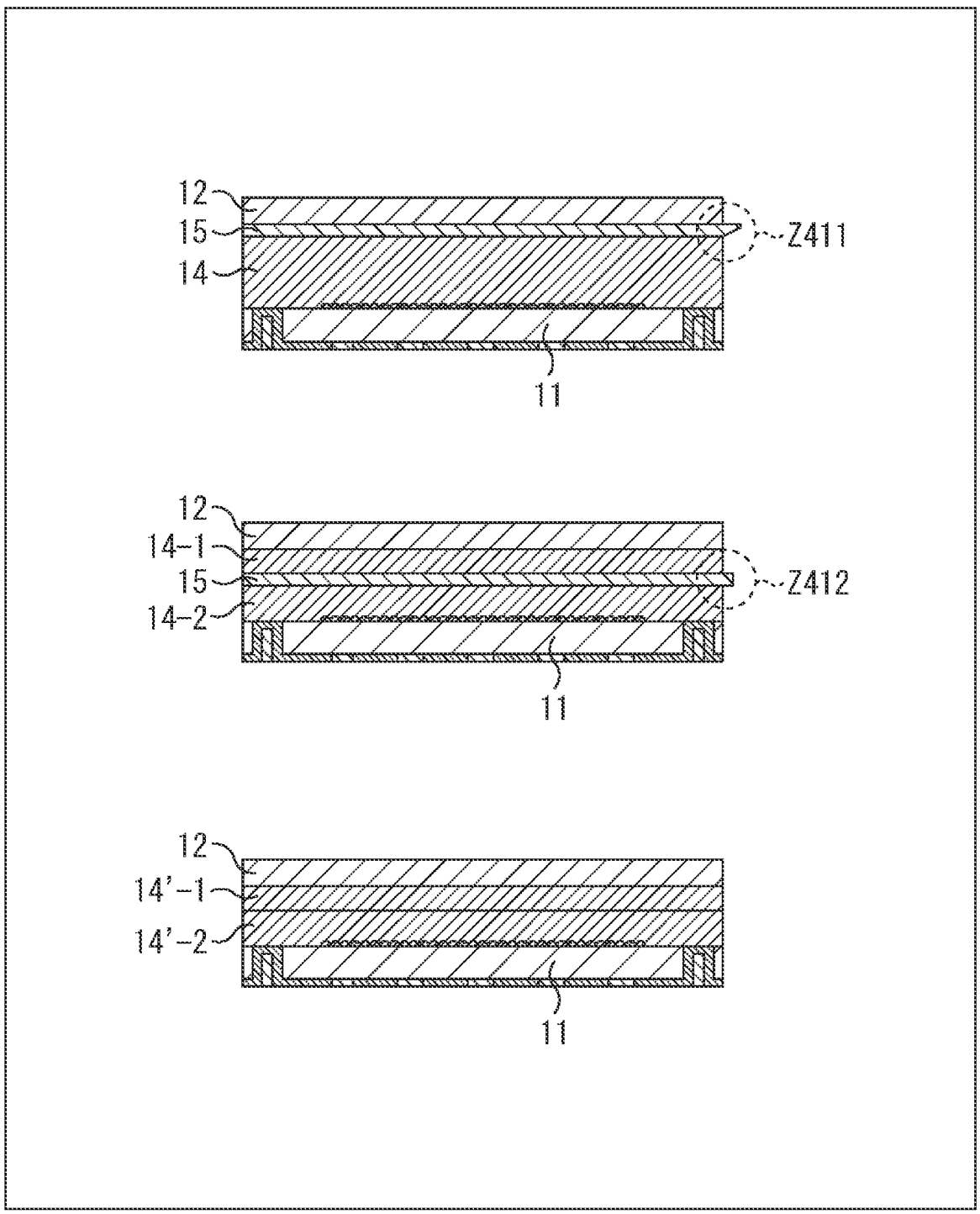
FIG. 29 is a diagram illustrating a configuration example of a sixteenth embodiment of an imaging device of the present disclosure.

Moreover, in particular, in a case where the glass substrate 12 and the IRCF 14 are joined via the adhesive 15, a resin burr attributable to the adhesive 15 is generated at the time of singulation as indicated by a range 2411 in an upper part of FIG. 29, and there has been a possibility that a machining accuracy is reduced at the time of mounting such as pickup.

Thus, as illustrated in a middle part of FIG. 29, the IRCF 14 is divided into two so as to be IRCFs 14-1 and 14-2, and the IRCFs 14-1 and 14-2 are bonded together with the adhesive 15.

With such a configuration, at the time of formation of films of the IRCFs 14-1 and 14-2, each of them can be formed as a thin film in a divided manner, and this facilitates formation of a thick film (divided formation) for obtaining desired spectral characteristics.

Furthermore, when the glass substrate 12 is joined to the solid-state imaging element 11, irregularities (irregularities due to sensors such as a PAD) on the solid-state imaging element 11 can be flattened by the IRCF 14-2 before the joining. This allows the adhesive 15 to be thinner, and as a result, the imaging device 1 can be reduced in height.

Moreover, warpage is compensated by the IRCFs 14-1 and 14-2 formed on the glass substrate 12 and the solid-state imaging element 11, respectively, and thus warpage of a device chip can be reduced.

Furthermore, glass has an elastic modulus higher than that of the IRCFs 14-1 and 14-2. In a case where the elastic modulus of the IRCFs 14-1 and 14-2 is set to be higher than the elastic modulus of the adhesive 15, the upper and lower sides of the adhesive 15 having a lower elastic modulus are covered with the IRCFs 14-1 and 14-2 having a higher elastic modulus than the adhesive 15 at the time of singulation. This allows for prevention of generation of resin burrs at the time of singulation (expanding) as indicated by a range 2412 in the upper part of FIG. 29.

Moreover, as illustrated in a lower part of FIG. 29, IRCFs 14'-1 and 14'-2 having a function as an adhesive may be formed and directly bonded together so as to face each other. In this way, it is possible to prevent generation of resin burrs of the adhesive 15 generated at the time of singulation.

<Manufacturing Method>

Next, a manufacturing method of joining the glass substrate 12 to the solid-state imaging element 11 with the adhesive 15 sandwiched between the IRCFs 14-1 and 14-2 illustrated in the middle part of FIG. 29 will be described with reference to FIG. 30.

Figure 30:
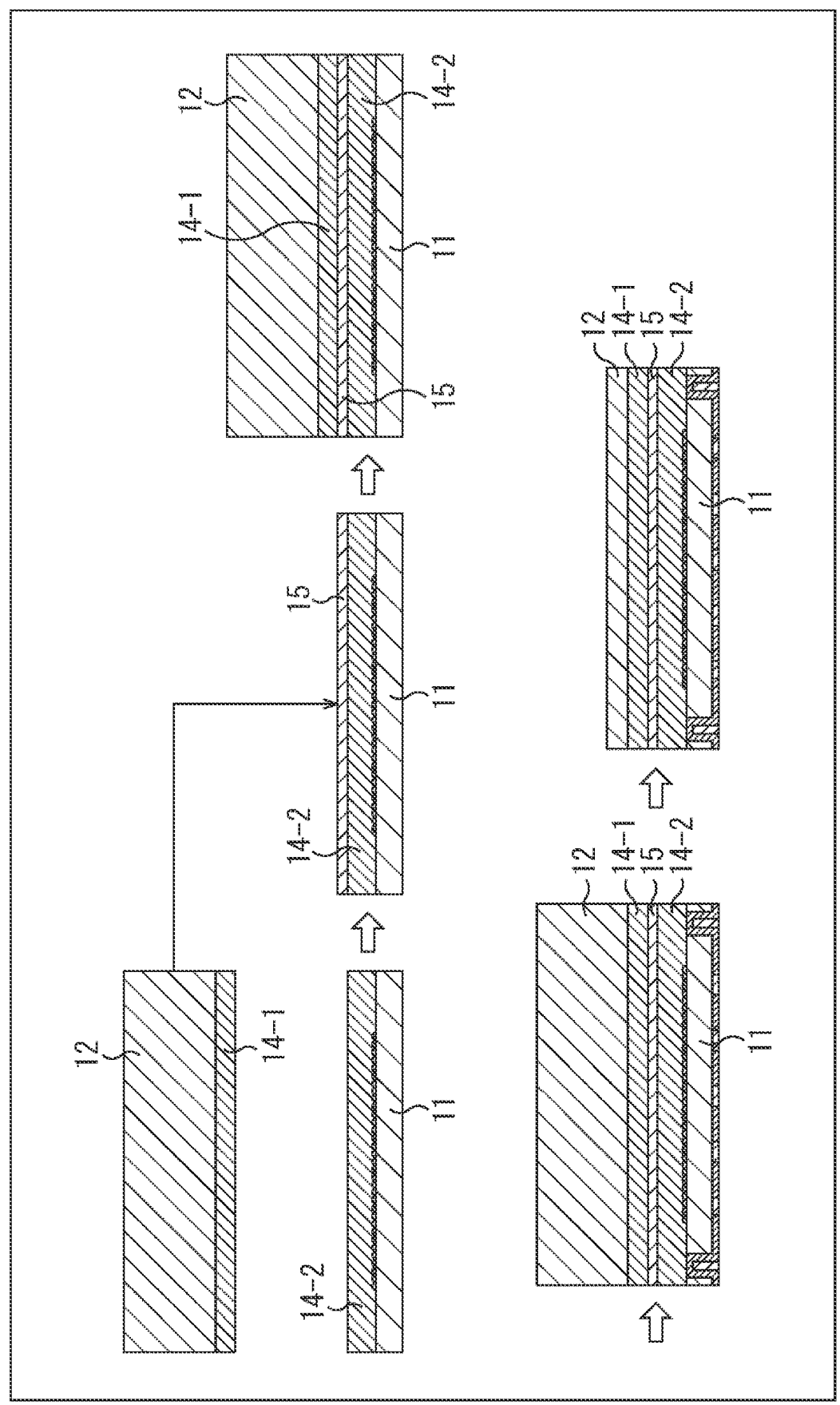
FIG. 30 is a diagram illustrating a method of manufacturing the imaging device in FIG. 29.

In a first step, as illustrated in an upper left part of FIG. 30, the IRCF 14-1 is applied to and formed on the glass substrate 12. Furthermore, the IRCF 14-2 is applied to and formed on the solid-state imaging element 11. Note that, in the upper left part of FIG. 30, the glass substrate 12 is drawn upside down after the IRCF 14-2 has been applied to and formed on the glass substrate 12.

In a second step, the adhesive 15 is applied onto the IRCF 14-2, as illustrated in an upper central part of FIG. 30.

In a third step, as illustrated in an upper right part of FIG. 30, the IRCF 14-1 on the glass substrate 12 is bonded onto the adhesive 15 illustrated in the upper central part of FIG. 30 so as to face the surface to which the adhesive 15 has been applied.

In a fourth step, as illustrated in a lower left part of FIG. 30, an electrode is formed on the rear surface side of the solid-state imaging element 11.

In a fifth step, as illustrated in a lower central part of FIG. 30, the glass substrate 12 is thinned by polishing.

Then, after the fifth step, edges are cut with a blade or the like for singulation, and thus the solid-state imaging element 11 is completed in which the IRCFs 14-1 and 14-2 are laminated on the imaging surface, and the glass substrate 12 is further formed thereon.

Through the above steps, the adhesive 15 is sandwiched between the IRCFs 14-1 and 14-2, and this allows for prevention of generation of burrs accompanying the singulation.

Furthermore, the IRCFs 14-1 and 14-2 can be formed so that each has a half of a required film thickness, and the required thickness of overcoating can be reduced, or overcoating is unnecessary. This prevents generation of microvoids and bubbles, and deterioration of the optical characteristics can be reduced.

Moreover, since the film thickness of each of the IRCFs 14-1 and 14-2 becomes thin, it is possible to reduce warpage due to curing shrinkage, it is possible to prevent occurrence of poor joining between the glass substrate 12 and the IRCF 14, and it is possible to prevent deterioration of the optical characteristics attributable to warpage.

Note that, as illustrated in the lower part of FIG. 29, in a case where the IRCFs 14'-1 and 14'-2 having the function of an adhesive are used, only the step of applying the adhesive 15 is omitted, and thus the description thereof is omitted.

<Modified Example of Shape of Side Surface after Singulation>

When the solid-state imaging element 11 in which the IRCFs 14-1 and 14-2 are formed and the glass substrate 12 is further formed is singulated by the manufacturing method described above, it is assumed that the edges are cut with a blade or the like so that a side cross section is perpendicular to the imaging surface.

However, the shapes of the side cross sections of the IRCFs 14-1 and 14-2 and the glass substrate 12 formed on the solid-state imaging element 11 may be adjusted so that an influence of fallen debris attributable to the glass substrate 12, the IRCFs 14-1 and 14-2, and the adhesive 15 may be further reduced.

Figure 31:
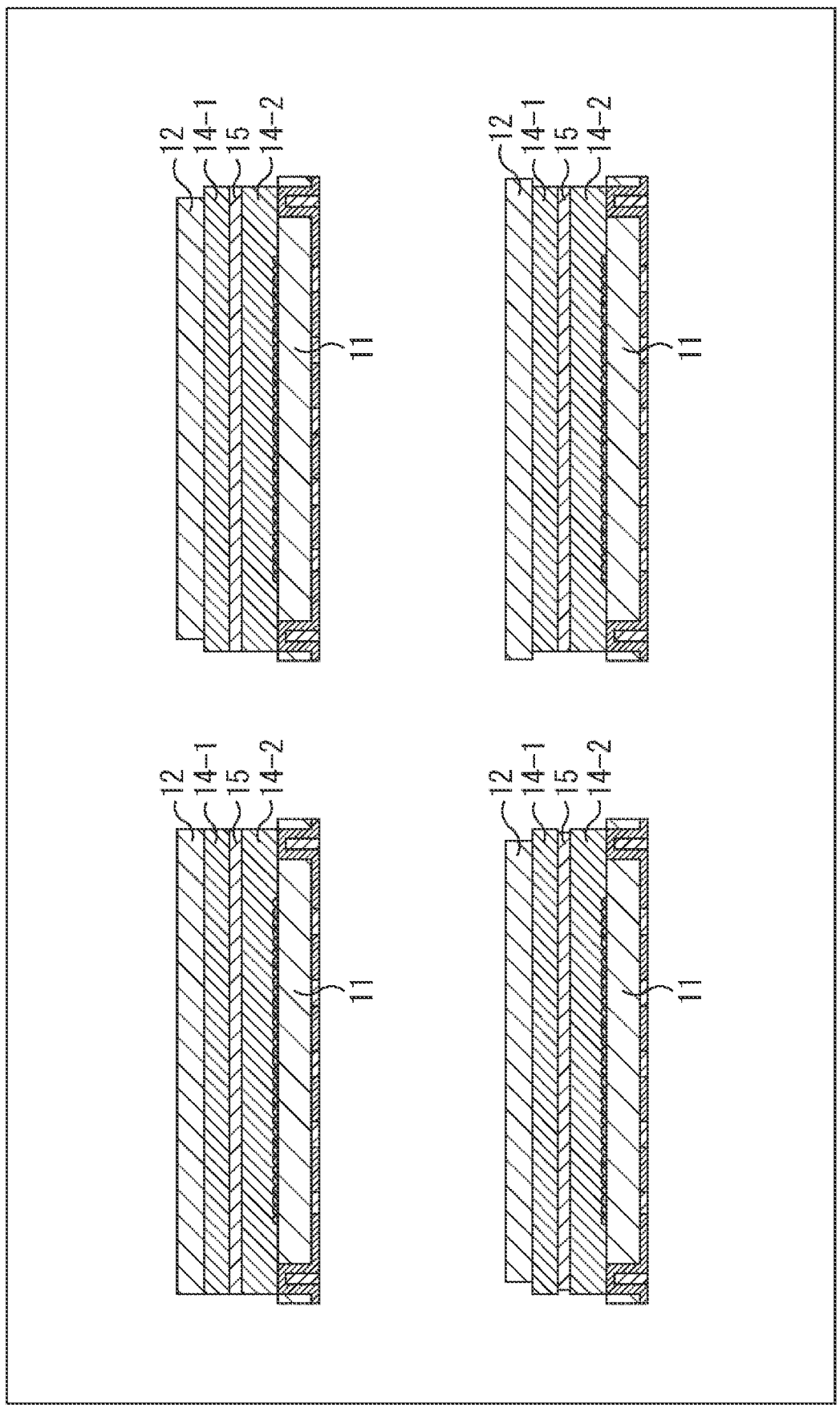
FIG. 31 is a diagram illustrating a modified example of a cross section of singulation of the configuration example in FIG. 29.

For example, as illustrated in an upper left part of FIG. 31, the side cross sections may be formed such that the external shape in the horizontal direction of the solid-state imaging element 11 is the largest, the external shapes of the glass substrate 12, the IRCFs 14-1 and 14-2, and the adhesive 15 are all equal and smaller than that of the solid-state imaging element 11.

Moreover, as illustrated in an upper right part of FIG. 31, the side cross sections may be formed such that the external shape in the horizontal direction of the solid-state imaging element 11 is the largest, the external shapes of the IRCFs 14-1 and 14-2 and the adhesive 15 are equal and the second largest after that of the solid-state imaging element 11, and the external shape of the glass substrate 12 is the smallest.

Furthermore, as illustrated in a lower left part of FIG. 31, the side cross sections may be formed such that the order of the sizes of the external shapes in the horizontal direction is, in descending order, the solid-state imaging element 11, the IRCFs 14-1 and 14-2, the adhesive 15, and the glass substrate 12.

Furthermore, as illustrated in a lower right part of FIG. 31, the side cross sections may be formed such that the external shape in the horizontal direction of the solid-state imaging element 11 is the largest, the external shape of the glass substrate 12 is the second largest, and the external shapes of the IRCFs 14-1 and 14-2 and the adhesive 15 are equal and the smallest.

<Singulation Method for Upper Left Part of FIG. 31>

Next, a singulation method for the upper left part of FIG. 31 will be described with reference to FIG. 32.

Figure 32:
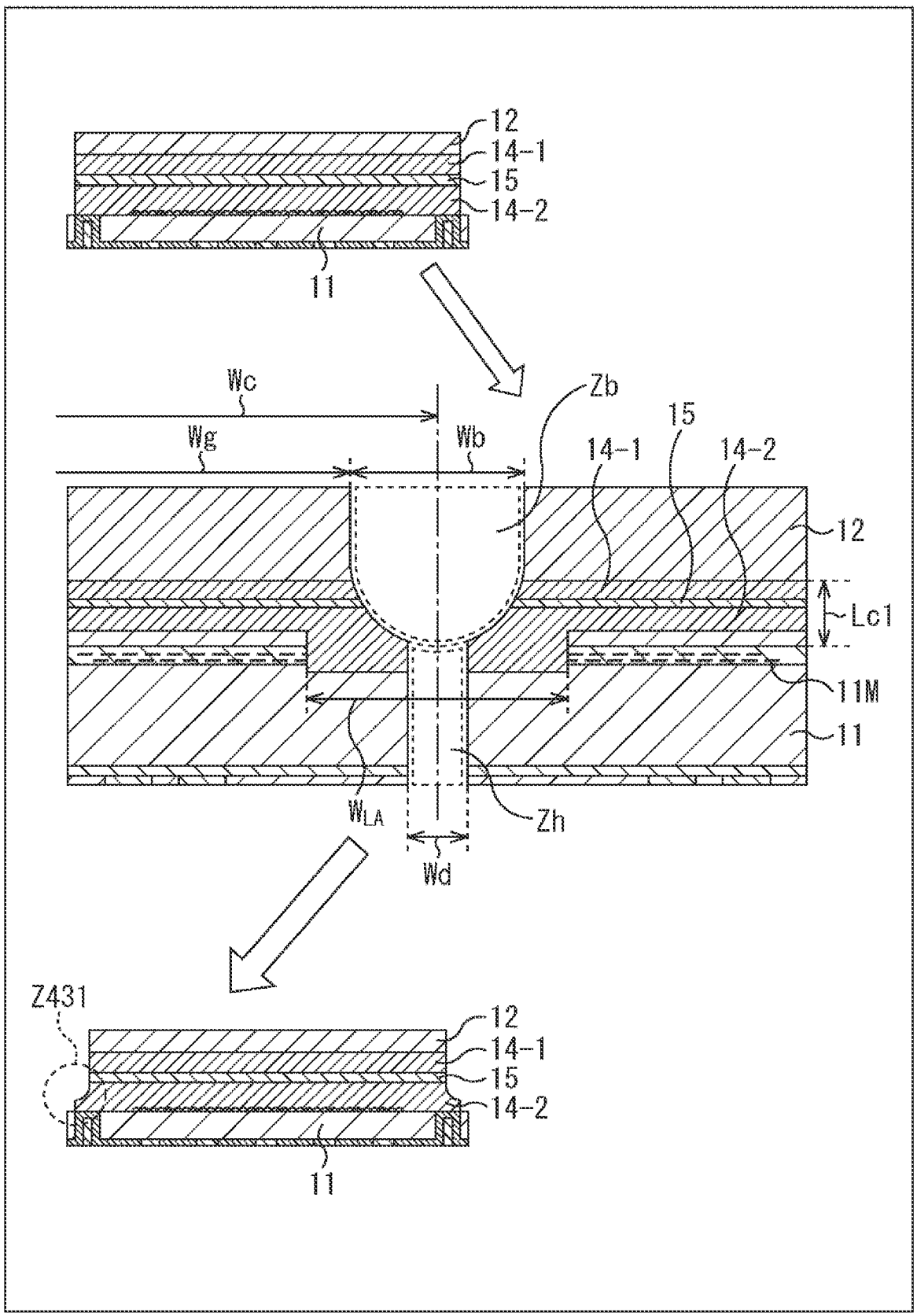
FIG. 32 is a diagram illustrating the method of manufacturing the imaging device in an upper left part of FIG. 31.

An upper part of FIG. 32 illustrates a diagram illustrating a side cross section illustrated in the upper left part of FIG. 31. That is, the upper part of FIG. 32 illustrates the side cross sections in which the external shape in the horizontal direction of the solid-state imaging element 11 is the largest, the external shapes of the glass substrate 12, the IRCFs 14-1 and 14-2, and the adhesive 15 are all equal and the second largest, and are smaller than that of the solid-state imaging element 11

Here, a method of forming the side cross sections illustrated in the upper left part of FIG. 31 will be described with reference to a middle part of FIG. 32. Note that the middle part of FIG. 32 is an enlarged view of a boundary between neighboring solid-state imaging elements 11 cut by singulation as viewed from a side.

In a first step, at the boundary between the neighboring solid-state imaging elements 11, a range Zb including the glass substrate 12, the IRCFs 14-1 and 14-2, and the adhesive 15 is cut from a surface layer of the IRCF 14-1 to a depth Lc1 with a blade having a predetermined width Wb (e.g., about 100 μm).

Here, in a central part of FIG. 32, the position corresponding to the depth Lc from the surface layer of the IRCF 14-1 is at a surface layer of the solid-state imaging element 11, and is a position up to a wiring layer 11M formed by Cu-to-Cu bonding or the like. However, it is only required that the position reaches the surface layer of the solid-state imaging element 11. Thus, as for the depth Lc1, the cut may reach a surface layer of the semiconductor substrate 81 in FIG. 6.

Furthermore, as illustrated in the central part of FIG. 32, the boundary is cut with the blade in a state of being centered at a center position of the neighboring solid-state imaging elements 11 indicated by a long dashed short dashed line. Furthermore, in the drawing, a width WLA is a width in which a wiring layer formed at edges of the two neighboring solid-state imaging elements 11 is formed. Moreover, a width to the center of a scribe line of one chip of the solid-state imaging element 11 is a width Wc, and a width to the edge of the glass substrate 12 is a width Wg.

Moreover, the range Zb corresponds to the shape of the blade, in which an upper part is represented by the width Wb of the blade and a lower part is expressed by a hemispherical shape, in accordance with the shape of the blade.

In a second step, for example, from a Si substrate (semiconductor substrate 81 in FIG. 6) of the solid-state imaging element 11, a range Zh having a predetermined width Wd (e.g., about 35 μm) thinner than the blade with which the glass substrate 12 has been cut is cut out by dry etching, laser dicing, or a blade, and thus the solid-state imaging element 11 is singulated into individual pieces. However, in the case of laser dicing, the width Wd is substantially zero. Furthermore, the shape of cutting can be adjusted to a desired shape by dry etching, laser dicing, or a blade.

As a result, as illustrated in a lower part of FIG. 32, the side cross sections are formed such that the external shape in the horizontal direction of the solid-state imaging element 11 is the largest, the external shapes of the glass substrate 12, the IRCFs 14-1 and 14-2, and the adhesive 15 are all equal and smaller than that of the solid-state imaging element 11.

Note that, in the lower part of FIG. 32, as indicated by a range 2431, a part of the IRCF 14-2 in the horizontal direction in the vicinity of the boundary with the solid-state imaging element 11 is drawn to be wider than the IRCF 14-1 in width in the horizontal direction, and this is different from the shapes of the side cross sections of the glass substrate 12, the IRCFs 14-1 and 14-2, and the adhesive 15 in the upper part of FIG. 32.

However, this is a result of drawing with emphasis on the shape of cutting with the blade, and the configuration in the lower part of FIG. 32 and the configuration in the upper part of FIG. 32 become substantially the same when the shape of cutting has been adjusted by dry etching, laser dicing, or a blade.

Furthermore, the processing of cutting the Si substrate (semiconductor substrate 81 in FIG. 6) forming the solid-state imaging element 11 by the range Zh may be executed before the work of cutting the range Zb, and at this time, the work may be performed with the state illustrated in the middle part of FIG. 32 turned upside down.

Moreover, since the wiring layer is likely to get cracked or have a film coming unstuck during blade dicing, the range Zh may be cut by ablation processing with a short pulse laser.

<Singulation Method for Upper Right Part of FIG. 31>

Next, a singulation method for the upper right part of FIG. 31 will be described with reference to FIG. 33.

Figure 33:
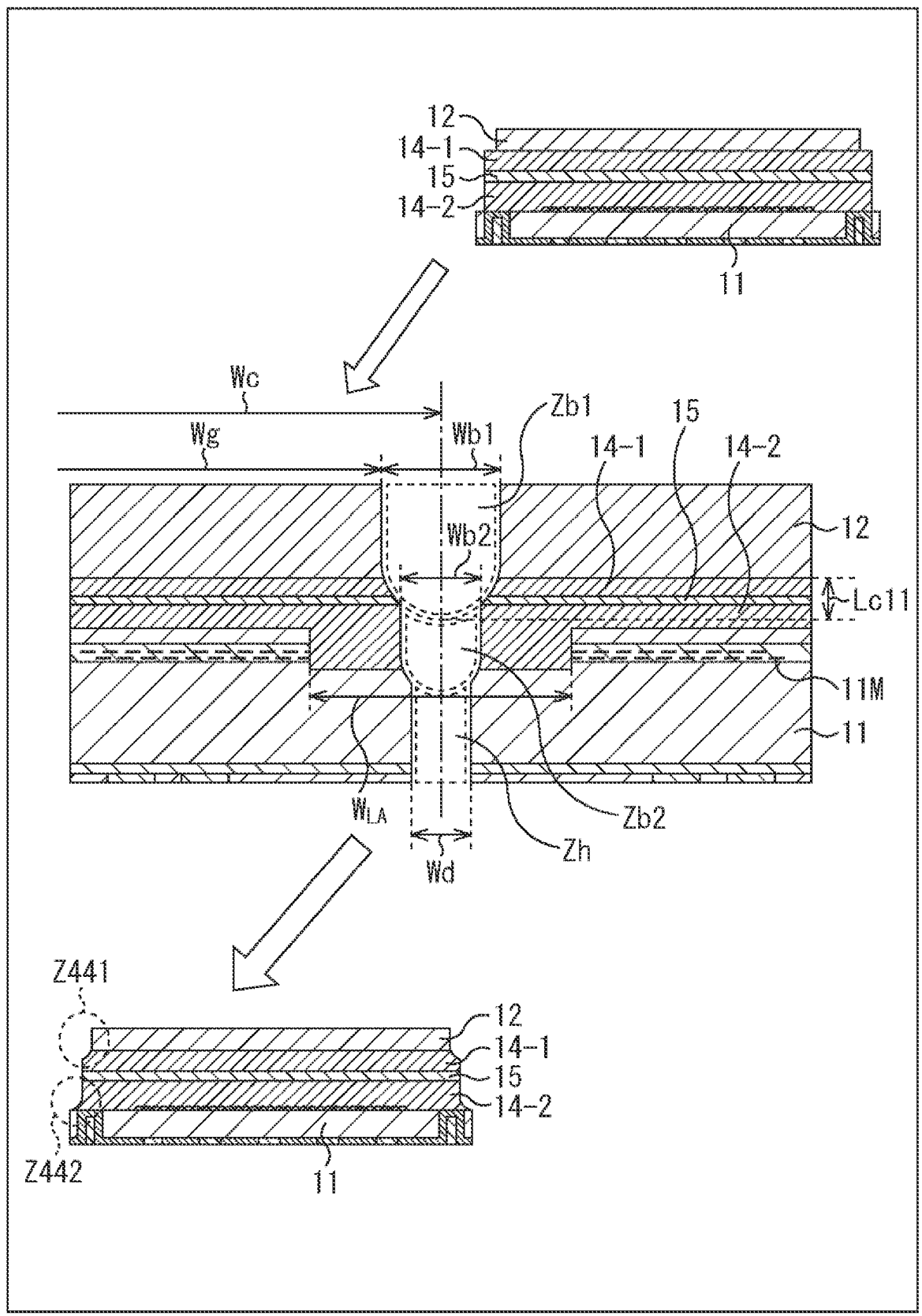
FIG. 33 is a diagram illustrating the method of manufacturing the imaging device in a lower left part of FIG. 31.

An upper part of FIG. 33 illustrates a diagram illustrating a side cross section illustrated in the upper right part of FIG. 31. That is, the upper part of FIG. 33 illustrates the side cross sections formed such that the external shape in the horizontal direction of the solid-state imaging element 11 is the largest, the external shapes of the IRCFs 14-1 and 14-2 and the adhesive 15 are equal and the second largest after that of the solid-state imaging element 11, and the external shape of the glass substrate 12 is the smallest.

Here, a method of forming the side cross sections illustrated in the upper right part of FIG. 31 will be described with reference to a middle part of FIG. 33. Note that the middle part of FIG. 33 is an enlarged view of a boundary between neighboring solid-state imaging elements 11 cut by singulation as viewed from a side.

In a first step, a range Zb1 including the glass substrate 12, the IRCFs 14-1 and 14-2, and the adhesive 15 is cut from a surface layer of the IRCF 14-1 to a depth Lc11 with a blade having a predetermined width Wb1 (e.g., about 100 μm).

In a second step, a range Zb2 having a depth exceeding the wiring layer 11M is cut with a blade having a predetermined width Wb2 (<width Wb1).

In a third step, for example, from a Si substrate (semiconductor substrate 81 in FIG. 6), a range Zh having a predetermined width Wd (e.g., about 35 μm) thinner than the width Wb2 is cut out by dry etching, laser dicing, or a blade, and thus the solid-state imaging element 11 is singulated into individual pieces. However, in the case of laser dicing, the width Wd is substantially zero. Furthermore, the shape of cutting can be adjusted to a desired shape by dry etching, laser dicing, or a blade.

As a result, as illustrated in a lower part of FIG. 33, the side cross sections are formed such that the external shape in the horizontal direction of the solid-state imaging element 11 is the largest, the external shapes of the IRCFs 14-1 and 14-2 and the adhesive 15 are equal and the second largest after that of the solid-state imaging element 11, and the glass substrate 12 is the smallest.

Note that, in the lower part of FIG. 33, as indicated by a range Z441, a part of the IRCF 14-1 in the horizontal direction is drawn to have the same width in the horizontal direction as the glass substrate 12. Furthermore, as indicated by a range Z442, a part of the IRCF 14-2 in the horizontal direction is drawn to be wider than the IRCF 14-1 in width in the horizontal direction.

Thus, the shapes of the side cross sections of the glass substrate 12, the IRCFs 14-1 and 14-2, and the adhesive 15 in the lower part of FIG. 33 are different from the shapes in the upper part of FIG. 33.

However, this is a result of drawing with emphasis on the shape of cutting with the blade, and the configuration in the lower part of FIG. 32 and the configuration in the upper part of FIG. 32 become substantially the same when the shape of cutting has been adjusted by dry etching, laser dicing, or a blade.

Furthermore, the processing of cutting the Si substrate (semiconductor substrate 81 in FIG. 6) forming the solid-state imaging element 11 by the range Zh may be executed before the work of cutting the ranges Zb1 and Zb2, and at this time, the work may be performed with the state illustrated in the middle part of FIG. 33 turned upside down.

Moreover, since the wiring layer is likely to get cracked or have a film coming unstuck during blade dicing, the range Zh may be cut by ablation processing with a short pulse laser.

<Singulation Method for Lower Left Part of FIG. 31>

Next, a singulation method for the lower left part of FIG. 31 will be described with reference to FIG. 34.

Figure 34:
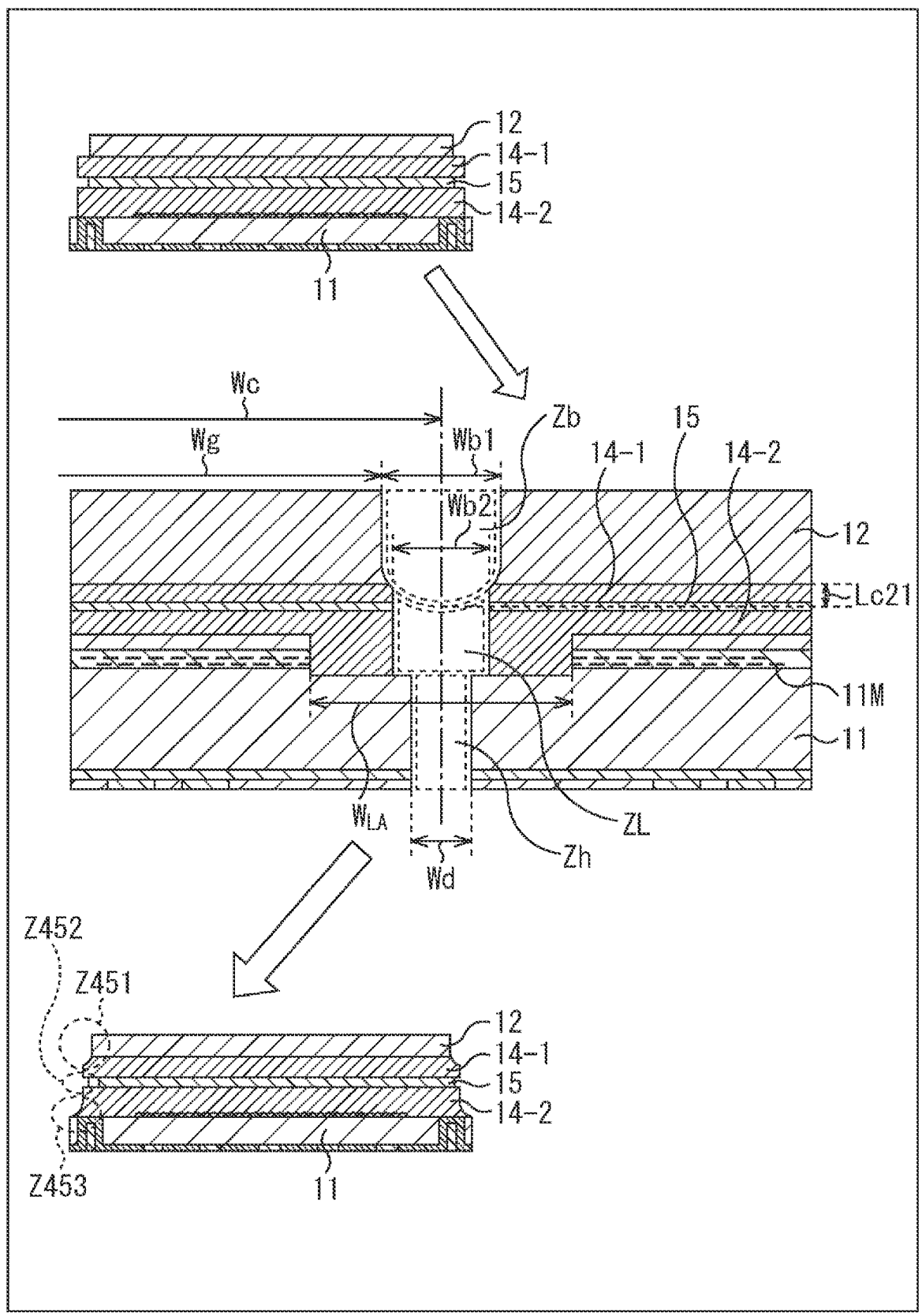
FIG. 34 is a diagram illustrating the method of manufacturing the imaging device in an upper right part of FIG. 31.

An upper part of FIG. 34 illustrates a diagram illustrating a side cross section illustrated in the lower left part of FIG. 31. That is, the upper part of FIG. 34 illustrates the side cross sections in which the order of the sizes of the external shapes in the horizontal direction is, in descending order, the solid-state imaging element 11, the IRCFs 14-1 and 14-2, the adhesive 15, and the glass substrate 12.

Here, a method of forming the side cross sections illustrated in the upper right part of FIG. 31 will be described with reference to a middle part of FIG. 34. Note that the middle part of FIG. 34 is an enlarged view of a boundary between neighboring solid-state imaging elements 11 cut by singulation as viewed from a side.

In a first step, a range Zb including the glass substrate 12, the IRCFs 14-1 and 14-2, and the adhesive 15 is cut from a surface layer of the IRCF 14-2 to a depth Lc21 with a blade having a predetermined width Wb1 (e.g., about 100 µm).

In a second step, laser ablation processing is performed only on a predetermined width Wb2 (<width Wb1), and a range ZL up to a depth exceeding the wiring layer 11M is cut.

In this step, the IRCFs 14-1 and 14-2 and the adhesive 15 thermally shrink due to absorption of the laser light in the vicinity of a processed surface, so that the adhesive 15 retracts with respect to cut surfaces of the IRCFs 14-1 and 14-2 due to wavelength dependence, and forms a recessed shape.

In a third step, for example, from a Si substrate (semiconductor substrate 81 in FIG. 6), a range Zh having a predetermined width Wd (e.g., about 35 µm) thinner than the width Wb2 is cut out by dry etching, laser dicing, or a blade, and thus the solid-state imaging element 11 is singulated into individual pieces. However, in the case of laser dicing, the width Wd is substantially zero. Furthermore, the shape of cutting can be adjusted to a desired shape by dry etching, laser dicing, or a blade.

As a result, as illustrated in a lower part of FIG. 34, the side cross sections are formed such that the external shape in the horizontal direction of the solid-state imaging element 11 is the largest, the external shapes of the IRCFs 14-1 and 14-2 are the largest after that, and then the external shape of the adhesive 15 is the largest after that, and the glass substrate 12 is the smallest. That is, as indicated by a range 2452 in the lower part of FIG. 34, the external shape of the adhesive 15 is smaller than the external shapes of the IRCFs 14-1 and 14-2.

Note that, in the lower part of FIG. 34, as indicated by a range 2453, a part of the IRCF 14-2 in the horizontal direction is drawn to be wider than the IRCF 14-1 in width in the horizontal direction. Furthermore, as indicated by a range 2451, a part of the IRCF 14-1 in the horizontal direction is drawn to have the same width in the horizontal direction as the glass substrate 12.

Thus, the shapes of the side cross sections of the glass substrate 12, the IRCFs 14-1 and 14-2, and the adhesive 15 in the lower part of FIG. 34 are different from the shapes in the upper part of FIG. 34.

However, this is a result of drawing with emphasis on the shape of cutting with the blade, and the configuration in the lower part of FIG. 32 and the configuration in the upper part of FIG. 32 become substantially the same when the shape of cutting has been adjusted by dry etching, laser dicing, or a blade.

Furthermore, the processing of cutting the Si substrate (semiconductor substrate 81 in FIG. 6) forming the solid-state imaging element 11 by the range Zh may be executed before the work of cutting the ranges Zb and ZL, and at this time, the work may be performed with the state illustrated in the middle part of FIG. 34 turned upside down.

Moreover, since the wiring layer is likely to get cracked or have a film coming unstuck during blade dicing, the range Zh may be cut by ablation processing with a short pulse laser.

<Singulation Method for Lower Right Part of FIG. 31>

Next, a singulation method for the lower right part of FIG. 31 will be described with reference to FIG. 35.

Figure 35:
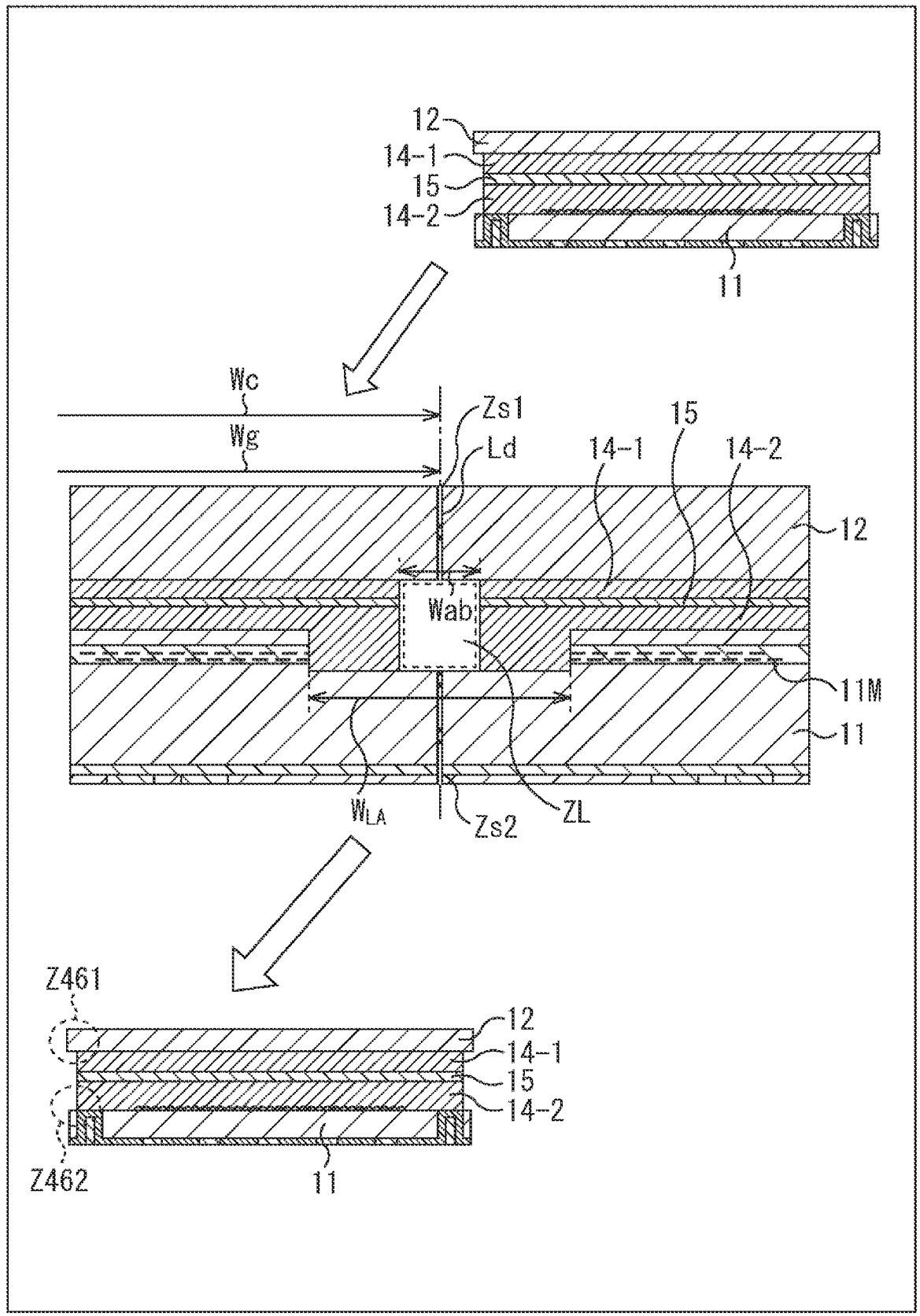
FIG. 35 is a diagram illustrating the method of manufacturing the imaging device in a lower right part of FIG. 31.

An upper part of FIG. 35 illustrates a diagram illustrating a side cross section illustrated in the lower right part of FIG. 31. That is, the upper part of FIG. 35 illustrates the side cross sections in which the external shape in the horizontal direction of the solid-state imaging element 11 is the largest, the external shape of the glass substrate 12 is the second largest, and the external shapes of the IRCFs 14-1 and 14-2 and the adhesive 15 are equal and the smallest.

Here, a method of forming the side cross sections illustrated in the lower right part of FIG. 31 will be described with reference to a middle part of FIG. 35. Note that the middle part of FIG. 35 is an enlarged view of a boundary between neighboring solid-state imaging elements 11 cut by singulation as viewed from a side.

In a first step, the glass substrate 12 in a range Zs1 having a width Ld of substantially zero is cut by so-called stealth (laser) dicing using a laser.

In a second step, laser ablation processing is performed only on a predetermined width Wab, and a range ZL having a depth exceeding the IRCFs 14-1 and 14-2 and the wiring layer 11M in the solid-state imaging element 11 is cut.

In this step, ablation processing using a laser is adjusted so that the cut surfaces of the IRCFs 14-1 and 14-2 and the adhesive 15 are the same.

In a third step, a range Zs2 having a width of substantially zero is cut by so-called stealth (laser) dicing using a laser, and the solid-state imaging element 11 is singulated into individual pieces. At this time, organic matter generated by the ablation is discharged to the outside through a groove formed by the stealth dicing.

As a result, as indicated by ranges 2461 and 2462 in a lower part of FIG. 35, the side cross sections are formed such that the external shape in the horizontal direction of the solid-state imaging element 11 is the largest, the external shape of the glass substrate 12 is the second largest, and the external shapes of the IRCFs 14-1 and 14-2 and the adhesive 15 are equal and the smallest.

Furthermore, the order of performing the stealth dicing processing on the glass substrate 12 and the stealth dicing processing on the solid-state imaging element 11 may be changed, and at this time, the work may be performed with the state illustrated in the middle part of FIG. 35 turned upside down.

<Addition of Antireflection Film>

Figure 36:
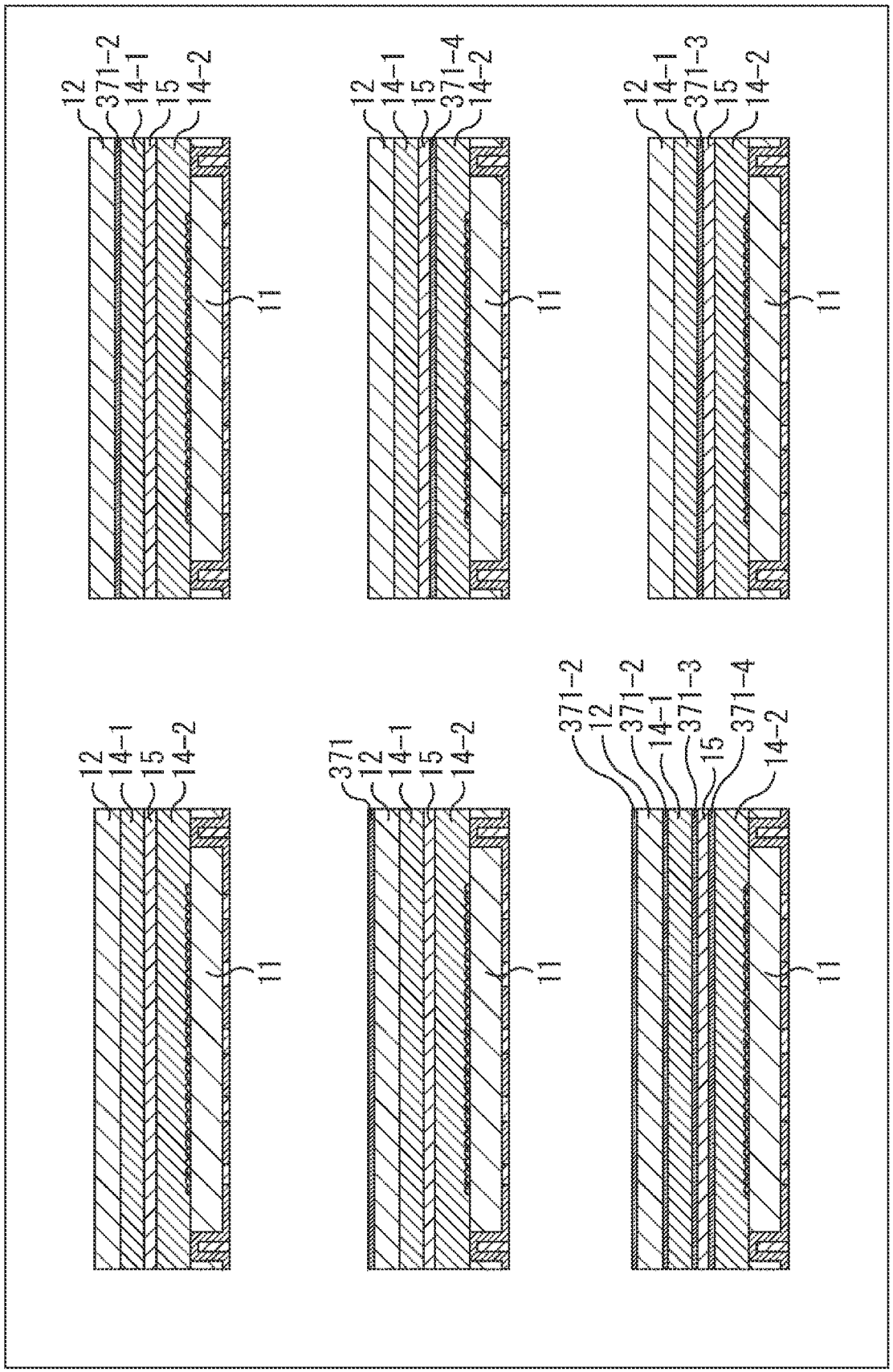
FIG. 36 is a diagram illustrating a modified example in which an antireflection film is added in the configuration in FIG. 29.

In the above description, as illustrated in an upper left part of FIG. 36, the example has been described in which the IRCFs 14-1 and 14-2 are formed on the solid-state imaging element 11 by bonding with the adhesive 15, and the glass substrate 12 is further formed on the IRCF 14-1 for the purpose of preventing generation of burrs and preventing reduction in optical characteristics. However, an additional film having an antireflection function may be further formed.

That is, for example, as illustrated in a middle left part of FIG. 36, an additional film 371 having an antireflection function may be formed on the glass substrate 12.

Furthermore, for example, as illustrated in a lower left part of FIG. 36, additional films 371-1 to 371-4 having an antireflection function may be formed on the glass substrate 12, at the boundary between the glass substrate 12 and the IRCF 14-1, at the boundary between the IRCF 14-1 and the adhesive 15, and at the boundary between the adhesive 15 and the IRCF 14-2, respectively.

Furthermore, as illustrated in each of an upper right part, a middle right part, and a lower right part of FIG. 36, any one of the additional films 371-2, 371-4, or 371-3 having an antireflection function may be formed, or a combination thereof may be formed.

Note that the additional films 371 and 371-1 to 371-4 may be formed with the use of, for example, a film having a function equivalent to that of the AR coat 271a or the antireflection treated portion (moth-eye) 291a described above.

The additional films 371 and 371-1 to 371-4 prevent incidence of unnecessary light, and prevent occurrence of ghosts and flare.

<Addition to Side Surface Portion>

In the above description, the example has been described in which the additional films 371-1 to 371-4 having an antireflection function are formed on at least one of the glass substrate 12, the boundary between the glass substrate 12 and the IRCF 14-1, the boundary between the IRCF 14-1 and the adhesive 15, or the boundary between the adhesive 15 and the IRCF 14-2. However, an additional film functioning as an antireflection film or a light absorption film may be formed on a side surface portion.

Figure 37:
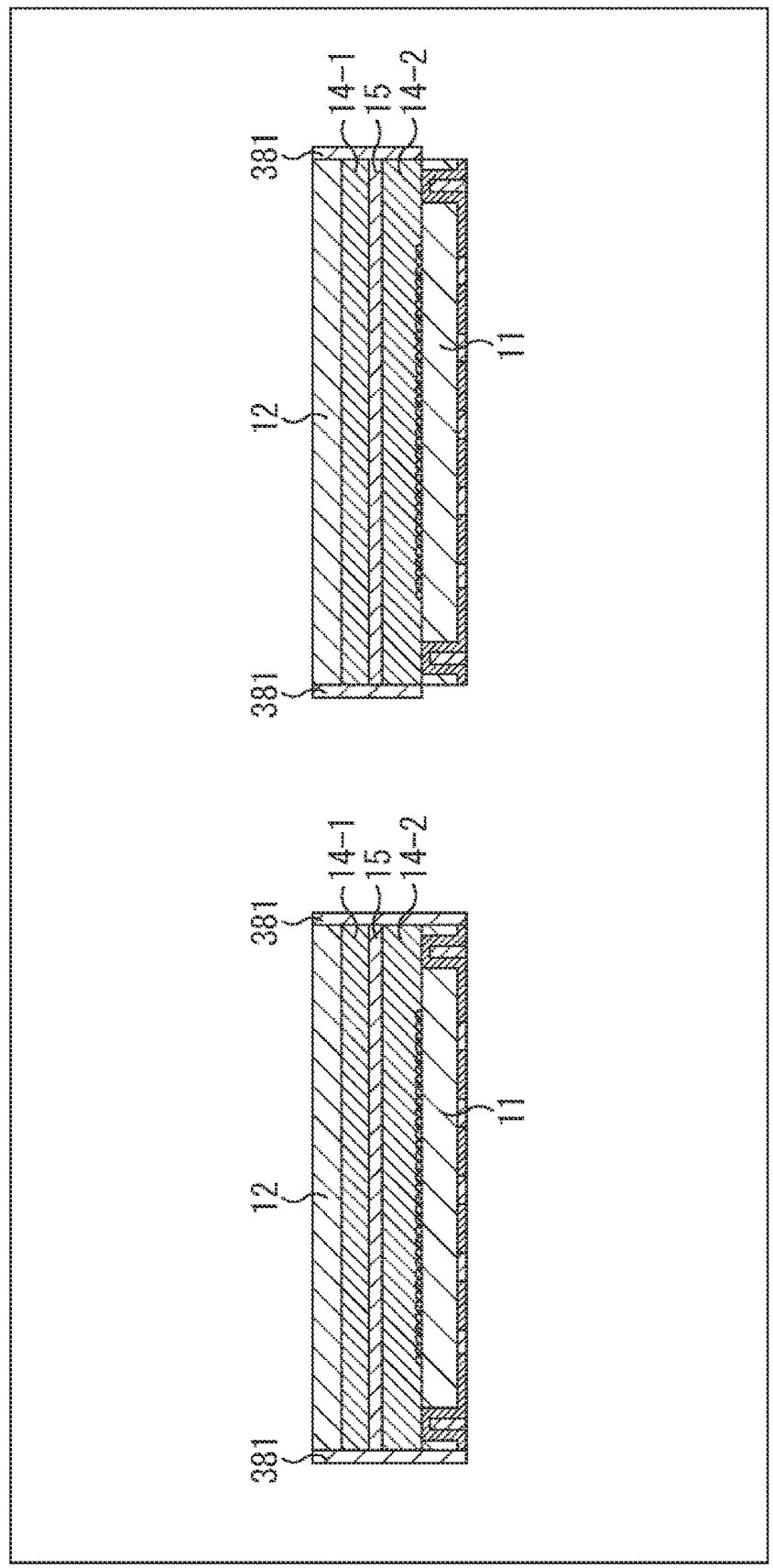
FIG. 37 is a diagram illustrating a modified example in which an antireflection film is added to a side surface portion in the configuration in FIG. 29.

That is, as illustrated in a left part of FIG. 37, an additional film 381 functioning as an antireflection film, a light absorption film, or the like may be formed on the entire side cross section of the glass substrate 12, the IRCFs 14-1 and 14-2, the adhesive 15, and the solid-state imaging element 11.

Furthermore, as illustrated in a right part of FIG. 37, the additional film 381 functioning as an antireflection film, a light absorption film, or the like may be formed only on the side surfaces of the glass substrate 12, the IRCFs 14-1 and 14-2, and the adhesive 15, excluding the side surface of the solid-state imaging element 11.

In either case, the additional film 381 is provided on the side surface portions of the solid-state imaging element 11, the glass substrate 12, the IRCFs 14-1 and 14-2, and the adhesive 15, and this prevents unnecessary light from entering the solid-state imaging element 11, and prevents occurrence of ghosts and flare.

17. Seventeenth Embodiment

In the above description, the example has been described in which each of the relationships in size in the horizontal direction among the solid-state imaging element 11, the IRCF 14-1, the adhesive 15, the IRCF 14-2, and the glass substrate 12 that are laminated is adjusted so that fallen debris is prevented and occurrence of flare and ghosts is prevented. However, a lens that is small and lightweight, and allows for high-resolution imaging may be achieved by defining the shape of the lens.

For example, a consideration will be given to a case where a glass substrate 12 is formed on a solid-state imaging element 11 and a lens corresponding to a lens 271 on which an AR coat 271a is formed is joined (e.g., the integrated component 10 in the imaging device 1 in FIG. 19). Note that the configuration of the imaging device 1 may be other than that in FIG. 19. For example, the same applies to a case where the lens 131 in the integrated component 10 in the imaging device 1 in FIG. 9 is replaced with the lens 271.

Figure 38:
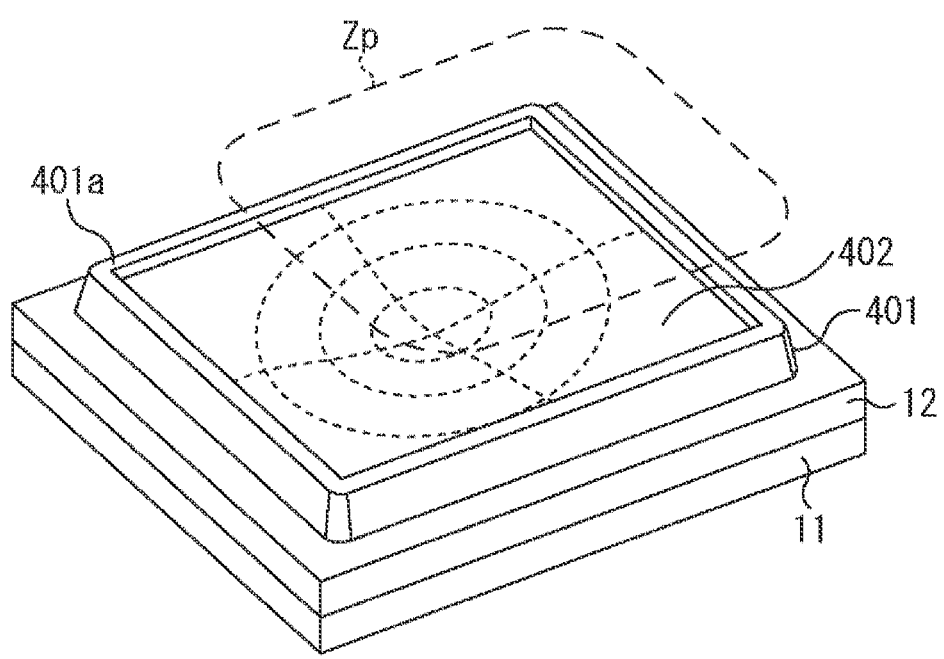
FIG. 38 is a diagram illustrating a configuration example of a seventeenth embodiment of an imaging device of the present disclosure.

That is, as illustrated in FIG. 38, it is assumed that a concave lens 401 (corresponding to the lens 271 in FIG. 19) that is concentrically aspheric and centered on the position of the center of gravity as viewed from the upper surface is formed on the glass substrate 12 on the solid-state imaging element 11. Furthermore, on the lens 401, an AR coat 402 (film having a function equivalent to that of the AR coat 271a or the antireflection treated portion 291a described above) is formed on a surface on which light is incident, and a protruding portion 401a is formed at an outer circumferential part. Note that FIGS. 38 and 39 illustrate a configuration in which the solid-state imaging element 11, the glass substrate 12, and the lens 271 in the integrated component 10 in the imaging device 1 in FIG. 19 are extracted.

Figure 39:
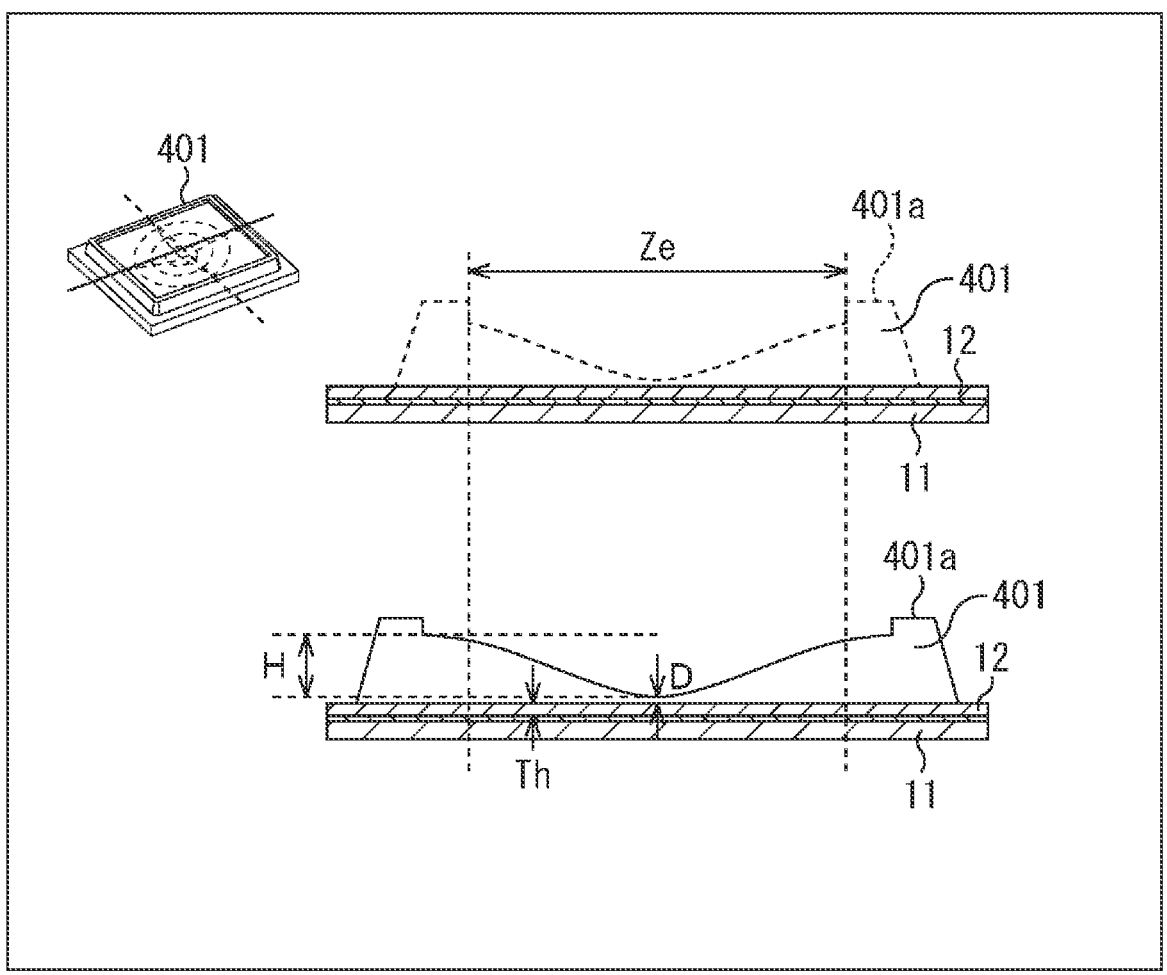
FIG. 39 is a diagram illustrating a condition regarding a thickness of a lens that is small and lightweight, and allows for capturing a high-resolution image.

Here, as illustrated in FIG. 39, the lens 401 has a bowl-like shape that forms a concave shape that is aspheric and centered on the position of the center of gravity as viewed from the upper surface. Note that, in FIG. 39, an upper right part of the drawing illustrates a cross-sectional shape of the lens 401 in the direction indicated by a dotted line in an upper left part of the drawing, and a lower right part of the drawing illustrates a cross-sectional shape of the lens 401 in the direction indicated by a solid line in the upper left part of the drawing.

In FIG. 39, a range Ze of the lens 401 has an aspheric curved surface structure that is common in the upper right part and the lower right part of FIG. 39. Such a shape constitutes an effective region where incident light from the upper side in the drawing is condensed on an imaging surface of the solid-state imaging element 11.

Furthermore, the lens 401 is constituted by an aspheric curved surface, and the thickness changes in accordance with the distance from the center position in a direction perpendicular to the incident direction of light. More specifically, the lens thickness at the center position is a minimum thickness D, and the lens thickness at a position farthest from the center in the range Ze is a maximal thickness H. Furthermore, in a case where the thickness of the glass substrate 12 is a thickness Th, the maximal thickness H of the lens 401 is thicker than the thickness Th of the glass substrate 12, and the minimum thickness D of the lens 401 is thinner than the thickness Th of the glass substrate 12.

That is, to summarize the relationship, using the lens 401 and the glass substrate 12 having the thicknesses D, H, and Th that satisfy the relationship expressed by thickness H>thickness Th>thickness D makes it possible to achieve the imaging device 1 (the integrated component 10 thereof) that is small and lightweight, and allows for imaging with high resolution.

Furthermore, by making a volume VG of the glass substrate 12 smaller than a volume VL of the lens 401, it is possible to form the volume of the lens most efficiently, and thus, it is possible to achieve the imaging device 1 that is small and lightweight, and allows for imaging with high resolution.

<Distribution of Stress Generated During Heating of AR Coat>

Furthermore, with the above configuration, it is possible to prevent stress due to expansion or contraction of the AR coat 402 during mount reflow thermal loading or during a reliability test.

Figure 40:
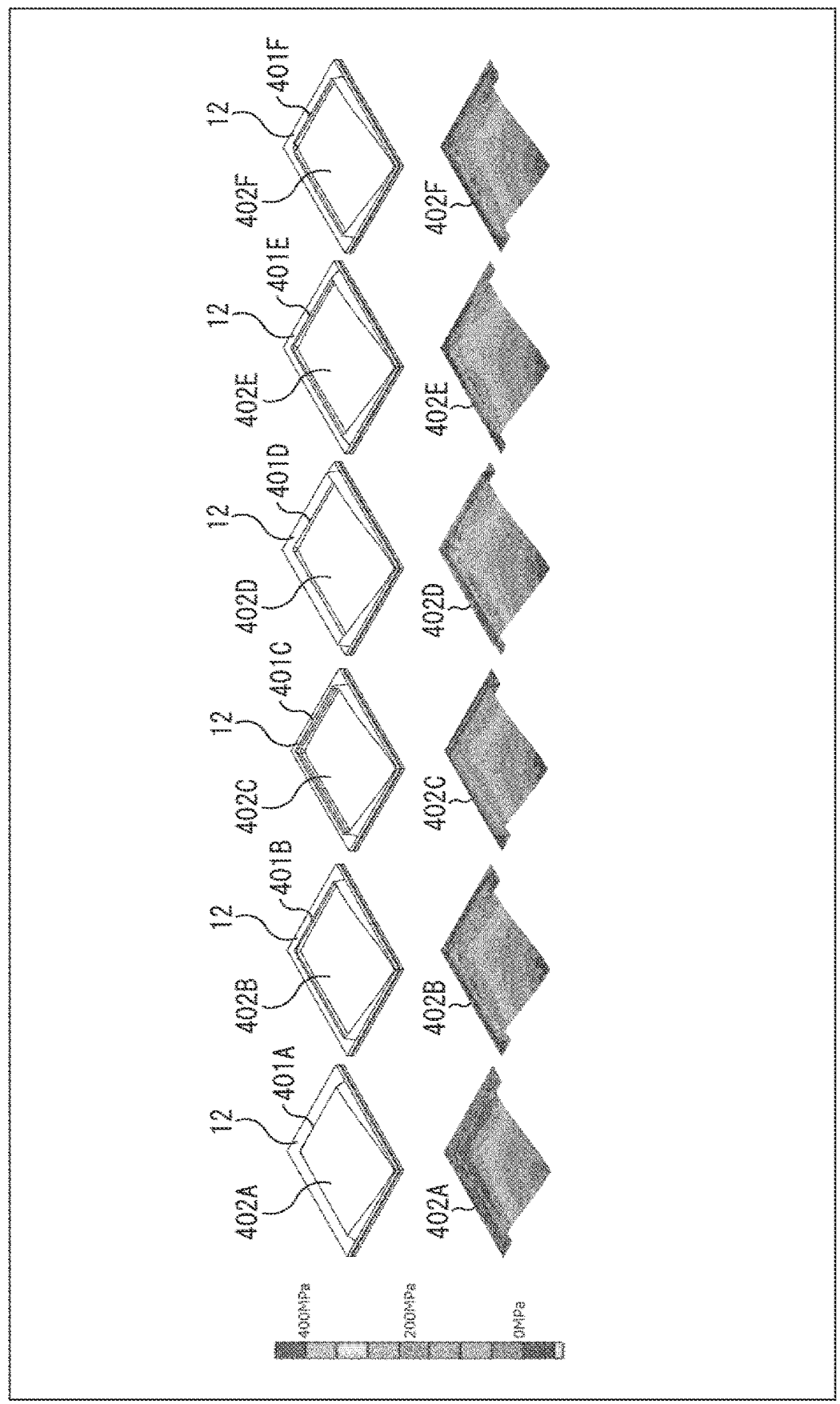
FIG. 40 is a diagram illustrating distribution of stress applied to an AR coat on the lens during mount reflow thermal loading in accordance with the shape of the lens.

FIG. 40 illustrates distribution of stress due to expansion or contraction of the AR coat 402 during mount reflow thermal loading in a case where the external shape of the lens 401 in FIG. 39 has been changed. Note that the stress distribution in FIG. 40 illustrates, with respect to the center position of the lens 401 indicated by a range Zp illustrated in FIG. 38, distribution in the range of ½ in the horizontal direction and ½ in the perpendicular direction, that is, distribution in the range of ¼ of the whole.

A leftmost part of FIG. 40 illustrates distribution of stress generated in an AR coat 402A during mount reflow thermal loading in a lens 401A in which the protruding portion 401a is not provided.

A second drawing from the left in FIG. 40 illustrates distribution of stress generated in an AR coat 402B during mount reflow thermal loading in a lens 401B provided with the protruding portion 401a illustrated in FIG. 39.

A third drawing from the left in FIG. 40 illustrates distribution of stress generated in an AR coat 402C during mount reflow thermal loading in a lens 401C in which the height of the protruding portion 401a illustrated in FIG. 39 has been increased than the height in the case of FIG. 39.

A fourth drawing from the left in FIG. 40 illustrates distribution of stress generated in an AR coat 402D during mount reflow thermal loading in a lens 401D in which the width of the protruding portion 401a illustrated in FIG. 39 has been enlarged as compared with the case of FIG. 39.

A fifth drawing from the left in FIG. 40 illustrates distribution of stress generated in an AR coat 402E during mount reflow thermal loading in a lens 401E in which a taper provided on a side surface of an outer circumferential part of the protruding portion 401a illustrated in FIG. 39 has been enlarged as compared with the case of FIG. 39.

A rightmost part of FIG. 40 illustrates distribution of stress generated in an AR coat 402F during mount reflow thermal loading in a lens 401F in which the protruding portion 401a illustrated in FIG. 39 is provided only on the four sides constituting the outer circumferential part.

As illustrated in FIG. 40, in the distribution of stress generated in the AR coat 402A of the lens 401A without the protruding portion 401a illustrated in the leftmost part, a large stress distribution appears on the outer circumferential side of the effective region. However, in the cases of the AR coats 402B to 402F of the lenses 401B to 401F in which the protruding portion 401a has been formed, a large stress distribution as seen in the AR coat 402A does not exist.

That is, by providing the protruding portion 401a in the lens 401, it is possible to prevent generation of a crack in the AR coat 402 due to expansion or contraction of the lens 401 during mount reflow thermal loading.

<Modified Example of Shape of Lens>

In the above description, the example has been described in which the imaging device 1 that is small and lightweight, and allows for imaging with high resolution is constituted by the concave lens 401 having the protruding portion 401a provided with a taper at the outer circumferential part as illustrated in FIG. 39. However, as long as the thicknesses D, H, and Th of the lens 401 and the glass substrate 12 satisfy the relationship expressed by thickness H>thickness Th>thickness D, the shape of the lens 401 may be another shape. Furthermore, it is more preferable that the volumes VG and VL satisfy a relationship expressed by volume VG<volume VL.

Figure 41:
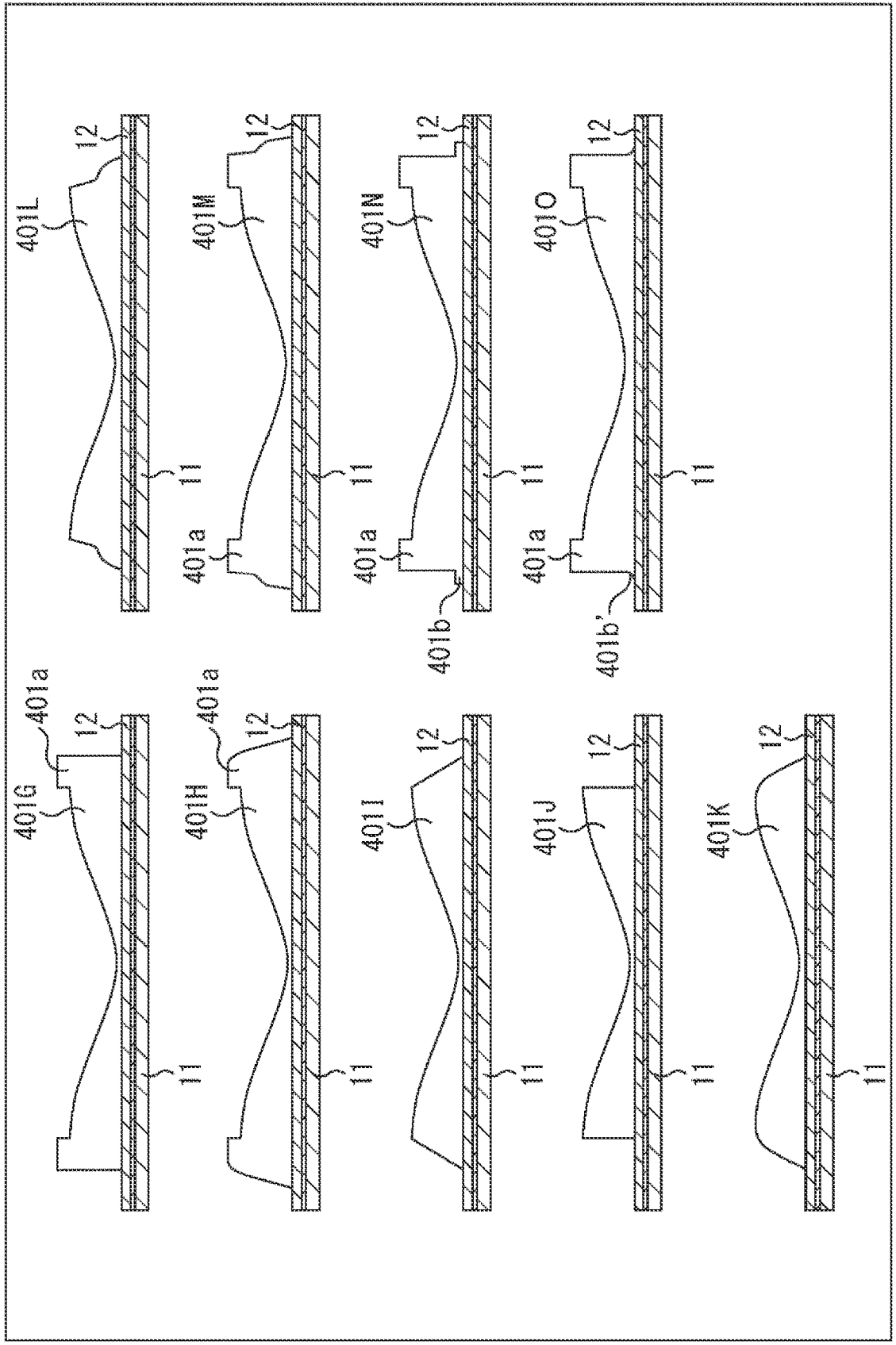
FIG. 41 is a diagram illustrating a modified example of the lens shape in FIG. 39.

For example, as indicated by a lens 401G in FIG. 41, a side surface on the outer circumferential side of the protruding portion 401a may form a right angle with the glass substrate 12, and may not include a taper.

Furthermore, as indicated by a lens 401H in FIG. 41, the side surface on the outer circumferential side of the protruding portion 401a may include a round taper.

Moreover, as indicated by a lens 401I in FIG. 41, the protruding portion 401a itself may not be included, and the side surface may include a linear tapered shape that forms a predetermined angle with the glass substrate 12.

Furthermore, as indicated by a lens 401J in FIG. 41, the protruding portion 401a itself may not be included, and the side surface may form a right angle with the glass substrate 12, and may not include a tapered shape.

Moreover, as indicated by a lens 401K in FIG. 41, the protruding portion 401a itself may not be included, and the side surface may include a round tapered shape with respect to the glass substrate 12.

Furthermore, as indicated by a lens 401L in FIG. 41, the protruding portion 401a itself may not be included, and the side surface of the lens may have a two-stage configuration having two inflection points. Note that a detailed configuration of the lens 401L will be described later with reference to FIG. 42. Furthermore, since the side surface of the lens 401L has a two-stage configuration having two inflection points, the lens 401L is hereinafter also referred to as a two-stage side surface type lens.

Moreover, as indicated by a lens 401M in FIG. 41, the side surface may include the protruding portion 401a, and may have a two-stage configuration having two inflection points on an external side surface.

Furthermore, as indicated by a lens 401N in FIG. 41, the protruding portion 401a may be included, and the side surface may form a right angle with the glass substrate 12, and moreover, a rectangular hem 401b may be added in the vicinity of the boundary with the glass substrate 12.

Moreover, as indicated by a lens 401N in FIG. 41, the protruding portion 401a may be included, and the side surface may form a right angle with the glass substrate 12, and moreover, a round hem 401b' may be added in the vicinity of the boundary with the glass substrate 12.

<Detailed Configuration of Two-Stage Side Surface Type Lens>

Here, a detailed configuration of the two-stage side surface type lens 401L in FIG. 41 will be described with reference to FIG. 42.

Figure 42:
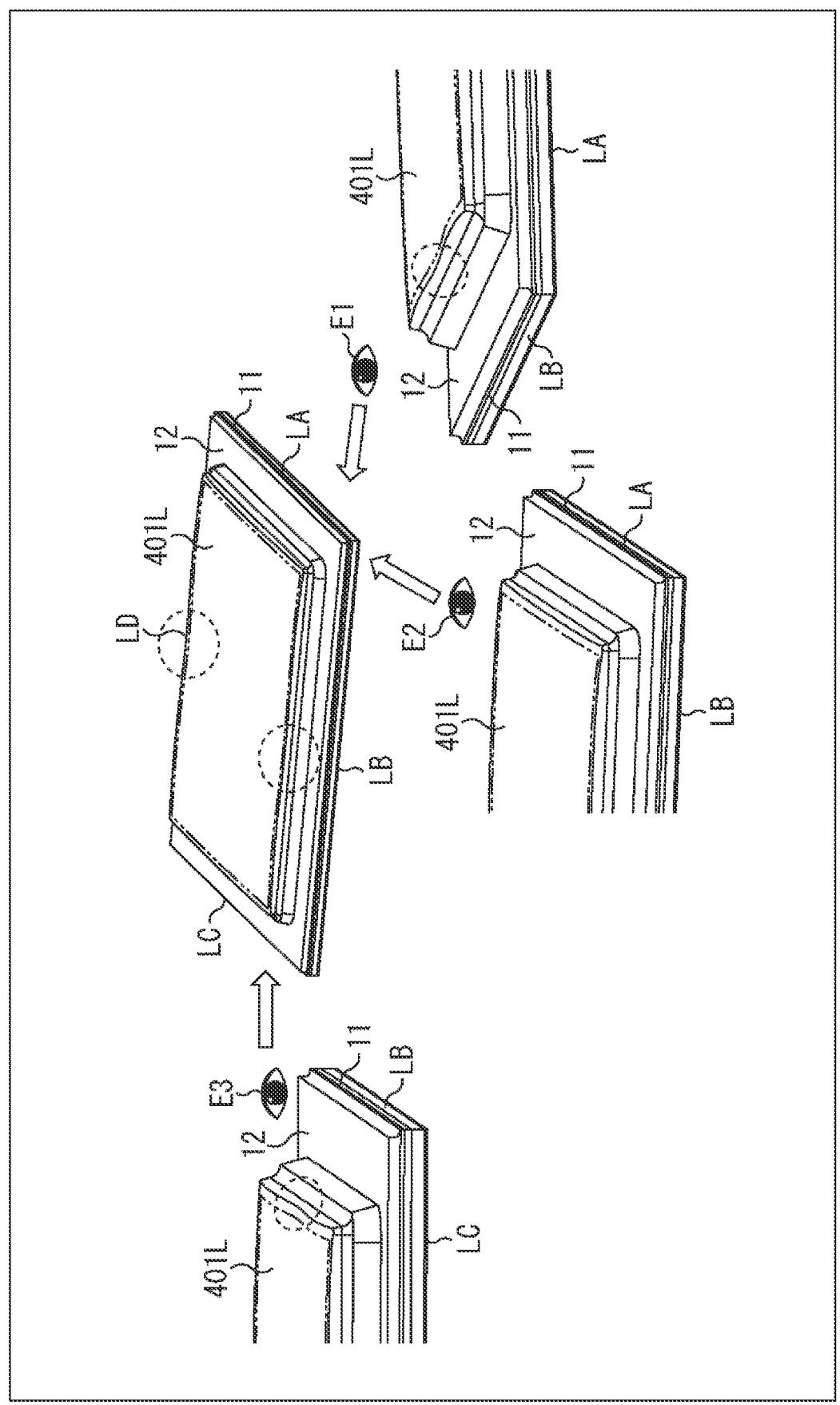
FIG. 42 is a diagram illustrating a shape of a two-stage side surface type lens in FIG. 41.

FIG. 42 illustrates an external perspective view when viewed from a variety of directions in a case where the glass substrate 12 is formed on the solid-state imaging element 11 and the two-stage side surface type lens 401L is provided thereon. Here, in an upper central part of FIG. 42, sides LA, LB, LC, and LD are set clockwise from the side on the right side in the drawing of the solid-state imaging element 11.

Then, a right part of FIG. 42 illustrates a perspective view around a corner portion between the sides LA and LB of the solid-state imaging element 11 when the solid-state imaging element 11 and the lens 401L are viewed from the direction of a line-of-sight E1 in the upper central part of FIG. 42. Furthermore, a lower central part of FIG. 42 illustrates a perspective view around the corner portion between the sides LA and LB of the solid-state imaging element 11 when the solid-state imaging element 11 and the lens 401L are viewed from the direction of a line-of-sight E2 in the upper central part of FIG. 42. Moreover, a left part of FIG. 42 illustrates a perspective view around a corner portion between the sides LB and LC of the solid-state imaging element 11 when the solid-state imaging element 11 and the lens 401L are viewed from the direction of a line-of-sight E3 in a central part of FIG. 42.

That is, in the two-stage side surface type lens 401L, a central part of the side LB (or LD (not illustrated)) serving as a long side is located at a position close to the position of the center of gravity in a circular shape functioning as a lens having the minimum lens thickness as viewed from the upper surface of the two-stage side surface type lens 401L serving as a concave lens, and thus, the lens is thin and a ridge line is shaped with a gentle curve as surrounded by a dotted line.

On the other hand, since central parts of the sides LA and LC serving as short sides are located far from the position of the center of gravity, the lens is thick, and the ridge line has a linear shape.

<Two Inflection Points and Two-Stage Side Surfaces>

Figure 43:
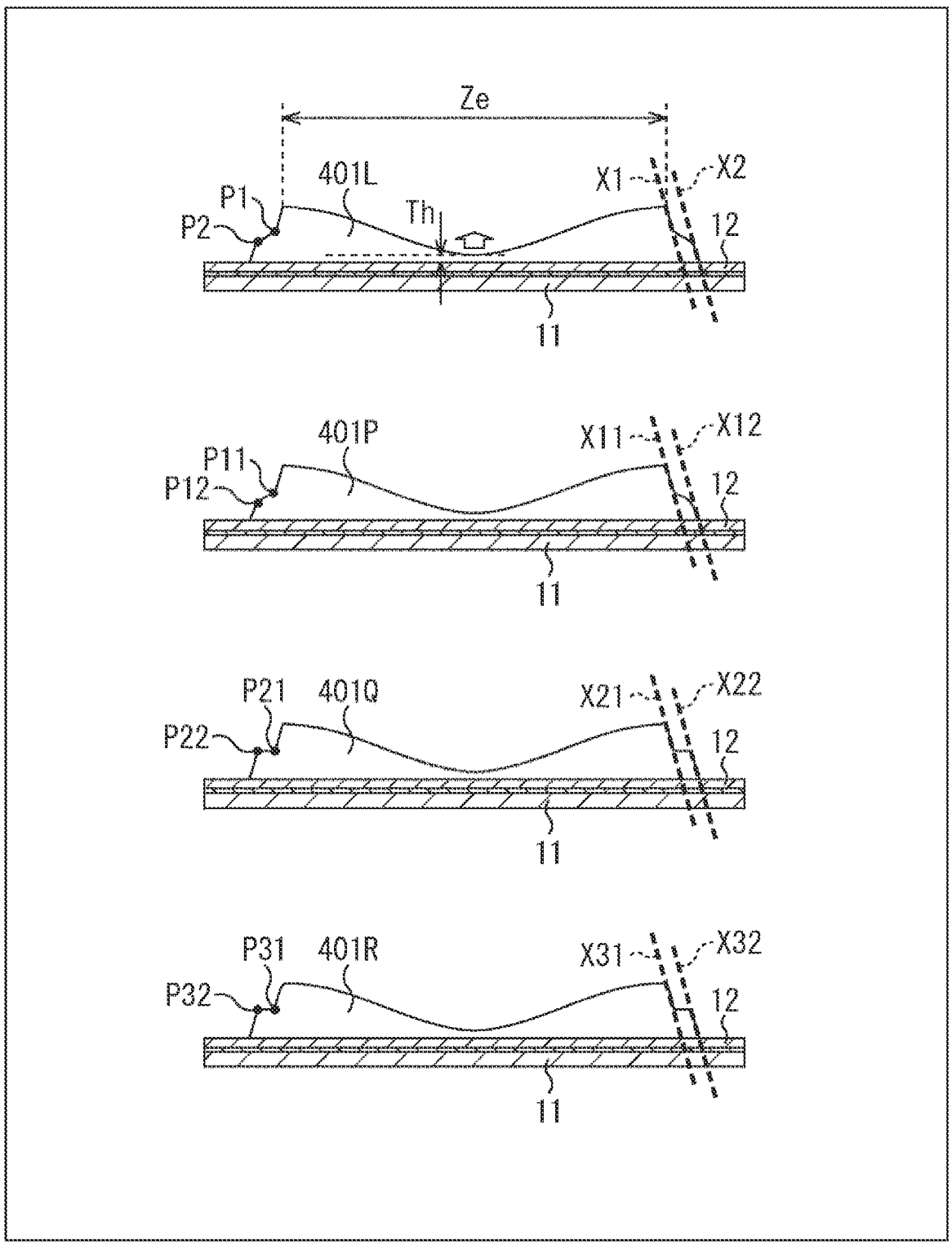
FIG. 43 is a diagram illustrating a modified example of the shape of the two-stage side surface type lens in FIG. 41.

Furthermore, as illustrated in FIG. 43, the two-stage side surface type lens 401L has a cross-sectional shape in which side surfaces of an ineffective region provided outside an effective region Ze have a two-stage configuration, average planes X1 and X2, each on one side surface, are formed in a staggered manner, and inflection points P1 and P2 in the cross-sectional shape are formed at positions of irregularities generated due to the two-stage side surfaces.

The inflection points P1 and P2 change in the order of a recess and a protrusion in order from the position closer to the solid-state imaging element 11.

Furthermore, the heights of the inflection points P1 and P2 from the glass substrate 12 are both provided at positions higher than the minimum thickness Th of the two-stage side surface type lens 401L.

Moreover, a difference between the average planes X1 and X2 (distance between the average planes X1 and X2), each on one of the two-stage side surfaces, is desirably larger than the thickness of the solid-state imaging element 11 (thickness of the silicon substrate 81 of the solid-state imaging element 11 in FIG. 6).

Furthermore, a difference in distance between the average planes X1 and X2, each on one of the two-stage side surfaces, is desirably 1% or more with respect to a region width (e.g., the width He in the horizontal direction or the height Ve in the perpendicular direction in FIG. 23) perpendicular to the incident direction of incident light in the effective region of the lens 401L.

Thus, as long as two-stage side surfaces and two inflection points that satisfy the conditions described above are formed, a shape other than the shape of the two-stage side surface type lens 401L may be adopted. For example, as illustrated in a second drawing from the top in FIG. 43, a two-stage side surface type lens 401P may be adopted in which two-stage side surfaces including average planes X11 and X12 are provided, and inflection points P11 and P12 having curvatures different from those of the inflection points P1 and P2 are formed at positions higher than a thinnest thickness Th of the lens from the glass substrate 12.

Furthermore, for example, as illustrated in a third drawing from the top in FIG. 43, a two-stage side surface type lens 401Q may be adopted in which two-stage side surfaces including average planes X21 and X22 are provided, and inflection points P21 and P22 having curvatures different from those of the inflection points P1 and P2 and the inflection points P11 and P22 are formed at positions higher than the thinnest thickness Th of the lens from the glass substrate 12.

Moreover, for example, as illustrated in a fourth drawing from the top in FIG. 43, a two-stage side surface type lens 401R may be adopted in which two-stage side surfaces including average planes X31 and X32 are provided, inflection points P31 and P32 are formed at positions higher than the thinnest thickness Th of the lens from the glass substrate 12, and an edge at a position where the lens 401 is the thickest is formed in a round shape.

<Distribution of Stress that Occurs During Heating of AR Coat in Lens Provided with Two Inflection Points and Side Surfaces Having Two-Stage Configuration>

As described above, in the case of the two-stage side surface type lens 401L provided with two inflection points and side surfaces having a two-stage configuration, it is possible to prevent stress applied to the AR coat 402 due to expansion or contraction of the lens 401L during mount reflow thermal loading or during a reliability test.

Figure 44:
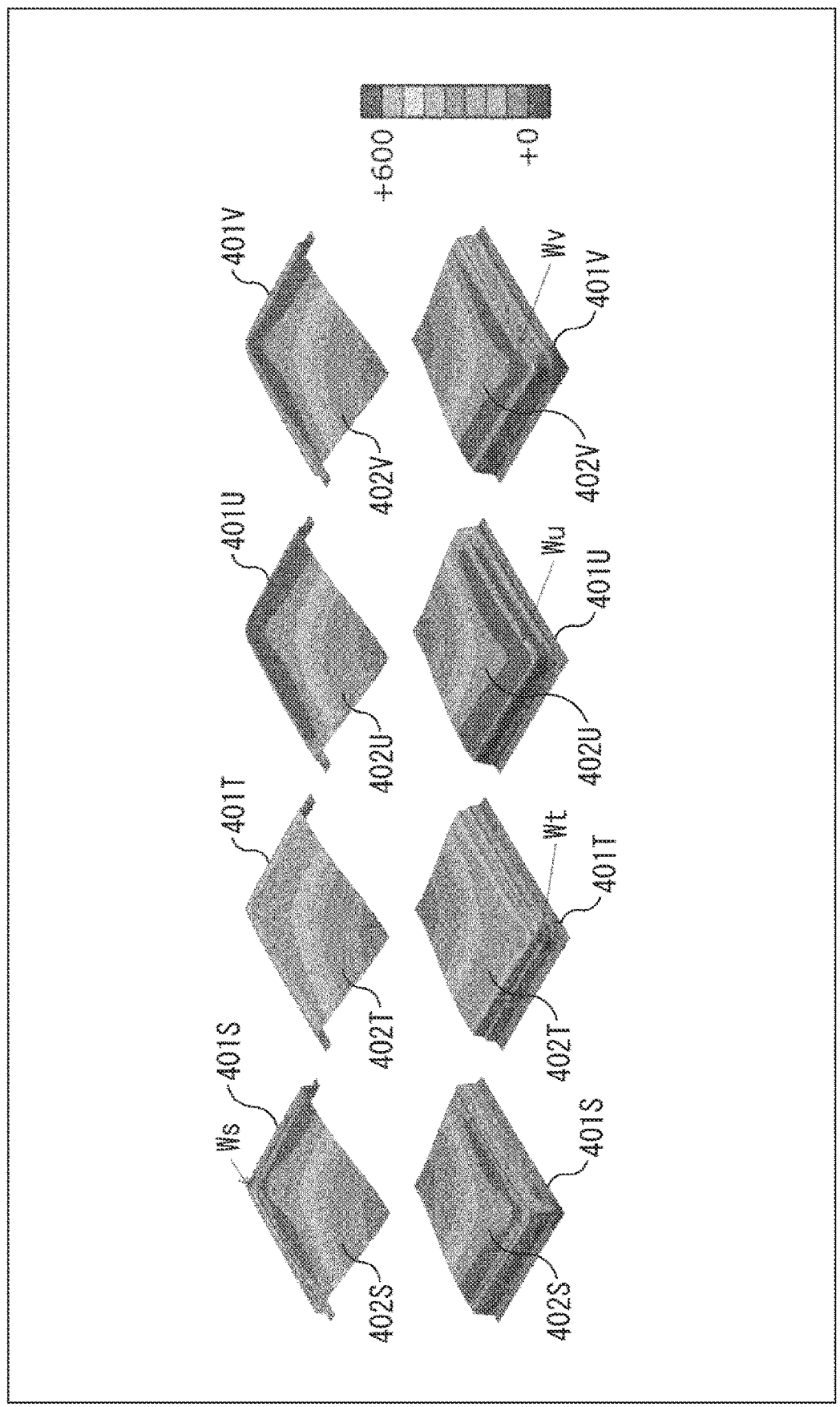
FIG. 44 is a diagram illustrating distribution of stress applied, during mount reflow thermal loading on the two-stage side surface type lens in FIG. 41, to an AR coat on the lens.

FIG. 44 illustrates distribution of stress due to expansion or contraction of the AR coat 402 during mount reflow thermal loading in a case where the external shape of the lens 401 in FIG. 39 has been changed. In FIG. 44, an upper part illustrates distribution of stress on the AR coat 402 on a further side when the lens 401 is viewed from a diagonal direction, and a lower part illustrates distribution of stress on the AR coat 402 on a nearer side when the lens 401 is viewed from the diagonal direction.

A leftmost part of FIG. 44 illustrates distribution of stress generated in an AR coat 402S during mount reflow thermal loading in a lens 401S (corresponding to the lens 401A), which is not provided with the protruding portion 401a nor is a two-stage side surface type lens.

A second drawing from the left in FIG. 44 illustrates distribution of stress generated in an AR coat 402T during mount reflow thermal loading in a lens 401T corresponding to the two-stage side surface type lens 401L illustrated in FIG. 43.

A third drawing from the left in FIG. 44 illustrates distribution of stress generated in an AR coat 402U during mount reflow thermal loading in a lens 401U in which the protruding portion 401a is not provided but a tapered shape is provided, and each corner portion between sides of the lens has been molded in a round shape.

A fourth drawing from the left in FIG. 44 illustrates distribution of stress generated in an AR coat 402V during mount reflow thermal loading in a lens 401V in which neither the protruding portion 401a nor the tapered shape is provided, the side surfaces are perpendicular to the glass substrate 12, and each corner portion between sides of the lens is molded in a round shape.

Figure 45:
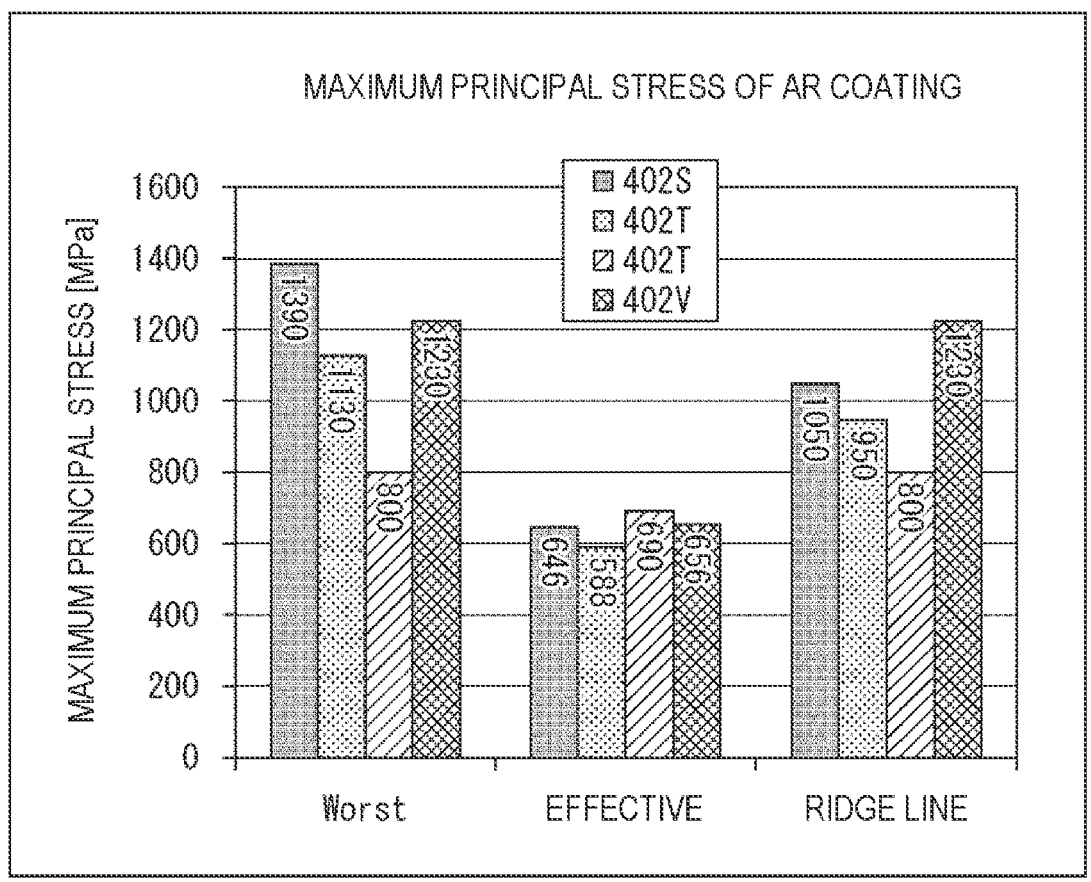
FIG. 45 is a diagram illustrating a maximum value in the distribution of stress applied to the AR coat on the lens during mount reflow thermal loading in FIG. 44.

Furthermore, FIG. 45 illustrates a graph indicating, in order from the left, an overall maximum value (worst) in the distribution of stress generated in the AR coat in each lens shape in FIG. 44, a maximum value (effective) in the effective region of the lens, and a maximum value (ridge line) in the ridge line. Furthermore, the graph indicating each maximum value in FIG. 45 shows the maximum value in the stress distribution of the AR coats 402S to 402V in order from the left.

As illustrated in FIG. 45, the overall maximum stress of each lens is: 1390 MPa at a corner portion Ws (FIG. 44) of the upper surface in the case of the AR coat 402S of the lens 401S; 1130 MPa at a corner portion Wt (FIG. 44) of the ridge line in the case of the AR coat 402T of the lens 401T; 800 MPa at Wu on the ridge line (FIG. 44) in the case of the AR coat 402U of the lens 401U; and 1230 MPa at Wv on the ridge line (FIG. 44) in the case of the AR coat 402V of the lens 401V.

Furthermore, as illustrated in FIG. 45, the maximum stress in the effective region of each lens is 646 MPa in the case of the AR coat 402S of the lens 401S, 588 MPa in the case of the AR coat 402T of the lens 401T, 690 MPa in the case of the AR coat 402U of the lens 401U, and 656 MPa in the case of the AR coat 402V of the lens 401V.

Moreover, the maximum stress on the ridge line of each lens is 1050 MPa in the case of the AR coat 402S of the lens 401S, 950 MPa in the case of the AR coat 402T of the lens 401T, 800 MPa in the case of the AR coat 402U of the lens 401U, and 1230 MPa in the case of the AR coat 402U of the lens 401V.

As can be seen from FIG. 45, every maximum stress is the smallest in the AR coat 402S of the lens 401S. However, as can be seen from FIG. 44, in the entire stress distribution in the effective region of the AR coat 402T of the lens 401T, there is no stress distribution around 600 MPa that is frequently present in the range close to the outer circumferential part of the AR coat 402U of the lens 401U, and as a whole, in the external shape constituted by the AR coat 402T of the lens 401T (the same as the lens 401L), the stress distribution generated in the AR coat 402T of the AR coat 402T (the same as an AR coat 402L) becomes small.

That is, as can be seen from FIGS. 44 and 45, in the lens 401T (401L) provided with two inflection points and side surfaces having a two-stage configuration during mount reflow thermal loading, expansion or contraction generated in the AR coat 402T (402L) is prevented, and generated stress attributable to expansion or contraction is reduced.

As described above, by adopting the two-stage side surface type lens 401L provided with two inflection points and side surfaces having a two-stage configuration as the lens 401, it is possible to prevent expansion or contraction due to heat during mount reflow thermal loading, a reliability test, or the like.

As a result, stress generated in the AR coat 402L can be reduced, and it is possible to prevent generation of a crack, the lens from coming unstuck, and the like. Furthermore, since expansion or contraction of the lens itself can be prevented, occurrence of distortion can be reduced, and it is possible to prevent image quality degradation due to an increase in birefringence attributable to distortion, and occurrence of flare due to an increase in interface reflection that occurs due to a local change in refractive index

18. Eighteenth Embodiment

In the above description, the example has been described in which a lens that is small and lightweight, and allows for high-resolution imaging is achieved by defining the shape of the lens. However, a lens that is smaller and more lightweight, and allows for capturing a high-resolution image may be achieved by improving the accuracy in forming the lens on a solid-state imaging element 11.

Figure 46:
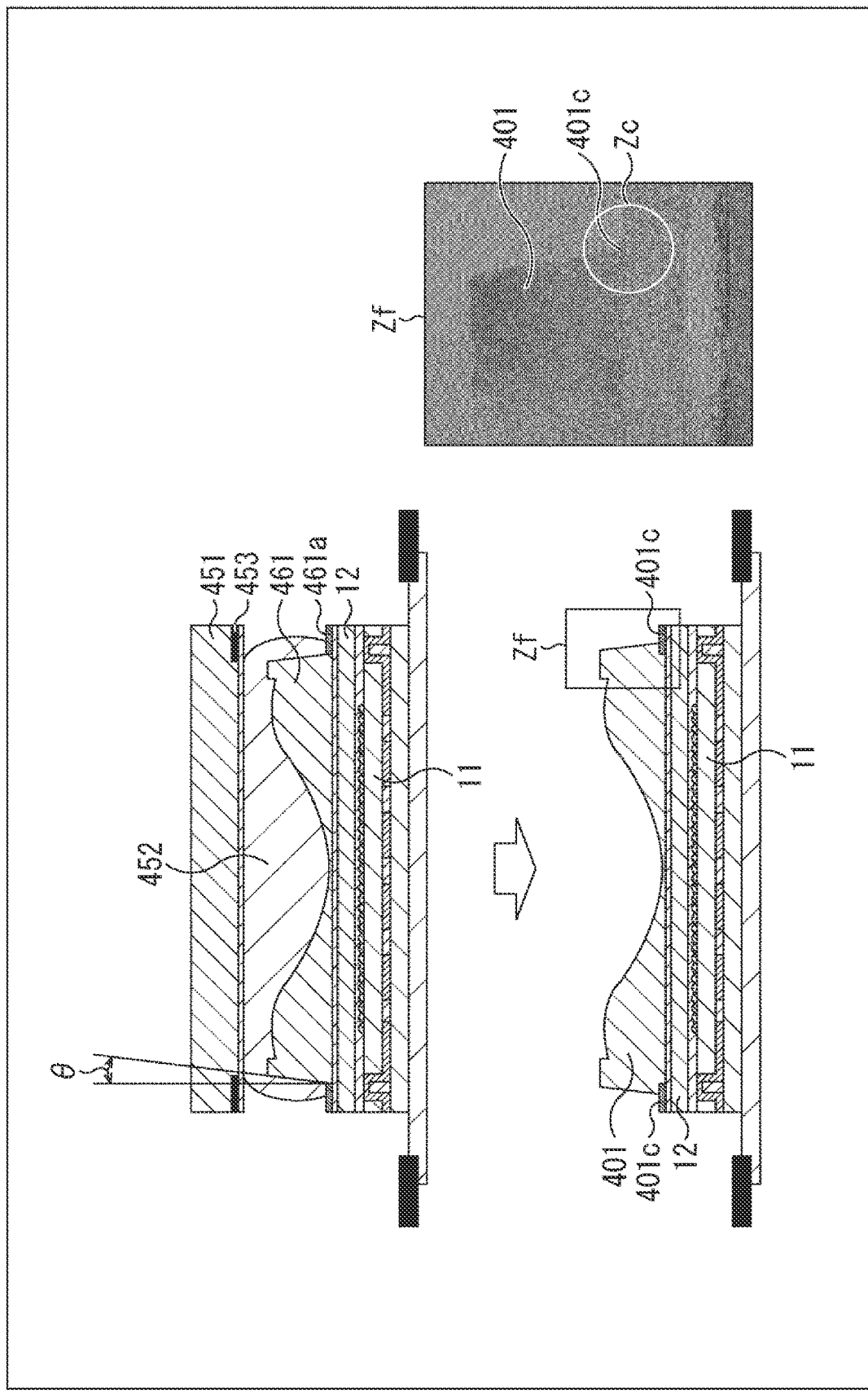
FIG. 46 is a diagram illustrating a manufacturing method in an eighteenth embodiment of an imaging device of the present disclosure.

As illustrated in an upper part of FIG. 46, in a state where a substrate 451 and a molding die 452 are pressed against a glass substrate 12 on the solid-state imaging element 11, a space between the molding die 452 and the glass substrate 12 is filled with an ultraviolet light curing resin 461 to be a material of a lens 401, and exposure is performed with ultraviolet light from the upper part of the drawing for a predetermined time.

Both the substrate 451 and the molding die 452 are constituted by materials that allow ultraviolet light to pass through.

The molding die 452 has an aspheric convex structure corresponding to the shape of the concave lens 401, a light shielding film 453 is formed in an outer circumferential part, and a taper can be formed on a side surface of the lens 401 having an angle θ as illustrated in FIG. 46, for example, depending on the angle of incident of ultraviolet light.

The ultraviolet light curing resin 461 to be a material of the lens 401 is exposed to ultraviolet light for a predetermined time to be cured, and is formed as an aspheric concave lens as illustrated in a lower part of FIG. 46 and attached to the glass substrate 12.

After a predetermined time has elapsed in a state of being irradiated with ultraviolet light, the ultraviolet light curing resin 461 is cured to form the lens 401. After the lens 401 has been formed, the molding die 452 is removed from the formed lens 401 (mold release).

At a boundary between an outer circumferential part of the lens 401 and the glass substrate 12, a part of the ultraviolet light curing resin 461 overflows from the molding die 452 to form an overflowing portion 461a. However, since the overflowing portion 461a is shielded from ultraviolet light by the light shielding film 453, as indicated by a range Zc in an enlarged view Zf, the overflowing portion 461a, which is a part of the ultraviolet light curing resin 461, remains without being cured, and remains as a hem 401d by being cured by ultraviolet light contained in natural light after mold release.

With this arrangement, the lens 401 is formed as a concave lens by the molding die 452, and a tapered shape is formed on the side surface at the angle θ defined by the light shielding film 453. Furthermore, since the hem 401d is formed in the outer circumferential part of the lens 401 at the boundary with the glass substrate 12, the lens 401 can be more firmly bonded to the glass substrate 12.

As a result, it is possible to form, with high accuracy, a lens that is small and lightweight, and allows for capturing a high-resolution image.

Figure 47:
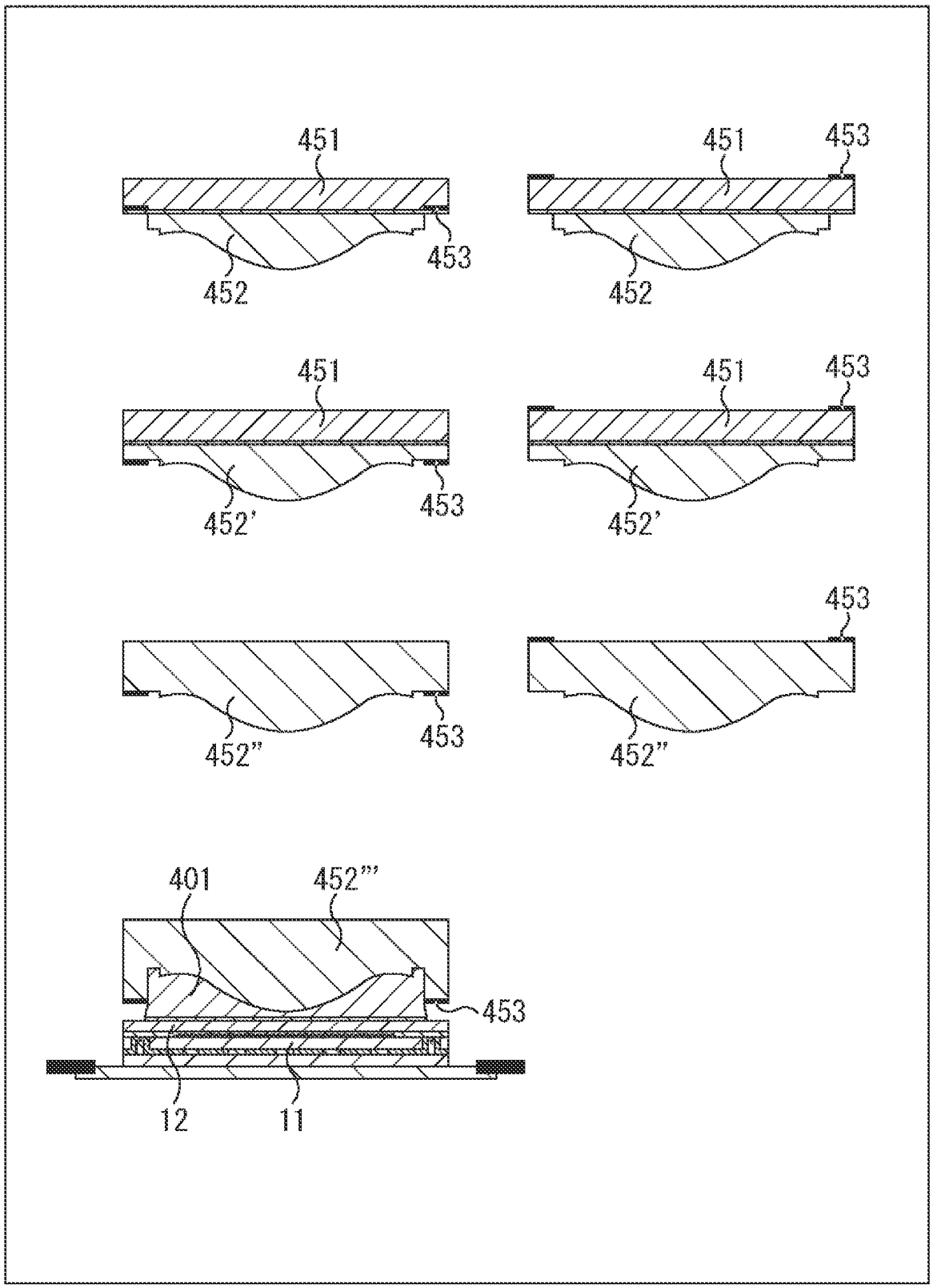
FIG. 47 is a diagram illustrating a modified example of the manufacturing method in FIG. 46.

Note that, in the above description, the example has been described in which, as illustrated in an upper left part of FIG. 47, the light shielding film 453 is provided on the outer circumferential part of the lens 401 on the rear surface side (lower side in the drawing) with respect to an incident direction of ultraviolet light on the substrate 451. However, as illustrated in an upper right part of FIG. 47, the light shielding film 453 may be provided on the outer circumferential part of the lens 401 on the front surface side (upper side in the drawing) with respect to the incident direction of ultraviolet light on the substrate 451.

Furthermore, as illustrated in a second drawing from the top on the left in FIG. 47, a molding die 452' larger in the horizontal direction than the molding die 452 may be formed in place of the substrate 451, and the light shielding film 453 may be provided on the outer circumferential part of the lens 401 on the rear surface side (lower side in the drawing) with respect to the incident direction of ultraviolet light.

Moreover, as illustrated in a second drawing from the top on the right in FIG. 47, the light shielding film 453 may be provided on the outer circumferential part of the lens 401 on the front surface side (upper side in the drawing) with respect to the incident direction of ultraviolet light on the substrate 451 of the molding die 452'.

Furthermore, as illustrated in a third drawing from the top on the left in FIG. 47, a molding die 452" in which the substrate 451 and the molding die 452 are integrated may be formed, and the light shielding film 453 may be provided on the outer circumferential part of the lens 401 on the rear surface side (lower side in the drawing) with respect to the incident direction of ultraviolet light.

Moreover, as illustrated in a third drawing from the top on the right in FIG. 47, the molding die 452″ in which the substrate 451 and the molding die 452 are integrated may be formed, and the light shielding film 453 may be provided on the outer circumferential part of the lens 401 on the front surface side (upper side in the drawing) with respect to the incident direction of ultraviolet light.

Furthermore, as illustrated in a lower left part of FIG. 47, a molding die 452‴ provided with a configuration that defines a part of a side surface portion may be formed in addition to the substrate 451 and the molding die 452, and the light shielding film 453 may be formed on an outer circumferential part of the molding die 452‴ on the rear surface side with respect to the incident direction of ultraviolet light.

Note that the configurations in FIGS. 46 and 47 are configurations in which the IRCF 14 and the adhesive 15 have been omitted from the integrated component 10 of the imaging device 1 in FIG. 9. However, the IRCF 14 and the adhesive 15 have been omitted only for convenience of description, and, as a matter of course, may be provided between the lens 401 (131) and the glass substrate 12. Furthermore, in the following description, a configuration in which the IRCF 14 and the adhesive 15 are omitted from the configuration in the imaging device 1 in FIG. 9 will be described as an example, but in any case, a configuration may be adopted in which, for example, the IRCF 14 and the adhesive 15 are provided between the lens 401 (131) and the glass substrate 12.

<Method of Forming Two-Stage Side Surface Type Lens>

Next, a method of manufacturing a two-stage side surface type lens will be described.

The basic manufacturing method is similar to the method of manufacturing a lens that is not the two-stage side surface type described above.

Figure 48:
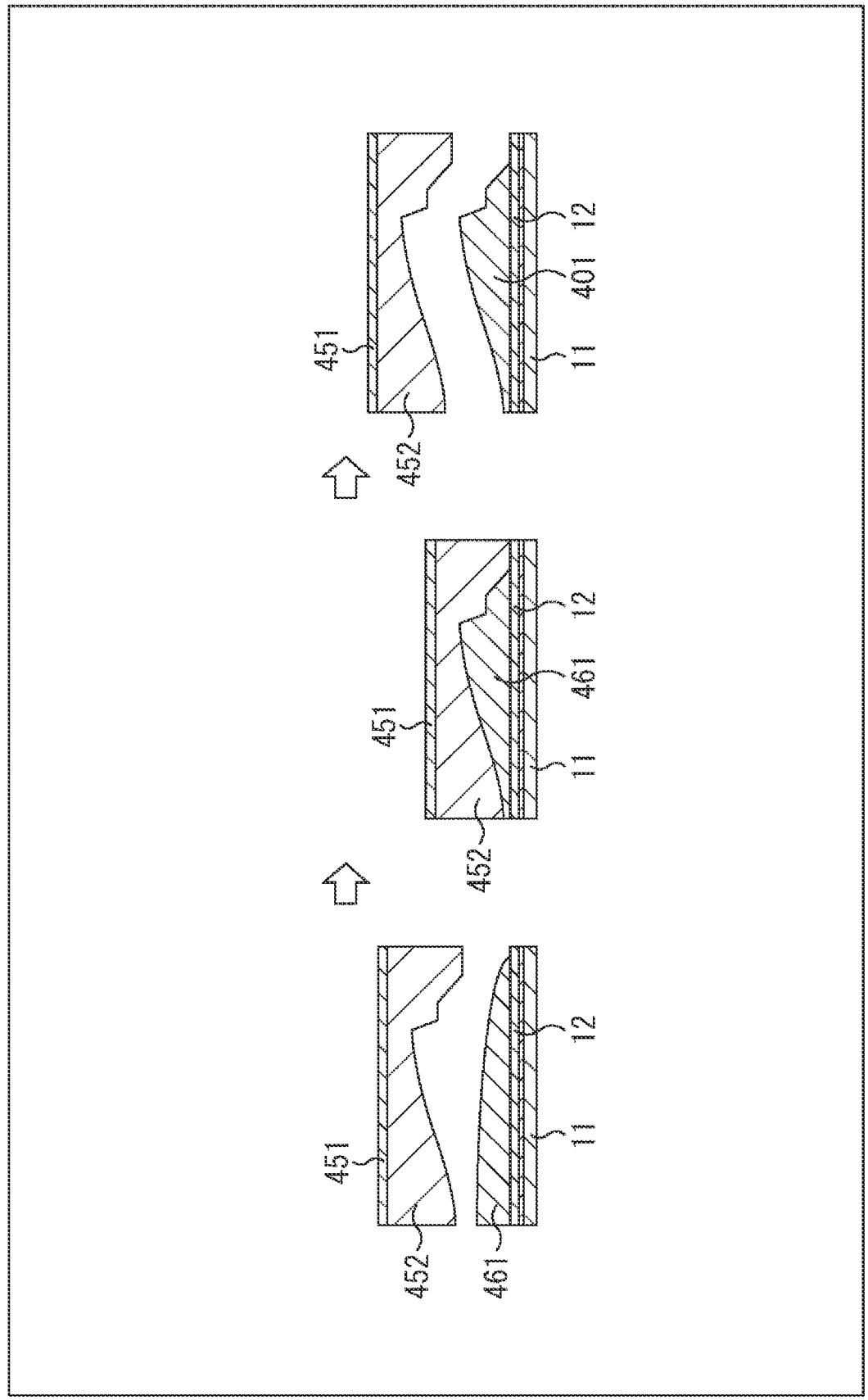
FIG. 48 is a diagram illustrating a method of manufacturing a two-stage side surface type lens.

That is, as illustrated in a left part of FIG. 48, the molding die 452 corresponding to the shape of a side surface of a two-stage side surface type lens 401L is prepared for the substrate 451, and the ultraviolet light curing resin 461 is placed on the glass substrate 12 on the solid-state imaging element 11. Note that FIG. 48 illustrates the configuration of only a right half of the side cross section of the molding die 452.

Next, as illustrated in a central part of FIG. 48, the placed ultraviolet light curing resin 461 is pressed against and fixed to the glass substrate 12 by the molding die 452, so that a recess of the molding die 452 is filled with the ultraviolet light curing resin 461, which is irradiated with ultraviolet light from the upper side in the drawing for a predetermined time.

The ultraviolet light curing resin 461 is cured by being exposed to ultraviolet light, and the concave two-stage side surface type lens 401 corresponding to the molding die 452 is formed.

After the lens 401 has been formed by being exposed to ultraviolet light for a predetermined time, as illustrated in a right part of FIG. 48, the molding die 452 is released, and the lens 401 including the two-stage side surface type lens is completed.

Furthermore, as illustrated in a left part of FIG. 49, in a part of a portion abutting on the glass substrate 12 in an outer circumferential part of the molding die 452, for example, a portion below a height of an inflection point, out of the two inflection points in a cross-sectional shape of a side surface, at a position closer to the glass substrate 12 may be cut, and the light shielding film 453 may be provided on the cut surface.

Figure 49:
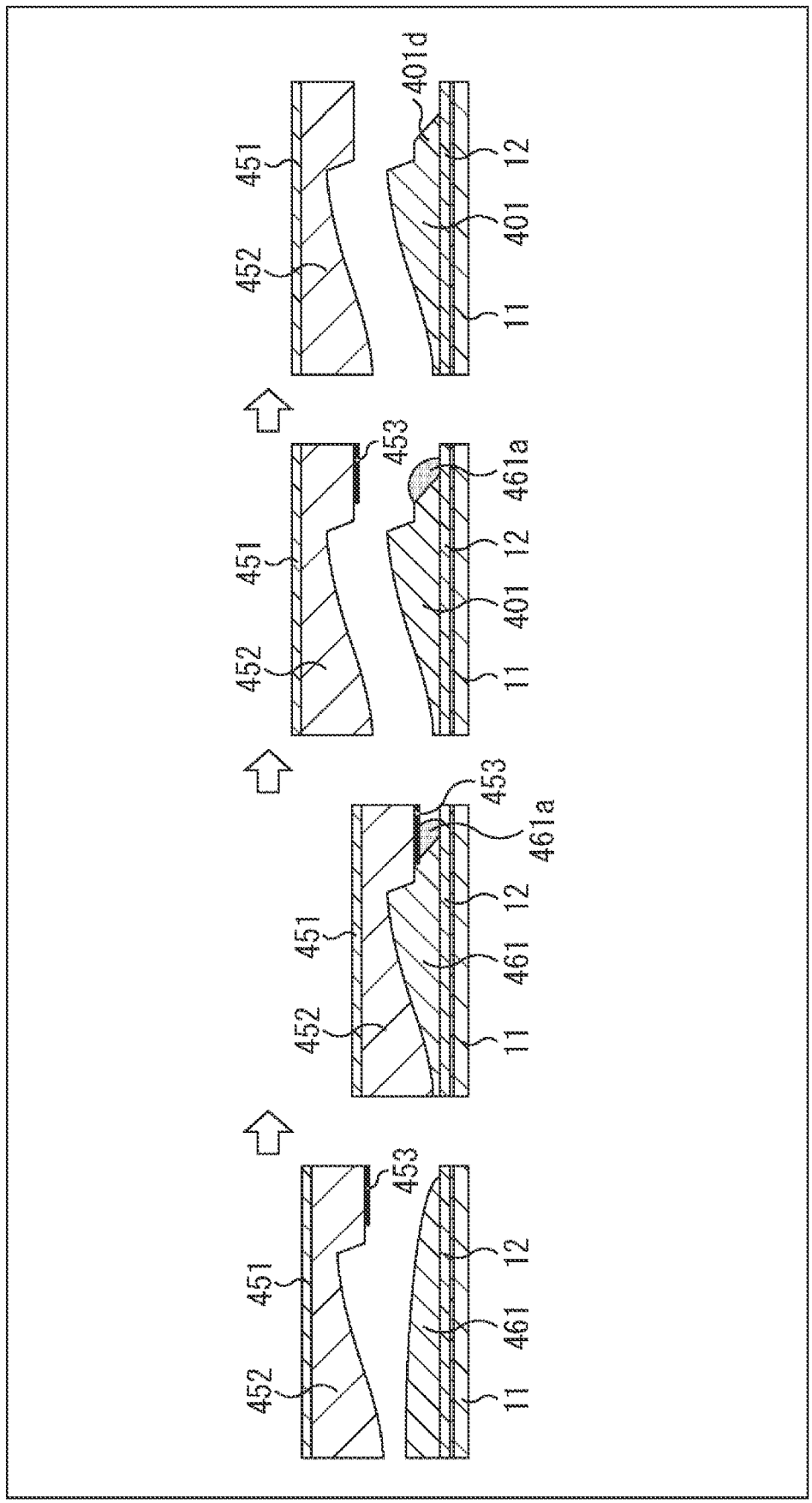
FIG. 49 is a diagram illustrating a modified example of the method of manufacturing the two-stage side surface type lens.

In this case, as illustrated in a second drawing from the left in FIG. 49, in a state where the recess of the molding die 452 is filled with the ultraviolet light curing resin 461, ultraviolet light is emitted from the upper side in the drawing for a predetermined time. A lower part of the light shielding film 453 is shielded from the ultraviolet light and remains uncured, and the lens 401 is in an uncompleted state. However, the ultraviolet light curing resin 461 at the periphery of the effective region in the drawing exposed to ultraviolet light is cured and formed as the lens 401.

When the molding die 452 is released in this state, as illustrated in a third drawing from the left in FIG. 49, a side surface of a portion close to the glass substrate 12 among the side surfaces of the outermost two-stage configuration of the lens 401 formed as a two-stage side surface type lens is left as the overflowing portion 461a of the uncured ultraviolet light curing resin 461.

Thus, as illustrated in a right part of FIG. 49, the side surface of the uncured ultraviolet light curing resin 461 that remains in the state of the overflowing portion 461a is cured by separately irradiating the side surface with ultraviolet light while controlling the angle of the side surface and a surface roughness.

Figure 50:
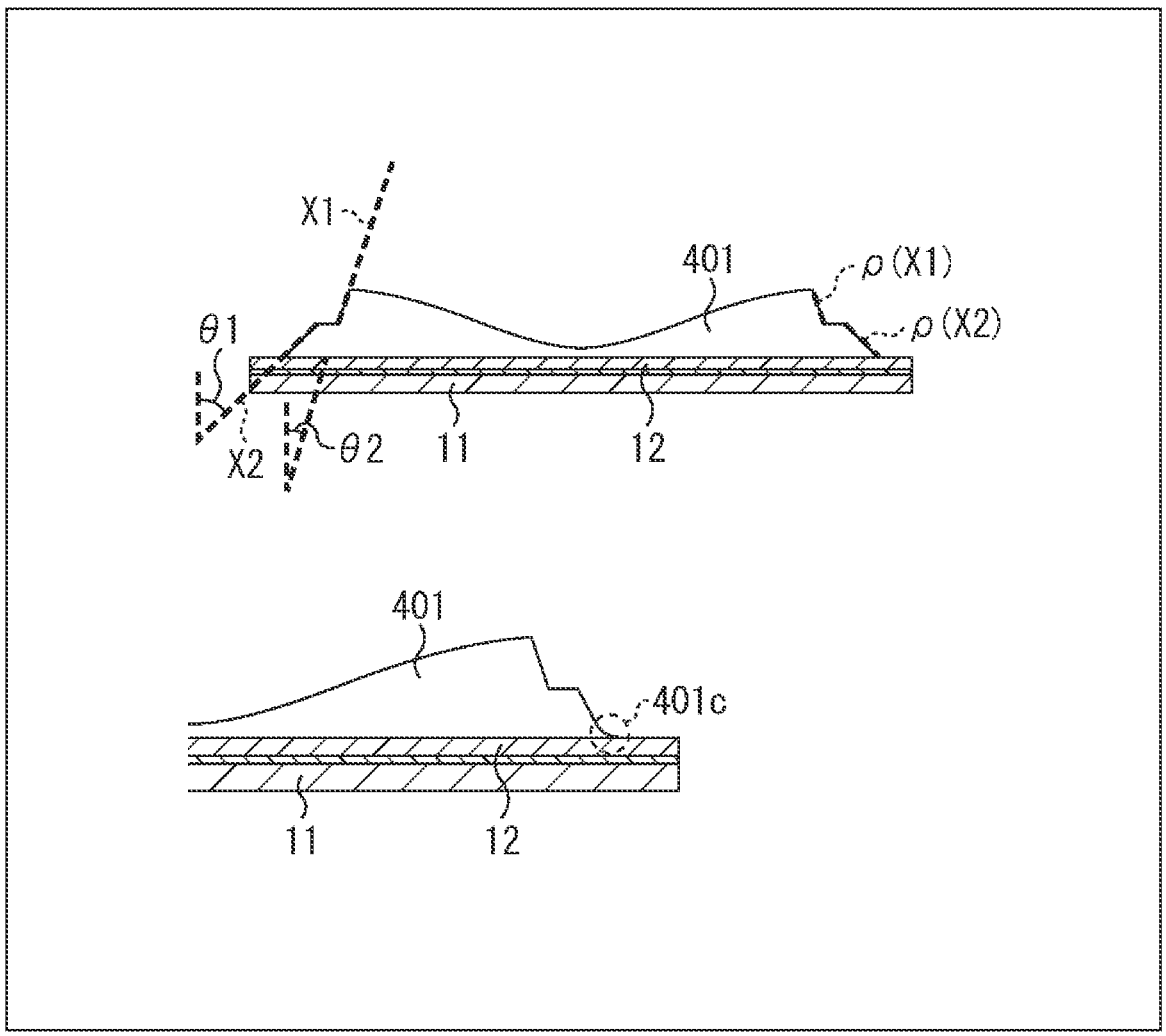
FIG. 50 is a diagram illustrating adjustment of an angle formed by an average plane of the side surface, adjustment of surface roughness, and provision of a hem in the method of manufacturing the two-stage side surface type lens in FIG. 49.

In this way, as illustrated in an upper part of FIG. 50, the angles formed by average planes X1 and X2 of the side surfaces of the lens 401 can be set to different angles such as angles θ1 and θ2, respectively, with respect to the incident direction of incident light, for example.

Here, when the angles of the side surfaces X1 and X2 are the angles θ1 and θ2, respectively, and the angle θ1 <the angle θ2 is satisfied, it is possible to prevent occurrence of side surface flare and to prevent the completed lens 401 from coming unstuck from the glass substrate 12 when the molding die 452 is released.

Furthermore, a configuration may be adopted in which surface roughness ρ(X1) and surface roughness ρ(X2) of the side surfaces X1 and X2, respectively, are different from each other.

Here, by setting the surface roughness ρ(X1) and the surface roughness ρ(X2) of the side surfaces X1 and X2, respectively, so that the surface roughness ρ(X1) <the surface roughness ρ(X2) is satisfied, it is possible to prevent occurrence of side surface flare and to prevent the completed lens 401 from coming unstuck from the glass substrate 12 when the molding die 452 is released.

Furthermore, by adjusting the shape of the overflowing portion 461a of the ultraviolet light curing resin 461, it is also possible to form the hem 401d as illustrated in a lower part of FIG. 50. With this arrangement, the lens 401 can be more firmly fixed to the glass substrate 12.

Note that the angles θ1 and θ2, the surface roughness ρ(X1) and the surface roughness ρ(X2), and the formation of the hem 401d can be set by the shape of the molding die 452 even in the case of not using the light shielding film 453 described with reference to FIG. 48. However, in the case of using the molding die 452 provided with the light shielding film 453 as referenced to FIG. 49, since the overflowing portion 461a of the ultraviolet light curing resin 461 left as an uncured portion after a first irradiation with ultraviolet light can be adjusted later, the degree of freedom in setting the angles θ1 and θ2, the surface roughness ρ(X1) and the surface roughness ρ(X2), and the hem 401d can be increased.

In either case, the lens 401 can be formed on the glass substrate 12 of the solid-state imaging element 11 with high accuracy. Furthermore, since the angle of the side surfaces X1 and X2, the surface roughness ρ(X1) and the surface roughness ρ(X2), and the presence or absence of the hem 401*d* in the two-stage side surface type lens 401 can be adjusted, occurrence of flare and ghosts can be prevented, and the lens 401 can be more firmly formed on the glass substrate 12.

19. Nineteenth Embodiment

In the above description, the example has been described in which the lens 401 is formed on the glass substrate 12 on the solid-state imaging element 11 with high accuracy by the molding method. However, the lens 401 may be formed on the glass substrate 12 with higher accuracy by forming an alignment mark on the glass substrate 12 and performing positioning on the basis of the alignment mark so that the lens 401 is formed at an appropriate position on the glass substrate 12.

Figure 51:
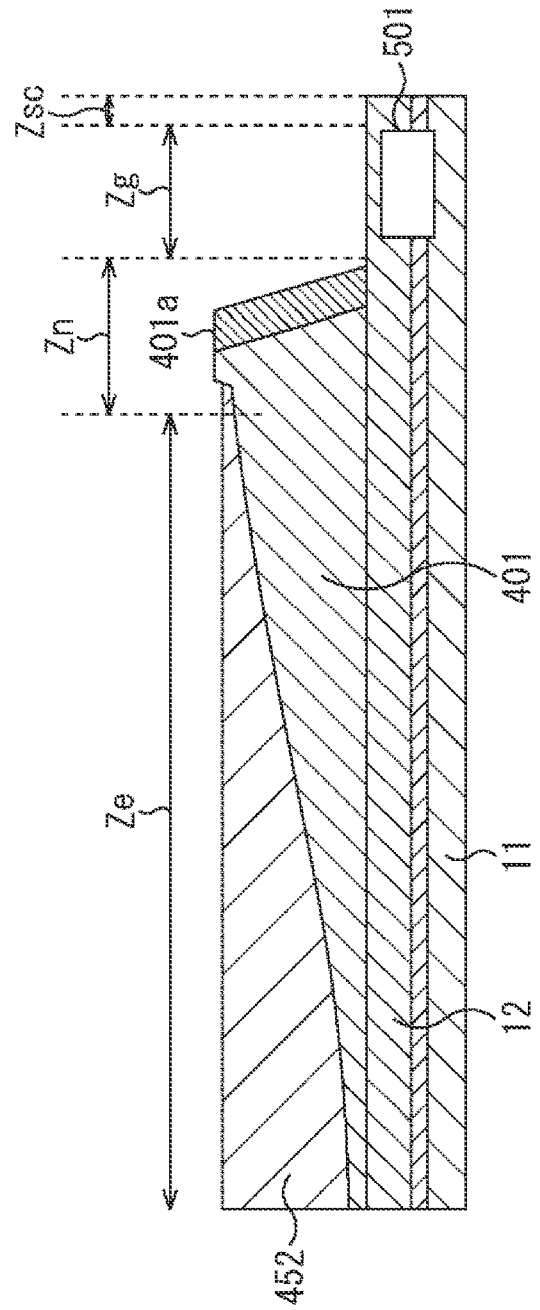
FIG. 51 is a diagram illustrating a configuration example of a nineteenth embodiment of an imaging device of the present disclosure.

That is, as illustrated in FIG. 51, an effective region Ze (corresponding to the effective region 131*a* in FIG. 23) of a lens 401 is provided from the center, an ineffective region Zn (corresponding to the ineffective region 131*b* in FIG. 23) is provided in an outer circumferential part thereof, a region Zg where a glass substrate 12 is exposed is further provided in an outer circumferential part thereof, and a region Zsc where a scribe line is set is provided in an outermost circumferential portion of a solid-state imaging element 11. In FIG. 51, a protruding portion 401*a* is provided in the ineffective region Zn (corresponding to the ineffective region 131*b* in FIG. 23).

The width of each region has a relationship expressed by width of the effective region Ze>width of the ineffective region Zn>width of the region Zg where the glass substrate 12 is exposed>width of the region Zsc where the scribe line is set.

An alignment mark 501 is formed in the region Zg on the glass substrate 12 where the glass substrate 12 is exposed. Thus, the size of the alignment mark 501 is smaller than the region Zg, but needs to be a size that can be recognized by an image for alignment.

Alignment may be performed by forming the alignment mark 501 on the glass substrate 12 at, for example, a position where a corner portion of the lens 401 is supposed to abut, and adjusting the corner portion of the lens in a molding die 452 to be at a position where the alignment mark 501 is provided on the basis of an image captured by an alignment camera.

<Example of Alignment Mark>

Figure 52:
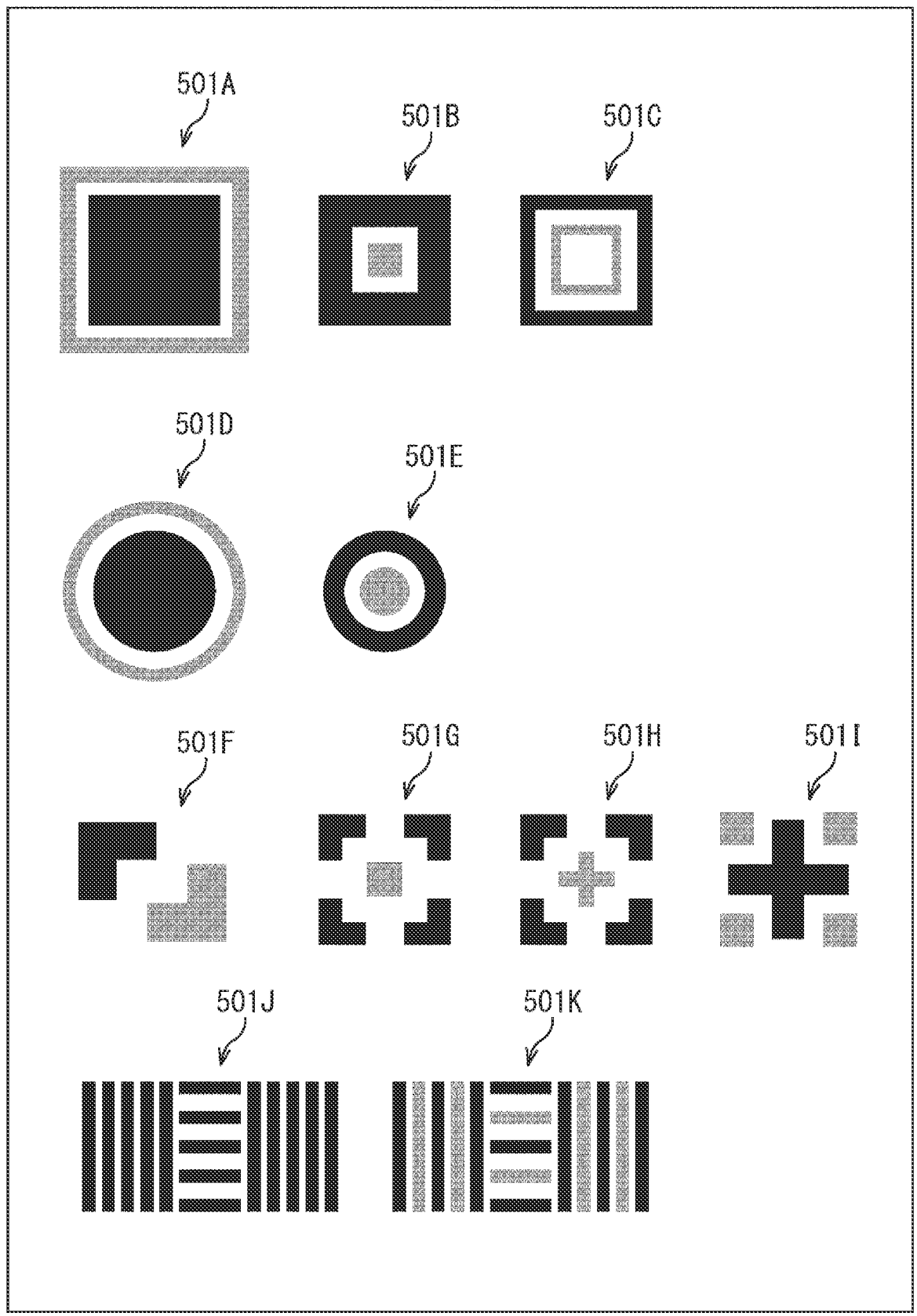
FIG. 52 is a diagram illustrating an example of an alignment mark in FIG. 51.

Examples of the alignment mark 501 include alignment marks 501A to 501K as illustrated in FIG. 52.

That is, the alignment marks 501A to 501C have a rectangular shape, the alignment marks 501D and 501E have a circular shape, the alignment marks 501F to 501I have a polygonal shape, and the alignment marks 501J and 501K include a plurality of linear shapes.

<Example of Providing Alignment Mark on Glass Substrate and Molding Die>

Furthermore, a black portion and a gray portion in each of the alignment marks 501A to 501K may be formed at corresponding positions in an outer circumferential portion of the lens 401 on the molding die 452 and in the region Zg on the glass substrate 12, respectively. To align the positional relationship between the lens 401 and the glass substrate 12, whether the black portion and the gray portion are in a positional relationship in which they correspond to each other may be checked on the basis of an image captured by the alignment camera, for example.

That is, in a case of the alignment mark 501A, as illustrated in FIG. 52, for the purpose of allowing the lens 401 and the molding die 452 to be in an appropriate positional relationship, a gray portion alignment mark 501' constituted by a rectangular frame is provided on the molding die 452, and the alignment mark 501 constituted by a rectangular part as a black portion is formed.

Figure 53:
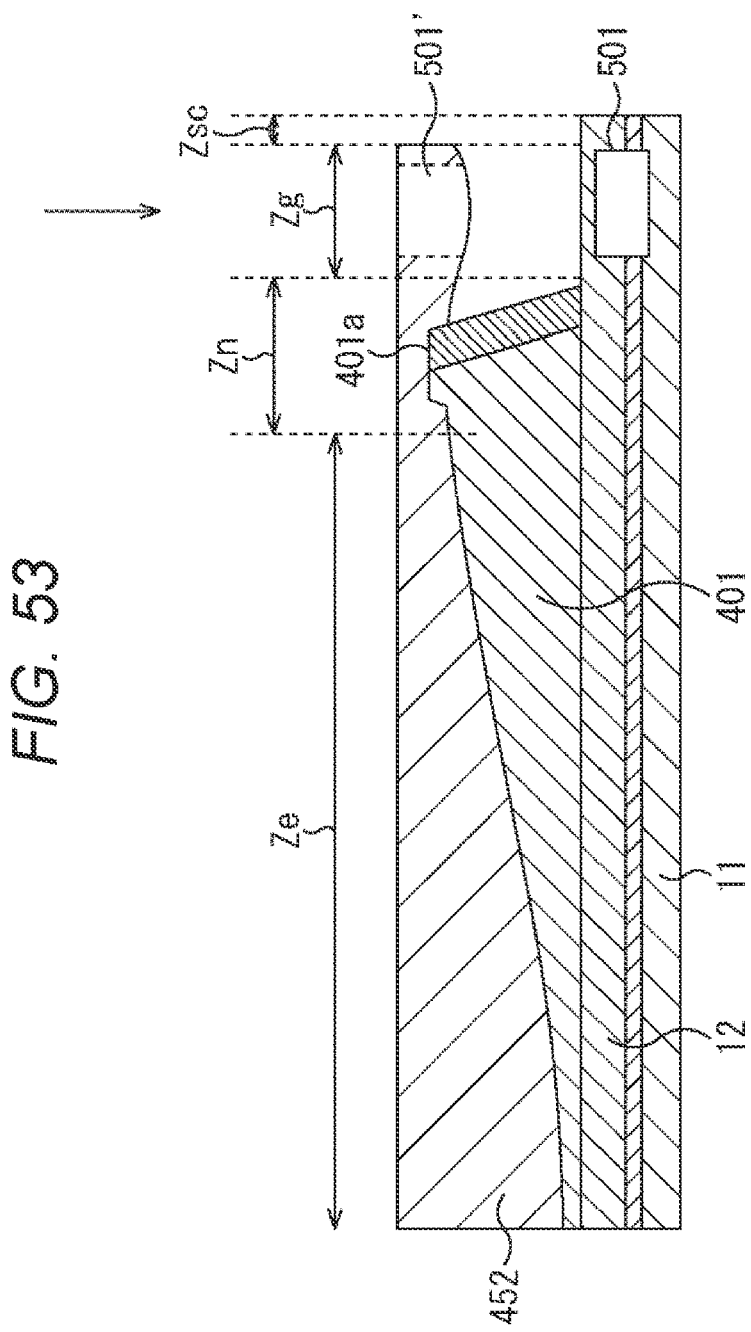
FIG. 53 is a diagram illustrating an application example using the alignment mark in FIG. 51.

Then, for alignment adjustment, the alignment mark 501 on the glass substrate 12 and the alignment mark 501' on the molding die 452 may be imaged with the alignment camera in the direction of an arrow in FIG. 53, and the position of the molding die 452 may be adjusted so that the black rectangular alignment mark 501 is imaged so as to be included in and overlap with the alignment mark 501' constituted by a gray rectangular frame.

In this case, it is desirable that the black portion alignment mark 501 and the gray portion alignment mark 501' are arranged in the same field of view of the same camera. Alternatively, positional relationships between a plurality of cameras may be calibrated in advance, and alignment may be performed by the plurality of cameras on the basis of correspondence of positional relationship between the alignment marks 501 and 501' provided at corresponding different positions.

In either case, the lens 401 can be positioned and formed with high accuracy on the glass substrate 12 of the solid-state imaging element 11 by the alignment mark 501.

20. Twentieth Embodiment

In the above description, the example has been described in which the lens 401 and the glass substrate 12 on the solid-state imaging element 11 are positioned and formed with high accuracy by the alignment mark. However, by forming an AR coat 402 in the effective region of the lens 401, sensitivity may be improved for high-definition imaging.

Figure 54:
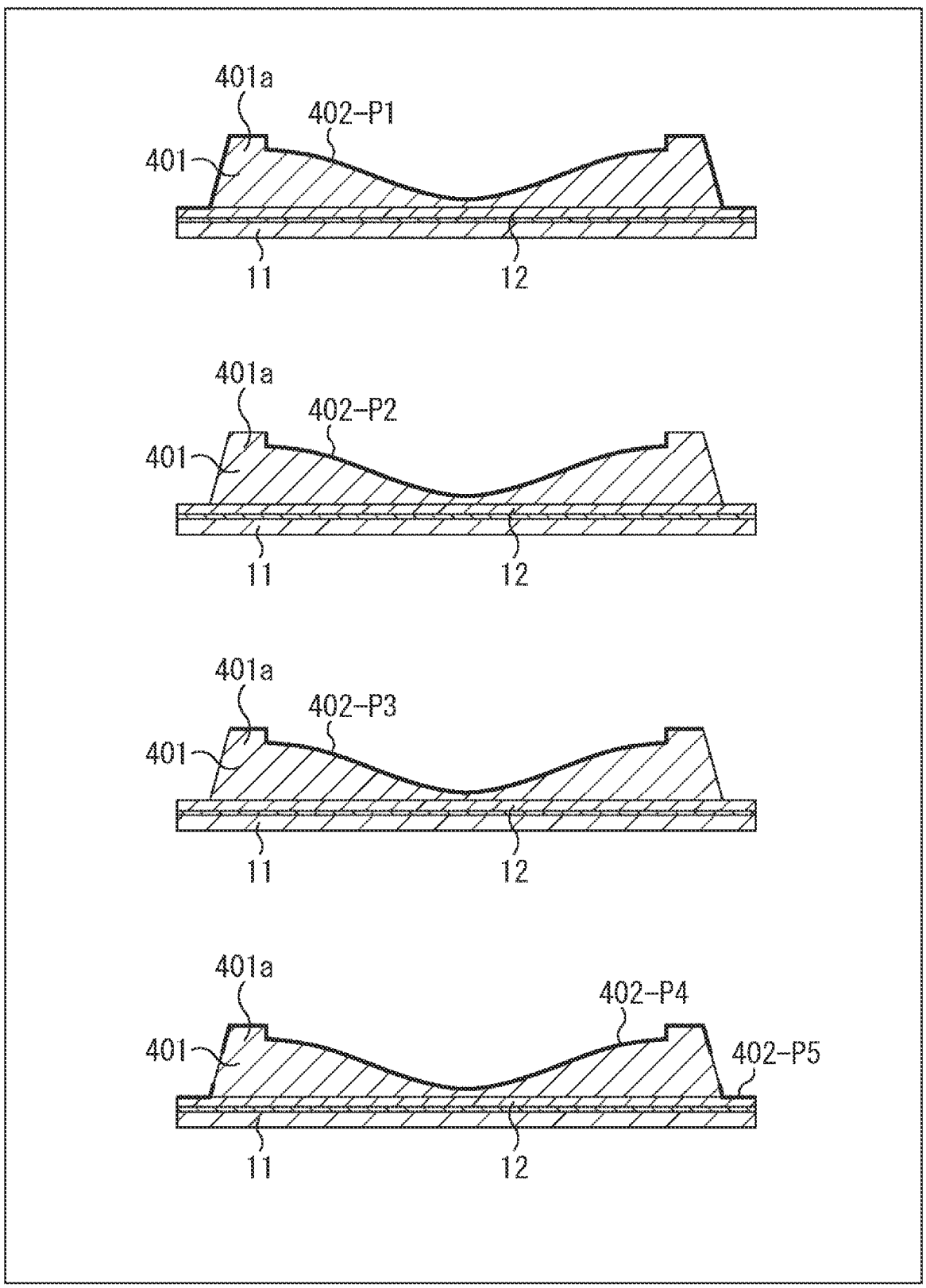
FIG. 54 is a diagram illustrating a configuration example of a twentieth embodiment of an imaging device of the present disclosure.

That is, for example, as indicated by a thick line in an uppermost part of FIG. 54, an AR coat 402-P1 may be formed on a glass substrate 12, an ineffective region (corresponding to the ineffective region 131*b* in FIG. 23) including a side surface and a planar portion of a protruding portion 401*a*, and the entire region of an effective region (corresponding to the effective region 131*a* in FIG. 23).

Furthermore, for example, as illustrated in a second drawing from the top in FIG. 54, an AR coat 402-P2 may be formed only in the effective region in the protruding portion 401*a* on a lens 401. Since the AR coat 402-P2 is formed only in the region (effective region (corresponding to the effective region 131*a* in FIG. 23)) in the protruding portion 401*a* on the lens 401, it is possible to reduce stress generated by expansion or contraction of the lens 401 due to heat during mount reflow thermal loading or the like, and it is possible to prevent generation of a crack in the AR coat 402-P2.

Moreover, for example, as indicated by a third drawing from the top in FIG. 54, an AR coat 402-P3 may be formed in a region (effective region (corresponding to the effective region 131*a* in FIG. 23)) inside the protruding portion 401*a* including the planar portion of the protruding portion 401*a* on the lens 401. Since the AR coat 402-P3 is formed only in the region inside the protruding portion 401*a* including the protruding portion 401*a* on the lens 401, it is possible to reduce stress generated on the AR coat 402-P3 due to expansion or contraction of the lens 401 due to heat during mount reflow thermal loading or the like, and it is possible to prevent generation of a crack.

Moreover, for example, as illustrated in a fourth drawing from the top in FIG. 54, in addition to the planar portion of the protruding portion 401a on the lens 401 and a part of an outer circumferential part thereof, an AR coat 402-P4 may be formed in a region inside the protruding portion 401a (effective region (corresponding to the effective region 131a in FIG. 23)), and moreover, an AR coat 402-P5 may be formed in a region in the vicinity of the boundary with the glass substrate 12 in the glass substrate 12 and the lens 401. By forming, on a part of a side surface portion of the lens 401, a region where the AR coat is not formed as in the AR coats 402-P4 and 402-P5, it is possible to reduce stress generated on the AR coat 402-P2 due to expansion or contraction of the lens 401 due to heat during mount reflow thermal loading or the like, and it is possible to prevent generation of a crack.

Figure 55:
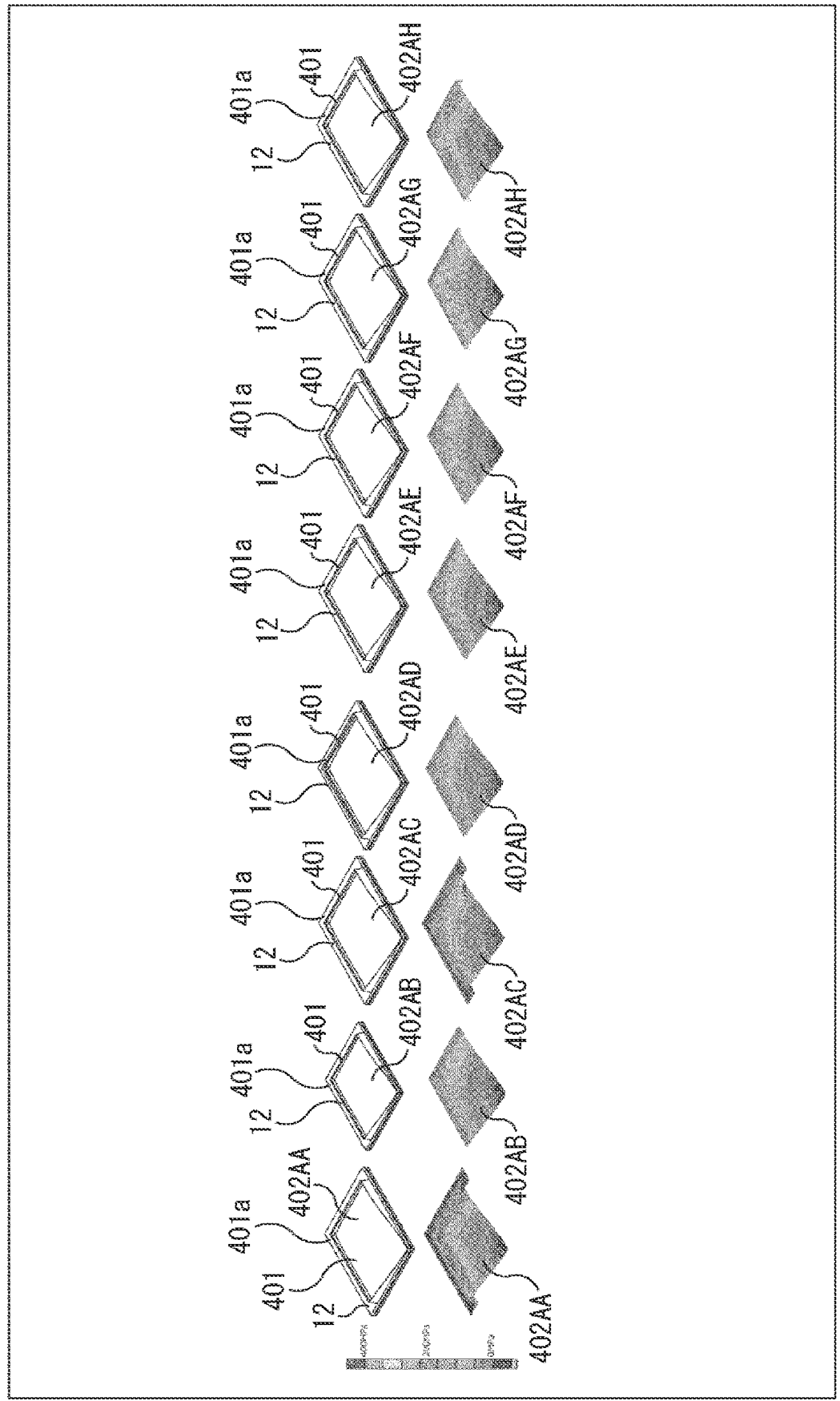
FIG. 55 is a diagram illustrating distribution of stress applied to an AR coat during mount reflow thermal loading in a case where the AR coat is formed on an entire surface and in other cases.

FIG. 55 summarizes distribution of stress generated in the AR coat 402 during mount reflow thermal loading, in which the region where the AR coat 402 is formed with respect to the lens 401 is changed in a variety of ways.

In FIG. 55, an upper part illustrates the external shape of the lens 401 and the AR coat 402 when the lens 401 has been horizontally divided into two and perpendicularly divided into two, and a lower part illustrates corresponding distribution of stress generated in the AR coat 402 during mount reflow thermal loading.

A left part of FIG. 55 illustrates a case where an AR coat 402AA is formed in which the AR coat is formed on the entire region including the peripheral glass substrate 12, the side surfaces of the lens 401, the protruding portion 401a, and the inside of the protruding portion 401a.

A second drawing from the left in FIG. 55 illustrates a case of an AR coat 402AB in which, as compared with the configuration in the leftmost part of FIG. 55, the AR coat is not formed on the peripheral glass substrate 12 and side surfaces of the lens 401, but the AR coat is formed in the remaining region.

A third drawing from the left in FIG. 55 illustrates a case of an AR coat 402AC in which, as compared with the configuration in the leftmost part of FIG. 55, the AR coat is not formed in the region of the side surfaces of the lens 401, but the AR coat is applied to the peripheral glass substrate 12, the protruding portion 401a, and the inside of the protruding portion 401a.

A fourth drawing from the left in FIG. 55 illustrates a case of an AR coat 402AD in which, as compared with the configuration in the leftmost part of FIG. 55, the AR coat is not formed in the region of the side surfaces of the lens 401, the planar portion of the protruding portion 401a, and the region from a flat portion of the upper surface of the protruding portion 401a to a predetermined width A inside the protruding portion 401a, but the AR coat is applied to the remaining portion inside the protruding portion 401a and the peripheral glass substrate 12. Here, the width A is, for example, 100 μm.

A fifth drawing from the left in FIG. 55 illustrates a case of an AR coat 402AE in which, as compared with the configuration in the leftmost part of FIG. 55, the AR coat is formed inside the protruding portion 401a, on the flat portion of the upper surface of the protruding portion 401a, and in a region of the predetermined width A from and below the flat portion in a side surface on the outside of the protruding portion 401a.

A sixth drawing from the left in FIG. 55 illustrates a case of an AR coat 402AF in which, as compared with the configuration in the leftmost part of FIG. 55, the AR coat is formed inside the protruding portion 401a, on the flat portion of the upper surface of the protruding portion 401a, and in a region of a predetermined width 2A from and below the flat portion in the side surface on the outside of the protruding portion 401a.

A seventh drawing from the left in FIG. 55 illustrates a case of an AR coat 402AG in which, as compared with the configuration in the leftmost part of FIG. 55, the AR coat is formed inside the protruding portion 401a, on the flat portion of the upper surface of the protruding portion 401a, and in a region of a predetermined width 3A from and below the flat portion in the side surface on the outside of the protruding portion 401a.

An eighth drawing from the left in FIG. 55 illustrates a case of an AR coat 402AH in which, as compared with the configuration in the leftmost part of FIG. 55, the AR coat is formed inside the protruding portion 401a, on the flat portion of the upper surface of the protruding portion 401a, and in a region of a predetermined width 4A from and below the flat portion in the side surface on the outside of the protruding portion 401a.

Comparison with the leftmost part of FIG. 55 shows that the stress generated in the AR coat 402 is smaller in a case where the AR coat 402 is formed in a state in which the AR coat inside the protruding portion 401a of the lens 401 is not continuously connected to the AR coat 402 on the glass substrate 12 than in a case of the AR coat 402AA formed so as to cover the entire surface of the lens 401 in any case.

As described above, by forming the AR coat 402 on the lens 401, occurrence of flare and ghosts can be prevented, and a higher-definition image can be captured.

Furthermore, as for the AR coat 402 to be formed, on the entire surface including the effective region and the ineffective region of the lens 401 including the protruding portion 401a and the glass substrate 12 serving as an outer circumferential part thereof, a region where the AR coat is not formed is provided at least partially excluding the effective region and the glass substrate 12, so that it is possible to prevent generation of a crack attributable to expansion or contraction during mount reflow thermal loading or heating for reliability inspection or the like.

Note that, although the AR coat 402 has been described here, other films may be used as long as the film is formed on the surface of the lens 401, and the same applies to, for example, an antireflection film such as moth-eye.

Furthermore, in the above description, the example of the lens including the protruding portion 401a has been described. However, even in a case of a lens that does not include the protruding portion 401a, it is only required that, on the entire surface including the effective region and the ineffective region and the glass substrate 12 serving as an outer circumferential part thereof, a region where the AR coat is not formed is provided at least partially excluding the effective region and the glass substrate 12. In other words, it is only required that the AR coat 402 formed on the lens 401 is not formed in a state of being continuously connected to the AR coat 402 formed on the side surfaces of the lens and the glass substrate 12. Thus, the lens 401 may be, for example, a two-stage side surface type lens 401L, and similar effects can be obtained as long as the AR coat 402 formed on the lens 401 is not formed in a state of being continuously connected to the AR coat 402 formed on the side surfaces of the lens and the glass substrate 12.

21. Twenty-First Embodiment

In the above description, the example has been described in which the AR coat 402 formed on the lens 401 is not formed in a state of being continuously connected to the AR coat 402 formed on the glass substrate 12, so that stress generated in the AR coat 402 due to expansion or contraction attributable to heat during mount reflow thermal loading is reduced.

However, a light shielding film may be formed so as to cover a protruding portion 401a and side surfaces of a lens 401 so that occurrence of side surface flare is prevented.

Figure 56:
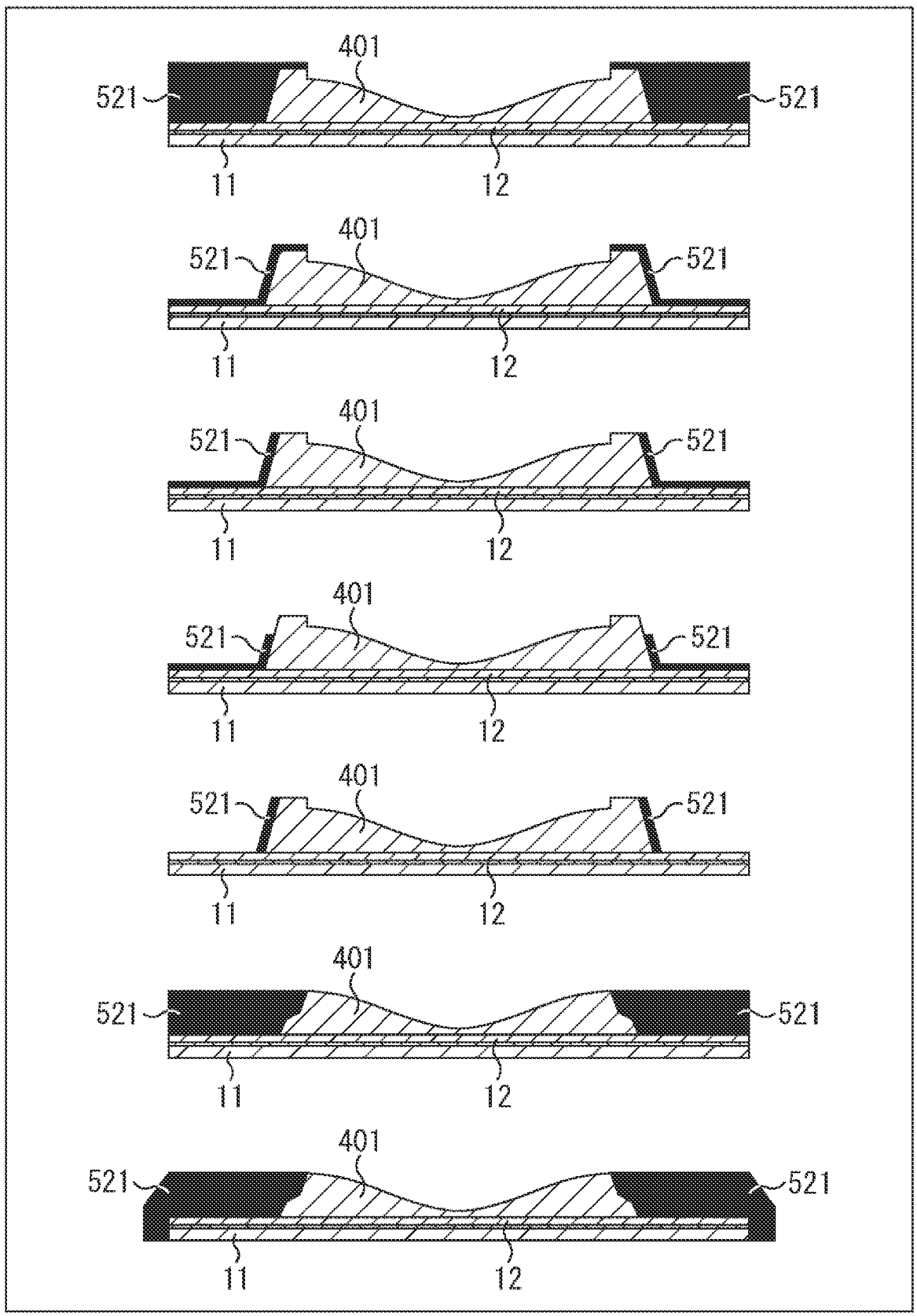
FIG. 56 is a diagram illustrating a configuration example of a twenty-first embodiment of an imaging device of the present disclosure.

That is, as illustrated in an uppermost part of FIG. 56, on a glass substrate 12, a light shielding film 521 may be formed on the side surface of the lens 401 and the entire range up to the height of a planar portion of the upper surface of the protruding portion 401a, that is, in a range excluding an effective region.

Furthermore, as illustrated in a second drawing from the top in FIG. 56, the light shielding film 521 may be formed on the entire surface from the top of the glass substrate 12, the side surface of the lens 401, and to the planar portion of the upper surface of the protruding portion 401a, that is, the entire surface portion excluding the effective region.

Moreover, as illustrated in a third drawing from the top in FIG. 56, the light shielding film 521 may be formed on a side surface of the protruding portion 401a of the lens 401 from the glass substrate 12.

Furthermore, as illustrated in a fourth drawing from the top in FIG. 56, the light shielding film 521 may be formed in a range from the glass substrate 12 to a predetermined height from the glass substrate 12 on the side surface of the protruding portion 401a of the lens 401.

Moreover, as illustrated in a fifth drawing from the top in FIG. 56, the light shielding film 521 may be formed only on the side surface of the protruding portion 401a of the lens 401.

Furthermore, as illustrated in a sixth drawing from the top in FIG. 56, the light shielding film 521 may be formed in a range up to the highest position of the two side surfaces of the two-stage side surface type lens 401 on the glass substrate 12.

Moreover, as illustrated in a seventh drawing from the top in FIG. 56, the light shielding film 521 may be formed so as to cover the entire surface up to the highest position of the two side surfaces of the two-stage side surface type lens 401 on the glass substrate 12 and an outer circumferential portion of a solid-state imaging element 11.

In either case, the light shielding film 521 is formed by partial film formation, formed by lithography after film formation, formed by film formation after resist formation and lift-off of the resist, or formed by lithography.

Furthermore, a mound for forming a light shielding film may be formed on an outer circumferential part of the two-stage side surface type lens 401, and the light shielding film 521 may be formed inside the mound on the outer circumferential part of the two-stage side surface type lens 401.

Figure 57:
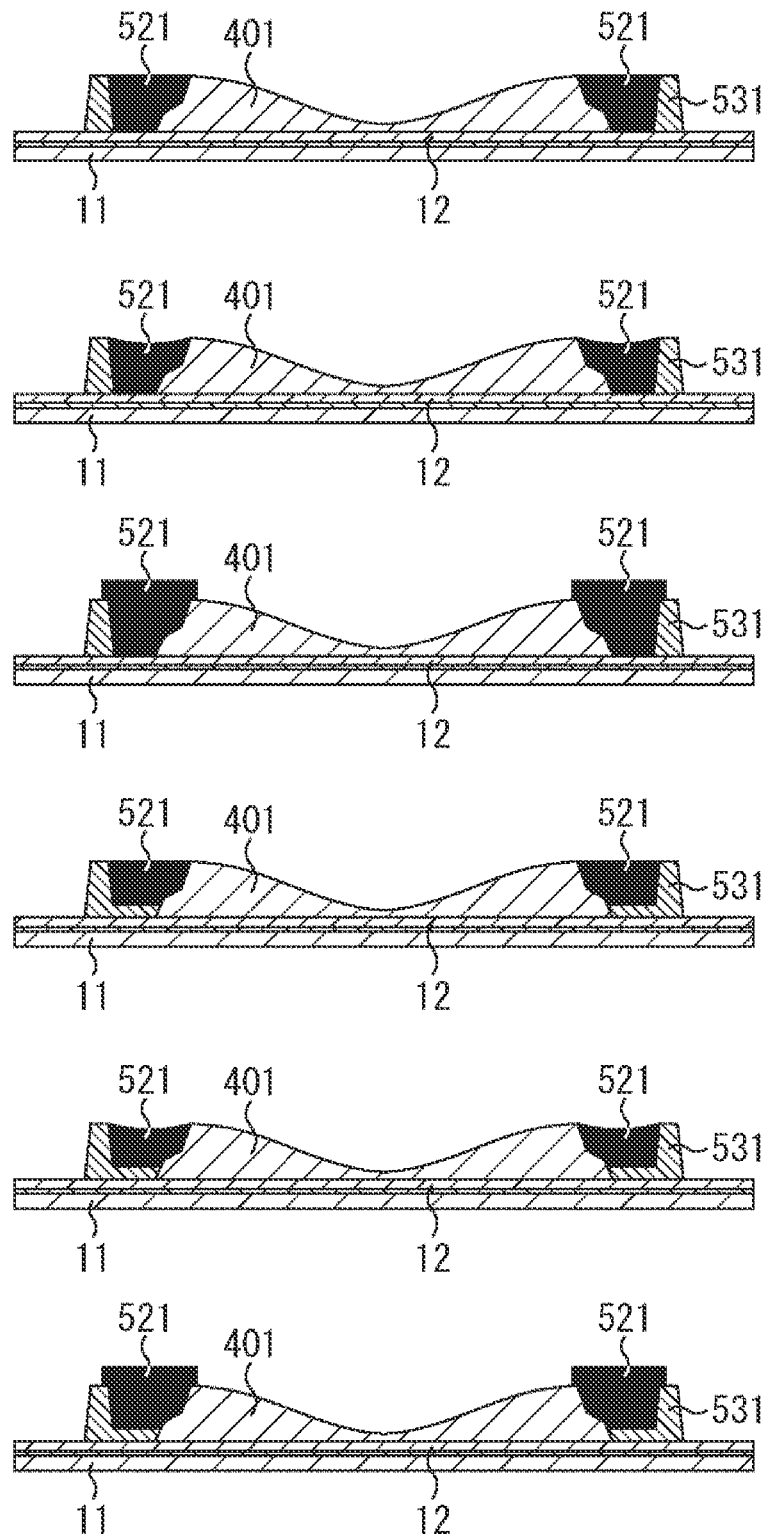
FIG. 57 is a diagram illustrating an example in which a light shielding film is formed on a side surface so as to connect a lens and a mound.

That is, as illustrated in an uppermost part of FIG. 57, a mound 531 having the same height as the lens height may be formed on the glass substrate 12 at the outer circumferential part of the two-stage side surface type lens 401, the light shielding film 521 may be formed inside the mound 531 on the outer circumferential part of the two-stage side surface type lens 401 by lithography or application, and then the heights of the light shielding film 521, the lens 401, and the mound 531 may be aligned by polishing such as chemical mechanical polishing (CMP).

Furthermore, as illustrated in a second part of FIG. 57, the mound 531 having the same height as the lens height may be formed on the glass substrate 12 in the outer circumferential part of the two-stage side surface type lens 401, and only a material of the light shielding film 521 may be applied inside the mound 531 in the outer circumferential part of the two-stage side surface type lens 401. The heights of the light shielding film 521, the lens 401, and the mound 531 may be self-aligned by the material of the light shielding film 521.

Moreover, as illustrated in a third part of FIG. 57, the mound 531 having the same height as the lens height may be formed on the glass substrate 12 in the outer circumferential part of the two-stage side surface type lens 401, and only the light shielding film 521 may be formed by lithography inside the mound 531 in the outer circumferential part of the two-stage side surface type lens 401.

Furthermore, as illustrated in a fourth part of FIG. 57, the mound 531 may be formed on the glass substrate 12 in the outer circumferential part of the two-stage side surface type lens 401 so as to cover the boundary between the two-stage side surface type lens 401 and the glass substrate 12, and after the light shielding film 521 has been formed inside the mound 531 on the outer circumferential part of the two-stage side surface type lens 401 by lithography or application, the heights of the light shielding film 521, the lens 401, and the mound 531 may be aligned by polishing such as chemical mechanical polishing (CMP).

Furthermore, as illustrated in a fifth part of FIG. 57, the mound 531 may be formed on the glass substrate 12 in the outer circumferential part of the two-stage side surface type lens 401 so as to cover the boundary between the two-stage side surface type lens 401 and the glass substrate 12, and only the material of the light shielding film 521 may be applied inside the mound 531 in the outer circumferential part of the two-stage side surface type lens 401. The heights of the light shielding film 521, the lens 401, and the mound 531 may be self-aligned by the material of the light shielding film 521.

Moreover, as illustrated in a sixth part of FIG. 57, the mound 531 may be formed on the glass substrate 12 in the outer circumferential part of the two-stage side surface type lens 401 so as to cover the boundary between the two-stage side surface type lens 401 and the glass substrate 12, and only the light shielding film 521 may be formed by lithography inside the mound 531 in the outer circumferential part of the two-stage side surface type lens 401.

In either case, since the light shielding film is formed so as to cover the protruding portion 401a and the side surface of the lens 401, occurrence of side surface flare can be prevented.

Note that, in the above description, the example has been described in which a light shielding film is formed on the outer circumferential part of the lens 401. However, it is only required that light from the outer circumferential part of the lens 401 cannot enter, and thus, for example, a light absorption film may be formed instead of the light shielding film.

22. Twenty-Second Embodiment

In the above description, a cavity-less structure in which the upper substrate lib and the glass substrate 12 for protecting the on-chip lens 11d are connected to each other via the adhesive 13 constituted by glass seal resin and a cavity is not provided has been mainly described as the configuration of the integrated component 10.

A structure in which the cavity is provided between the upper substrate lib and the glass substrate 12 has been described in the ninth embodiment illustrated in FIG. 17. In the following twenty-second embodiment, another cavity structure in which a cavity is provided will be further described.

<First Configuration Example of Twenty-Second Embodiment>

Figure 58:
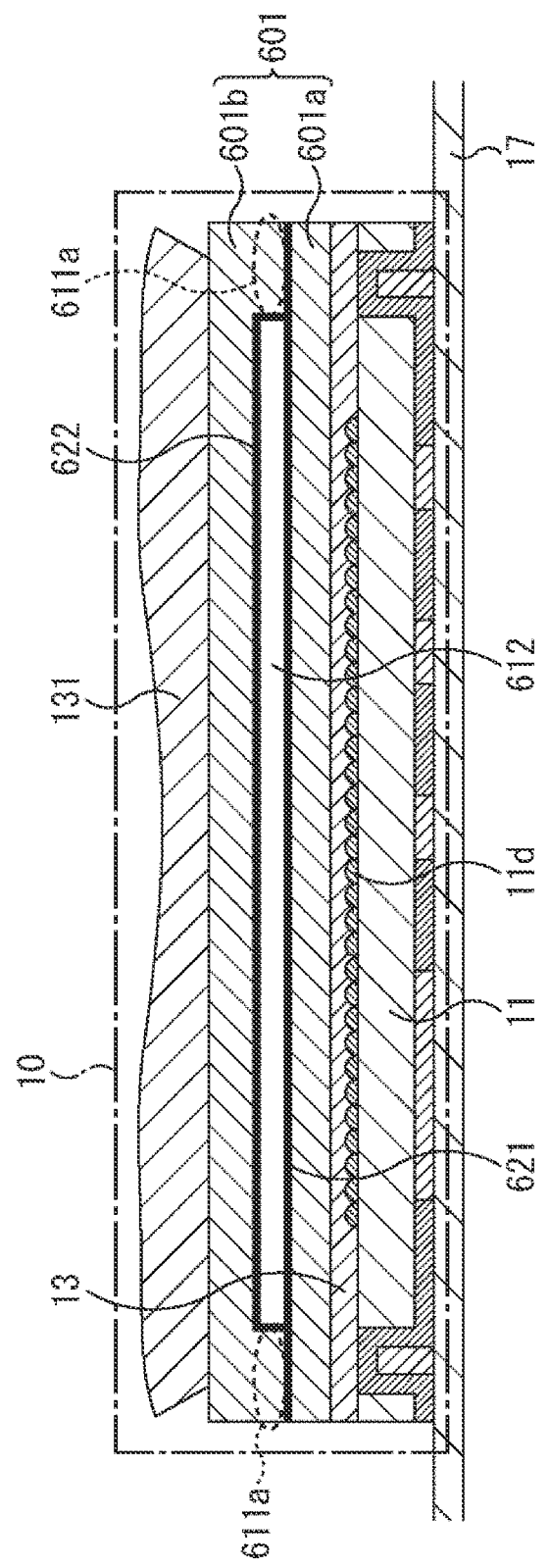
FIG. 58 is a side sectional view illustrating a first configuration example according to a twenty-second embodiment of an imaging device of the present disclosure.

FIG. 58 is a side sectional view illustrating a first configuration example according to the twenty-second embodiment of the imaging device of the present disclosure.

Note that, in FIG. 58, only an integrated component 10 and a part of a circuit board 17 in an imaging device 1 are illustrated in an enlarged manner. Other peripheral portions, specifically, an actuator 18, a connector 19, a spacer 20, and a lens group 16 connected to the actuator 18, in which a configuration similar to that of the other embodiments described above is adopted, are not illustrated. The same applies to FIGS. 61 to 66 described later.

In FIG. 58, a glass substrate 601 having a configuration in which a first glass substrate 601a and a second glass substrate 601b are bonded together is provided on an upper surface portion of a solid-state imaging element 11.

The lower surface of the glass substrate 601 is bonded to the solid-state imaging element 11 with an adhesive 13 that is transparent and has a refractive index substantially the same as that of the glass substrate 601. On the upper surface of the glass substrate 601, the same lens 131 as that of the imaging device 1 illustrated in FIG. 9 is formed.

The lens 131 constitutes a lowermost layer with respect to the incident direction of light among a plurality of lenses constituting the lens group 16, and is denoted with the same reference numeral as the lens group 16 in FIG. 1, and has in common with the imaging device 1 in FIG. 9 that a lens 131 serving as the lowermost layer with respect to the incident direction of light is not included.

On the other hand, in the imaging device 1 in FIG. 9, the lens 131 is provided on the IRCF 14 formed on the glass substrate 12. In FIG. 58, the IRCF 14 is omitted, and the lens 131 is formed on the glass substrate 601, which is a difference from the imaging device 1 in FIG. 9. Note that the IRCF 14 may be provided between the glass substrate 601 and the lens 131.

As described above, the glass substrate 601 has a configuration in which the first glass substrate 601a and the second glass substrate 601b are bonded together. The second glass substrate 601b, which is on the lens group 16 side and is farther from the solid-state imaging element 11, has a protrusion 611a protruding toward the first glass substrate 601a, so that a cavity 612 constituted by an air layer is formed between the first glass substrate 601a and the second glass substrate 601b. The protrusion 611a is provided on an outer circumferential part of the second glass substrate 601b, which is square in a plan view. The cavity 612 is surrounded by the protrusion 611a on four side surfaces in the planar direction, and is surrounded by the upper surface of the first glass substrate 601a and the lower surface of the second glass substrate 601b in the vertical direction (perpendicular direction). That is, the cavity 612 is sealed (enclosed) with the first glass substrate 601a and the second glass substrate 601b.

An AR coat 621 is formed on the upper surface of the first glass substrate 601a, and an AR coat 622 is formed on the lower surface of the second glass substrate 601b and also on a side surface portion that is in contact with the cavity 612 of the protrusion 611a. With this arrangement, surfaces of the first glass substrate 601a and the second glass substrate 601b that are in contact with the cavity 612 have an antireflection function.

The AR coats 621 and 622 can be formed with the use of a film similar to the AR coat 271a illustrated in FIG. 19. That is, the AR coats 621 and 622 can be formed with the use of, for example, an insulating film (e.g., SiCH, SiCOH, or SiCNH) containing, as main components, resin such as a transparent silicon-based resin, an acryl-based resin, an epoxy-based resin, or a styrene-based resin, silicon (Si), carbon (C), and hydrogen (H), an insulating film (e.g., SiON or SiN) containing silicon (Si) and nitrogen (N) as main components, or a SiO2 film, a P—SiO film, an HDP-SiO film, or the like formed with the use of an oxidizing agent and a material gas including at least one of silicon hydroxide, alkylsilane, alkoxysilane, polysiloxane, or the like.

Figure 59:
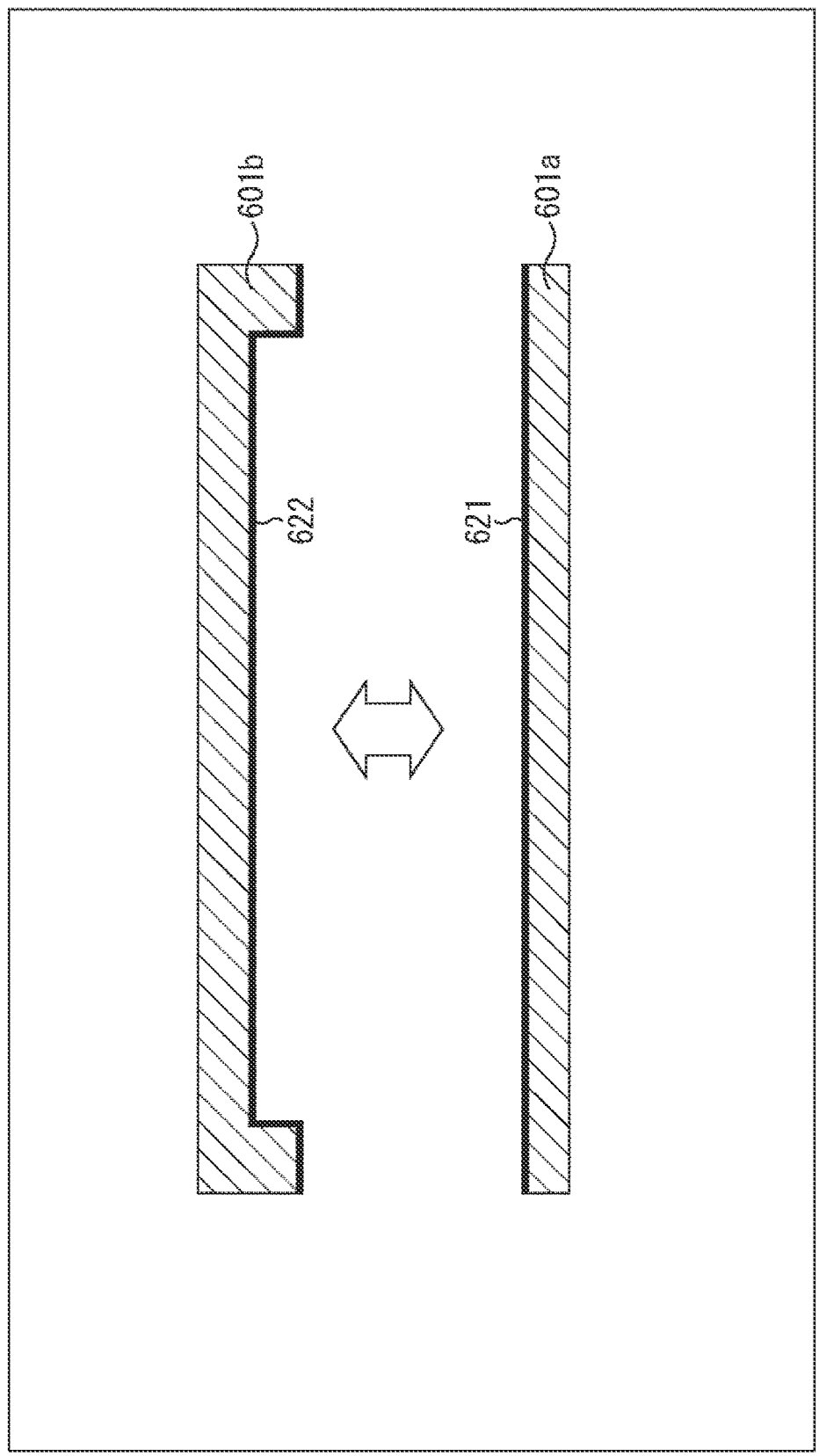
FIG. 59 is a diagram illustrating plasma joining between a first glass substrate and a second glass substrate.

As illustrated in FIG. 59, the glass substrate 601 has a configuration in which the first glass substrate 601a and the second glass substrate 601b are bonded by plasma joining in which contact surfaces of the first glass substrate 601a and the second glass substrate 601b are directly joined after being subjected to a surface activation treatment by plasma. The first glass substrate 601a and the second glass substrate 601b are bonded together via the AR coats 621 and 622, and the AR coats 621 and 622 also have a role of increasing joining strength in plasma joining.

Figure 60:
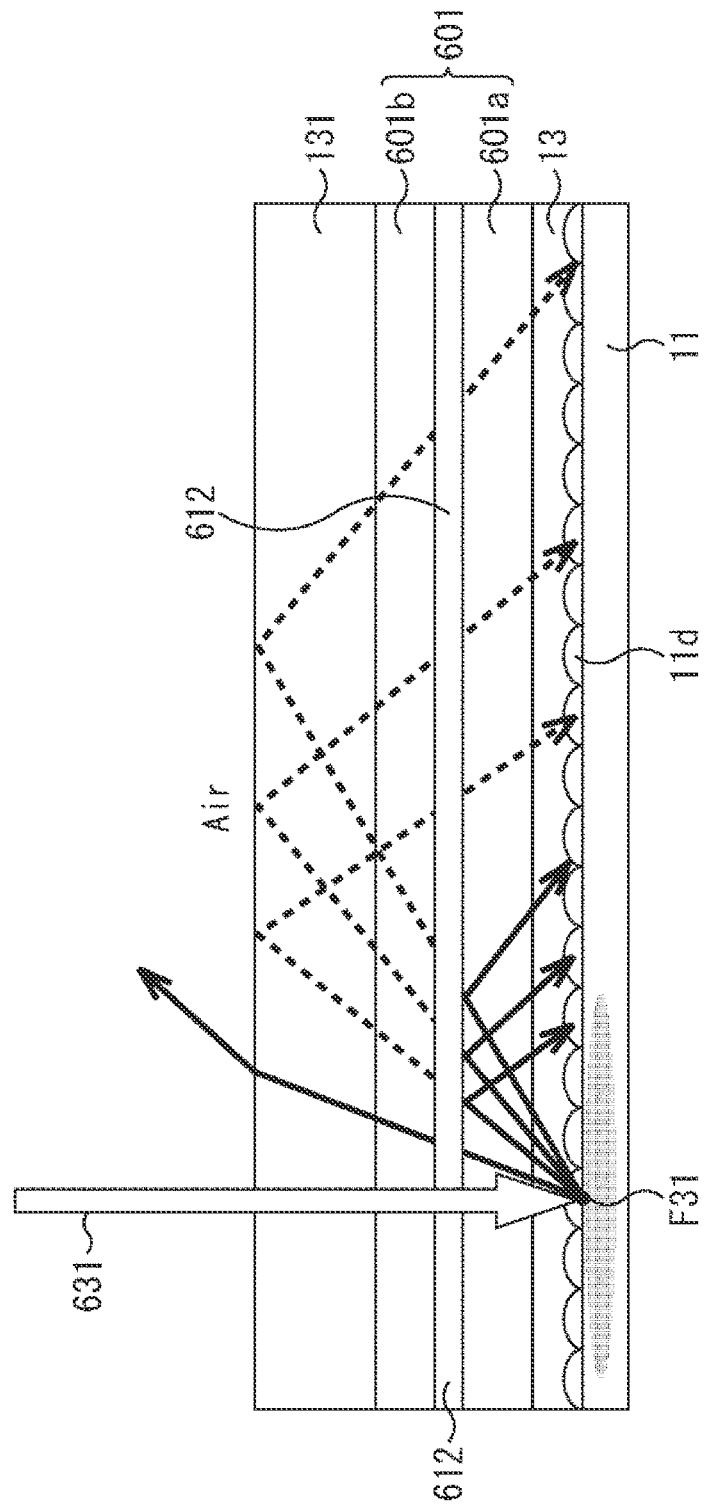
FIG. 60 is a schematic diagram illustrating an effect of the twenty-second embodiment.

Effects of the cavity 612 will be described with reference to FIG. 60. FIG. 60 is a schematic diagram of a laminated cross-sectional structure formed on the upper side of the solid-state imaging element 11.

A part of incident light 631 that passes through the lens group 16 (not illustrated) and travels toward the solid-state imaging element 11 is reflected at a position F31 on the upper surface of the solid-state imaging element 11 and becomes reflected light.

In a case of a structure without the cavity 612 between the first glass substrate 601a and the second glass substrate 601b, the refractive indexes of the glass substrate 601, the adhesive 13, and the lens 131 are substantially the same, so that the reflected light generated on the upper surface of the solid-state imaging element 11 is totally reflected on the upper surface (surface) of the lens 131, which is an interface with different refractive indexes. As a result, as indicated by a dotted arrow in FIG. 60, the reflected light enters the solid-state imaging element 11 again at a position away from the position F31 of the incident light 631, which causes flare or a ghost.

On the other hand, according to the first configuration example of the imaging device according to the twenty-second embodiment illustrated in FIG. 58, since the cavity 612 is provided on the side closer to the solid-state imaging element 11 than the bottom surface of the lowermost lens 131, the reflected light is totally reflected at the interface of the cavity 612 as indicated by a solid arrow in FIG. 60. As a result, the reflected light is incident again at a position close to the position F31 of the incident light 631, and spreading of total reflection flare can be prevented. This reduces image quality degradation.

Furthermore, although not illustrated in the schematic diagram in FIG. 60, since the AR coats 621 and 622 for preventing reflection are formed at the interfaces between the first glass substrate 601a and the second glass substrate 601b and the cavity 612, reflection of the incident light 631 at the interfaces with the cavity 612 can be prevented, and it is possible to allow more incident light to be incident on a photoelectric conversion unit (photodiode 51) of the solid-state imaging element 11. Note that either one of the AR coats 621 and 622 may be omitted.

<Second Configuration Example of Twenty-Second Embodiment>

Figure 61:
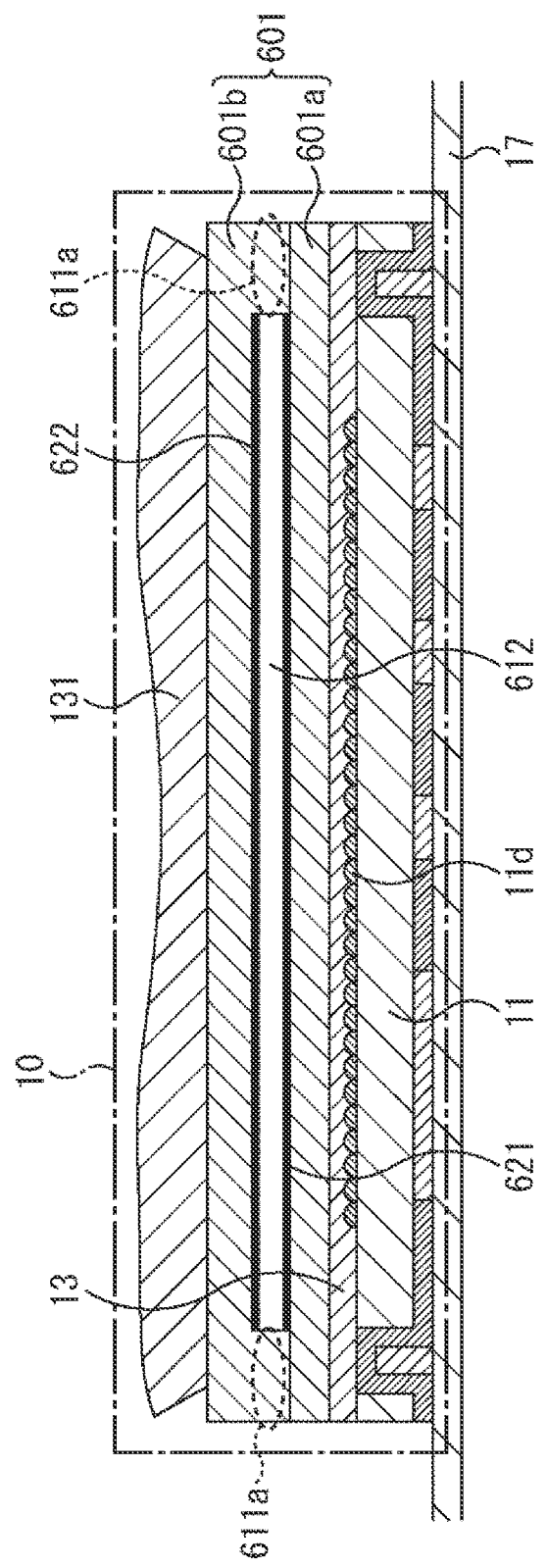
FIG. 61 is a side sectional view illustrating a second configuration example according to the twenty-second embodiment of the imaging device of the present disclosure.

FIG. 61 is a side sectional view illustrating a second configuration example according to the twenty-second embodiment of the imaging device of the present disclosure.

The second configuration example illustrated in FIG. 61 is different from the first configuration example in that the AR coats 621 and 622 are not formed on the joining surfaces of the first glass substrate 601a and the second glass substrate 601b and the side surface portion where the protrusion 611a of the second glass substrate 601b is in contact with the cavity 612, and has in common with the first configuration example in other points. In the second configuration example, the first glass substrate 601a and the second glass substrate 601b are directly bonded together by, for example, thermal fusion of the glass substrates.

Similarly in the second configuration example in FIG. 61, the cavity 612 is formed on the side closer to the solid-state imaging element 11 than the bottom surface of the lowermost lens 131. Thus, as described with reference to FIG. 60, occurrence of flare due to reflected light reflected at the interface of the solid-state imaging element 11 can be prevented, and image quality degradation can be reduced. Furthermore, the AR coats 621 and 622 allow more incident light to be incident on the photoelectric conversion unit of the solid-state imaging element 11.

<Third Configuration Example of Twenty-Second Embodiment>

Figure 62:
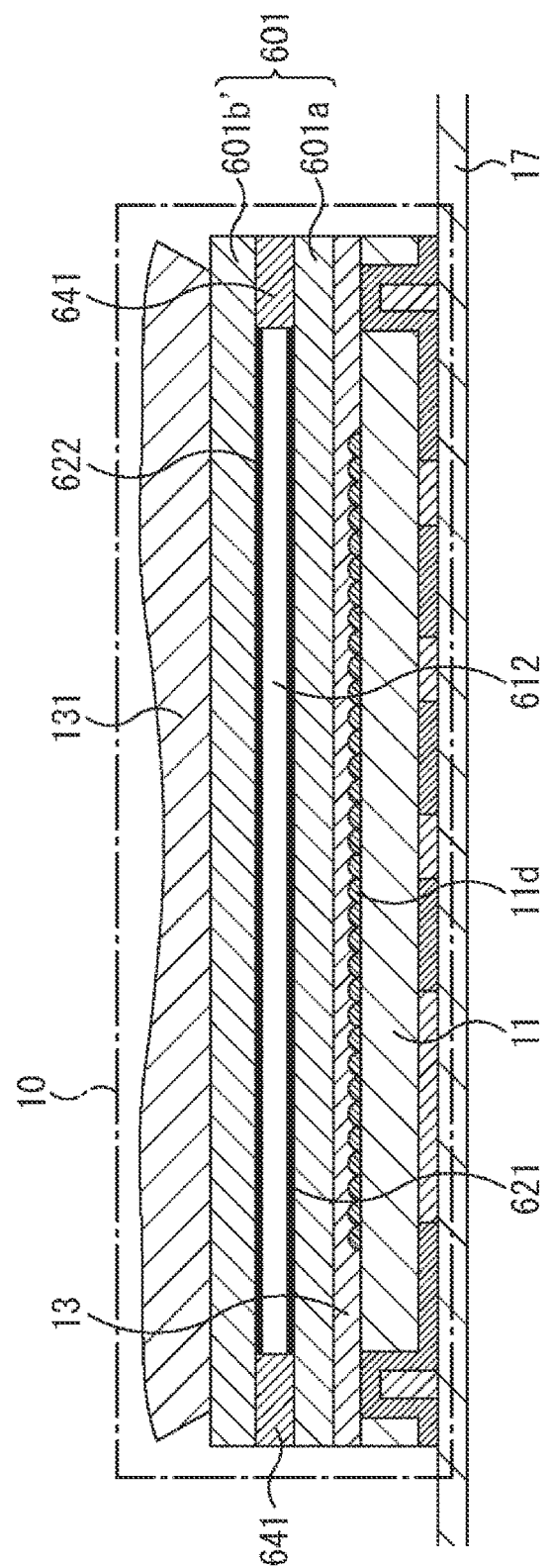
FIG. 62 is a side sectional view illustrating a third configuration example according to the twenty-second embodiment of the imaging device of the present disclosure.

FIG. 62 is a side sectional view illustrating a third configuration example according to the twenty-second embodiment of the imaging device of the present disclosure.

In the third configuration example illustrated in FIG. 62, the second glass substrate 601b in the second configuration example in FIG. 61 is replaced with a second glass substrate 601b'. The second glass substrate 601b' is different from the second glass substrate 601b in that the second glass substrate 601b' has a flat plate shape without the protrusion 611a. Then, instead of the protrusion 611a of the second glass substrate 601b, a sealing film 641 is arranged between the first glass substrate 601a and the second glass substrate 601b', and the first glass substrate 601a and the second glass substrate 601b' are bonded together via the sealing film 641.

The sealing film 641 can be, for example, an organic adhesive. Alternatively, for example, a metal film of tungsten (W), aluminum (Al), copper (Cu), gold (Au), or the like, or an insulating film of silicon oxide (SiO2), silicon nitride (SiN), silicon oxynitride (SiON), silicon carbide (SiC), silicon oxycarbide (SiOC), or the like may be used for the sealing film 641.

In a similar manner to the first configuration example and the second configuration example, the sealing film 641 is arranged on an outer circumferential parts of the first glass substrate 601a and the second glass substrate 601b' in a plan view, and the cavity 612 is sealed (enclosed) with the first glass substrate 601a and the second glass substrate 601b'.

Similarly in the third configuration example in FIG. 62, the cavity 612 is formed on the side closer to the solid-state imaging element 11 than the bottom surface of the lowermost lens 131. Thus, as described with reference to FIG. 60, occurrence of flare due to reflected light reflected at the interface of the solid-state imaging element 11 can be prevented, and image quality degradation can be reduced. Furthermore, the AR coats 621 and 622 allow more incident light to be incident on the photoelectric conversion unit of the solid-state imaging element 11.

<Fourth Configuration Example of Twenty-Second Embodiment>

Figure 63:
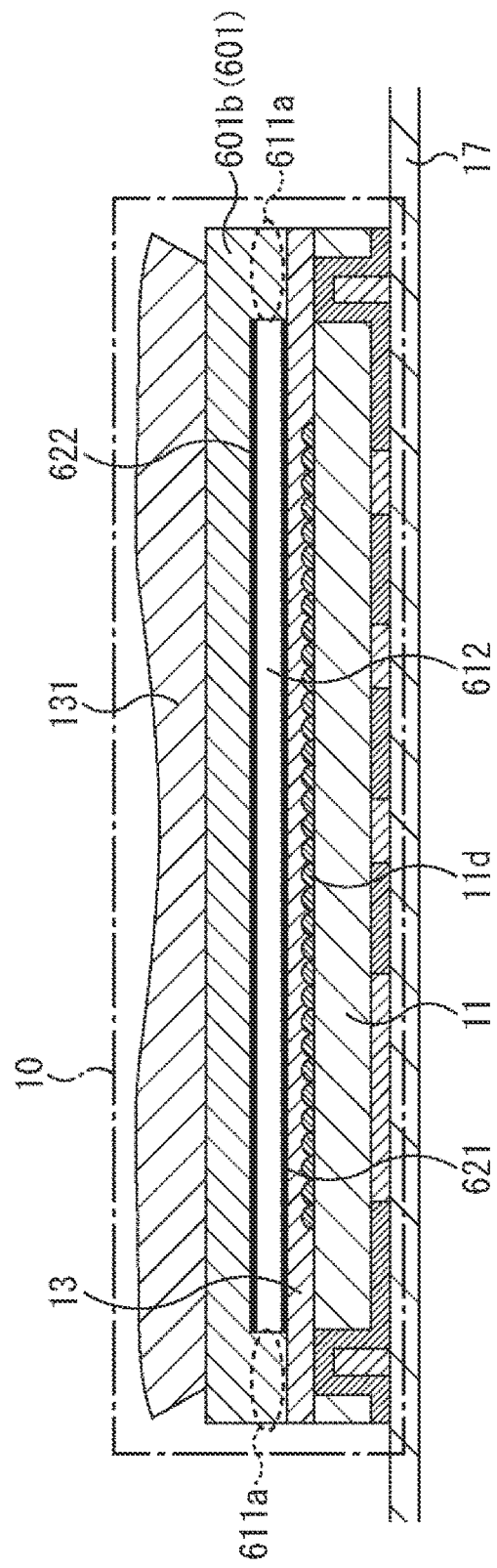
FIG. 63 is a side sectional view illustrating a fourth configuration example according to the twenty-second embodiment of the imaging device of the present disclosure.

FIG. 63 is a side sectional view illustrating a fourth configuration example according to the twenty-second embodiment of the imaging device of the present disclosure.

In the fourth configuration example illustrated in FIG. 63, the first glass substrate 601a is omitted as compared with the second configuration example illustrated in FIG. 61. In other words, in the second configuration example illustrated in FIG. 61, the glass substrate 601 has a configuration in which the first glass substrate 601a and the second glass substrate 601b are bonded. In the fourth configuration example in FIG. 63, the glass substrate 601 is constituted only by the second glass substrate 601b, which is one of the first glass substrate and the second glass substrate.

The second glass substrate 601b is bonded with the adhesive 13 formed flat on the lower surface of the protrusion 611a, and thus the cavity 612 is formed between the second glass substrate 601b and the adhesive 13. That is, the cavity 612 is sealed (enclosed) with the second glass substrate 601b and the adhesive 13. The adhesive 13 also functions as a flattening film that flattens the upper surface of an on-chip lens 11d, and the AR coat 621 is formed on the interface of the adhesive 13 in contact with the cavity 612. Furthermore, the AR coat 622 is formed on a surface of the second glass substrate 601b in contact with the cavity 612 in the vertical direction (perpendicular direction).

Similarly in the fourth configuration example in FIG. 63, the cavity 612 is formed on the side closer to the solid-state imaging element 11 than the bottom surface of the lowermost lens 131. Thus, as described with reference to FIG. 60, occurrence of flare due to reflected light reflected at the interface of the solid-state imaging element 11 can be prevented, and image quality degradation can be reduced. Furthermore, the AR coats 621 and 622 allow more incident light to be incident on the photoelectric conversion unit of the solid-state imaging element 11.

<Fifth Configuration Example of Twenty-Second Embodiment>

Figure 64:
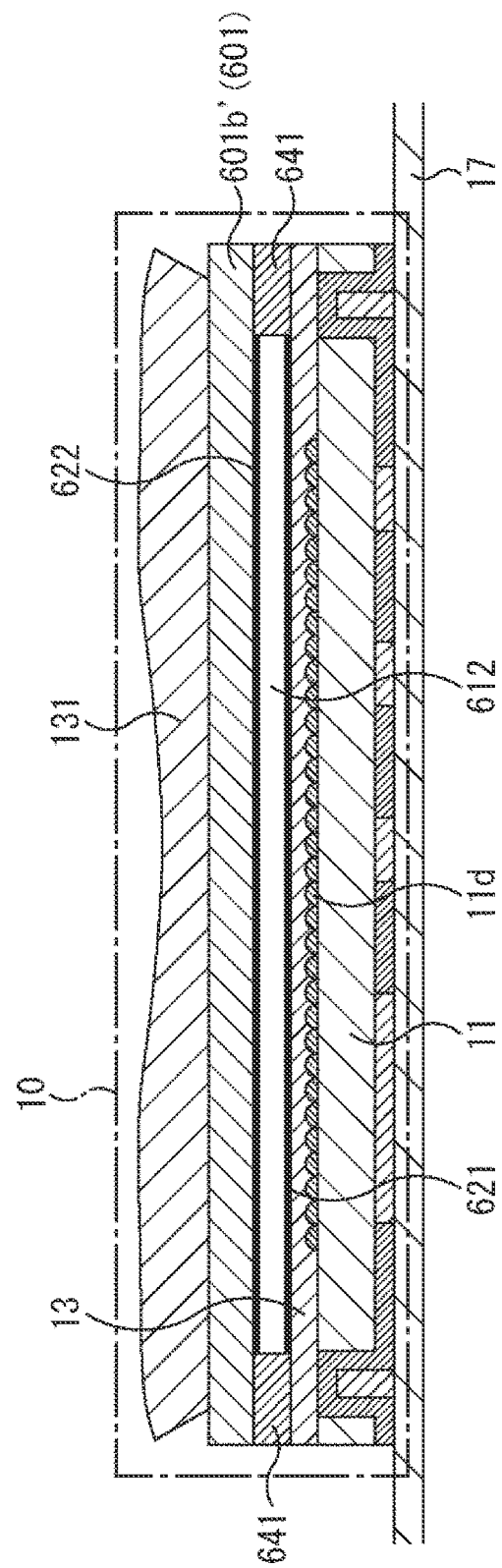
FIG. 64 is a side sectional view illustrating a fifth configuration example according to the twenty-second embodiment of the imaging device of the present disclosure.

FIG. 64 is a side sectional view illustrating a fifth configuration example according to the twenty-second embodiment of the imaging device of the present disclosure.

In the fifth configuration example illustrated in FIG. 64, the second glass substrate 601b in the fourth configuration example illustrated in FIG. 63 is replaced with the second glass substrate 601b' without the protrusion 611a. Then, instead of the protrusion 611a of the second glass substrate 601b, the sealing film 641 is arranged between the adhesive 13 and the second glass substrate 601b'. A vertical direction (perpendicular direction) of the cavity 612 is surrounded by the second glass substrate 601b' and the adhesive 13, four side surfaces of the cavity 612 in the planar direction are surrounded by the sealing film 641, and thus the cavity 612 is sealed (enclosed).

In other words, the fifth configuration example illustrated in FIG. 64 is a configuration in which the first glass substrate 601a is omitted from the third configuration example illustrated in FIG. 62, and other configurations are similar to those of the third configuration example illustrated in FIG. 62.

Similarly in the fifth configuration example in FIG. 64, the cavity 612 is formed on the side closer to the solid-state imaging element 11 than the bottom surface of the lowermost lens 131. Thus, as described with reference to FIG. 60, occurrence of flare due to reflected light reflected at the interface of the solid-state imaging element 11 can be prevented, and image quality degradation can be reduced.

Furthermore, the AR coats 621 and 622 allow more incident light to be incident on the photoelectric conversion unit of the solid-state imaging element 11.

<Sixth Configuration Example of Twenty-Second Embodiment>

Figure 65:
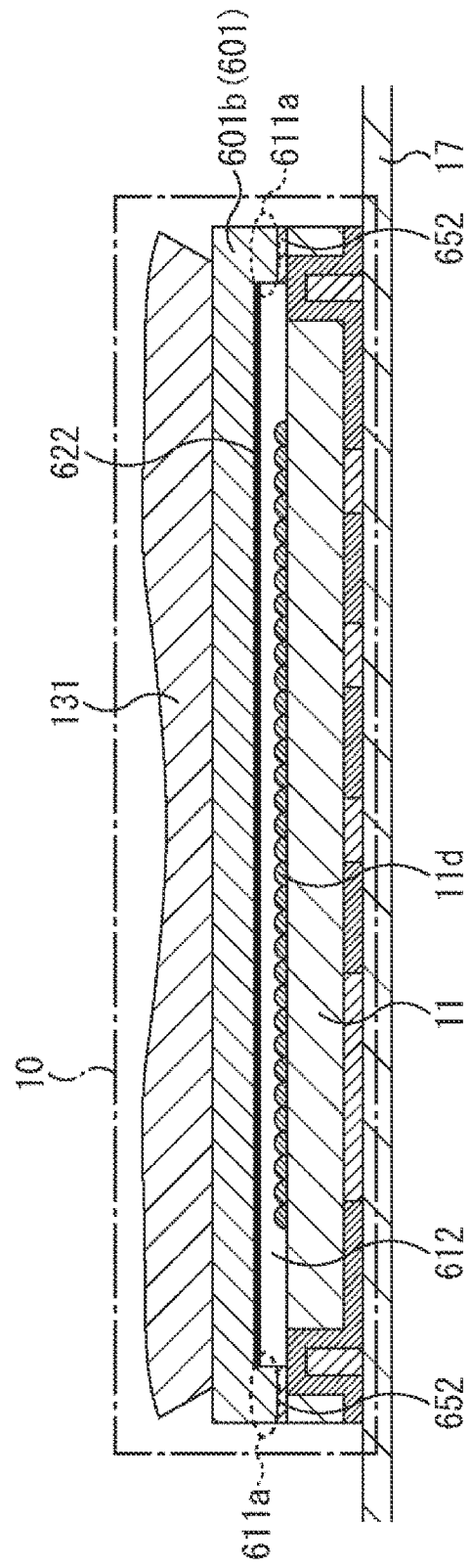
FIG. 65 is a side sectional view illustrating a sixth configuration example according to the twenty-second embodiment of the imaging device of the present disclosure.

FIG. 65 is a side sectional view illustrating a sixth configuration example according to the twenty-second embodiment of the imaging device of the present disclosure.

The sixth configuration example illustrated in FIG. 65 is a configuration in which the adhesive 13 covering the upper surface of the on-chip lens 11d is omitted as compared with the fourth configuration example illustrated in FIG. 63. The bottom surface of the protrusion 611a of the second glass substrate 601b is bonded to the solid-state imaging element 11 via a transparent adhesive 652, so that the cavity 612 is formed between the on-chip lens 11d on the upper surface of the solid-state imaging element 11 and the second glass substrate 601b. The vertical direction (perpendicular direction) of the cavity 612 is surrounded by the second glass substrate 601b and the upper surface of the solid-state imaging element 11, four side surfaces of the cavity 612 in the planar direction are surrounded by the second glass substrate 601b, and thus the cavity 612 is sealed (enclosed). Since the adhesive 13 and the first glass substrate 601a forming a flat surface are omitted, the AR coat 621 is also omitted. Other configurations are similar to those of the fourth configuration example illustrated in FIG. 63.

Similarly in the sixth configuration example in FIG. 65, the cavity 612 is formed on the side closer to the solid-state imaging element 11 than the bottom surface of the lowermost lens 131. Thus, as described with reference to FIG. 60, occurrence of flare due to reflected light reflected at the interface of the solid-state imaging element 11 can be prevented, and image quality degradation can be reduced. Furthermore, the AR coat 622 allows more incident light to be incident on the photoelectric conversion unit of the solid-state imaging element 11.

<Seventh Configuration Example of Twenty-Second Embodiment>

Figure 66:
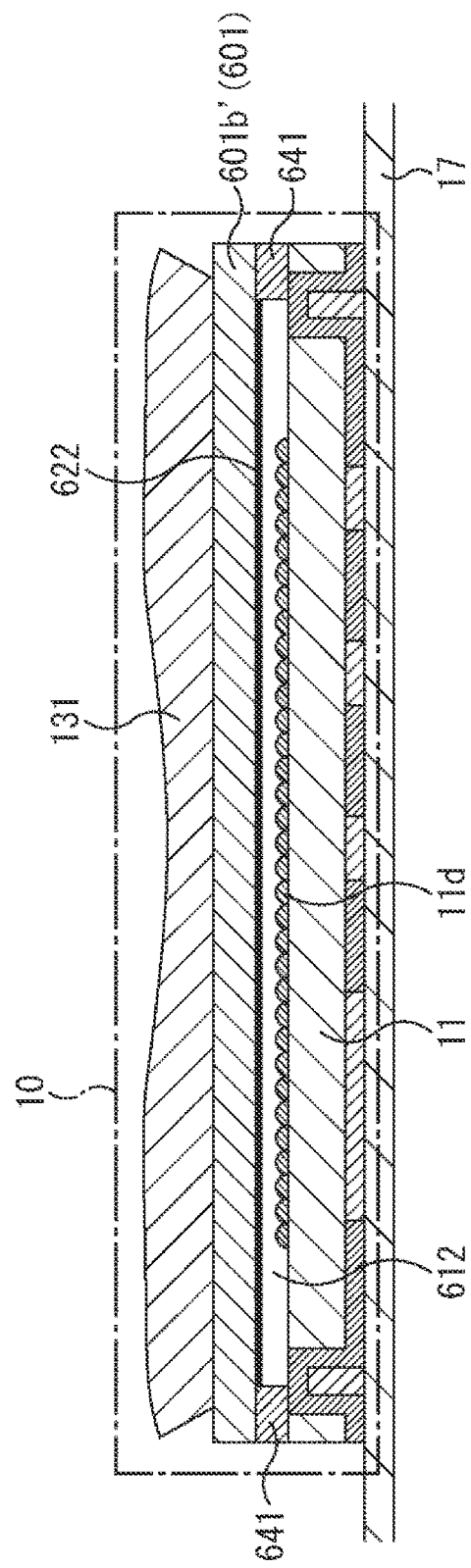
FIG. 66 is a side sectional view illustrating a seventh configuration example according to the twenty-second embodiment of the imaging device of the present disclosure.

FIG. 66 is a side sectional view illustrating a seventh configuration example according to the twenty-second embodiment of the imaging device of the present disclosure.

The seventh configuration example illustrated in FIG. 66 is a configuration in which the adhesive 13 covering the upper surface of the on-chip lens 11d is omitted as compared with the fifth configuration example illustrated in FIG. 64. The bottom surface of the sealing film 641 formed on an outer circumferential part of the lower surface of the second glass substrate 601b' having a flat plate shape is bonded to the solid-state imaging element 11, and thus the cavity 612 is formed between the upper surface of the solid-state imaging element 11 and the second glass substrate 601b'. The vertical direction (perpendicular direction) of the cavity 612 is surrounded by the second glass substrate 601b' and the upper surface of the solid-state imaging element 11, four side surfaces of the cavity 612 in the planar direction are surrounded by the sealing film 641, and thus the cavity 612 is sealed (enclosed). Since the adhesive 13 and the first glass substrate 601a forming a flat surface are omitted, the AR coat 621 is also omitted. Other configurations are similar to those of the fifth configuration example illustrated in FIG. 64.

Similarly in the seventh configuration example in FIG. 66, the cavity 612 is formed on the side closer to the solid-state imaging element 11 than the bottom surface of the lowermost lens 131. Thus, as described with reference to FIG. 60, occurrence of flare due to reflected light reflected at the interface of the solid-state imaging element 11 can be prevented, and image quality degradation can be reduced. Furthermore, the AR coat 622 allows more incident light to be incident on the photoelectric conversion unit of the solid-state imaging element 11.

<Summary of Twenty-Second Embodiment>

According to the first configuration example to the seventh configuration example according to the twenty-second embodiment described above, the cavity 612 is formed between the lens 131 formed on the second glass substrate 601b or 601b' of the integrated component 10 and the solid-state imaging element 11. With this arrangement, as described with reference to FIG. 60, occurrence of flare due to reflected light reflected at the interface of the solid-state imaging element 11 can be prevented, and image quality degradation can be reduced.

Furthermore, at least one of the AR coat 621 or 622 allows more incident light to be incident on the photoelectric conversion unit of the solid-state imaging element 11. In the second configuration example to the seventh configuration example, the AR coat 622 is not formed on the four side surfaces in the planar direction of the cavity 612, but may be formed in a similar manner to the first configuration example.

In the cavity 612, all of the four side surfaces in the planar direction and the surfaces in the vertical direction (perpendicular direction) are surrounded by a material different from the material of the lens 131, specifically, a highly elastic material, and sealed (enclosed). With this arrangement, it is possible to prevent occurrence of dew condensation or the like due to moisture intrusion.

Note that, in the twenty-second embodiment illustrated in FIGS. 58 to 66, the lens 131 is adopted as a structure of the lens formed on the second glass substrate 601b (or 601b'), but the structure of the lens formed on the second glass substrate 601b is not particularly limited.

That is, the lens formed on the second glass substrate 601b may be, for example, the lens group 171 (FIG. 14) including a plurality of lenses, the lens 271 (FIG. 19) with the AR coat 271a, the lens 291 (FIG. 20) to which an antireflection function of a moth-eye structure is added, the infrared light cut lens 301 (FIG. 21) with the infrared cut function, or the like.

Furthermore, the lens formed on the second glass substrate 601b may be the lens 401 that is constituted by an aspheric curved surface and has a thickness that changes in accordance with the distance from the center position in a direction perpendicular to the incident direction of light as illustrated in FIGS. 38 and 39. In the lens 401, the lens thickness at the center position is the minimum thickness D, and the lens thickness at a position farthest from the center in the range Ze is the maximal thickness H. Furthermore, in a case where the thickness of the glass substrate 601 is a thickness Th, the maximal thickness H of the lens 401 is thicker than the thickness Th of the glass substrate 601, and the minimum thickness D of the lens 401 is thinner than the thickness Th of the glass substrate 601. By defining the shape of the lens formed on the second glass substrate 601b (or 601b') as in the lens 401, it is possible to achieve a lens that is small and lightweight, and allows for high-resolution imaging as described above.

23. Example of Application to Electronic Equipment

The imaging device 1 described above with reference to FIGS. 1, 9, and the like described above, and the like can be used for, for example, various types of electronic equipment such as an imaging device such as a digital still camera or a digital video camera, a mobile phone having an imaging function, or other devices having an imaging function.

Figure 67:
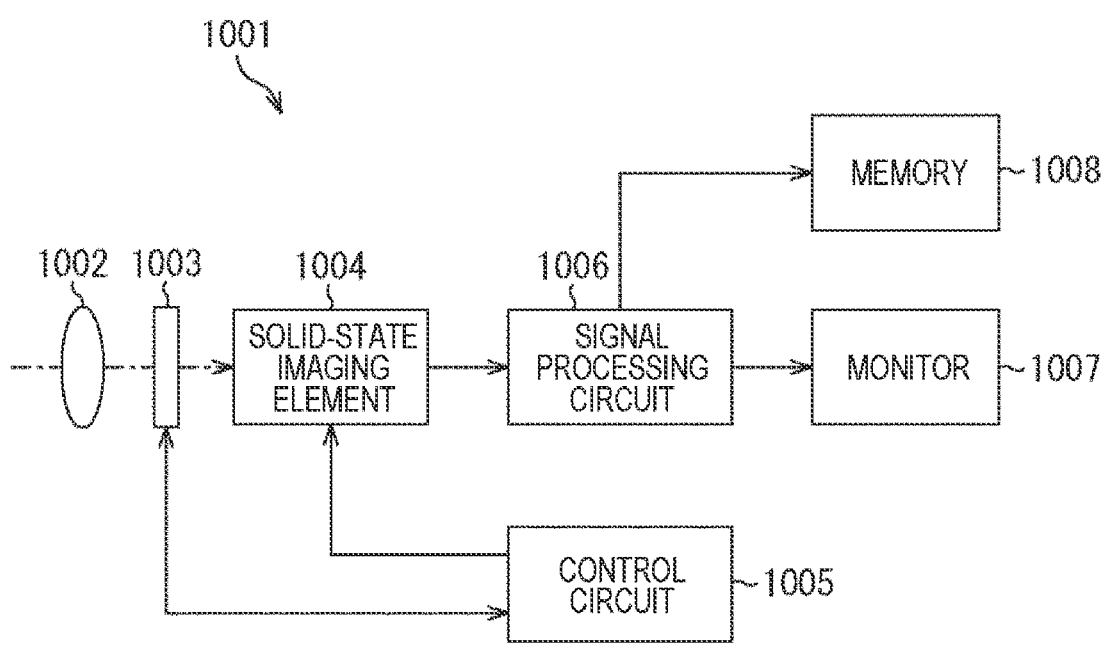
FIG. 67 is a block diagram illustrating a configuration example of the imaging device as electronic equipment in which the camera module of the present disclosure is used.

FIG. 67 is a block diagram illustrating a configuration example of an imaging device as electronic equipment to which the present technology is applied.

An imaging device 1001 illustrated in FIG. 67 includes an optical system 1002, a shutter device 1003, a solid-state imaging element 1004, a drive circuit 1005, a signal processing circuit 1006, a monitor 1007, and a memory 1008, and can capture a still image and a moving image.

The optical system 1002 is constituted by one or a plurality of lenses, and guides light (incident light) from a subject to the solid-state imaging element 1004, so that the light is formed as an image on a light receiving surface of the solid-state imaging element 1004.

The shutter device 1003 is arranged between the optical system 1002 and the solid-state imaging element 1004, and controls a light irradiation period and a light shielding period with respect to the solid-state imaging element 1004 in accordance with control of the drive circuit 1005.

The solid-state imaging element 1004 is constituted by a package including the solid-state imaging element described above. The solid-state imaging element 1004 accumulates a signal charge for a certain period in accordance with light formed as an image on the light receiving surface via the optical system 1002 and the shutter device 1003. The signal charge accumulated in the solid-state imaging element 1004 is transferred in accordance with a drive signal (timing signal) supplied from the drive circuit 1005.

The drive circuit 1005 outputs a drive signal for controlling a transfer operation of the solid-state imaging element 1004 and a shutter operation of the shutter device 1003 to drive the solid-state imaging element 1004 and the shutter device 1003.

The signal processing circuit 1006 performs various types of signal processing on the signal charge output from the solid-state imaging element 1004. An image (image data) obtained by signal processing performed by the signal processing circuit 1006 is supplied to and displayed on the monitor 1007, or supplied to and stored (recorded) in the memory 1008.

Similarly in the imaging device 1001 configured as described above, by using the imaging device 1 described above with reference to FIGS. 1, 9, and the like instead of the optical system 1002 and the solid-state imaging element 1004 described above, it is possible to prevent ghosts and flare attributable to internal diffuse reflection while achieving downsizing and reduction in height of the device configuration.

24. Usage Example of Solid-State Imaging Device

Figure 68:
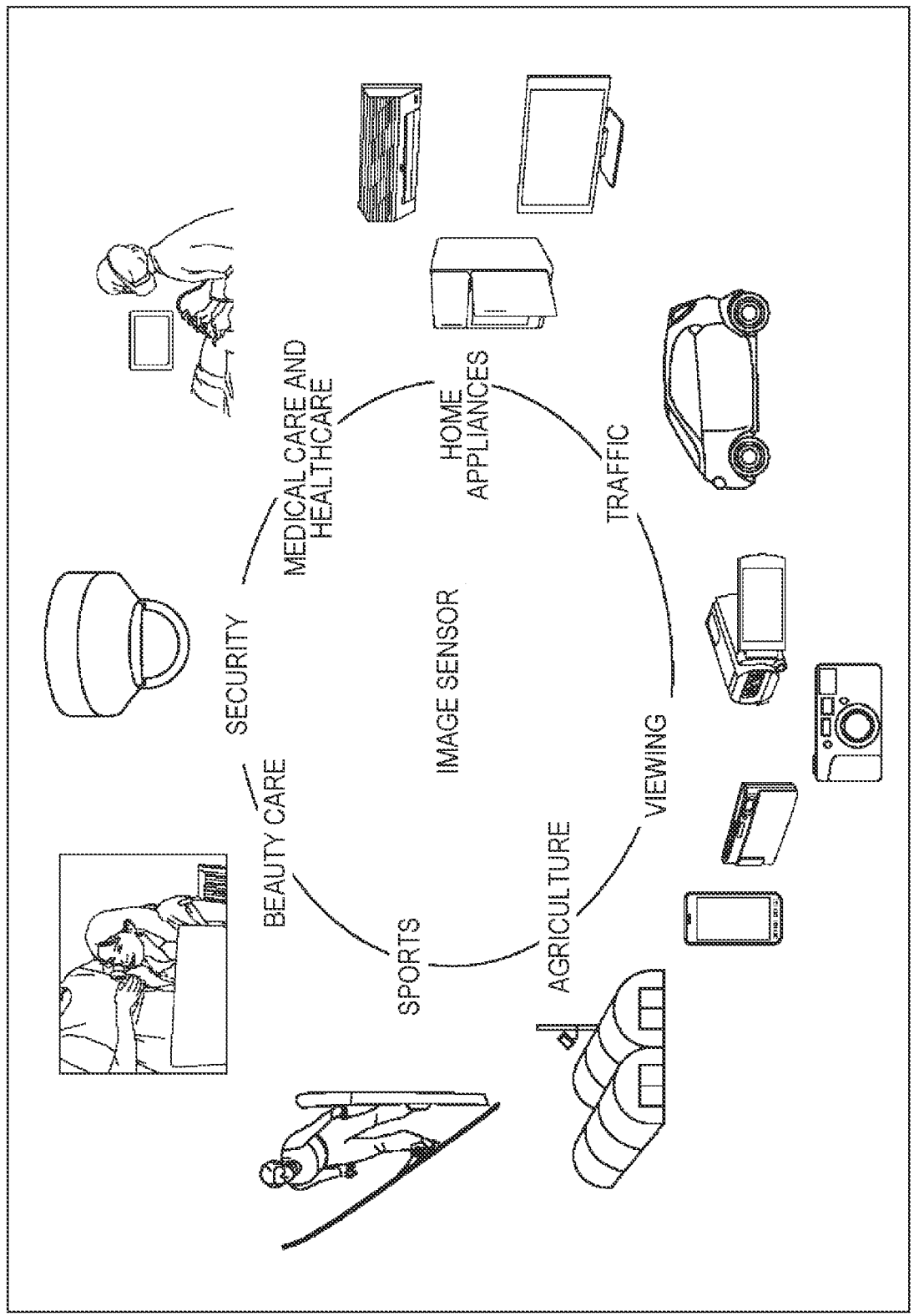
FIG. 68 is a diagram illustrating a usage example of a camera module to which the technology of the present disclosure is applied.

FIG. 68 is a diagram illustrating a usage example of using the imaging device 1 described above.

The imaging device 1 described above can be used, for example, in a variety of cases of sensing light such as visible light, infrared light, ultraviolet light, or X-rays as described below.

A device that captures an image to be used for viewing, such as a digital camera or a portable device with a camera function A device used for traffic, such as an in-vehicle sensor that captures images of the front, rear, surroundings, inside, and the like of an automobile for safe driving such as automatic stop, recognition of a driver's state, and the like, a monitoring camera that monitors traveling vehicles and roads, and a distance measuring sensor that measures a distance between vehicles and the like A device used for home appliances such as a TV, a refrigerator, and an air conditioner in order to capture an image of a gesture of a user and perform an apparatus operation in accordance with the gesture A device used for medical care or healthcare, such as an endoscope or a device for angiography using reception of infrared light A device used for security, such as a monitoring camera for crime prevention or a camera for person authentication A device used for beauty care, such as a skin analyzer for imaging skin or a microscope for imaging scalp A device used for sports, such as an action camera or a wearable camera for sports or the like A device used for agriculture, such as a camera for monitoring a state of a field or a crop

25. Example of Application to Endoscopic Surgery System

The technology according to the present disclosure (the present technology) can be applied to a variety of products. For example, the technology according to the present disclosure may be applied to an endoscopic surgery system.

Figure 69:
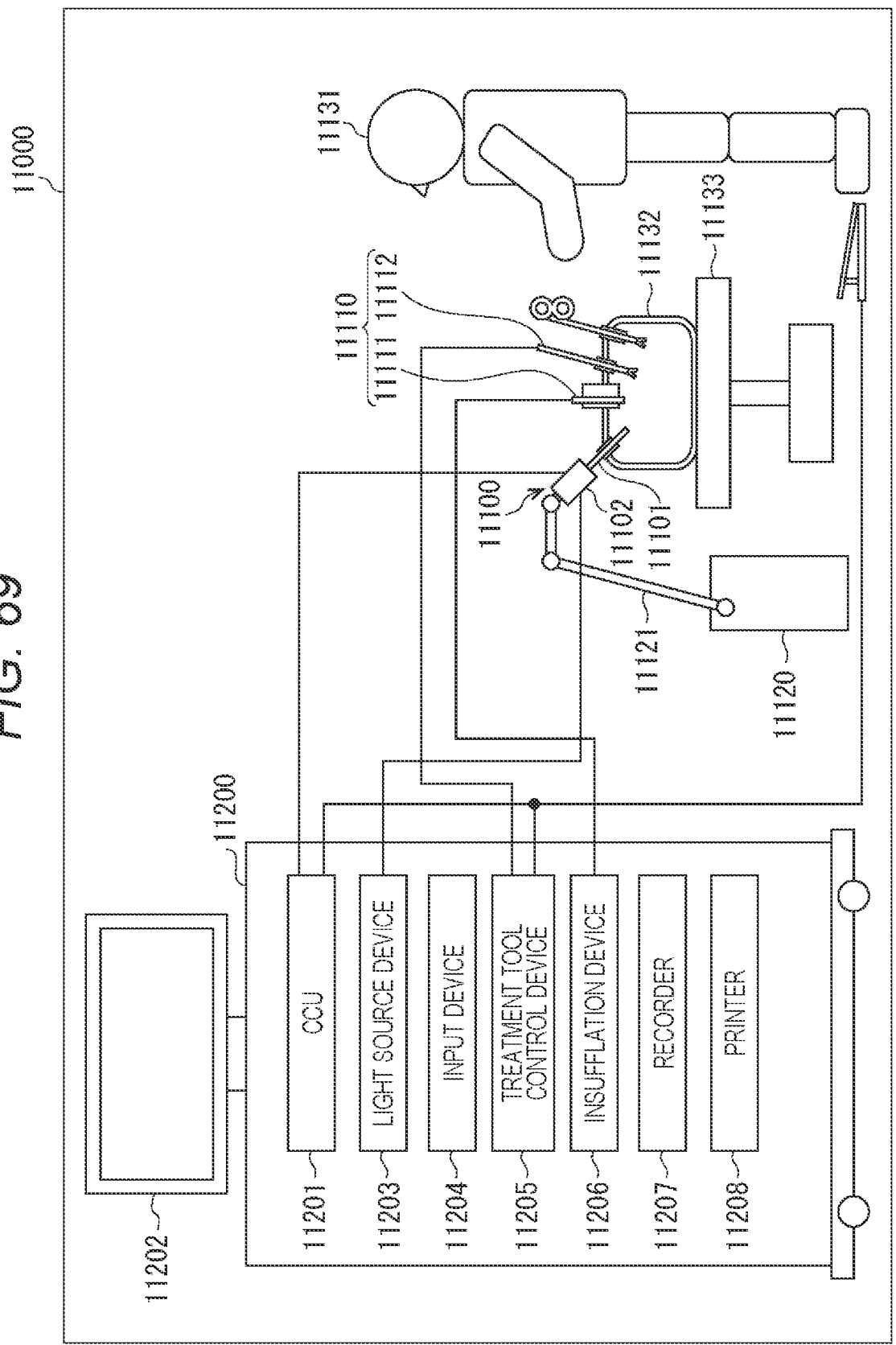
FIG. 69 is a diagram illustrating an example of a schematic configuration of an endoscopic surgery system.

FIG. 69 is a diagram illustrating an example of a schematic configuration of an endoscopic surgery system to which the technology according to the present disclosure (the present technology) may be applied.

FIG. 69 illustrates a situation in which an operator (doctor) 11131 is performing surgery on a patient 11132 on a patient bed 11133 using an endoscopic surgery system 11000. As illustrated, the endoscopic surgery system 11000 includes an endoscope 11100, other surgical tools 11110 such as an insufflation tube 11111 and an energy treatment tool 11112, a support arm device 11120 that supports the endoscope 11100, and a cart 11200 on which various devices for endoscopic surgery are mounted.

The endoscope 11100 includes a lens barrel 11101 having a region of a predetermined length from its distal end inserted into a body cavity of the patient 11132, and a camera head 11102 connected to a proximal end of the lens barrel 11101. In the illustrated example, the endoscope 11100 configured as a so-called rigid endoscope having the lens barrel 11101 that is rigid is illustrated. Alternatively, the endoscope 11100 may be configured as a so-called flexible endoscope having a flexible lens barrel.

The lens barrel 11101 is provided with, at the distal end thereof, an opening portion in which an objective lens is fitted. The endoscope 11100 is connected with a light source device 11203. Light generated by the light source device 11203 is guided to the distal end of the lens barrel by a light guide extending inside the lens barrel 11101, and is emitted through the objective lens toward an observation target in the body cavity of the patient 11132. Note that the endoscope 11100 may be a forward-viewing endoscope, an oblique-viewing endoscope, or a side-viewing endoscope.

The camera head 11102 is provided with an optical system and an imaging element inside thereof, and light reflected from the observation target (observation light) is condensed on the imaging element by the optical system. The imaging element photoelectrically converts the observation light to generate an electric signal corresponding to the observation light, that is, an image signal corresponding to an observation image. The image signal is transmitted to a camera control unit (CCU) 11201 as raw data.

The CCU 11201 is constituted by a central processing unit (CPU), a graphics processing unit (GPU), and the like, and integrally controls operations of the endoscope 11100 and a display device 11202. Moreover, the CCU 11201 receives an image signal from the camera head 11102, and performs, on the image signal, various types of image processing for displaying an image based on the image signal, such as development processing (demosaic processing), for example.

The CCU 11201 controls the display device 11202 to display an image based on the image signal on which the CCU 11201 has performed image processing.

The light source device 11203 includes a light source such as a light emitting diode (LED), for example, and supplies the endoscope 11100 with emitted light at the time of imaging a surgical site or the like.

An input device 11204 is an input interface to the endoscopic surgery system 11000. A user can input various types of information and input instructions to the endoscopic surgery system 11000 via the input device 11204. The user inputs, for example, an instruction to change conditions (type of emitted light, magnification, focal length, and the like) of imaging by the endoscope 11100.

A treatment tool control device 11205 controls driving of the energy treatment tool 11112 for cauterization or incision of tissue, sealing of a blood vessel, or the like. An insufflation device 11206 sends gas through the insufflation tube 11111 into the body cavity in order to inflate the body cavity of the patient 11132 for the purpose of securing a field of view of the endoscope 11100 and securing a working space for the operator. A recorder 11207 is a device that can record various types of information regarding surgery. A printer 11208 is a device that can print various types of information regarding surgery in various formats such as text, images, or graphs.

Note that the light source device 11203 that supplies the endoscope 11100 with emitted light at the time of imaging a surgical site can be constituted by, for example, an LED, a laser light source, or a white light source constituted by a combination thereof. In a case where the white light source is constituted by a combination of RGB laser light sources, an output intensity and output timing of each color (each wavelength) can be controlled with high precision, and this enables white balance adjustment of a captured image at the light source device 11203. Furthermore, in this case, an image for each of R, G, and B can be captured in a time-division manner by emitting laser light from each of the RGB laser light sources to an observation target in a time-division manner, and controlling driving of the imaging element of the camera head 11102 in synchronization with the emission timing. According to this method, it is possible to obtain a color image without providing a color filter in the imaging element.

Furthermore, driving of the light source device 11203 may be controlled so that the intensity of light to be output changes at a predetermined time interval. By controlling the driving of the imaging element of the camera head 11102 in synchronization with the timing of the change in the light intensity, acquiring images in a time-division manner, and generating a composite image from the images, a high dynamic range image without so-called blocked up shadows or blown out highlights can be generated.

Furthermore, the light source device 11203 may have a configuration in which light can be supplied in a predetermined wavelength band that can be used for special light observation. In special light observation, for example, by utilizing wavelength dependence of light absorption in body tissue, so-called narrow band imaging is performed in which a predetermined tissue such as a blood vessel in a mucosal surface layer is imaged with high contrast by emitting light in a band narrower than that of light emitted during normal observation (that is, white light). Alternatively, in special light observation, fluorescence observation may be performed in which an image is obtained by fluorescence generated by emitting excitation light. Fluorescence observation allows, for example, fluorescence from the body tissue to be observed with excitation light emitted to body tissue and (autofluorescence observation), or a fluorescent image to be obtained by locally injecting a reagent such as indocyanine green (ICG) into body tissue and emitting excitation light corresponding to a fluorescence wavelength of the reagent to the body tissue. The light source device 11203 may have a configuration in which narrow-band light and/or excitation light that can be used for such special light observation can be supplied.

Figure 70:
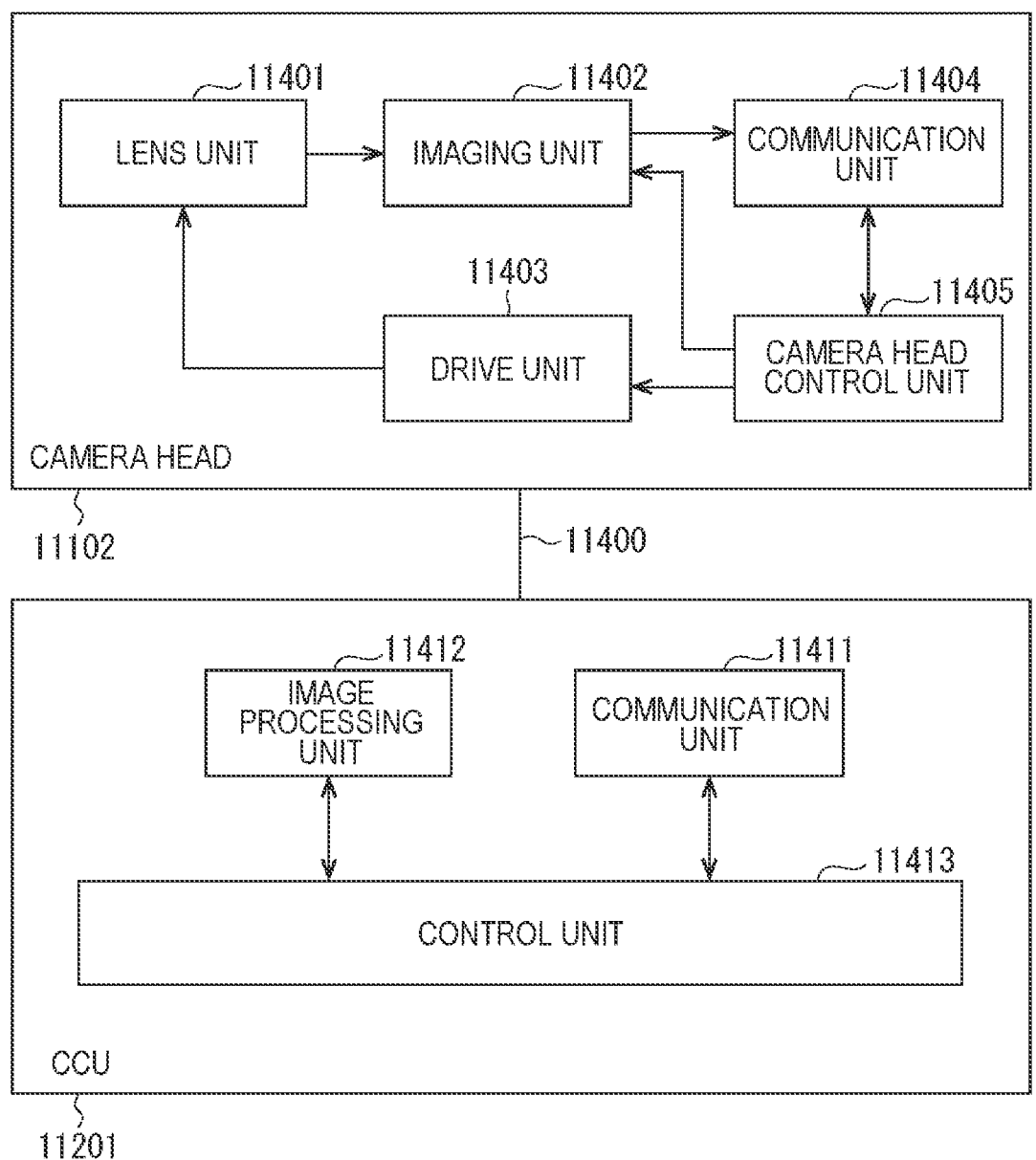
FIG. 70 is a block diagram illustrating an example of a functional configuration of a camera head and a CCU.

FIG. 70 is a block diagram illustrating an example of a functional configuration of the camera head 11102 and the CCU 11201 illustrated in FIG. 69.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are connected by a transmission cable 11400 and can communicate with each other.

The lens unit 11401 is an optical system provided at a connection with the lens barrel 11101. Observation light taken in from the distal end of the lens barrel 11101 is guided to the camera head 11102 and enters the lens unit 11401. The lens unit 11401 is constituted by a combination of a plurality of lenses including a zoom lens and a focus lens.

The imaging unit 11402 is constituted by an imaging element. The number of imaging elements constituting the imaging unit 11402 may be one (so-called single-plate type), or may be more than one (so-called multi-plate type). In a case where the imaging unit 11402 is configured as a multi-plate type, for example, image signals, each corresponding to one of R, G, and B, may be generated by the corresponding imaging elements, and a color image may be obtained by combining the image signals. Alternatively, the imaging unit 11402 may include a pair of imaging elements, one for acquiring a right-eye image signal and the other for acquiring a left-eye image signal, thereby supporting three-dimensional (3D) display. The 3D display allows the operator 11131 to grasp the depth of living tissue in the surgical site more accurately. Note that, in a case where the imaging unit 11402 has a multi-plate type configuration, a plurality of the lens units 11401 may be provided for the corresponding imaging elements.

Furthermore, the imaging unit 11402 is not necessarily provided in the camera head 11102. For example, the imaging unit 11402 may be provided inside the lens barrel 11101 just behind the objective lens.

The drive unit 11403 is constituted by an actuator, and the camera head control unit 11405 controls the zoom lens and the focus lens of the lens unit 11401 to move by a predetermined distance along the optical axis. With this arrangement, the magnification and the focus of an image captured by the imaging unit 11402 can be appropriately adjusted.

The communication unit 11404 is constituted by a communication device for transmitting and receiving various types of information to and from the CCU 11201. The communication unit 11404 transmits an image signal obtained from the imaging unit 11402 as raw data to the CCU 11201 via the transmission cable 11400.

Furthermore, the communication unit 11404 receives a control signal for controlling driving of the camera head 11102 from the CCU 11201, and supplies the control signal to the camera head control unit 11405. The control signal contains information regarding imaging conditions such as information for specifying a frame rate of a captured image, information for specifying an exposure value at the time of imaging, and/or information for specifying a magnification and focus of the captured image.

Note that the imaging conditions such as the frame rate, the exposure value, the magnification, and the focus described above may be appropriately specified by a user, or may be automatically set by the control unit 11413 of the CCU 11201 on the basis of an acquired image signal. In the latter case, the endoscope 11100 has a so-called auto exposure (AE) function, an auto focus (AF) function, and an auto white balance (AWB) function.

The camera head control unit 11405 controls the driving of the camera head 11102 on the basis of the control signal from the CCU 11201 received via the communication unit 11404.

The communication unit 11411 is constituted by a communication device for transmitting and receiving various types of information to and from the camera head 11102. The communication unit 11411 receives an image signal transmitted from the camera head 11102 via the transmission cable 11400.

Furthermore, the communication unit 11411 transmits a control signal for controlling the driving of the camera head 11102 to the camera head 11102. Image signals and control signals can be transmitted by electric communication, optical communication, or the like.

The image processing unit 11412 performs various types of image processing on an image signal that is raw data transmitted from the camera head 11102.

The control unit 11413 performs various types of control related to imaging of a surgical site or the like by the endoscope 11100 and display of a captured image obtained by imaging of the surgical site or the like. For example, the control unit 11413 generates a control signal for controlling the driving of the camera head 11102.

Furthermore, the control unit 11413 causes the display device 11202 to display a captured image in which a surgical site or the like is visible on the basis of an image signal on which the image processing unit 11412 has performed image processing. At this time, the control unit 11413 may use various image recognition technologies to recognize various objects in the captured image. For example, the control unit 11413 can recognize a surgical tool such as forceps, a specific living body site, bleeding, mist at the time of using the energy treatment tool 11112, and the like by detecting a shape, color, and the like of an edge of an object in the captured image. When the captured image is displayed on the display device 11202, the control unit 11413 may superimpose various types of surgery support information upon the image of the surgical site using results of the recognition. The surgery support information is superimposed and displayed so as to be presented to the operator 11131, and this allows a burden on the operator 11131 to be reduced and the operator 11131 to proceed with surgery in a reliable manner.

The transmission cable 11400 connecting the camera head 11102 and the CCU 11201 is an electric signal cable that supports electric signal communication, an optical fiber cable that supports optical communication, or a composite cable thereof.

Here, in the illustrated example, wired communication is performed using the transmission cable 11400, but wireless communication may be performed between the camera head 11102 and the CCU 11201.

The example of the endoscopic surgery system to which the technology according to the present disclosure can be applied has been described above. The technology according to the present disclosure can be applied to, for example, the endoscope 11100, the camera head 11102 (imaging unit 11402 thereof), the CCU 11201 (image processing unit 11412 thereof), and the like, among the above-described configurations. Specifically, for example, the imaging device 1 in FIGS. 1, 9, and the like can be used for the lens unit 11401 and the imaging unit 10402. By applying the technology according to the present disclosure to the lens unit 11401 and the imaging unit 10402, it is possible to achieve downsizing and reduction in height of the device configuration, and to prevent occurrence of flare and ghosts attributable to internal diffuse reflection.

Note that, here, an endoscopic surgery system has been described as an example, but the technology according to the present disclosure may be applied to other than an endoscopic surgery system, for example, a microscopic surgery system.

26. Example of Application to Mobile Object

The technology according to the present disclosure (the present technology) can be applied to a variety of products. For example, the technology according to the present disclosure may be materialized as a device that is mounted on any type of mobile object such as an automobile, an electric vehicle, a hybrid electric vehicle, a motorcycle, a bicycle, personal mobility, an airplane, a drone, a ship, or a robot.

Figure 71:
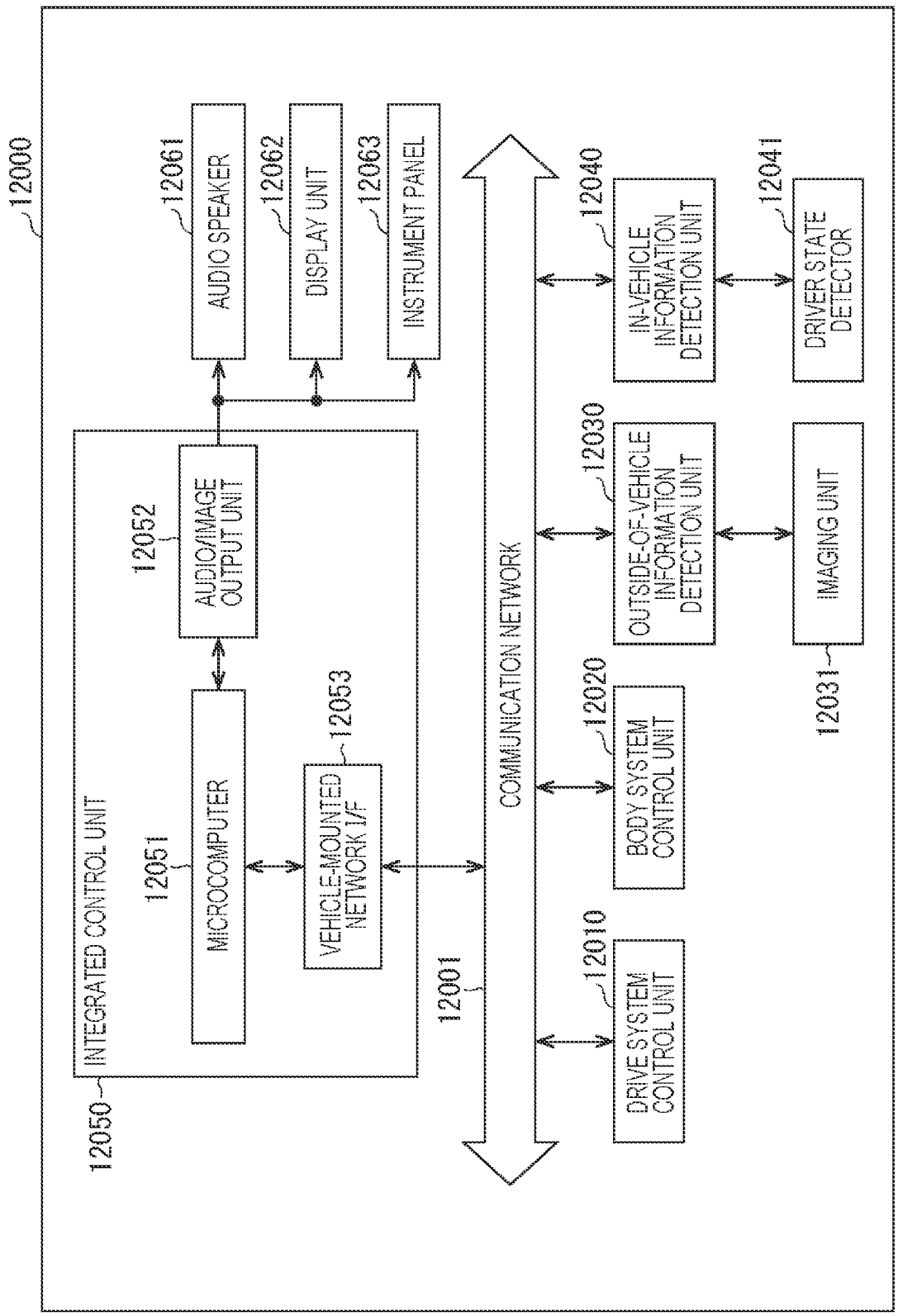
FIG. 71 is a block diagram illustrating an example of a schematic configuration of a vehicle control system.

FIG. 71 is a block diagram illustrating a schematic configuration example of a vehicle control system that is an example of a mobile object control system to which the technology according to the present disclosure can be applied.

A vehicle control system 12000 includes a plurality of electronic control units connected via a communication network 12001. In the example illustrated in FIG. 71, the vehicle control system 12000 includes a drive system control unit 12010, a body system control unit 12020, an outside-of-vehicle information detection unit 12030, an in-vehicle information detection unit 12040, and an integrated control unit 12050. Furthermore, as a functional configuration of the integrated control unit 12050, a microcomputer 12051, an audio/image output unit 12052, and a vehicle-mounted network interface (I/F) 12053 are illustrated.

The drive system control unit 12010 controls operation of devices related to a drive system of the vehicle in accordance with various programs. For example, the drive system control unit 12010 functions as a device for controlling a driving force generation device for generating a driving force of the vehicle such as an internal combustion engine or a driving motor, a driving force transmission mechanism for transmitting the driving force to wheels, a steering mechanism that regulates a steering angle of the vehicle, a braking device that generates a braking force of the vehicle, and the like.

The body system control unit 12020 controls operation of various devices mounted on the vehicle body in accordance with various programs. For example, the body system control unit 12020 functions as a device for controlling a keyless entry system, a smart key system, a power window device, or various lamps such as a head lamp, a back lamp, a brake lamp, a blinker, or a fog lamp. In this case, radio waves transmitted from a portable device that substitutes for a key or signals from various switches can be input to the body system control unit 12020. The body system control unit 12020 receives the input of these radio waves or signals, and controls a door lock device, the power window device, a lamp, and the like of the vehicle.

The outside-of-vehicle information detection unit 12030 detects information outside the vehicle on which the vehicle control system 12000 is mounted. For example, the outside-of-vehicle information detection unit 12030 is connected with an imaging unit 12031. The outside-of-vehicle information detection unit 12030 causes the imaging unit 12031 to capture an image of the outside of the vehicle, and receives the captured image. The outside-of-vehicle information detection unit 12030 may perform object detection processing or distance detection processing of a person, a car, an obstacle, a sign, a character on a road surface, or the like on the basis of the received image.

The imaging unit 12031 is an optical sensor that receives light and outputs an electric signal in accordance with the amount of the received light. The imaging unit 12031 can output the electric signal as an image, or can output the electric signal as distance measurement information. Furthermore, the light received by the imaging unit 12031 may be visible light or invisible light such as infrared rays.

The in-vehicle information detection unit 12040 detects information inside the vehicle. The in-vehicle information detection unit 12040 is connected with, for example, a driver state detector 12041 that detects a state of a driver. The driver state detector 12041 includes, for example, a camera for imaging a driver. On the basis of detection information input from the driver state detector 12041, the in-vehicle information detection unit 12040 may calculate the degree of fatigue or concentration of the driver, or determine whether or not the driver has fallen asleep.

The microcomputer 12051 can compute a control target value for the driving force generation device, the steering mechanism, or the braking device on the basis of information acquired from the inside or outside of the vehicle by the outside-of-vehicle information detection unit 12030 or the in-vehicle information detection unit 12040, and output a control command to the drive system control unit 12010. For example, the microcomputer 12051 can perform cooperative control for the purpose of implementing functions of an advanced driver assistance system (ADAS) including collision avoidance or shock mitigation of the vehicle, follow-up traveling based on an inter-vehicle distance, vehicle speed maintaining traveling, vehicle collision warning, vehicle lane departure warning, or the like.

Furthermore, the microcomputer 12051 can perform cooperative control for the purpose of automated driving that allows for autonomous traveling without depending on a driver's operation or the like by controlling the driving force generation device, the steering mechanism, the braking device, or the like on the basis of information acquired from the surroundings of the vehicle by the outside-of-vehicle information detection unit 12030 or the in-vehicle information detection unit 12040.

Furthermore, the microcomputer 12051 can output a control command to the body system control unit 12020 on the basis of information outside of the vehicle acquired by the outside-of-vehicle information detection unit 12030. For example, the microcomputer 12051 can perform cooperative control for the purpose of preventing glare, for example, controlling the head lamp to switch from high beam to low beam in accordance with the position of a preceding car or an oncoming car detected by the outside-of-vehicle information detection unit 12030.

The audio/image output unit 12052 transmits at least one of an audio output signal or an image output signal to an output device capable of visually or aurally notifying an occupant in the vehicle or the outside of the vehicle of information. In the example in FIG. 71, an audio speaker 12061, a display unit 12062, and an instrument panel 12063 are illustrated as the output device. The display unit 12062 may include, for example, at least one of an on-board display or a head-up display.

Figure 72:
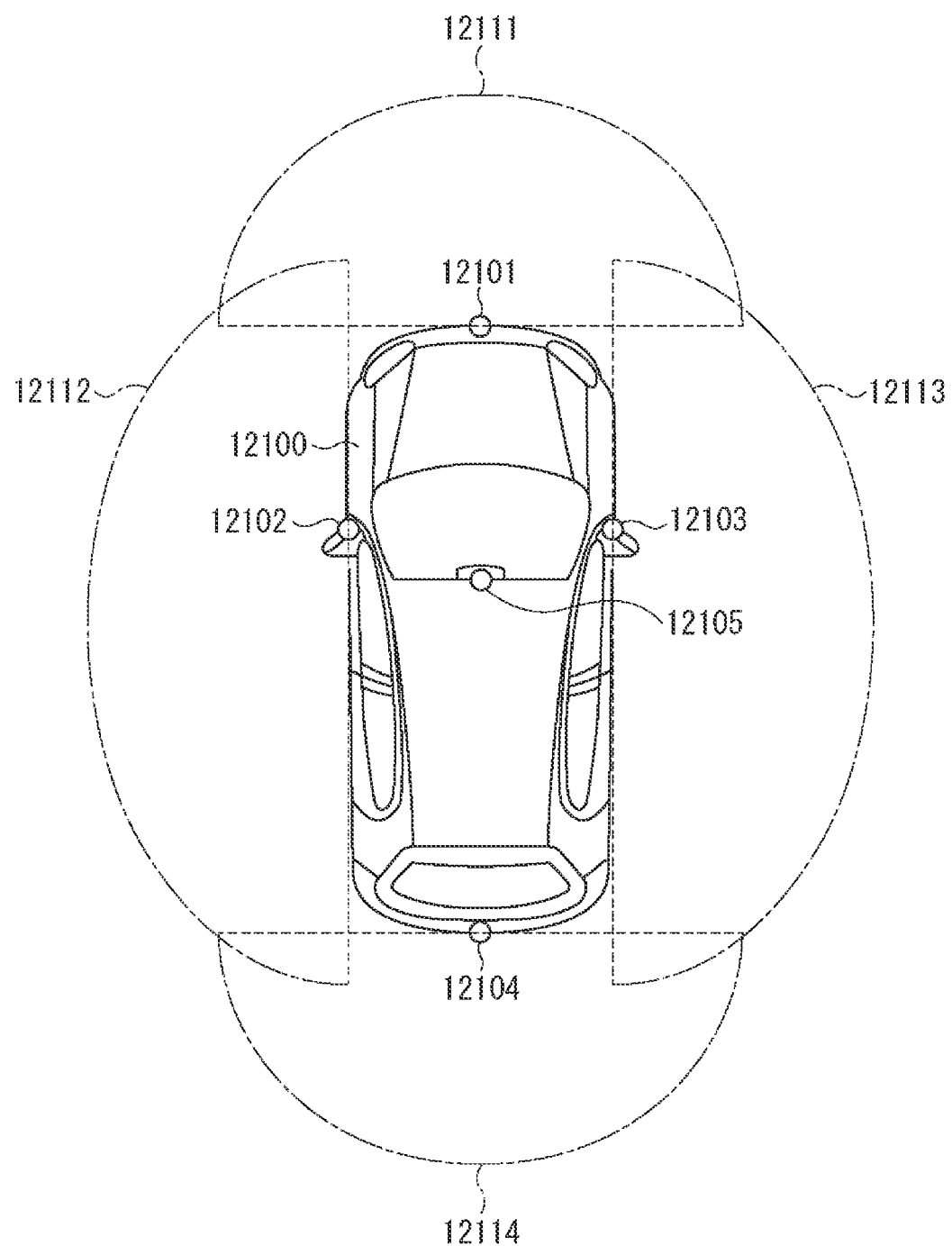
FIG. 72 is an explanatory diagram illustrating an example of installation positions of an outside-of-vehicle information detector and an imaging unit.

FIG. 72 is a diagram illustrating an example of an installation position of the imaging unit 12031.

In FIG. 72, a vehicle 12100 includes imaging units 12101, 12102, 12103, 12104, and 12105 as the imaging unit 12031.

The imaging units 12101, 12102, 12103, 12104, and 12105 are provided at, for example, a front nose, a side mirror, a rear bumper, a back door, and the top of a windshield in a vehicle interior of the vehicle 12100. The imaging unit 12101 disposed at the front nose and the imaging unit 12105 disposed at the top of the windshield in the vehicle interior mainly acquire an image in front of the vehicle 12100. The imaging units 12102 and 12103 disposed at the side mirrors mainly acquire images of side views from the vehicle 12100. The imaging unit 12104 disposed at the rear bumper or the back door mainly acquires an image behind the vehicle 12100. The front images acquired by the imaging units 12101 and 12105 are mainly used for detecting a preceding vehicle, a pedestrian, an obstacle, a traffic light, a traffic sign, a lane, or the like.

Note that FIG. 72 illustrates an example of imaging ranges of the imaging units 12101 to 12104. An imaging range 12111 indicates an imaging range of the imaging unit 12101 provided at the front nose, imaging ranges 12112 and 12113 respectively indicate imaging ranges of the imaging units 12102 and 12103 provided at the side mirrors, and an imaging range 12114 indicates an imaging range of the imaging unit 12104 provided at the rear bumper or the back door. For example, a bird's-eye view image of the vehicle 12100 viewed from above can be obtained by superimposing pieces of image data captured by the imaging units 12101 to 12104.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 obtains a distance to each three-dimensional object in the imaging ranges 12111 to 12114 and a temporal change of the distance (relative speed with respect to the vehicle 12100) on the basis of the distance information obtained from the imaging units 12101 to 12104, thereby extracting, as a preceding car, a three-dimensional object traveling at a predetermined speed (e.g., 0 km/h or more) in substantially the same direction as the vehicle 12100, in particular, the closest three-dimensional object on a traveling path of the vehicle 12100. Moreover, the microcomputer 12051 can set an inter-vehicle distance behind the preceding car to be secured in advance, and can perform automatic brake control (including follow-up stop control), automatic acceleration control (including follow-up start control), and the like. As described above, it is possible to perform cooperative control for the purpose of automated driving that allows for autonomous traveling without depending on a driver's operation or the like.

For example, on the basis of the distance information obtained from the imaging units 12101 to 12104, the microcomputer 12051 can extract from and classify three-dimensional object data regarding three-dimensional objects into two-wheeled vehicles, ordinary vehicles, large-sized vehicles, pedestrians, utility poles, and other three-dimensional objects, for use in automatic avoidance of obstacles. For example, the microcomputer 12051 identifies obstacles around the vehicle 12100 as obstacles that can be visually recognized by a driver of the vehicle 12100 and obstacles that are difficult to visually recognize. Then, the microcomputer 12051 determines a collision risk indicating a risk of collision with each obstacle. In a case where the collision risk is a set value or more and there is a possibility of collision, the microcomputer 12051 can perform driving assistance for collision avoidance by outputting an alarm to the driver via the audio speaker 12061 or the display unit 12062 or performing forced deceleration or avoidance steering via the drive system control unit 12010.

At least one of the imaging units 12101 to 12104 may be an infrared camera that detects infrared rays. For example, the microcomputer 12051 can recognize a pedestrian by determining whether or not there is a pedestrian in images captured by the imaging units 12101 to 12104. Such pedestrian recognition is performed by, for example, a procedure of extracting feature points in the images captured by the imaging units 12101 to 12104 as infrared cameras and a procedure of performing pattern matching processing on a series of feature points indicating an outline of an object and determining whether or not the object is a pedestrian. In a case where the microcomputer 12051 determines that there is a pedestrian in the images captured by the imaging units 12101 to 12104 and recognizes the pedestrian, the audio/image output unit 12052 controls the display unit 12062 to superimpose and display a bounding box for highlighting the recognized pedestrian. Furthermore, the audio/image output unit 12052 may control the display unit 12062 to display an icon or the like indicating a pedestrian at a desired position.

The example of the vehicle control system to which the technology according to the present disclosure can be applied has been described above. The technology according to the present disclosure can be applied to, for example, the imaging unit 12031 among the configurations described above. Specifically, for example, the imaging device 1 in FIGS. 1, 9, and the like can be used for the imaging unit 12031. By applying the technology according to the present disclosure to the imaging unit 12031, it is possible to achieve downsizing and reduction in height of the device configuration, and to prevent occurrence of flare and ghosts attributable to internal diffuse reflection.

Note that the effects described in the present specification are merely examples and are not restrictive, and effects other than those described in the present specification may be obtained.

Note that the present technology can be configured as described below.

(1)
An imaging device including:
a solid-state imaging element including a laminate substrate in which a first substrate and a second substrate are laminated;
a glass substrate positioned above the first substrate; and
a lens formed on the glass substrate,
in which
a cavity is provided between the lens and the solid-state imaging element.

(2)
The imaging device according to (1), in which
the lens is formed to have a maximal thickness larger than a thickness of the glass substrate, and a minimum thickness smaller than the thickness of the glass substrate.

(3)
The imaging device according to (1) or (2), in which
the cavity is sealed with a material different from a material of the lens.

(4)
The imaging device according to any one of (1) to (3), in which
an antireflection film is formed on at least a part of an interface with the cavity.

(5)
The imaging device according to any one of (1) to (4), in which
the glass substrate has a configuration in which a first glass substrate and a second glass substrate are bonded together.

(6)
The imaging device according to (5), in which
the cavity is formed between the first glass substrate and the second glass substrate.

(7)
The imaging device according to (6), in which
the first glass substrate and the second glass substrate are bonded together via an antireflection film.

(8)
The imaging device according to (6), in which
the first glass substrate and the second glass substrate are directly bonded together by thermal fusion.

(9)
The imaging device according to (6), in which
the first glass substrate and the second glass substrate are bonded together via a sealing film.

(10)
The imaging device according to any one of (1) to (4), in which
the cavity is formed between the glass substrate and a flattening film covering an on-chip lens of the solid-state imaging element.

(11)
The imaging device according to (10), in which
the cavity is sealed with the glass substrate and the flattening film.

(12)
The imaging device according to (10), in which
the cavity is sealed with a vertical direction of the cavity surrounded by the glass substrate and the flattening film, and a planar direction of the cavity surrounded by a sealing film.

(13)
The imaging device according to any one of (1) to (4), in which
the cavity is formed between the glass substrate and an on-chip lens of the solid-state imaging element.

(14)
The imaging device according to (13), in which
the cavity is sealed with a planar direction of the cavity surrounded by the glass substrate.

(15)
The imaging device according to (13), in which the cavity is sealed with a planar direction of the cavity surrounded by a sealing film.

REFERENCE SIGNS LIST

1 Imaging device
10 Integrated component
11 Solid-state imaging element (having a CPS structure)
11a Lower substrate (logic substrate)
lib Upper substrate (pixel sensor substrate)
11c Color filter
11d On-chip lens
12 Glass substrate
13 Adhesive
14 IRCF (infrared cut filter)
14' IRCF glass substrate
15 Adhesive
16 Lens group
17 Circuit board
18 Actuator
19 Connector
20 Spacer
171 Lens group
231 Glass substrate
231a Protrusion
231b Cavity
271 Lens
271a AR coat
291 Lens
291a Antireflection treated portion
301 Infrared light cut lens
321 Glass substrate
401 Lens
601 Glass substrate
601a First glass substrate
601b, 601b' Second glass substrate
611a Protrusion
612 Cavity
621, 622 AR coat
641 Sealing film
652 Adhesive

The invention claimed is:

1. An imaging device, comprising:
a solid-state imaging element including a laminate substrate, wherein
the laminate substrate includes a first substrate and a second substrate,
and
the first substrate and the second substrate are laminated;
a glass substrate above the first substrate, wherein
the glass substrate includes a first glass substrate and a second glass substrate, and
the first glass substrate is bonded to the second glass substrate;
a lens on the glass substrate; and
a cavity between the lens and the solid-state imaging element.

2. The imaging device according to claim 1, wherein a first thickness of the lens is larger than a thickness of the glass substrate, and
a second thickness of the lens is smaller than the thickness of the glass substrate.

3. The imaging device according to claim 1, wherein the cavity is sealed with a material different from a material of the lens.

4. The imaging device according to claim 1, further comprising an antireflection film on at least a part of an interface between the glass substrate and the cavity.

5. The imaging device according to claim 1, wherein the cavity is between the first glass substrate and the second glass substrate.

6. The imaging device according to claim 5, wherein the first glass substrate is bonded to the second glass substrate via an antireflection film.

7. The imaging device according to claim 5, wherein the first glass substrate is directly bonded to the second glass substrate by thermal fusion.

8. The imaging device according to claim 5, wherein the first glass substrate is bonded to the second glass substrate via a sealing film.

9. The imaging device according to claim 1, wherein
the cavity is between the glass substrate and a flattening film, and
the flattening film is configured to cover an on-chip lens of the solid-state imaging element.

10. The imaging device according to claim 9, wherein the cavity is sealed with the glass substrate and the flattening film.

11. The imaging device according to claim 9, wherein
a vertical direction of the cavity is sealed with the glass substrate and the flattening film, and
a planar direction of the cavity is sealed with a sealing film.

12. The imaging device according to claim 1, wherein the cavity is between the glass substrate and an on-chip lens of the solid-state imaging element.

13. The imaging device according to claim 12, wherein a planar direction of the cavity is sealed by with the glass substrate.

14. The imaging device according to claim 12, wherein a planar direction of the cavity is sealed with a sealing film.

* * * * *